US011374182B2

(12) United States Patent
Jin et al.

(10) Patent No.: US 11,374,182 B2
(45) Date of Patent: Jun. 28, 2022

(54) ORGANIC ELECTROLUMINESCENCE DEVICE AND AMINE COMPOUND FOR ORGANIC ELECTROLUMINESCENCE DEVICE

(71) Applicant: SAMSUNG DISPLAY CO., LTD., Yongin-si (KR)

(72) Inventors: Xiulan Jin, Yokohama (JP); Ichinori Takada, Yokohama (JP)

(73) Assignee: Samsung Display Co., Ltd., Yongin-si (KR)

(*) Notice: Subject to any disclaimer, the term of this patent is extended or adjusted under 35 U.S.C. 154(b) by 373 days.

(21) Appl. No.: 16/524,363

(22) Filed: Jul. 29, 2019

(65) Prior Publication Data

US 2020/0083466 A1 Mar. 12, 2020

(30) Foreign Application Priority Data

Sep. 11, 2018 (KR) ........................ 10-2018-0108393

(51) Int. Cl.
*C07F 7/08* (2006.01)
*H01L 51/00* (2006.01)
(Continued)

(52) U.S. Cl.
CPC ........ *H01L 51/0094* (2013.01); *C07F 7/0816* (2013.01); *C09K 11/06* (2013.01);
(Continued)

(58) Field of Classification Search
None
See application file for complete search history.

(56) References Cited

U.S. PATENT DOCUMENTS 8,927,749 B2 1/2015 Boudreault et al.
9,502,672 B2 11/2016 Lin et al.
(Continued)

FOREIGN PATENT DOCUMENTS

CN 106966955 A 7/2017
JP 4700442 B2 6/2011
(Continued)

OTHER PUBLICATIONS

Machine translation of JP-2006083167, translation generated Aug. 2021,44 pages (Year: 2021).*

*Primary Examiner* — Robert S Loewe
(74) *Attorney, Agent, or Firm* — Lewis Roca Rothgerber Christie LLP

(57) ABSTRACT

Provided is an organic electroluminescence device, including a first electrode, a hole transport region that is on the first electrode and includes an amine compound represented by the following Formula 1, an emission layer on the hole transport region, an electron transport region on the emission layer, and a second electrode on the electron transport region,

[Formula 1]

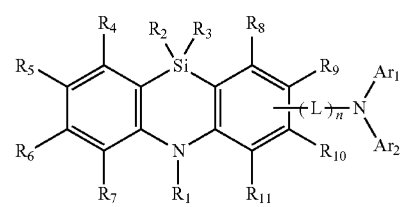

20 Claims, 2 Drawing Sheets

(51) Int. Cl.
*C09K 11/06* (2006.01)
*H01L 51/50* (2006.01)

(52) U.S. Cl.
CPC .... *C09K 2211/1018* (2013.01); *H01L 51/006* (2013.01); *H01L 51/0052* (2013.01); *H01L 51/0061* (2013.01); *H01L 51/0071* (2013.01); *H01L 51/0074* (2013.01); *H01L 51/5012* (2013.01); *H01L 51/5016* (2013.01); *H01L 51/5056* (2013.01); *H01L 51/5072* (2013.01); *H01L 51/5088* (2013.01)

(56) References Cited

U.S. PATENT DOCUMENTS

| | | | | |
|---|---|---|---|---|
| 2013/0341600 | A1* | 12/2013 | Lin | C07F 7/0816 257/40 |
| 2015/0171339 | A1* | 6/2015 | Sakamoto | H01L 51/0071 257/40 |
| 2016/0218296 | A1* | 7/2016 | Matsuoka | H01L 51/0058 |
| 2018/0312533 | A1* | 11/2018 | Ahn | C07F 7/0816 |

FOREIGN PATENT DOCUMENTS

| | | | |
|---|---|---|---|
| KR | 10-0648050 | B1 | 11/2006 |
| KR | 10-2013-0113115 | A | 10/2013 |
| KR | 10-2013-0143494 | A | 12/2013 |
| KR | 10-2016-0078102 | A | 7/2016 |
| KR | 10-1769764 | B1 | 8/2017 |
| WO | WO 2006/033563 | A1 | 3/2006 |
| WO | WO 2015/080182 | A1 | 6/2015 |

* cited by examiner

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION

Korean Patent Application No. 10-2018-0108393, filed on Sep. 11, 2018, in the Korean Intellectual Property Office, and entitled: "Organic Electroluminescence Device and Amine Compound for Organic Electroluminescence Device," is incorporated by reference herein in its entirety.

BACKGROUND

1. Field

Embodiments relate to an amine compound and an organic electroluminescence device including the same.

2. Description of the Related Art

Development on an organic electroluminescence display as an image display is being actively conducted. An organic electroluminescence display is different from a liquid crystal display and is so called a self-luminescent display which accomplishes display by recombining holes and electrons injected from a first electrode and a second electrode in an emission layer and emitting light from a luminescent material which includes an organic compound in the emission layer.

In an application of an organic electroluminescence device to a display, decrease of a driving voltage, increase of emission efficiency and extension of life for the organic electroluminescence device are required, and development of a material which may stably implement these requirements in the organic electroluminescence device is also continuously required.

SUMMARY

Embodiments are directed to an amine compound represented by the following Formula 1,

[Formula 1]

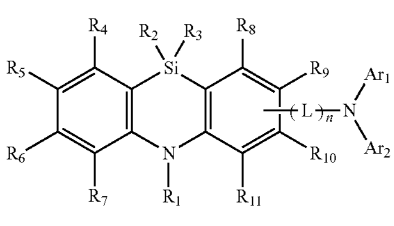

In Formula 1, $R_1$ may be a substituted or unsubstituted aryl group having 6 to 40 ring carbon atoms, $R_2$ and $R_3$ may each independently be a substituted or unsubstituted aryl group having 6 to 40 ring carbon atoms, or a substituted or unsubstituted heteroaryl group having 2 to 40 ring carbon atoms, and $R_4$ to $R_{11}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, or may form a ring by combining adjacent groups with each other. In Formula 1, $Ar_1$ and $Ar_2$ may each independently be a substituted or unsubstituted aryl group having 6 to 40 ring carbon atoms, or a substituted or unsubstituted heteroaryl group having 2 to 40 ring carbon atoms, L may be a direct linkage, a substituted or unsubstituted arylene group having 6 to 30 ring carbon atoms, or a substituted or unsubstituted heteroarylene group having 2 to 30 ring carbon atoms, and n may be an integer of 0 to 4.

In an example embodiment. Formula 1 may be represented by the following Formula 1-1 or 1-2,

[Formula 1-1]

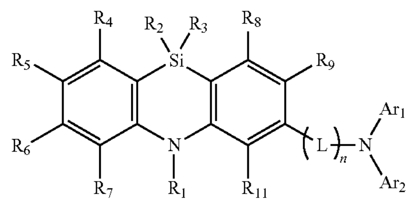

[Formula 1-2]

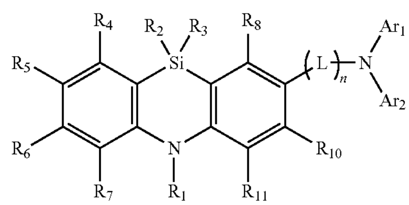

In Formulae 1-1 and 1-2, $R_1$ to $R_{11}$, $Ar_1$, $Ar_2$, L, and n are the same as defined in Formula 1.

In an example embodiment, Formula 1 may be represented by the following Formula 2-1 or 2-2,

[Formula 2-1]

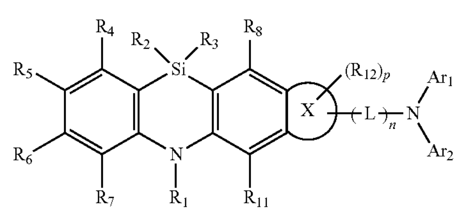

[Formula 2-2]

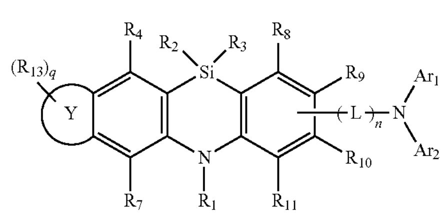

In Formulae 2-1 and 2-2, X and Y may each independently be a hydrocarbon ring having 6 to 40 ring carbon atoms, or a heterocycle having 2 to 40 ring carbon atoms, $R_{12}$ and $R_{13}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, p and q may each independently be an integer of 0 to 3, and $R_1$ to $R_{11}$, $Ar_1$, $Ar_2$, L, and n are the same as defined in Formula 1.

In an example embodiment, Formulae 2-1 and 2-2 may be represented by the following Formulae 2-1A and 2-2A, respectively,

[Formula 2-1A]

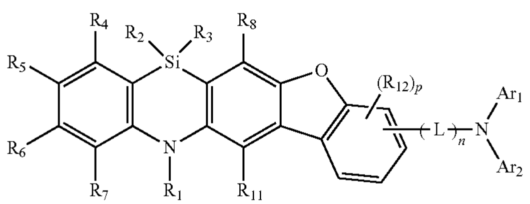

[Formula 2-2A]

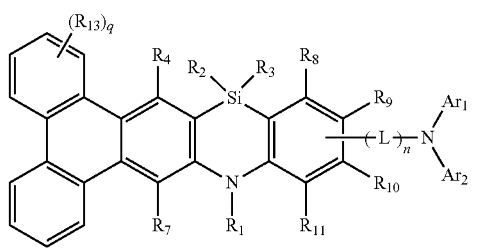

In Formulae 2-1A and 2-2A, $R_{12}$ and p are the same as defined in Formula 2-1, $R_{13}$ and q are the same as defined in Formula 2-2, and $R_1$ to $R_{11}$, $Ar_1$, $Ar_2$, L, and n are the same as defined in Formula 1.

In an example embodiment, in Formula 1, $R_1$ may be an unsubstituted phenyl group.

In an example embodiment, in Formula 1, $R_2$ and $R_3$ may each independently be an unsubstituted phenyl group, an unsubstituted dibenzofuranyl group, or an unsubstituted dibenzothiophenyl group.

In an example embodiment, in Formula 1, $R_2$ and $R_3$ may be the same each other.

In an example embodiment, in Formula 1, $Ar_1$ and $Ar_2$ may each independently be a substituted or unsubstituted phenyl group, a substituted or unsubstituted naphthyl group, a substituted or unsubstituted phenanthrenyl group, a substituted or unsubstituted biphenyl group, a substituted or unsubstituted terphenyl group, a substituted or unsubstituted benzofuranyl group, a substituted or unsubstituted dibenzofuranyl group, a substituted or unsubstituted benzothiophenyl group, a substituted or unsubstituted dibenzothiophenyl group, a substituted or unsubstituted pyridinyl group, a substituted or unsubstituted quinolinyl group, or a substituted or unsubstituted fluorenyl group.

In an example embodiment, in Formula 1, L may be a direct linkage, a substituted or unsubstituted phenylene group, or a substituted or unsubstituted divalent dibenzofuran group.

In an example embodiment, an organic electroluminescence device may include a first electrode; a hole transport region that is on the first electrode and includes an amine compound according to an example embodiment; an emission layer on the hole transport region; an electron transport region on the emission layer; and a second electrode on the electron transport region.

In an example embodiment, the hole transport region may include a hole injection layer disposed between the first electrode and the emission layer and a hole transport layer disposed between the hole injection layer and the emission layer, and the hole transport layer may include the amine compound according to an example embodiment.

In an example embodiment, the emission layer may include an anthracene derivative represented by the following Formula 3,

[Formula 3]

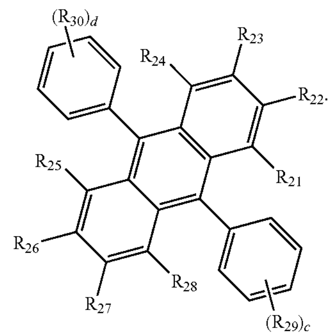

In Formula 3, $R_{21}$ to $R_{30}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms, or form a ring by combining adjacent groups with each other, and c and d may each independently be an integer of 0 to 5.

BRIEF DESCRIPTION OF THE DRAWINGS

Features will become apparent to those of skill in the art by describing in detail example embodiments with reference to the attached drawings in which.

DETAILED DESCRIPTION

Figure 1:
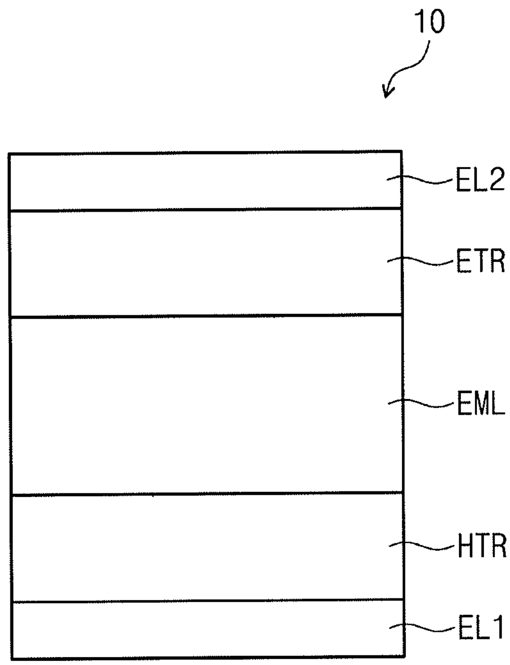
FIG. 1 illustrates a schematic cross-sectional view of an organic electroluminescence device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. Like reference numerals refer to like elements throughout.

It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprise" or "have," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be "directly on" the other part, or intervening layers may also be present.

In the present disclosure, -* means a position to be connected.

In the present disclosure, "substituted or unsubstituted" may mean unsubstituted or substituted with at least one substituent selected from the group consisting of deuterium, halogen, cyano, nitro, amino, silyl, boron, phosphine oxide, phosphine sulfide, alkyl, alkenyl, alkoxy, aryloxy, alkylthio, arylthio, hydrocarbon ring, aryl and heterocyclic group. In addition, each of the substituent illustrated above may be substituted or unsubstituted. For example, biphenyl may be interpreted as aryl, or phenyl substituted with phenyl.

In the present disclosure, examples of a halogen atom are a fluorine atom, a chlorine atom, a bromine atom, or an iodine atom.

In the present disclosure, the alkyl group may have a linear, branched or cyclic form. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc.

In the present disclosure, the hydrocarbon ring may mean an aliphatic hydrocarbon ring or an aromatic hydrocarbon ring. The hydrocarbon ring includes no heteroatom, and may be a ring including 5 to 60 ring carbon atoms. The hydrocarbon ring may be a monocycle or a polycycle.

In the present disclosure, the heterocycle include an aliphatic heterocycle and an aromatic heterocycle. The heterocycle may be a monocycle or a polycycle. The heterocycle includes at least one heteroatom for forming a ring, and the carbon number of the heterocycle for forming a ring may be 2 to 60.

In the present disclosure, the aryl group means any functional group or substituent derived from an aromatic hydrocarbon ring. The aryl group may be monocyclic aryl or polycyclic aryl. The carbon number of the aryl group for forming a ring may be 6 to 40, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the present disclosure, the fluorenyl group may be substituted, and two substituents may be combined with each other to form a spiro structure. Examples of the substituted fluorenyl group may include the following groups.

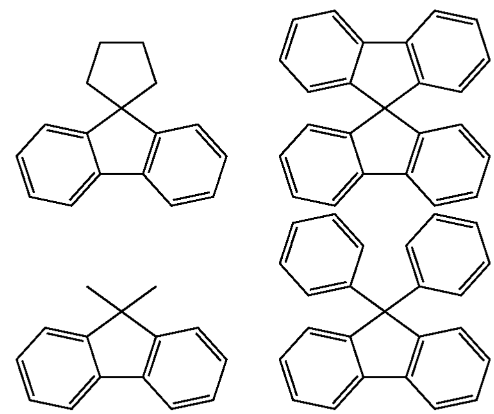

In the present disclosure, the heteroaryl group may be heteroaryl including at least one of O, N, P, Si, or S as a heteroatom. The carbon number of the heteroaryl group for forming a ring may be 2 to 40, 2 to 30, or 2 to 20. The heteroaryl group may be monocyclic heteroaryl or polycyclic heteroaryl. Polycyclic heteroaryl may have bicyclic or tricyclic structure, for example. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-aryl carbazole, N-heteroaryl carbazole, N-alkyl carbazole, benzoxazole, benzoimidazole, benzothiazole, benzocarbazole, benzothiophene, dibenzothiophene, thienothiophene, benzofuran, phenanthroline, thiazole, isoxazole, oxadiazole, thiadiazole, phenothiazine, dibenzosilole, dibenzofuran, etc.

In the present disclosure, the silyl group includes alkyl silyl and aryl silyl. Examples of the silyl group may include trimethylsilyl, triethylsilyl, t-butyl dimethylsilyl, vinyl dimethylsilyl, propyl dimethylsilyl, triphenylsilyl, diphenylsilyl, phenylsilyl, etc.

In the present disclosure, the oxy group may include alkoxy and aryloxy. The alkoxy group may have a linear, branched or cyclic form. The carbon number of the alkoxy group is not specifically limited and may be 1 to 20, or 1 to 10, for example. Examples of the alkoxy group may include methoxy, ethoxy, n-propoxy, isopropoxy, butoxy, pentyloxy, hexyloxy, octyloxy, nonyloxy, decyloxy, etc.

In the present disclosure, the above-described examples of the aryl group may be applied to the aryl group in aryloxy. The carbon number of the aryloxy group for forming a ring is not specifically limited and may be 6 to 30, for example. For example, the aryloxy group may be a benzyloxy group.

In the present disclosure, the terms "forming a ring by combining adjacent groups with each other" may mean forming a substituted or unsubstituted hydrocarbon ring or a substituted or unsubstituted heterocycle by combining adjacent groups with each other. The hydrocarbon ring includes an aliphatic hydrocarbon ring and an aromatic hydrocarbon ring. The heterocycle includes an aliphatic heterocycle and an aromatic heterocycle. The ring formed by combining adjacent groups may be a monocycle or a polycycle. In addition, the ring formed by combining adjacent groups may be connected with another ring to form a spiro structure.

In the present disclosure, the terms "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

Hereinafter, an organic electroluminescence device according to an example embodiment and an amine compound according to an example embodiment included therein will be explained referring to the accompanying drawings.

Figure 2:
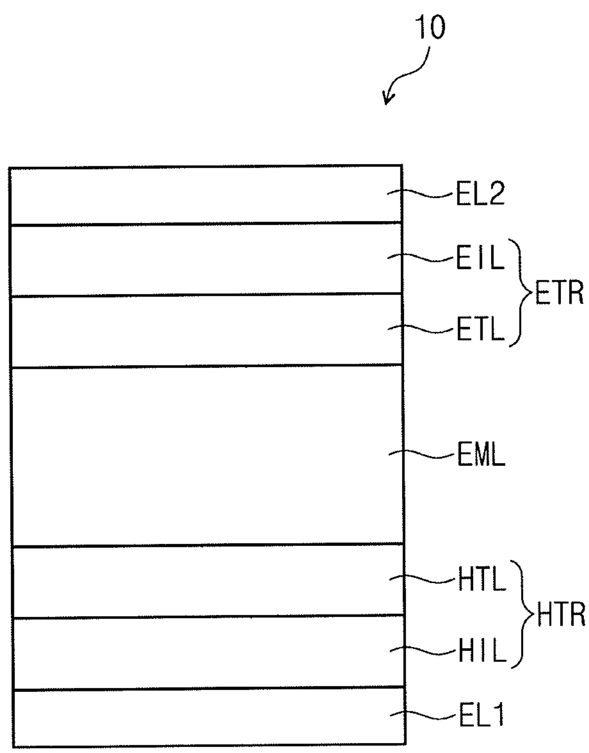
FIG. 2 illustrates a schematic cross-sectional view of an organic electroluminescence device according to an example embodiment.
Figure 3:
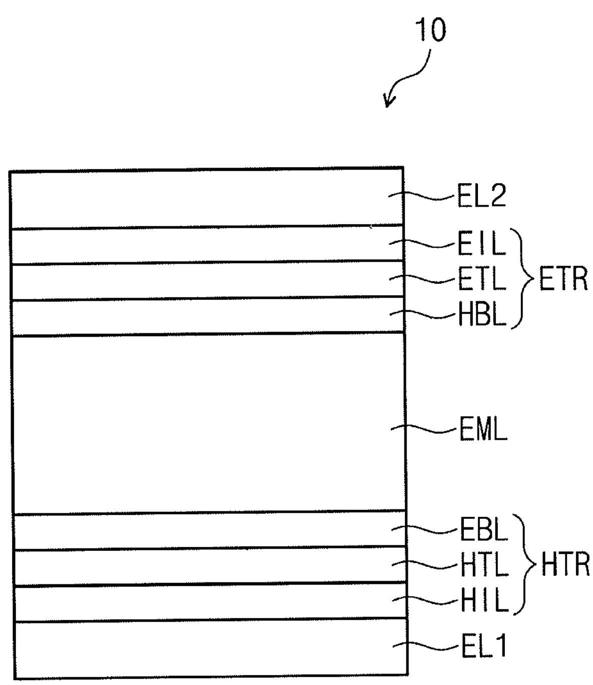
FIG. 3 illustrates a schematic cross-sectional view of an organic electroluminescence device according to an example embodiment.

Each of FIGS. 1 to 3 is a schematic cross-sectional view illustrating an organic electroluminescence device according to an example embodiment.

Referring to FIGS. 1 to 3, an organic electroluminescence device 10 according to an example embodiment may include a first electrode EL1, a hole transport region HTR, an emission layer EML, an electron transport region ETR, and a second electrode EL2, laminated in order.

The first electrode EL1 and the second electrode EL2 are disposed oppositely, and a plurality of organic layers may be disposed between the first electrode EL1 and the second electrode EL2. The plurality of organic layers may include a hole transport region HTR, an emission layer EML and an electron transport region ETR.

The organic electroluminescence device 10 according to an example embodiment may include the amine compound according to an example embodiment in the hole transport region HTR disposed between the first electrode EL1 and the second electrode EL2.

Comparing with FIG. 1, FIG. 2 shows a schematic cross-sectional view illustrating an organic electroluminescence device 10 according to an example embodiment, in which a hole transport region HTR includes a hole injection layer HIL and a hole transport layer HTL, and an electron transport region ETR includes an electron injection layer EIL and an electron transport layer ETL. Furthermore, comparing with FIG. 1, FIG. 3 shows a schematic cross-sectional view illustrating an organic electroluminescence device 10 according to an example embodiment, in which a hole transport region HTR includes a hole injection layer HIL, a hole transport layer HTL and an electron blocking layer EBL, and an electron transport region ETR includes an electron injection layer EIL, an electron transport layer ETL and a hole blocking layer HBL. In an organic electroluminescence device 10 according to an example embodiment, the hole transport layer HTL may include the amine compound according to an example embodiment, described below.

Although not shown, in an organic electroluminescence device 10 according to an example embodiment, a hole transport layer HTL may include a plurality of sub-layers for hole transport (not shown), and a sub-layer adjacent to the emission layer EML among the plurality of sub-layers for hole transport (not shown) may include the amine compound according to an example embodiment, described below.

The first electrode EL1 has conductivity. The first electrode EL1 may be formed by a metal alloy or a conductive compound. The first electrode EL1 may be an anode. The first electrode EL1 may also be a pixel electrode. The first electrode EL1 may be a transmissive electrode, a transflective electrode, or a reflective electrode. In case the first electrode EL1 is the transmissive electrode, the first electrode EL1 may include a transparent metal oxide such as indium tin oxide (ITO), indium zinc oxide (IZO), zinc oxide (ZnO), or indium tin zinc oxide (ITZO). In case the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or transflective layer formed using the above materials, and a transparent conductive layer formed using ITO, IZO, ZnO, or ITZO. For example, the first electrode EL1 may have a triple-layer structure of ITO/Ag/ITO. The thickness of the first electrode EL1 may be from about 1,000 Å to about 10,000 Å, for example, from about 1,000 Å to about 3,000 Å.

The hole transport region HTR is on the first electrode EL1. The hole transport region HTR may include at least one of a hole injection layer HIL, a hole transport layer HTL, a hole buffer layer (not shown), or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In addition, the hole transport region HTR may have a single layer structure formed using a plurality of different materials, or a laminated structure of hole injection layer HIL/hole transport layer HTL, hole injection layer HIL/hole transport layer HTL/hole buffer layer (not shown), hole injection layer HIL/hole buffer layer (not shown), hole transport layer HTL/hole buffer layer, or hole injection layer HIL/hole transport layer HTL/electron blocking layer EBL, laminated in order from the first electrode EL1.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

In an organic electroluminescence device 10 according to an example embodiment, the hole transport region HTR may include an amine compound represented by the following Formula 1.

[Formula 1]

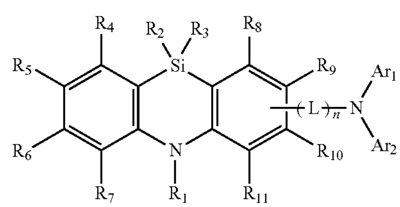

The amine compound according to an example embodiment may include a phenazasiline

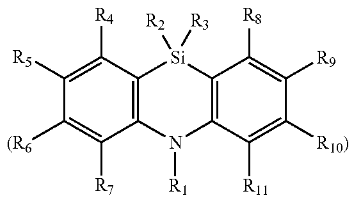

moiety and an arylamine moiety

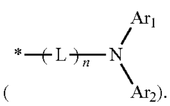

In Formula 1, $R_1$ may be a substituted or unsubstituted aryl group having 6 to 40 ring carbon atoms, $R_2$ and $R_3$ may each independently be a substituted or unsubstituted aryl group having 6 to 40 ring carbon atoms, or a substituted or unsubstituted heteroaryl group having 2 to 40 ring carbon atoms.

For example, in Formula 1, $R_1$ may be a substituted or unsubstituted phenyl group. For example, $R_1$ may be an unsubstituted phenyl group.

In the amine compound according to an example embodiment represented by Formula 1, $R_2$ and $R_3$ may each independently be a substituted or unsubstituted phenyl group, a substituted or unsubstituted dibenzofuranyl group, or a substituted or unsubstituted dibenzothiophenyl group. For example, $R_2$ and $R_3$ may each independently be an unsubstituted phenyl group, an unsubstituted dibenzofuranyl group, or an unsubstituted dibenzothiophenyl group.

In the amine compound according to an example embodiment, $R_2$ and $R_3$ may be the same each other. For example, both of $R_2$ and $R_3$ may be an unsubstituted phenyl group, both of $R_2$ and $R_3$ may be an unsubstituted dibenzofuranyl group, or both of $R_2$ and $R_3$ may be an unsubstituted dibenzothiophenyl group. $R_2$ and $R_3$ may be different from each other.

In Formula 1, $R_4$ to $R_{11}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, or may form a ring by combining adjacent groups with each other.

For example, in Formula 1, adjacent groups of $R_4$ to $R_{11}$ may combine with each other to form a hydrocarbon ring or a heterocycle. Adjacent groups of $R_4$ to $R_{11}$ may combine with the phenazasiline moiety

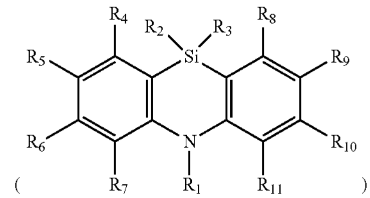

to form a condensed ring.

In an example embodiment, $R_4$ to $R_{11}$ in Formula 1 may be a hydrogen atom, e.g., except at the position of the arylamine moiety.

In the amine compound represented by Formula 1, $Ar_1$ and $Ar_2$ may each independently be a substituted or unsubstituted aryl group having 6 to 40 ring carbon atoms, or a substituted or unsubstituted heteroaryl group having 2 to 40 ring carbon atoms. In the amine compound according to an example embodiment, $Ar_1$ and $Ar_2$ may be the same or different from each other.

For example, in the amine compound according to an example embodiment, $Ar_1$ and $Ar_2$ may each independently be a substituted or unsubstituted phenyl group, a substituted or unsubstituted naphthyl group, a substituted or unsubstituted phenanthrenyl group, a substituted or unsubstituted biphenyl group, a substituted or unsubstituted terphenyl group, a substituted or unsubstituted benzofuranyl group, a substituted or unsubstituted dibenzofuranyl group, a substituted or unsubstituted benzothiophenyl group, a substituted or unsubstituted dibenzothiophenyl group, a substituted or unsubstituted pyridinyl group, a substituted or unsubstituted quinolinyl group, or a substituted or unsubstituted fluorenyl group.

For example, $Ar_1$ and $Ar_2$ may each independently be an unsubstituted phenyl group, a phenyl group substituted with a halogen atom, a phenyl group substituted with a naphthyl group, a phenyl group substituted with a carbazole group, an unsubstituted naphthyl group, an unsubstituted phenanthrenyl group, an unsubstituted biphenyl group, a biphenyl group substituted with a phenyl group, an unsubstituted terphenyl group, an unsubstituted dibenzofuranyl group, an unsubstituted dibenzothiophenyl group, or a fluorenyl group substituted with a phenyl group.

In Formula 1, L may be a direct linkage, a substituted or unsubstituted arylene group having 6 to 30 ring carbon atoms, or a substituted or unsubstituted heteroarylene group having 2 to 30 ring carbon atoms, and n may be an integer of 0 to 4, e.g., 1 to 4. In an example embodiment, L may be a direct linkage. In the present disclosure, a direct linkage may be a single bond.

For example, L may be a substituted or unsubstituted phenylene group, or a substituted or unsubstituted divalent dibenzofuran group. For example, L may be a direct linkage, an unsubstituted phenylene group, or an unsubstituted divalent dibenzofuran group.

In Formula 1, n may be 0 or 1, e.g., 1. In case n is an integer of 2 or more, a plurality of L may be the same or different from each other.

In an example embodiment, the amine compound may be represented by a combination of the following formulae (illustrating a phenazasiline moiety and an amine moiety, respectively) in which * of the amine moiety $-(L)_nNAr_1Ar_2$ is a bond to a ring carbon atom of the phenazasiline moiety at one of $R_8$, $R_9$, $R_{10}$, or $R_{11}$:

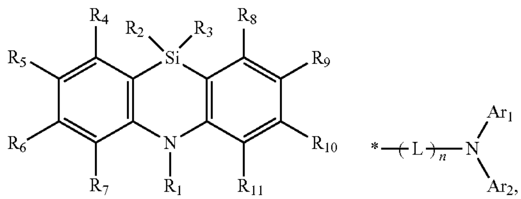

and the other three of $R_8$ to $R_{11}$ are each independently a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, or form a ring by combining adjacent groups with each other.

The amine compound according to an example embodiment represented by Formula 1 may be represented by the following Formula 1-1 or 1-2.

[Formula 1-1]

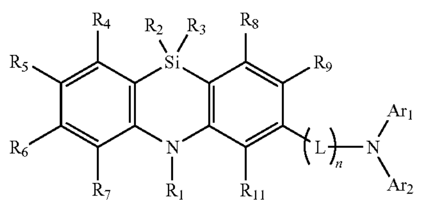

[Formula 1-2]

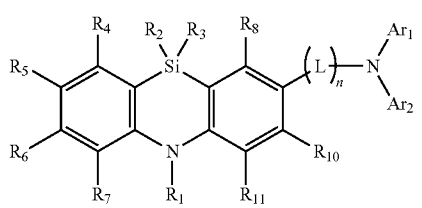

Formulae 1-1 and 1-2 differ from each other in the position of phenazasiline moiety where the amine moiety is combined. Formula 1-1 shows the case where the amine moiety is combined with phenazasiline at the position of $R_{10}$ of Formula 1. Formula 1-2 shows the case where the amine moiety is combined with phenazasiline at the position of $R_9$ of Formula 1.

The above explanation on Formula 1 may be applied to $R_1$ to $R_{11}$, $Ar_1$, $Ar_2$, L, and n in Formulae 1-1 and 1-2.

Formula 1 may also be represented by the following Formula 2-1 or 2-2.

[Formula 2-1]

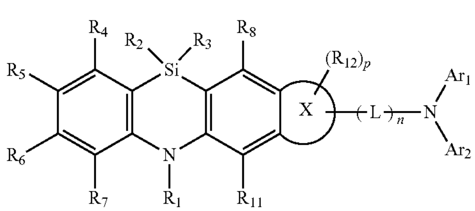

-continued

[Formula 2-2]

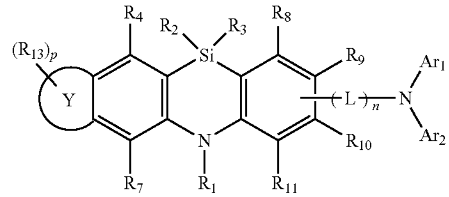

Formulae 2-1 and 2-2 show the case where adjacent groups of $R_4$ to $R_{11}$ combine with each other to form a ring. For example, adjacent groups of $R_4$ to $R_{11}$ combine with each other to form a condensed ring with phenazasiline in Formulae 2-1 and 2-2.

Formula 2-1 shows the case where $R_9$ and $R_{10}$ of Formula 1 combine with each other to form a condensed ring with phenazasiline. Formula 2-2 shows the case where $R_5$ and $R_6$ of Formula 1 combine with each other to form a condensed ring with phenazasiline.

In Formula 2-1, X may be a hydrocarbon ring having 6 to 40 ring carbon atoms, or a heterocycle having 2 to 40 ring carbon atoms. For example, X may be an aryl group having 6 to 40 ring carbon atoms, or a heteroaryl group having 2 to 40 ring carbon atoms.

In Formula 2-1, $R_{12}$ may be a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms. Furthermore, in Formula 2-1, p may be an integer of 0 to 3.

In Formula 2-1, in case p is an integer of 2 or more, a plurality of $R_{12}$ may be the same or different from each other.

The above explanation on Formula 1 may be applied to $R_1$ to $R_8$, $R_{11}$, $Ar_1$, $Ar_2$, L, and n in Formula 2-1.

Formula 2-1 may be represented by the following Formula 2-1A.

[Formula 2-1A]

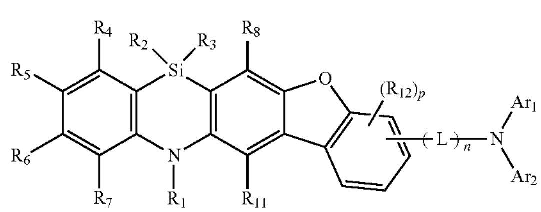

Formula 2-1A shows the case where X of Formula 2-1 forms a heterocycle. X of Formula 2-1 may be a hydrocarbon ring combined with phenazasiline.

In Formula 2-2, Y may be a hydrocarbon ring having 6 to 40 ring carbon atoms, or a heterocycle having 2 to 40 ring carbon atoms. For example, Y may be an aryl group having 6 to 40 ring carbon atoms, or a heteroaryl group having 2 to 40 ring carbon atoms.

In Formula 2-2, $R_{13}$ may be a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms. Furthermore, in Formula 2-2, q may be an integer of 0 to 3.

In Formula 2-2, in case q is an integer of 2 or more, a plurality of $R_{13}$ may be the same or different from each other.

The above explanation on Formula 1 may be applied to $R_1$ to $R_4$, $R_7$ to $R_{11}$, $Ar_1$, $Ar_2$, L, and n in Formula 2-2.

Formula 2-2 may be represented by the following Formula 2-2A.

[Formula 2-2A]

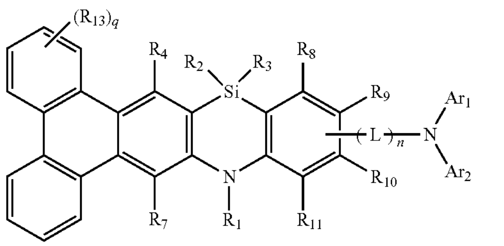

Formula 2-2A shows the case where Y of Formula 2-2 forms a hydrocarbon ring. Y of Formula 2-2 may be a heterocycle combined with phenazasiline.

The amine compound according to an example embodiment may include a phenazasiline moiety. The amine compound according to an example embodiment may be a monoamine compound having a condensed ring including a phenazasiline moiety as a substituent.

An amine compound according to an example embodiment includes both a phenazasiline moiety and an arylamine moiety. The amine compound may exhibit a long life as well as provide enhanced efficiency of a device using the amine compound.

Without being bound by theory, it is believed that the amine compound according to an example embodiment has enhanced resistance to high temperature and electric charge by introducing a phenazasiline moiety having an excellent resistance to heat and electric charge to an arylamine moiety having an extended life property, and therefore, it may be used as a material for an organic electroluminescence device with further extended life. Furthermore, it is believed that the nitrogen atom included in the phenazasiline moiety enhances hole transport capability of the whole molecule of the amine compound to increase the chance of recombining holes and electrons in the emission layer of the organic electroluminescence device, which enables the organic electroluminescence device using the amine compound according to an example embodiment to have enhanced emission efficiency.

The amine compound according to an example embodiment represented by Formula 1 may be any one of compounds represented in the following Compound Groups A and B. Thus, the organic electroluminescence device according to an example embodiment may include at least one of compounds represented in the following Compound Groups A and B in the hole transport region HTR.

In Compound Group A, the amine moiety is connected at the position of $R_{10}$ of Formula 1. In Compound Group B, the amine moiety is connected at the position of $R_9$ of Formula 1.

[Compound Group A]

A1

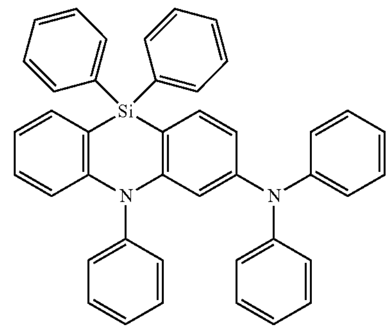

A2

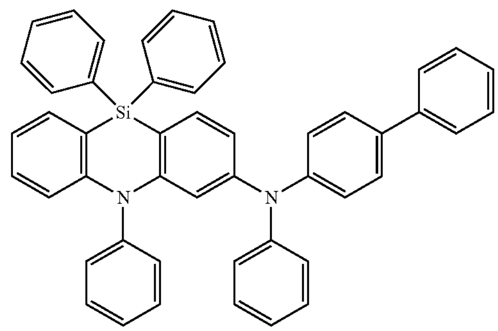

A3

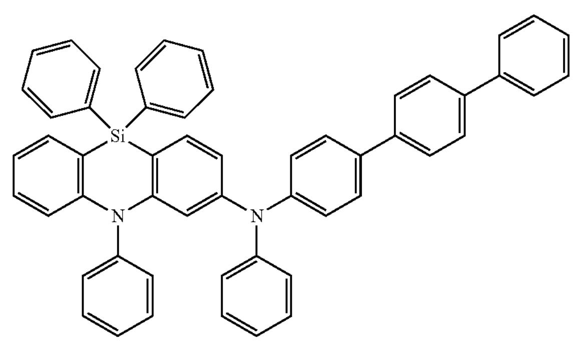

A4

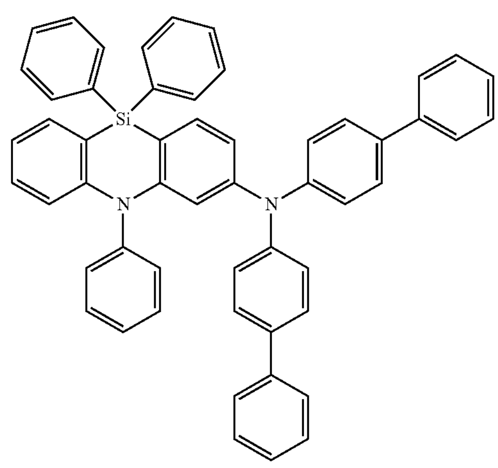

-continued
A5
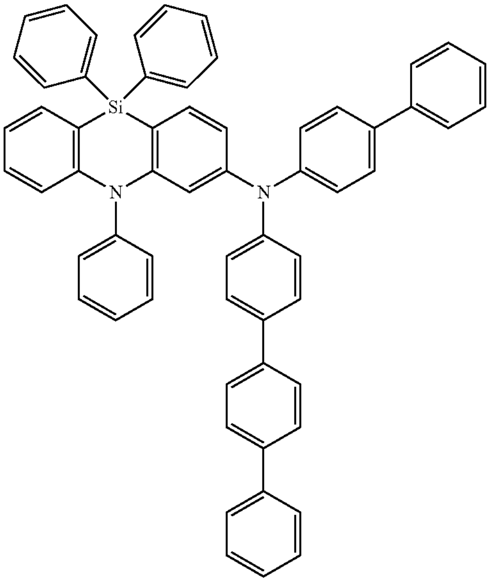
A6
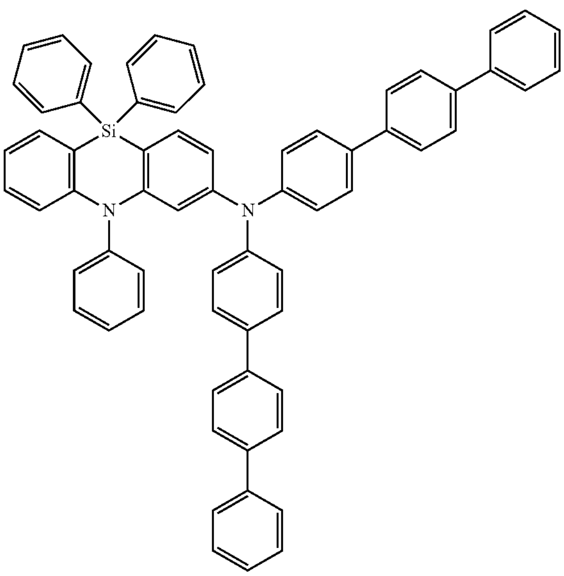
A7
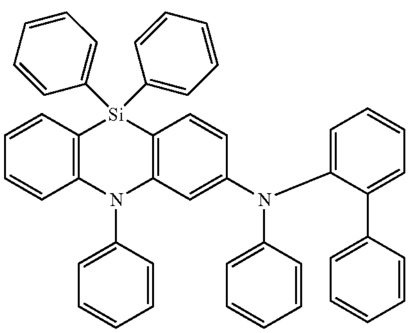
-continued
A8
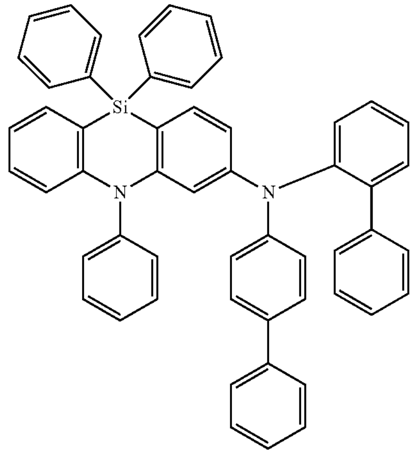
A9
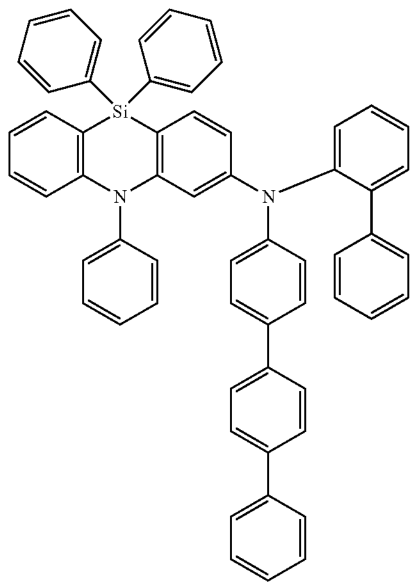
A10
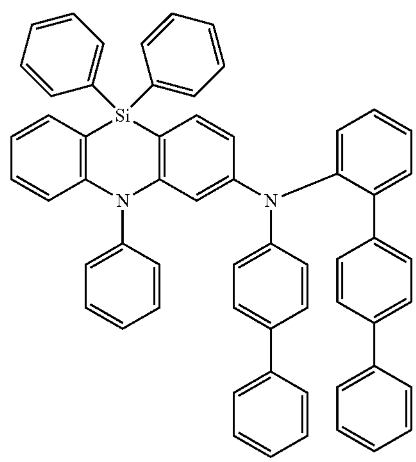

-continued
A11
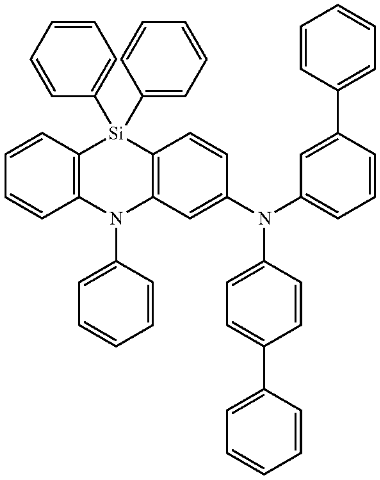
A12
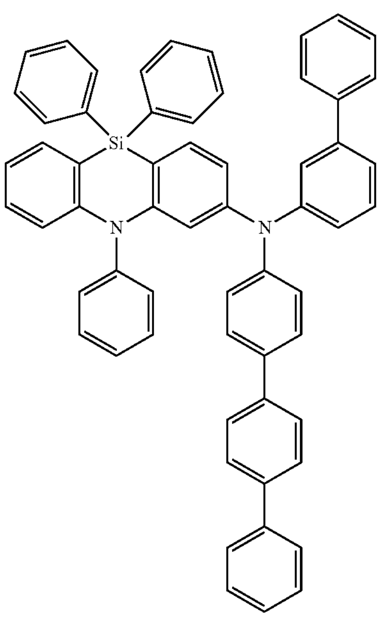
-continued
A13
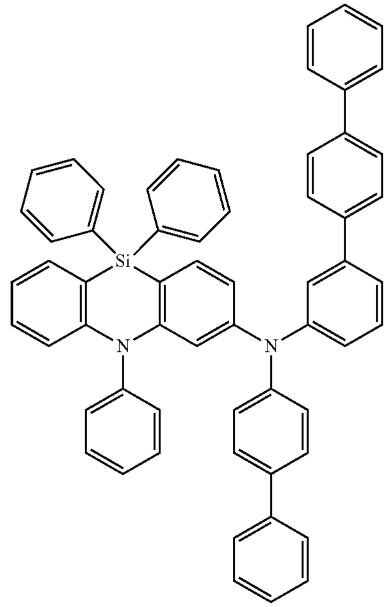
A14
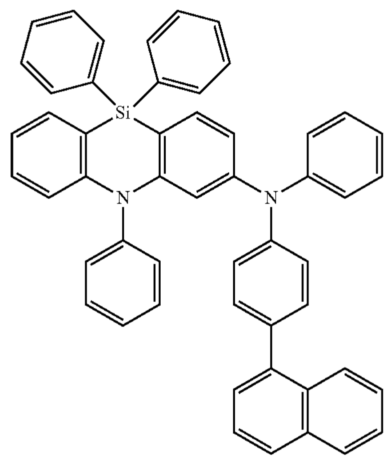
A15
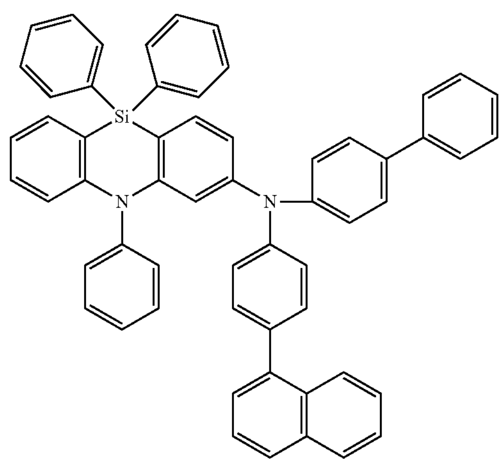

-continued
A16
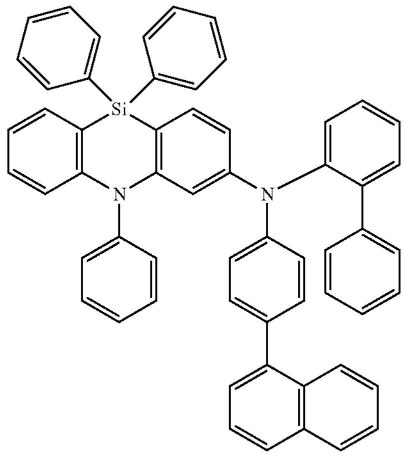
A17
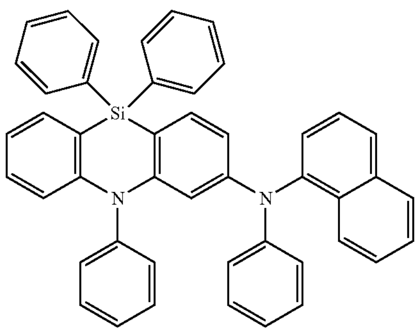
A18
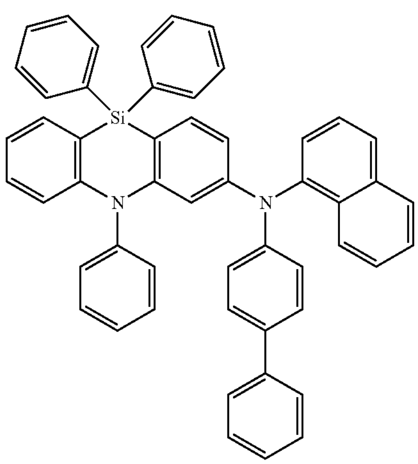
A19
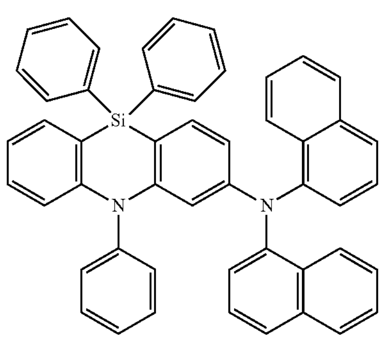
-continued
A20
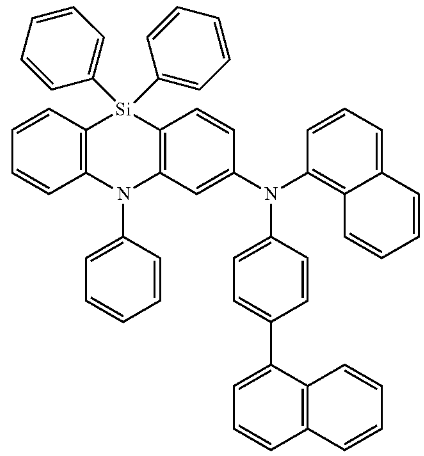
A21
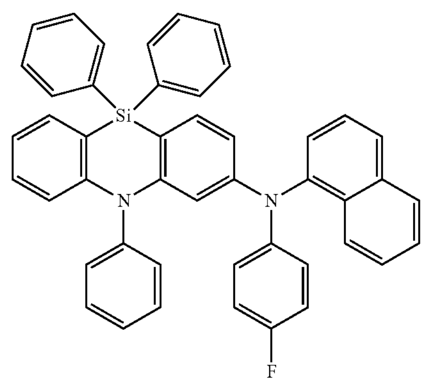
A22
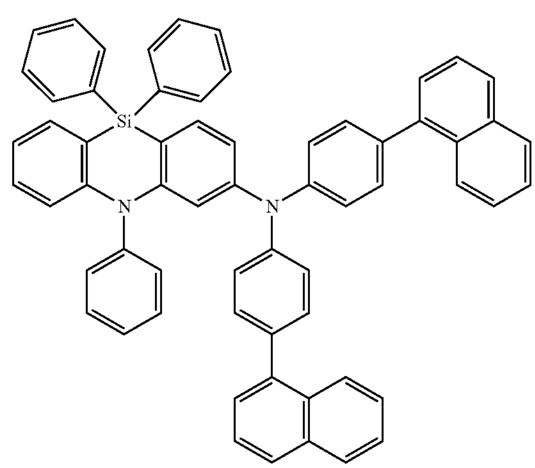

-continued
A23
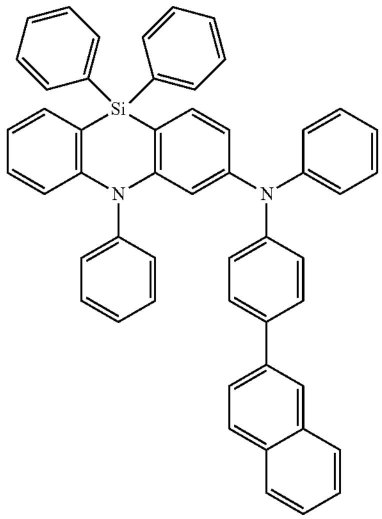
A24
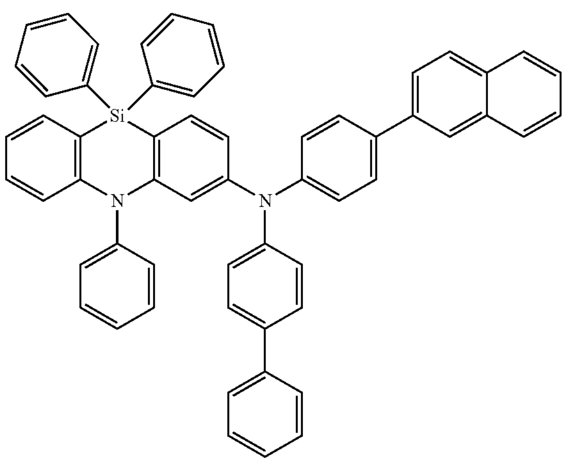
A25
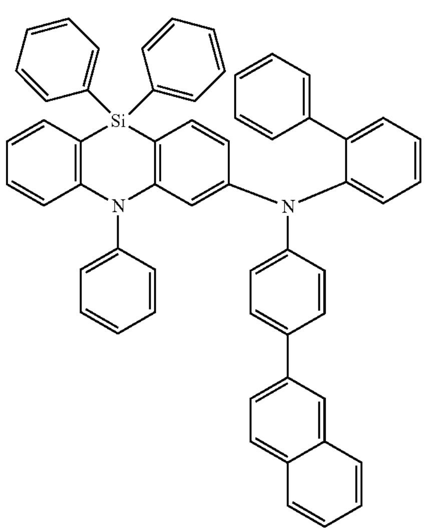
-continued
A26
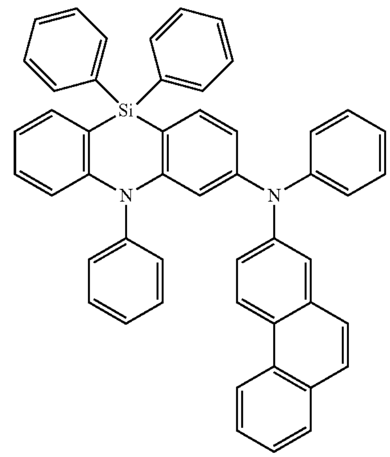
A27
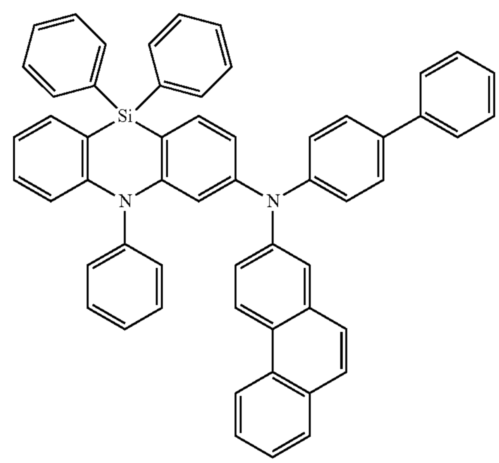
A28
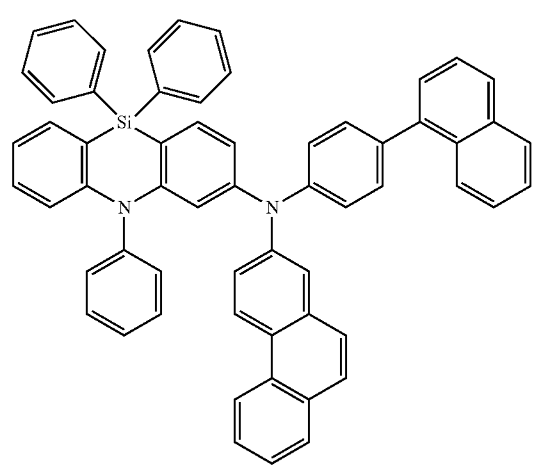

-continued
A29
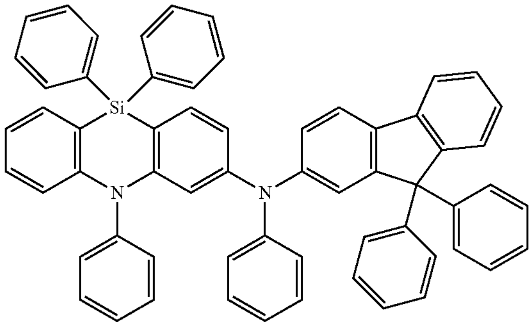
A30
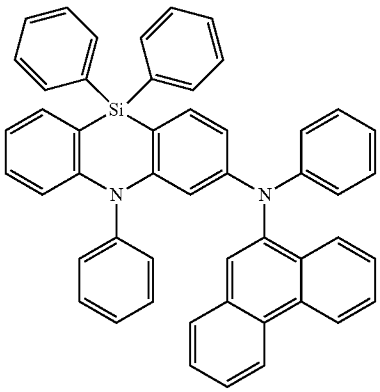
A31
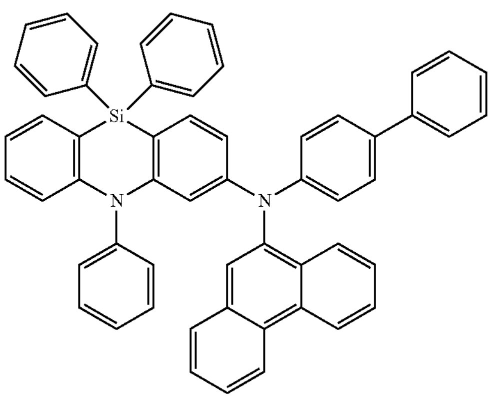
A32
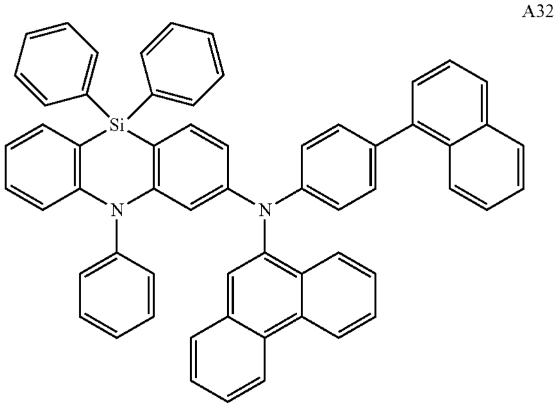
A33
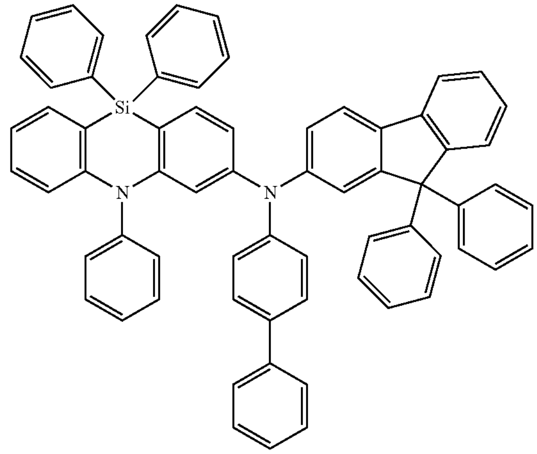
A34
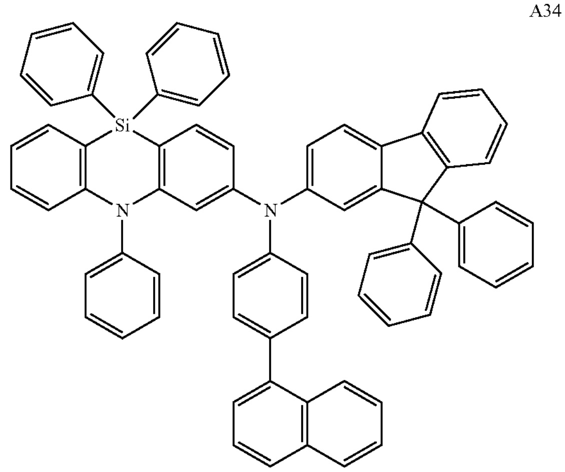
A35
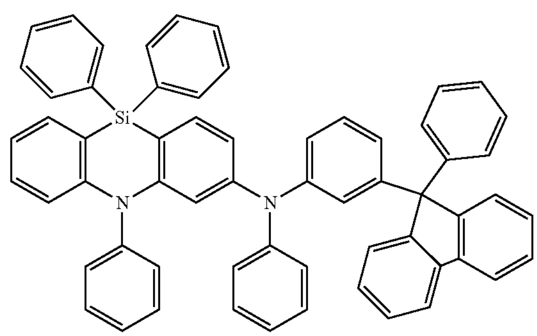

-continued
A36
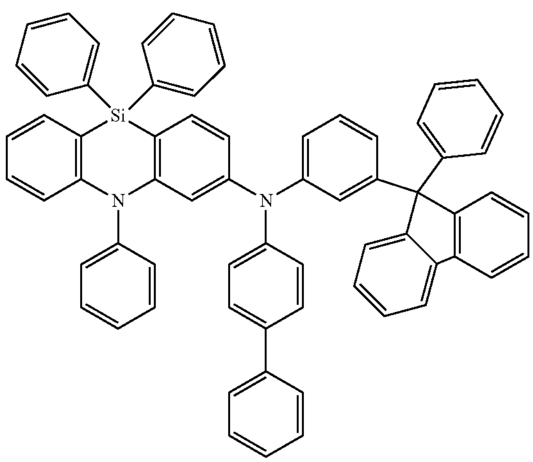
A37
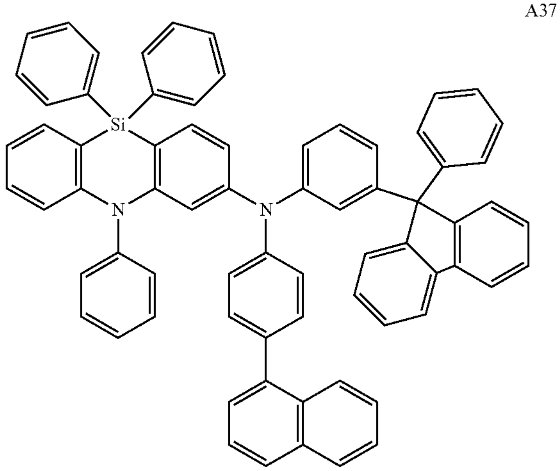
A38
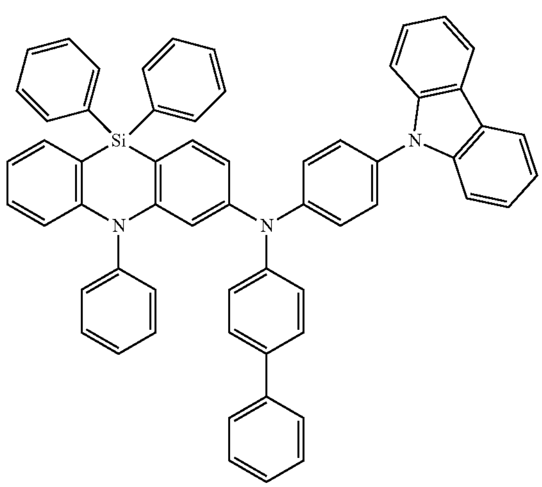
-continued
A39
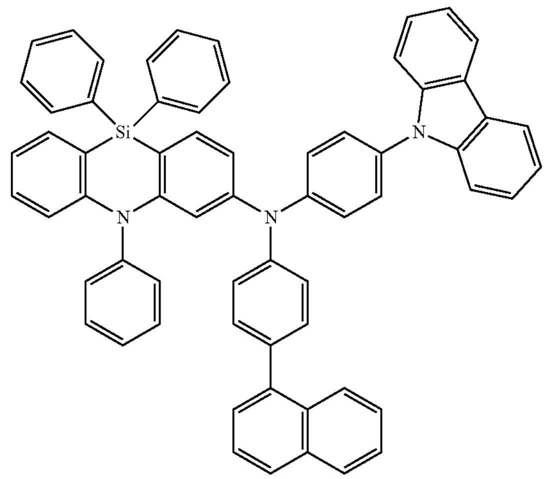
A40
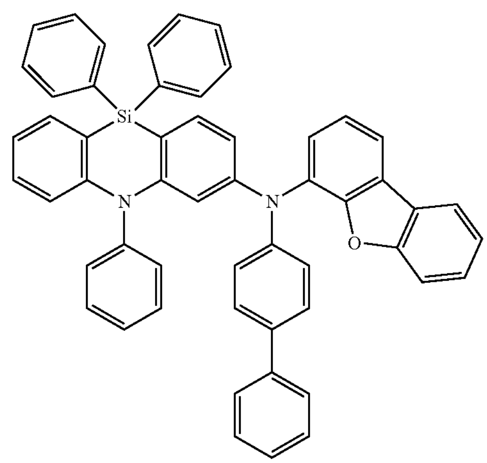
A41
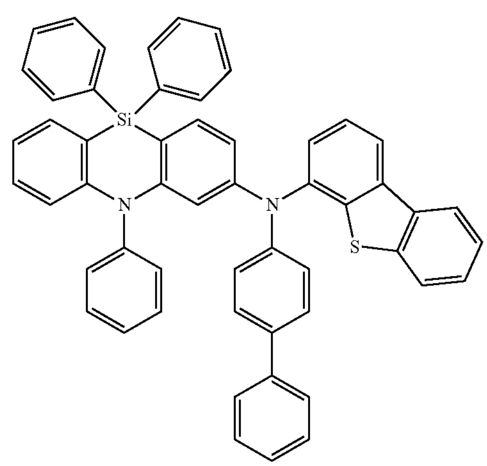

-continued
A42
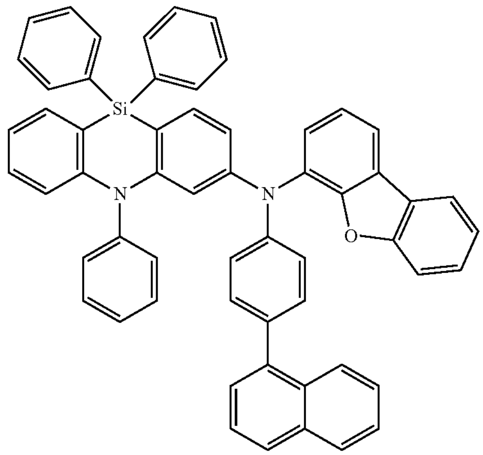
A43
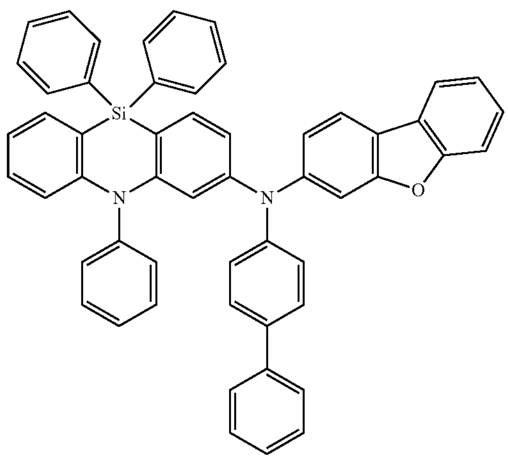
A44
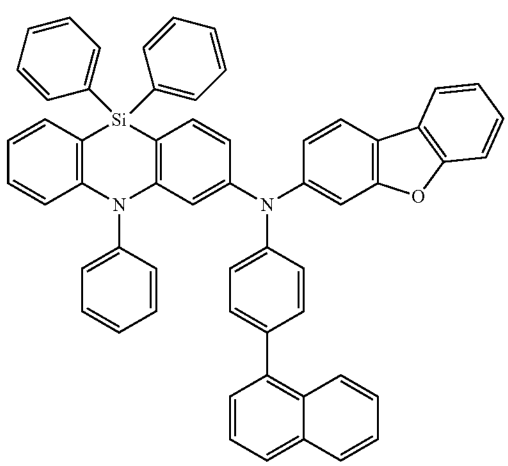
-continued
A45
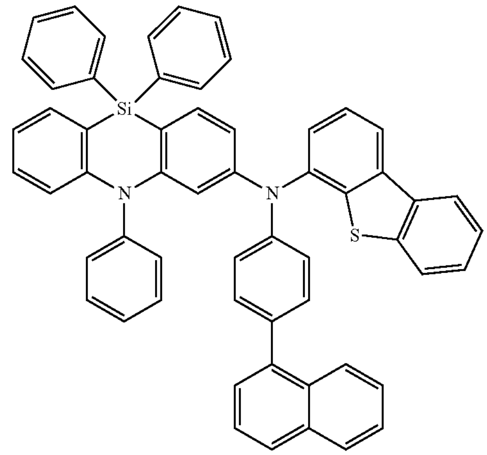
A46
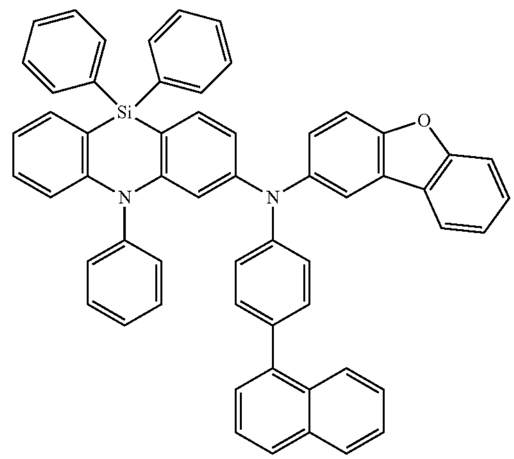
A47
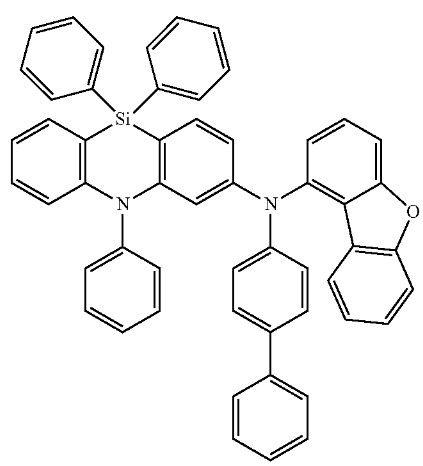

-continued
A48
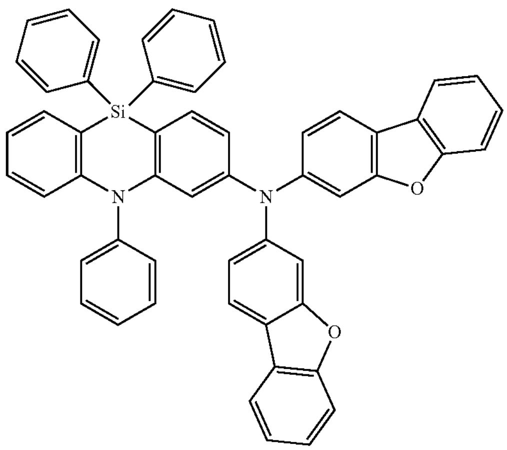
A49
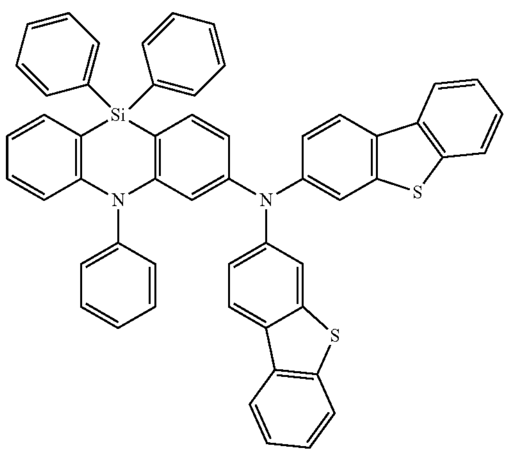
A50
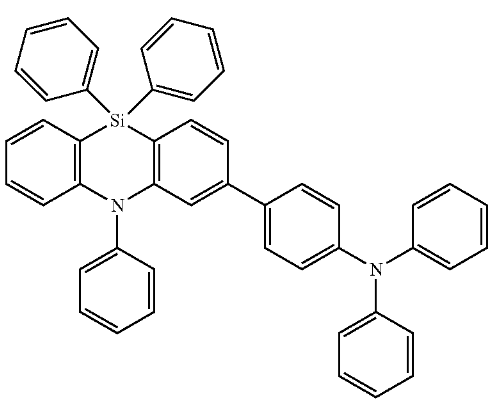
-continued
A51
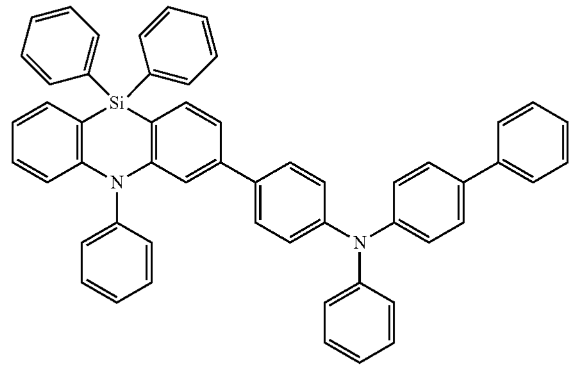
A52
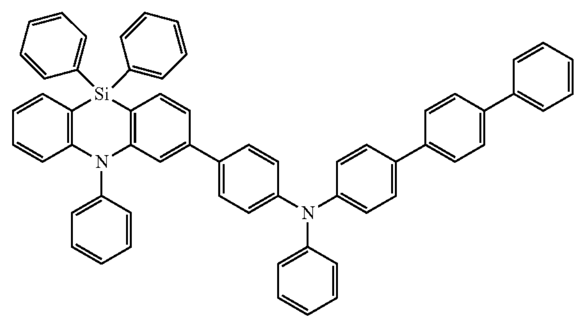
A53
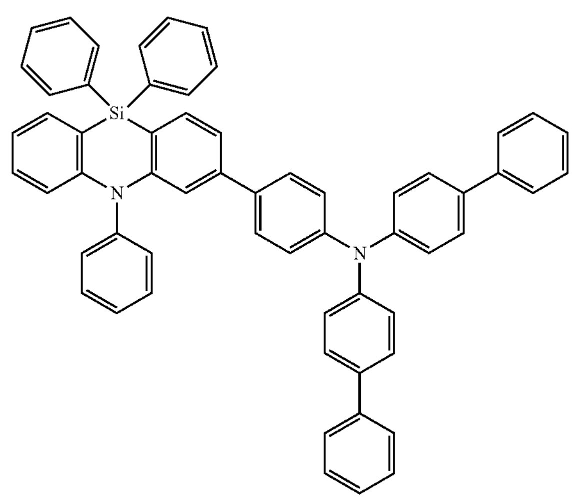

-continued
A54
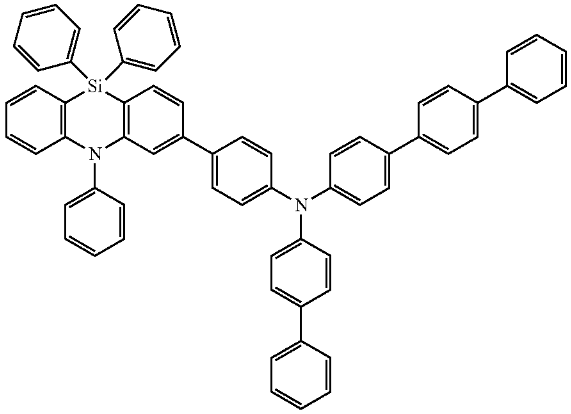
A55
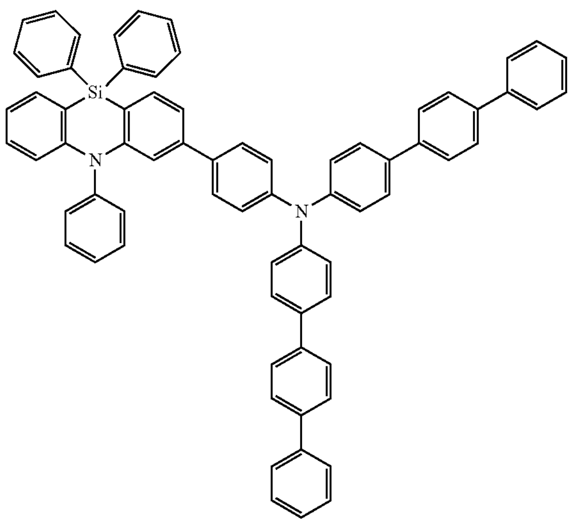
A56
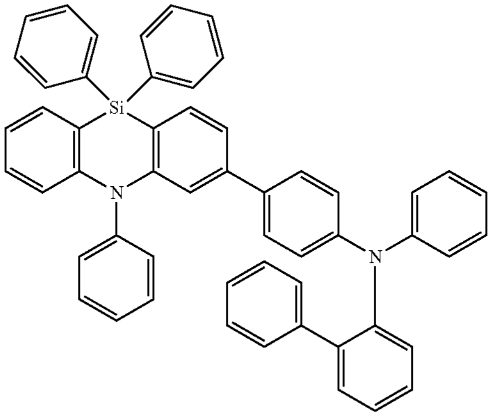
-continued
A57
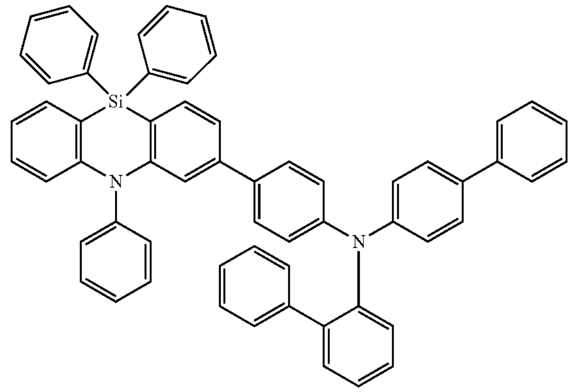
A58
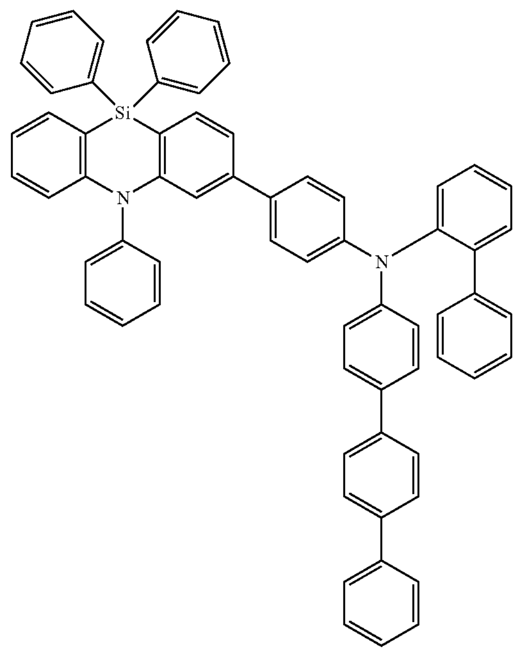
A59
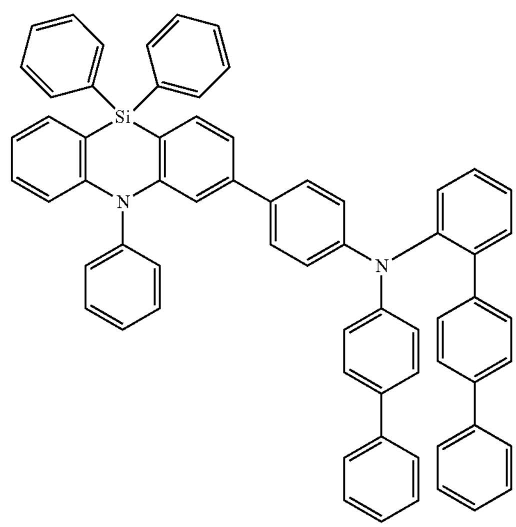

-continued
A60
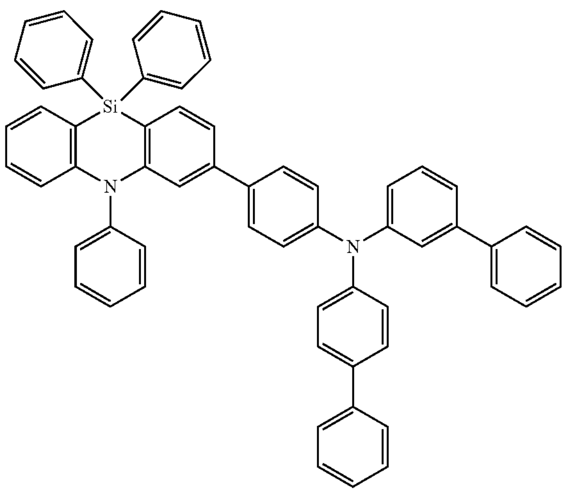
A61
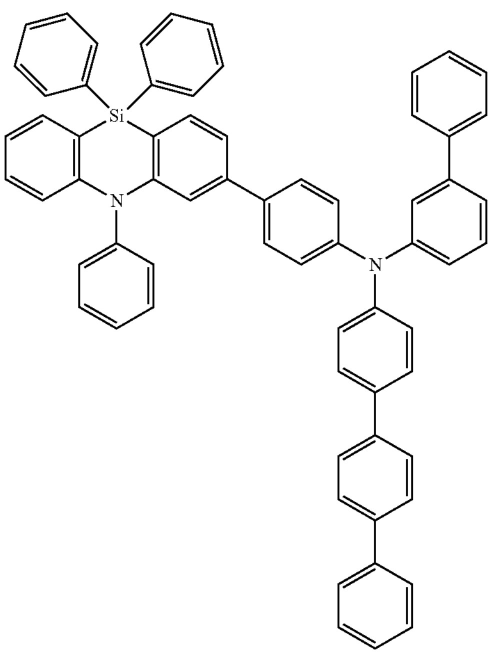
A62
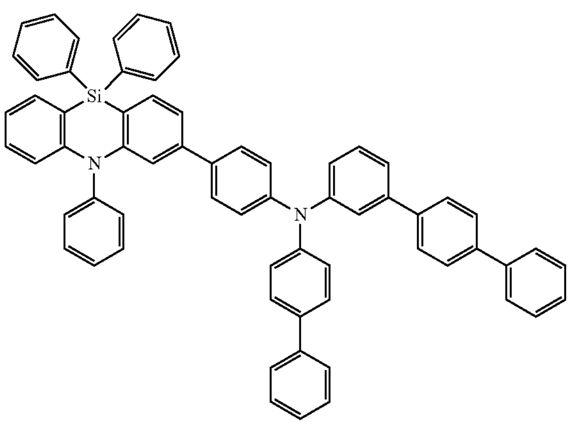
-continued
A63
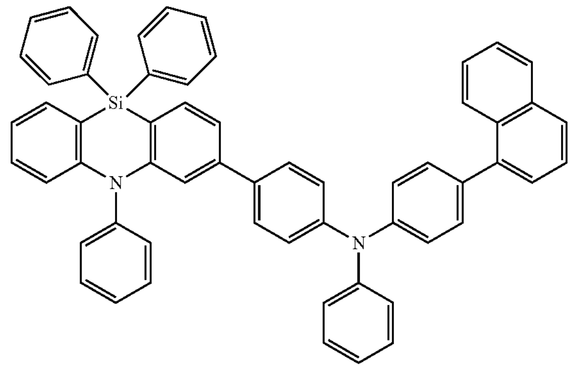
A64
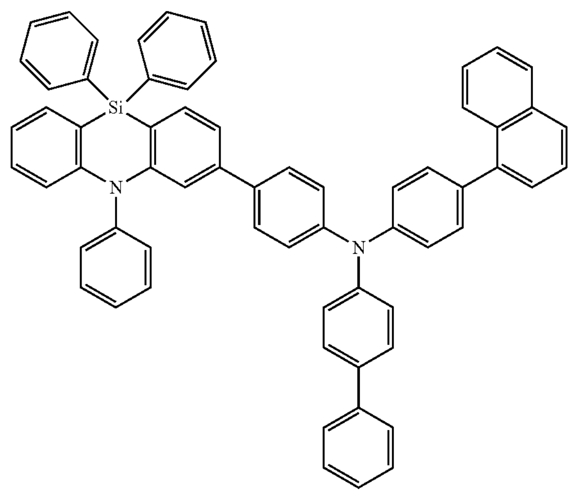
A65
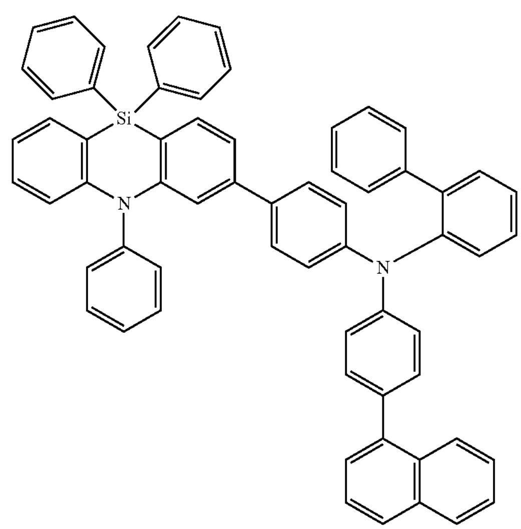

-continued
A66
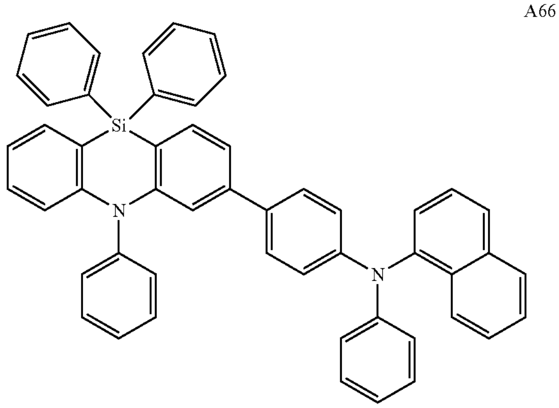
A67
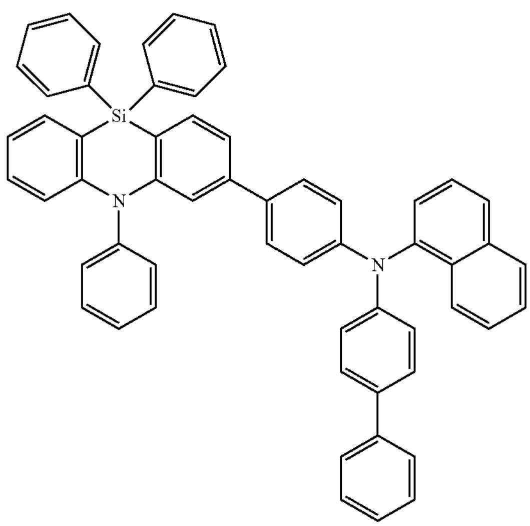
A68
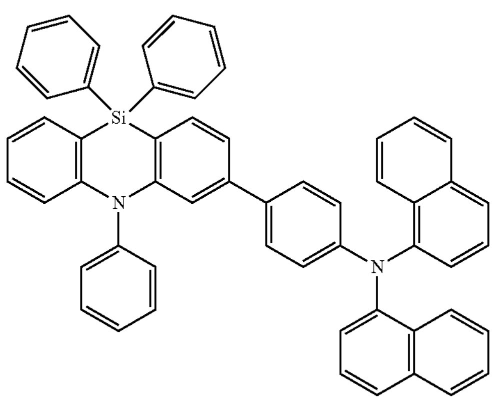
-continued
A69
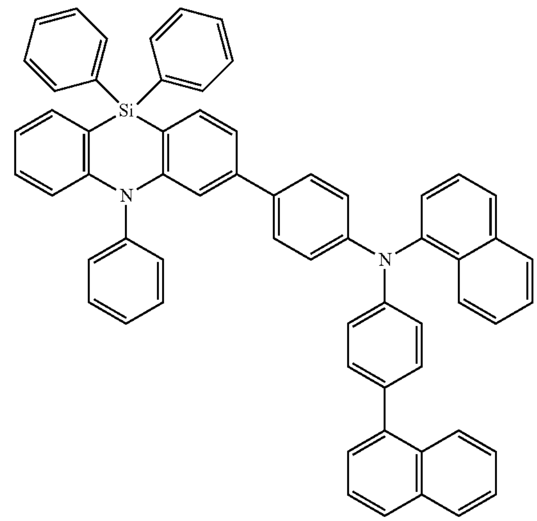
A70
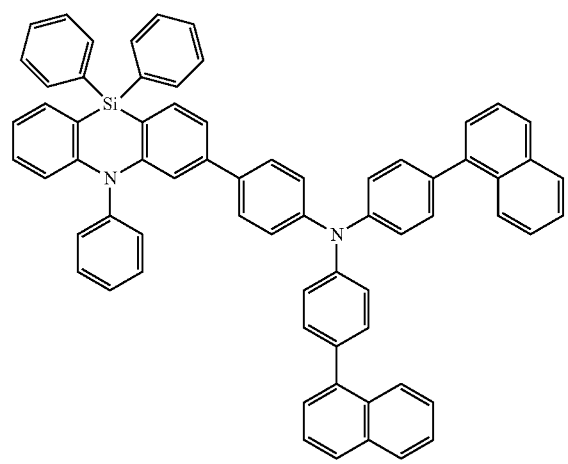
A71
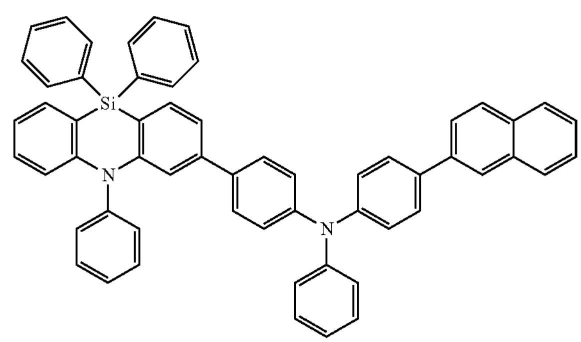

-continued
A72
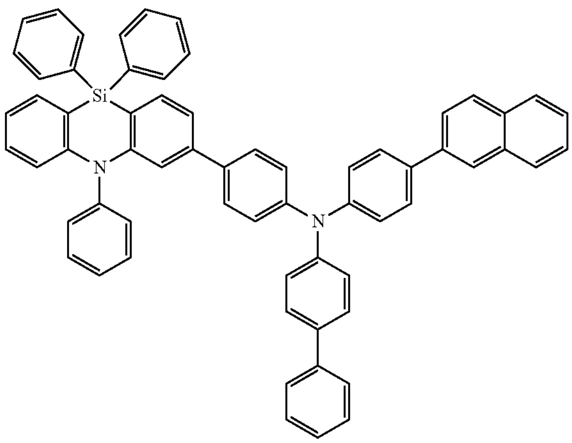
A73
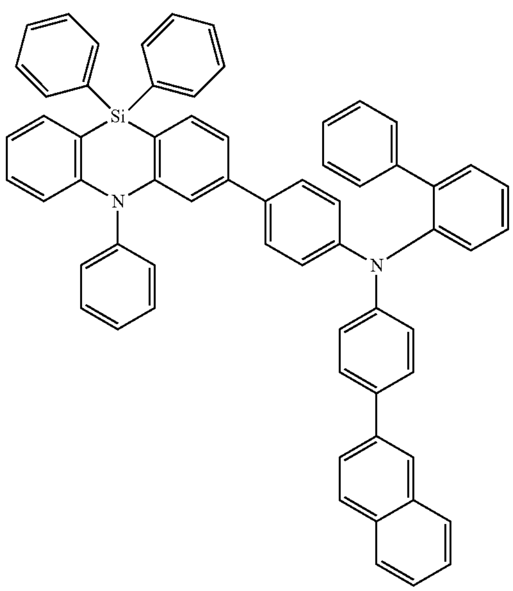
A74
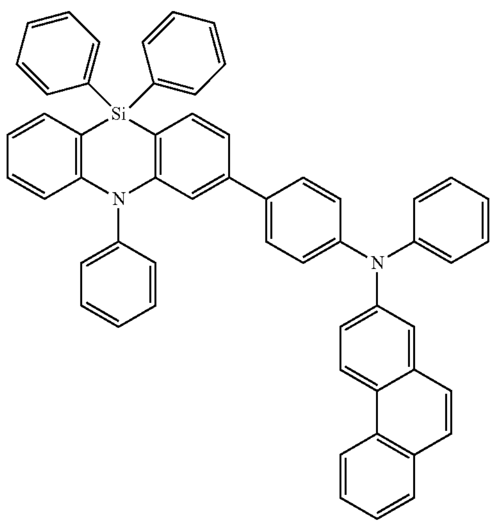
-continued
A75
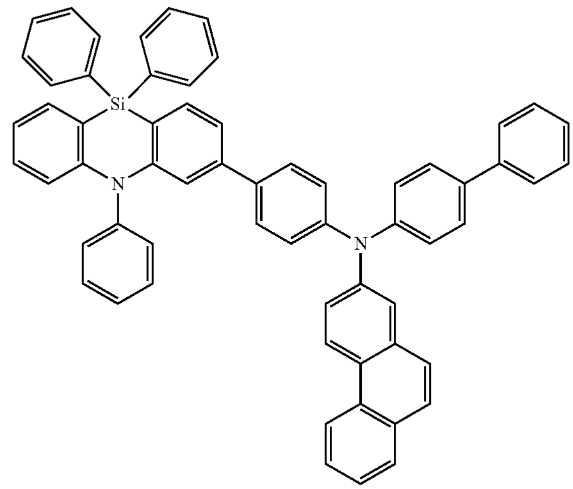
A76
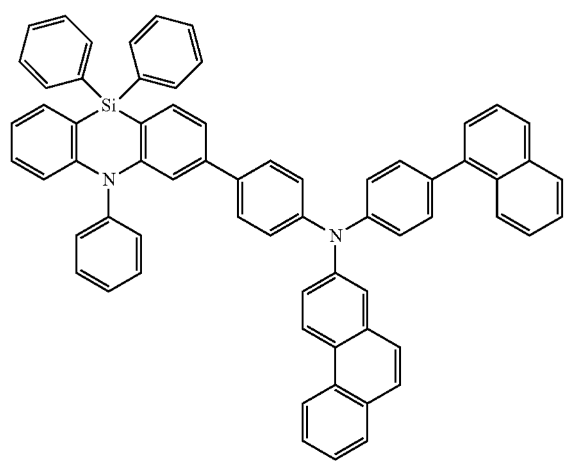
A77
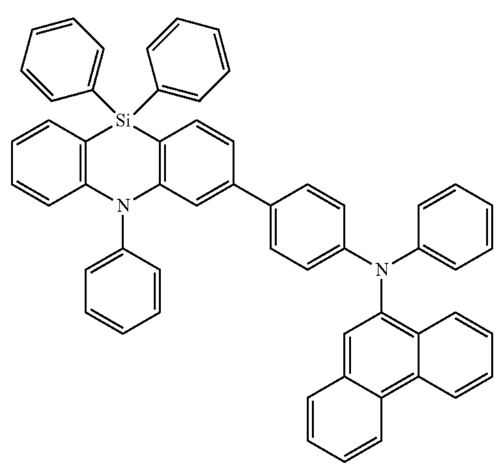

-continued
A78
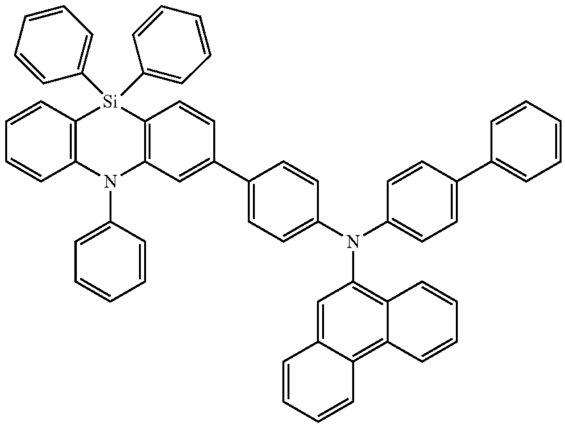
A79
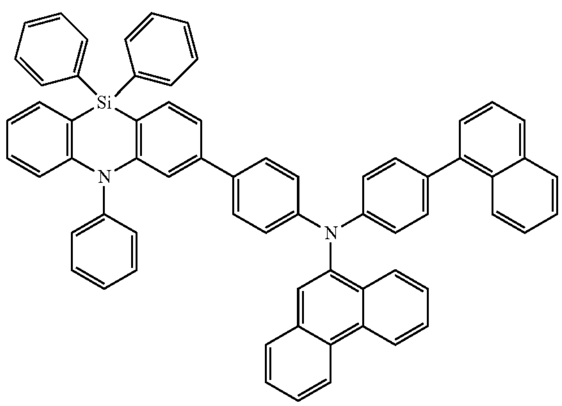
A80
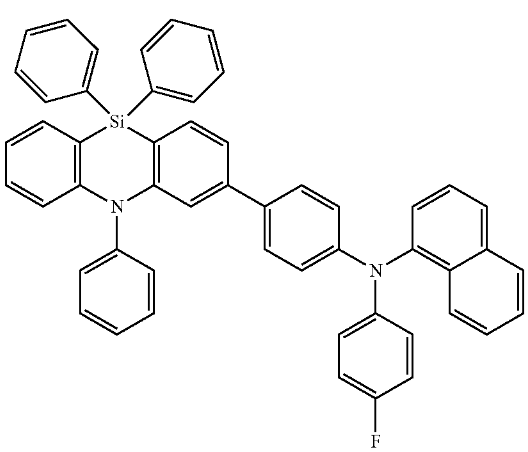
-continued
A81
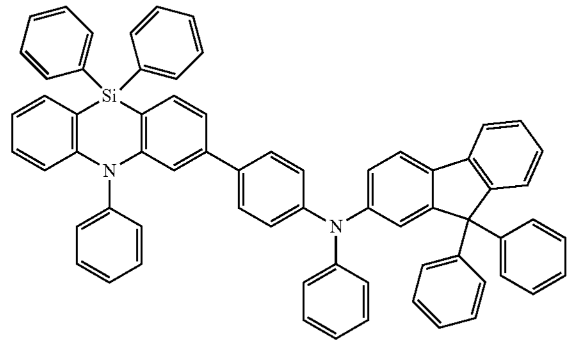
A82
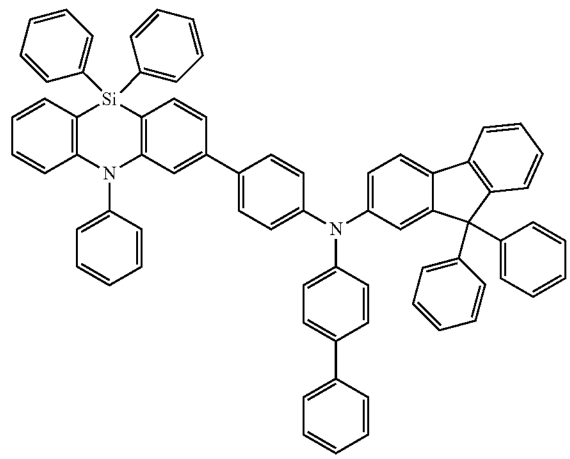
A83
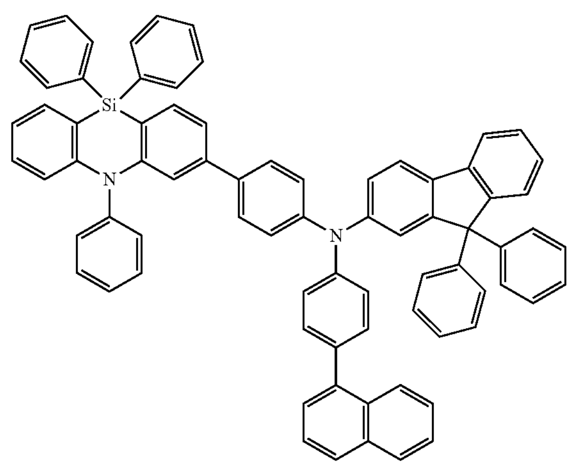

A84
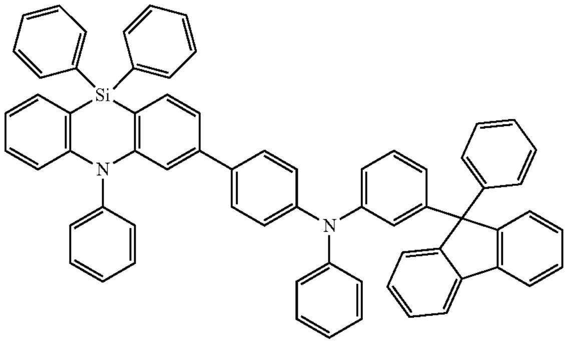
A85
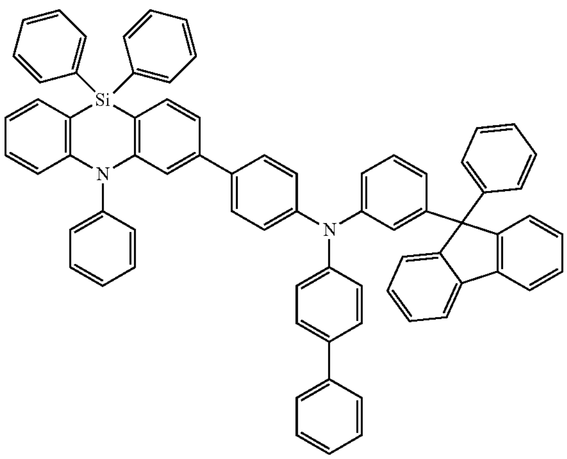
A86
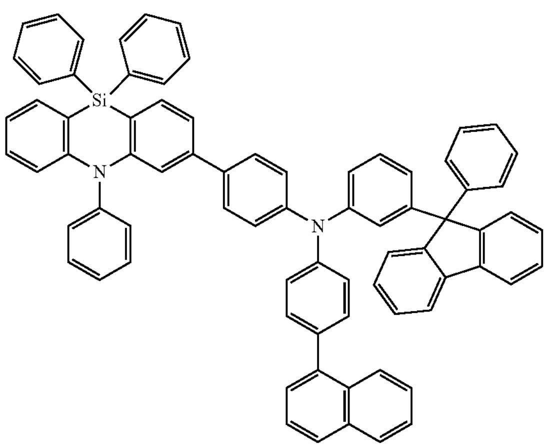
A87
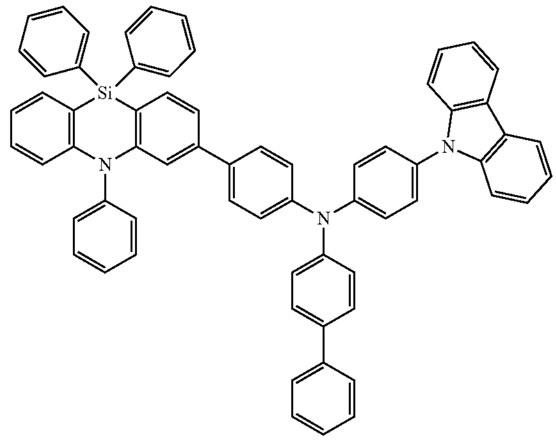
A88
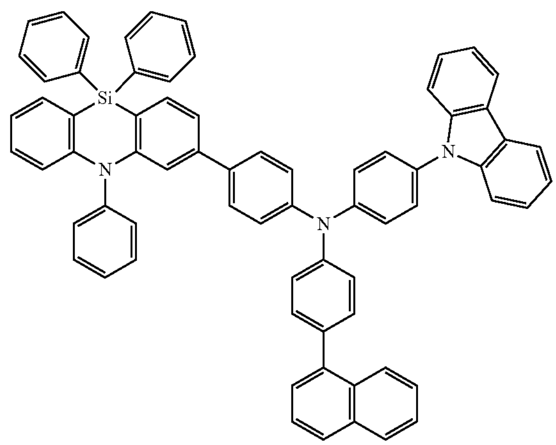
A89
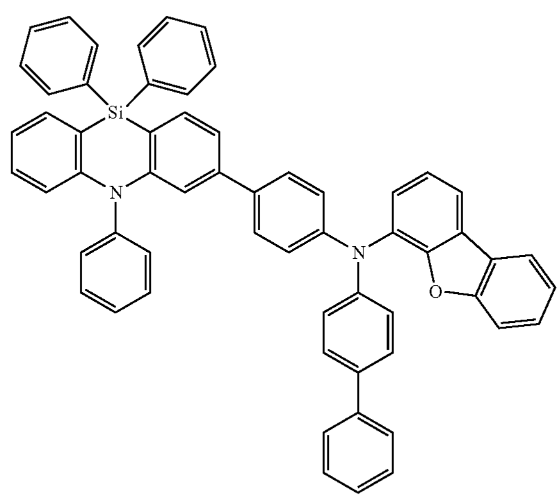

A90
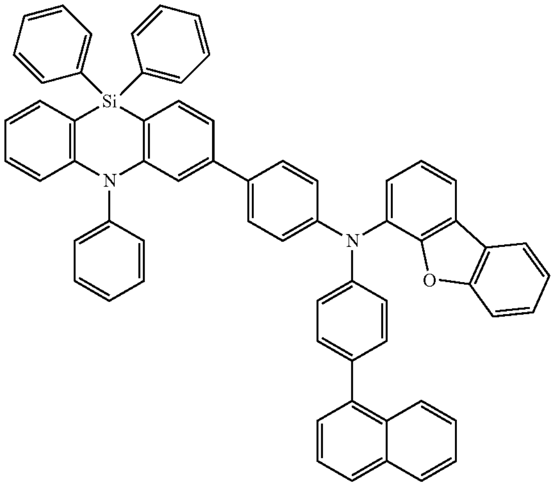
A91
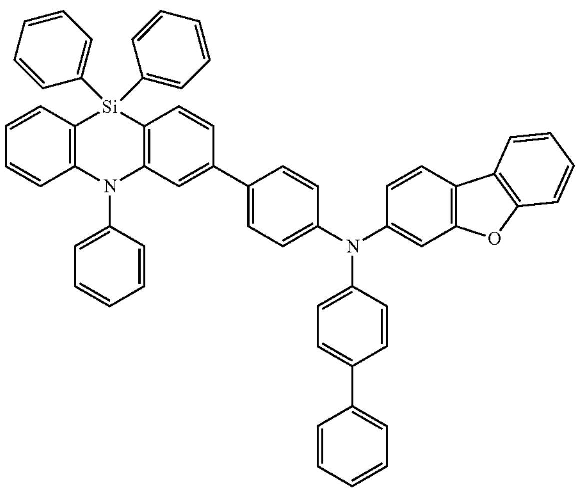
A92
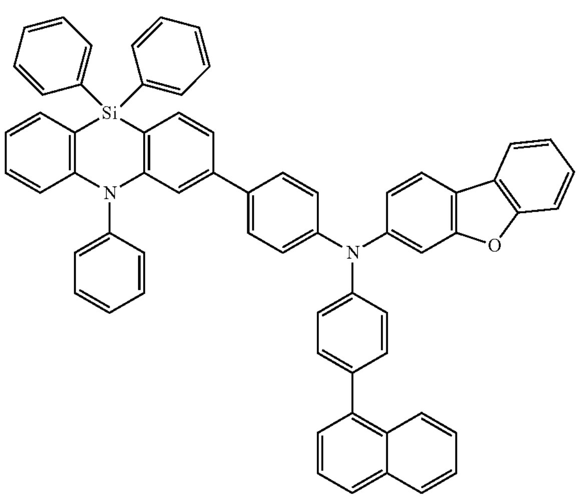
A93
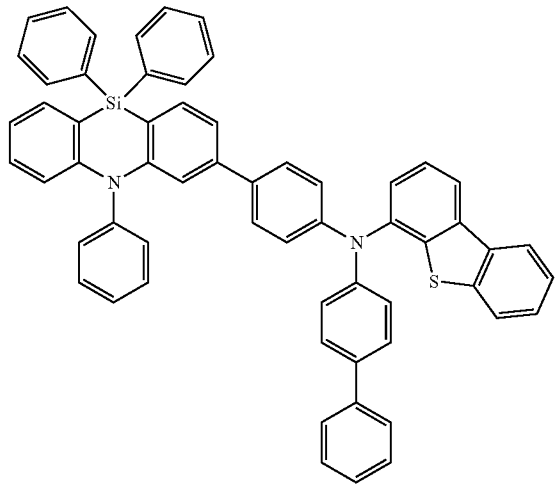
A94
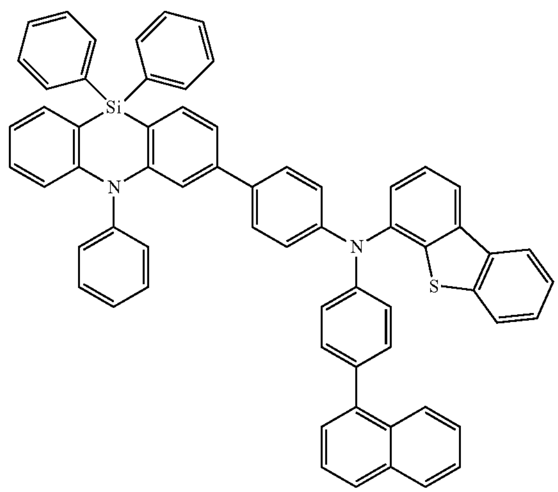
A95
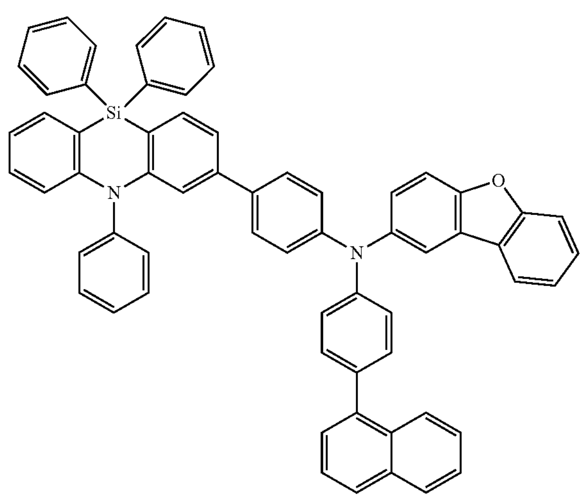

-continued
A96
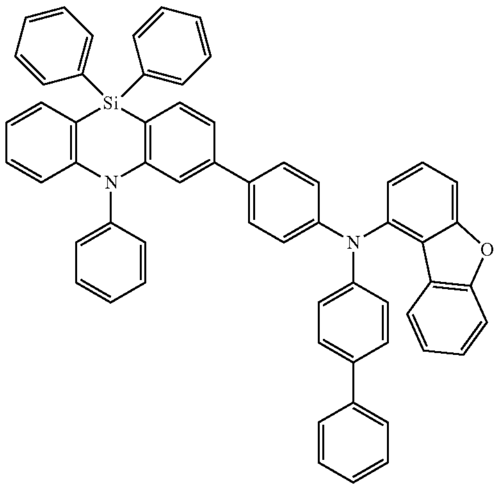
A97
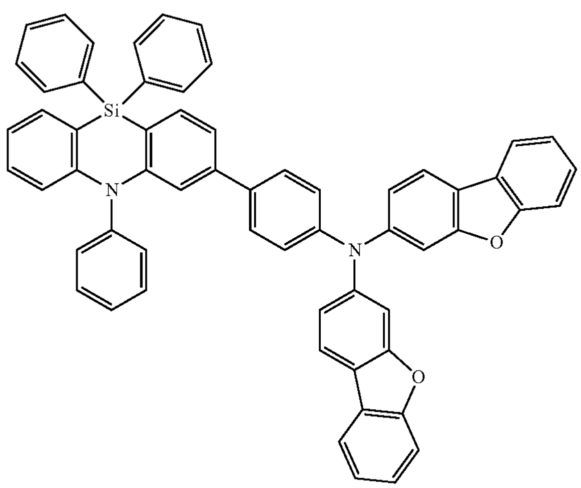
A98
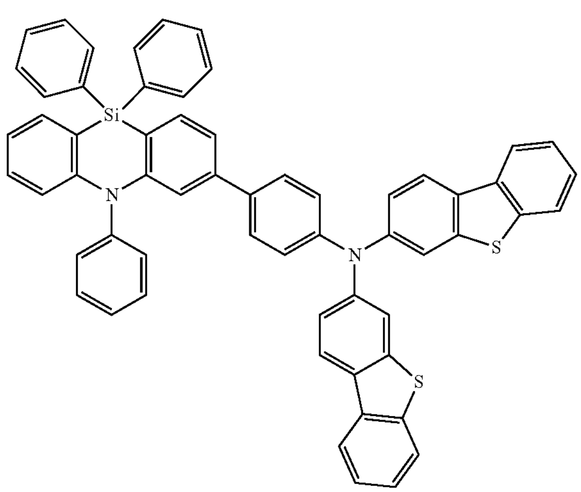
-continued
A99
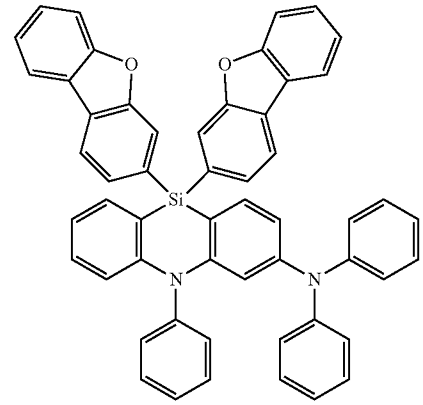
A100
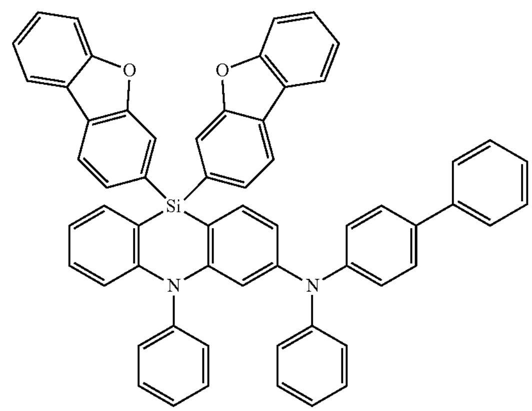
A101
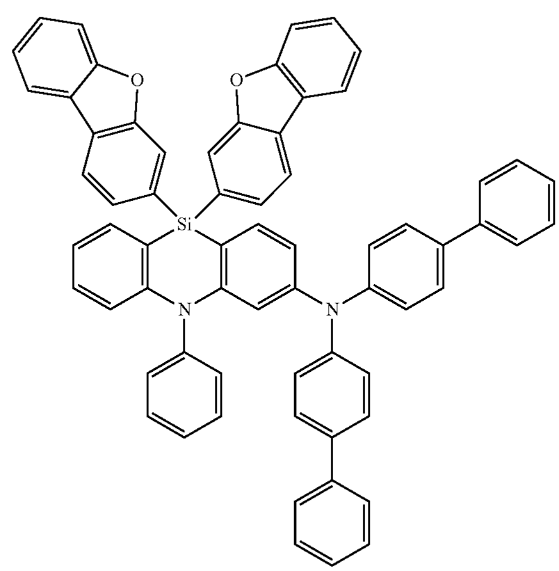

A102
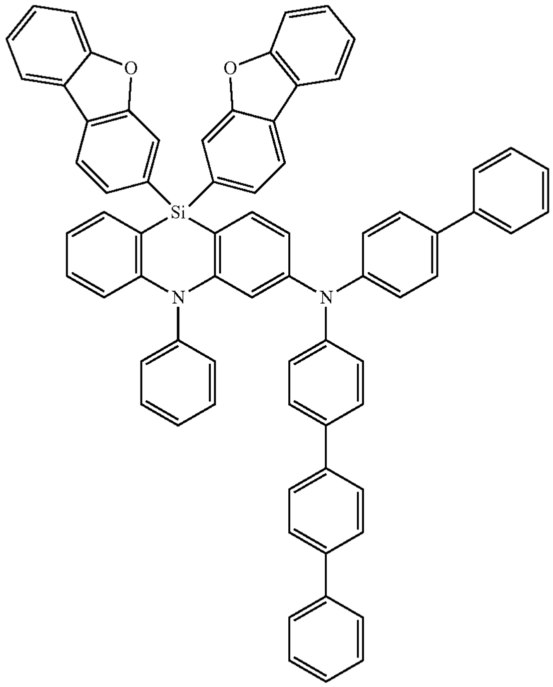
A103
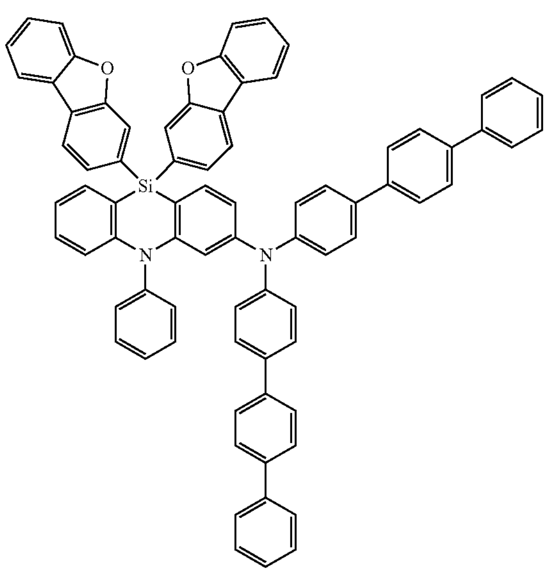
A104
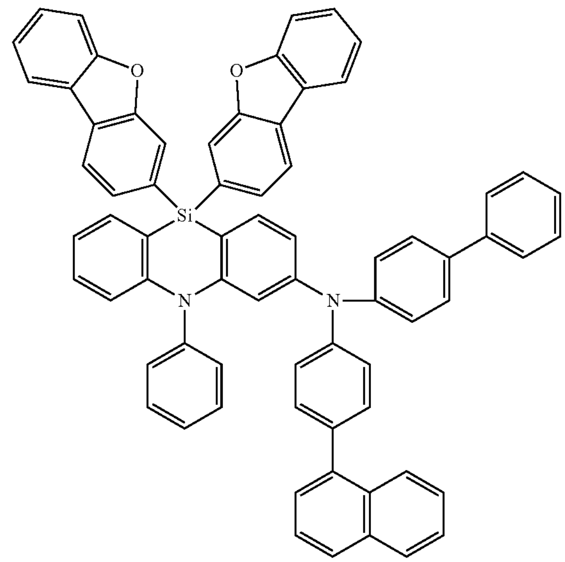
A105
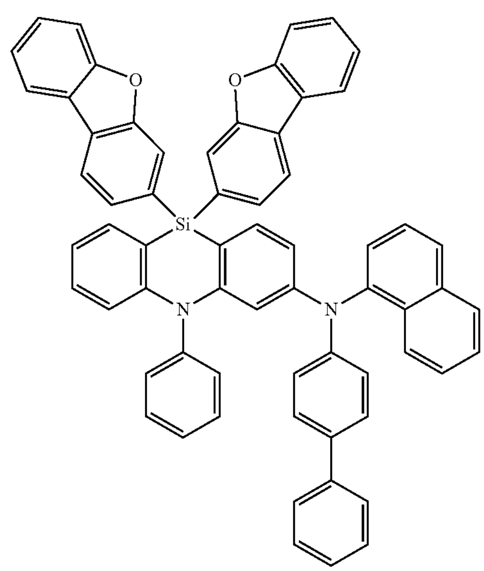

-continued
A106
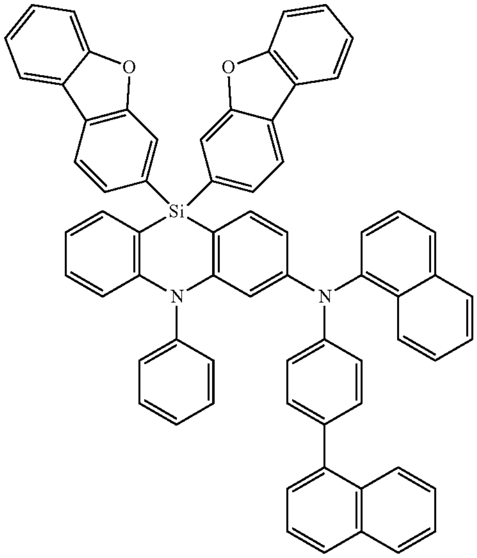
A107
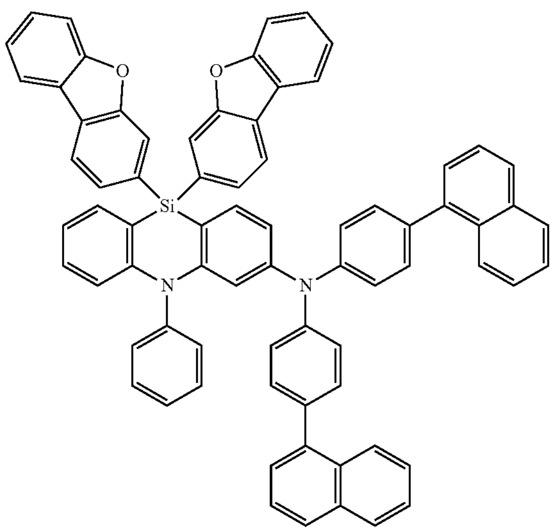
A108
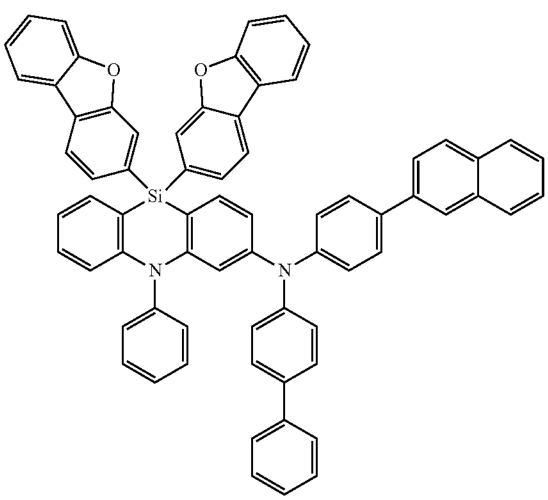
-continued
A109
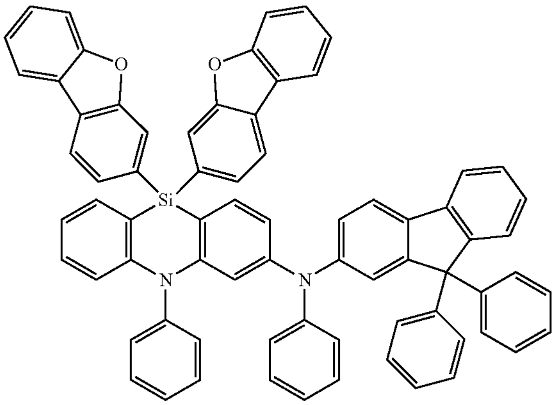
A110
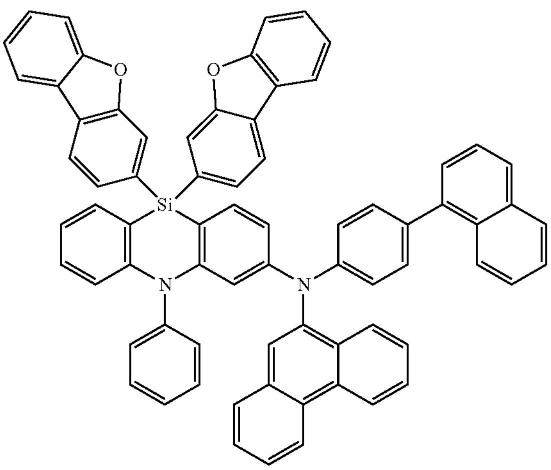
A111
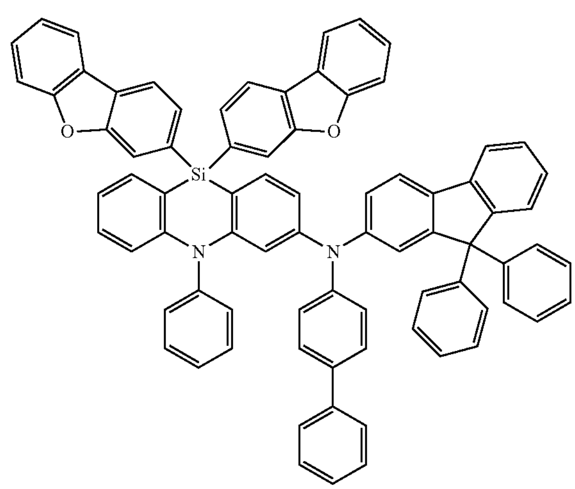

-continued
A112
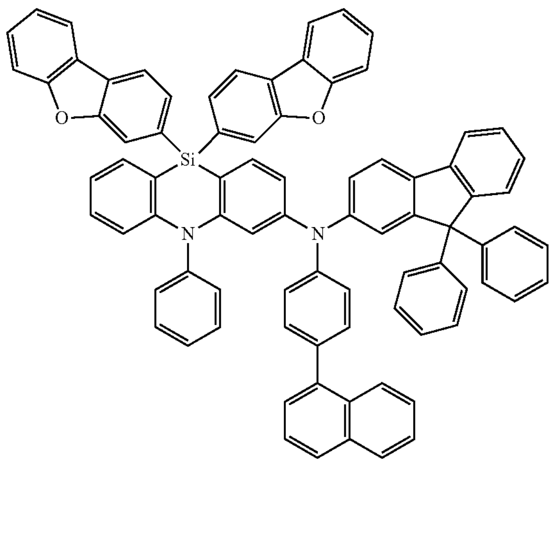
A113
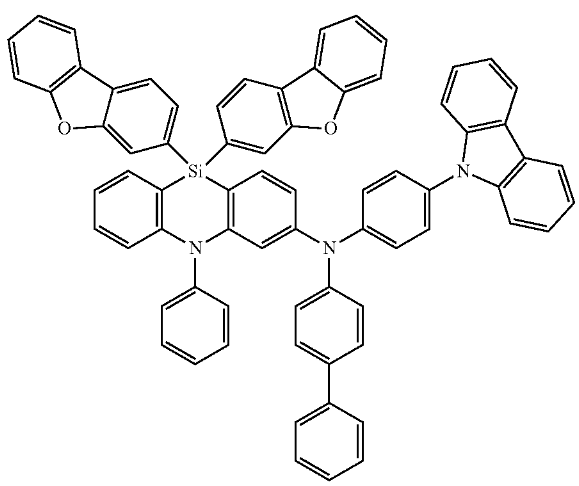
A114
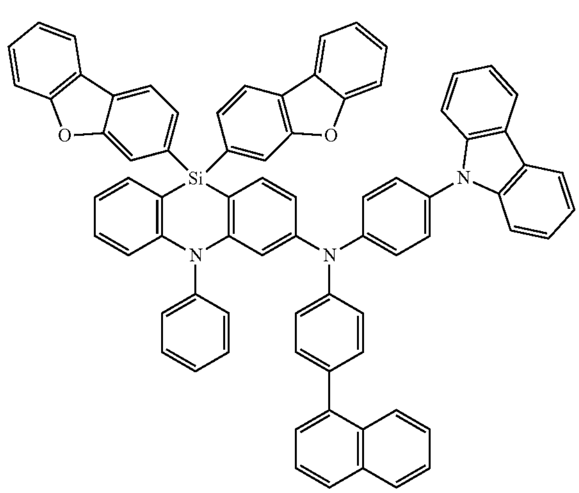
-continued
A115
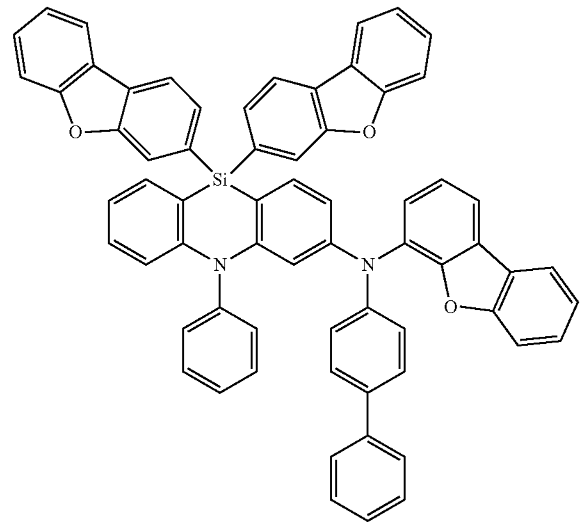
A116
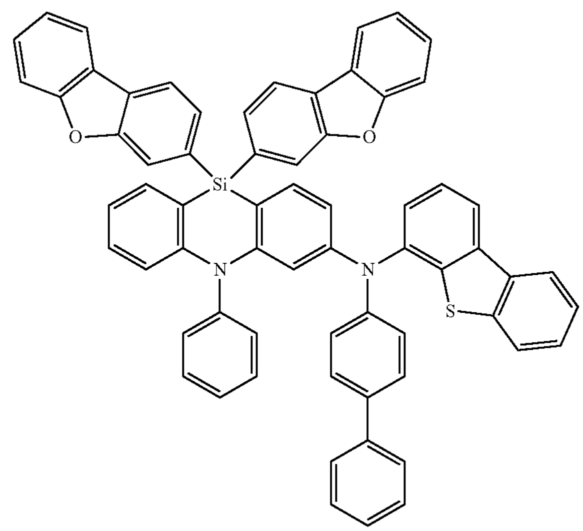
A117
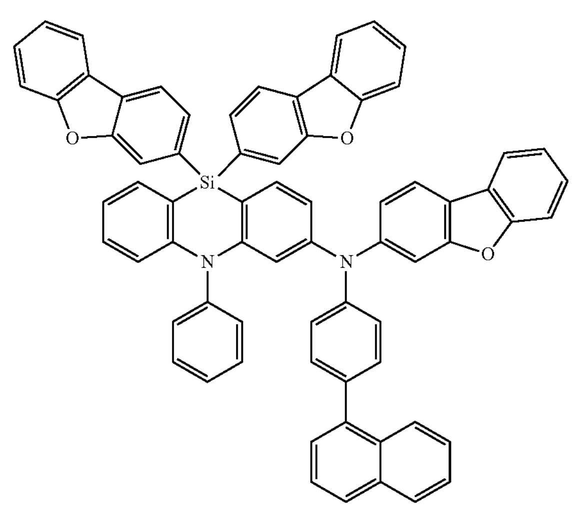

-continued
A118
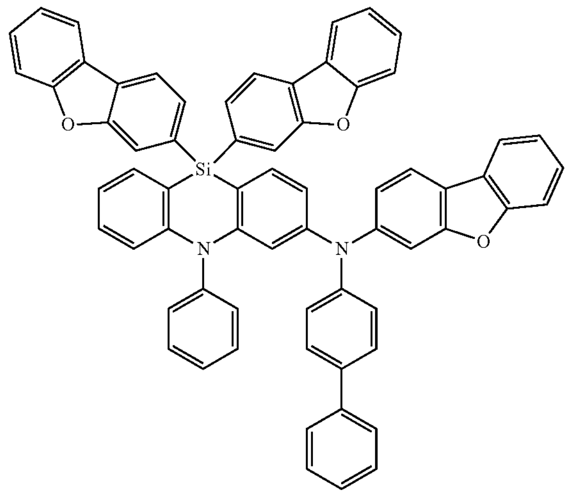
A119
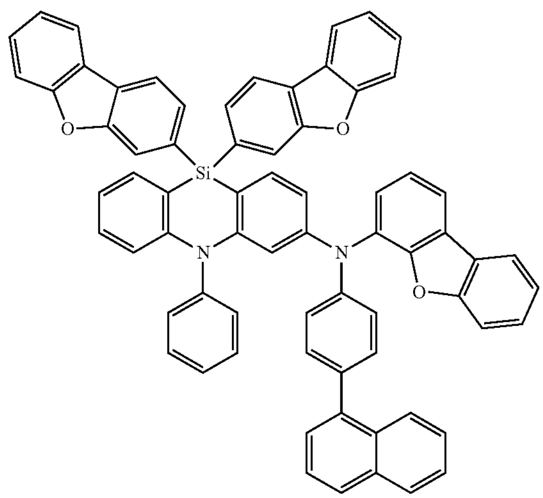
A120
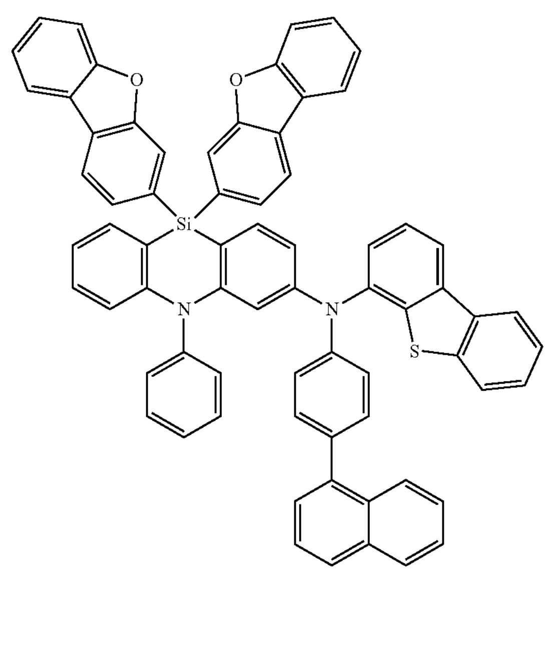
-continued
A121
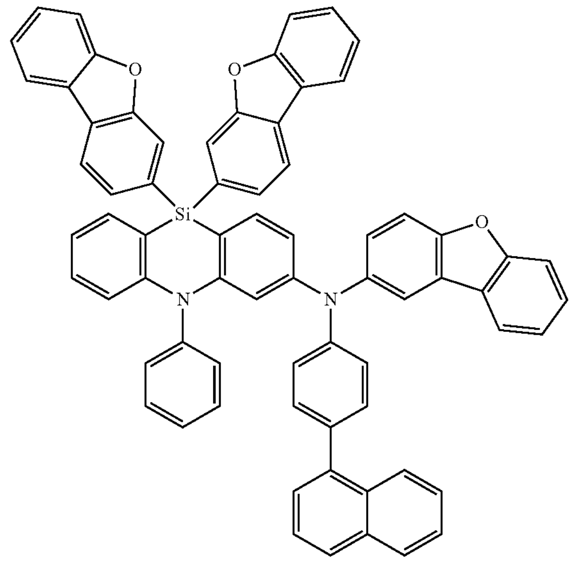
A122
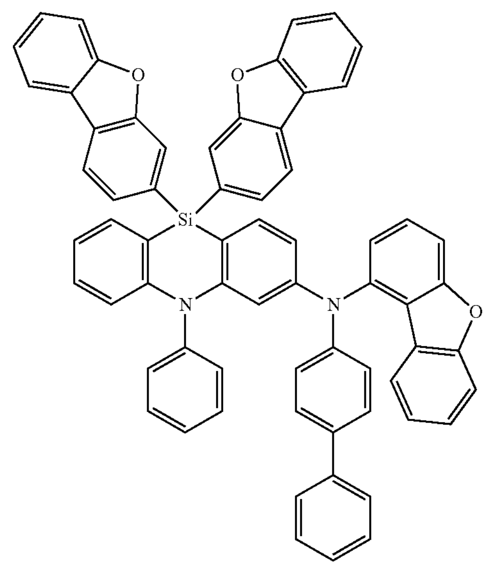
A123
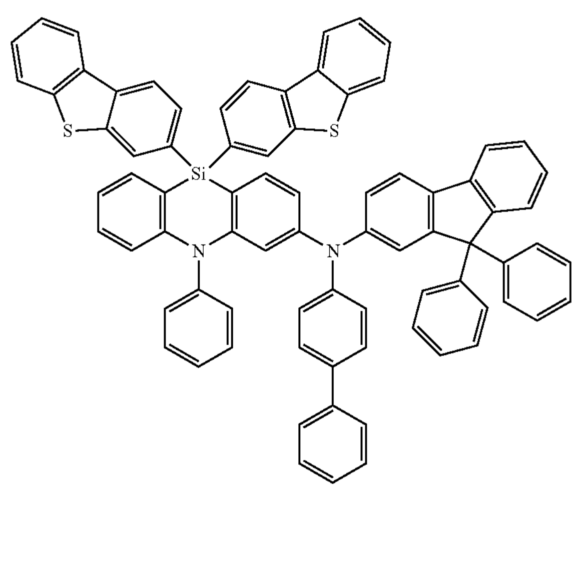

-continued
A124
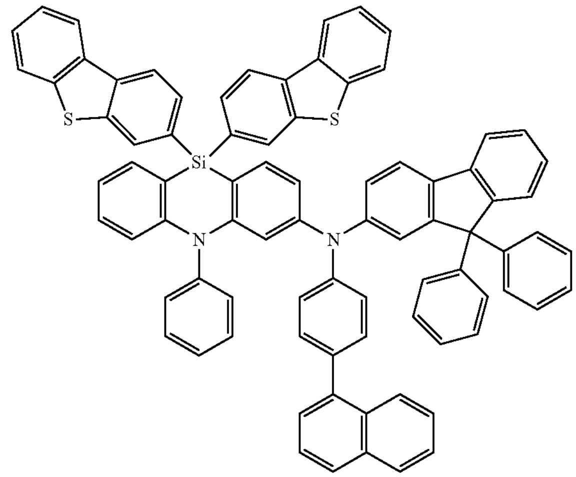
A125
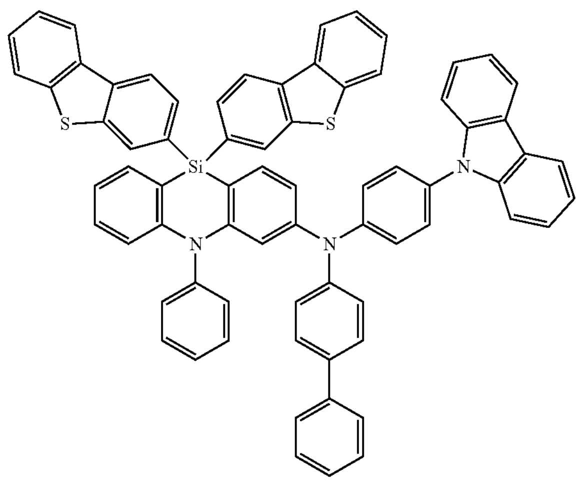
A126
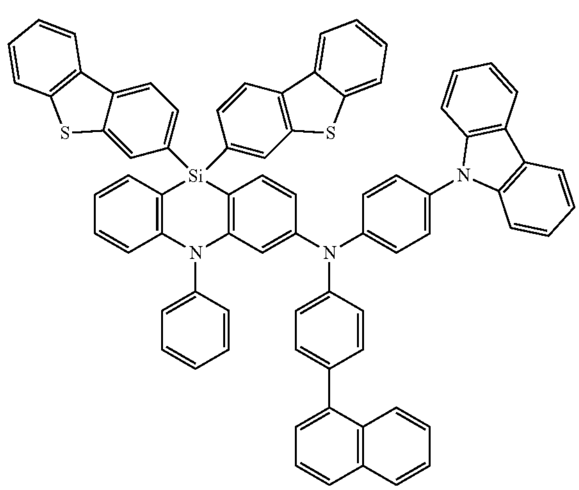
-continued
A127
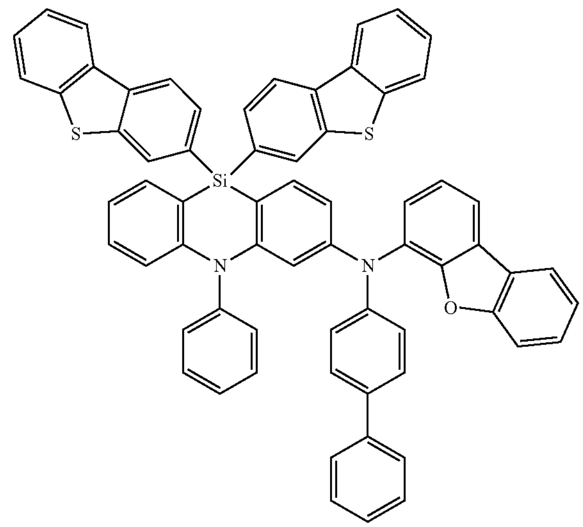
A128
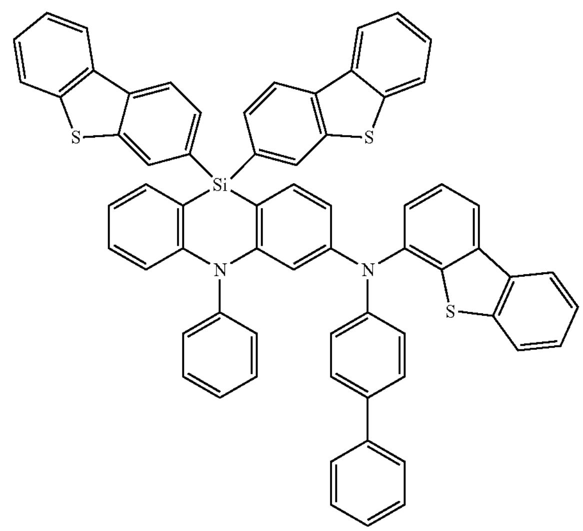
A129
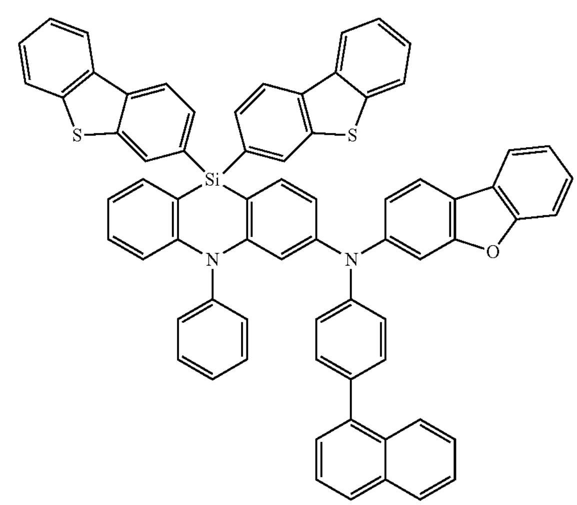

-continued
A130
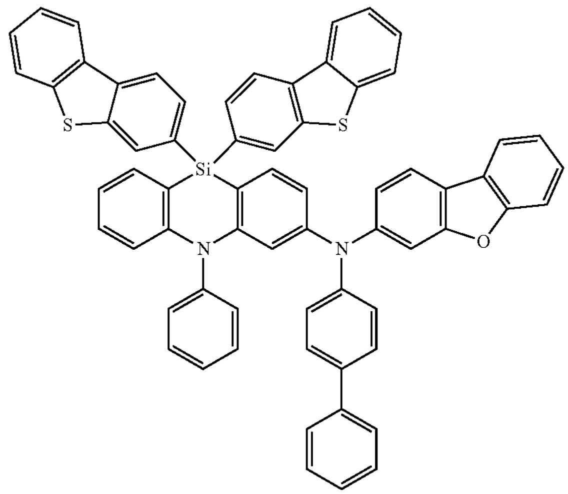
A131
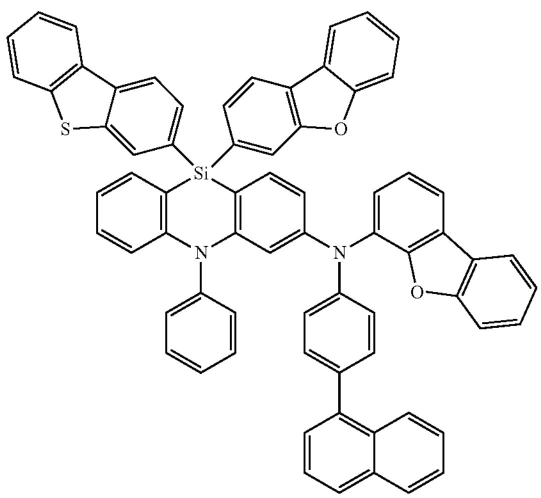
A132
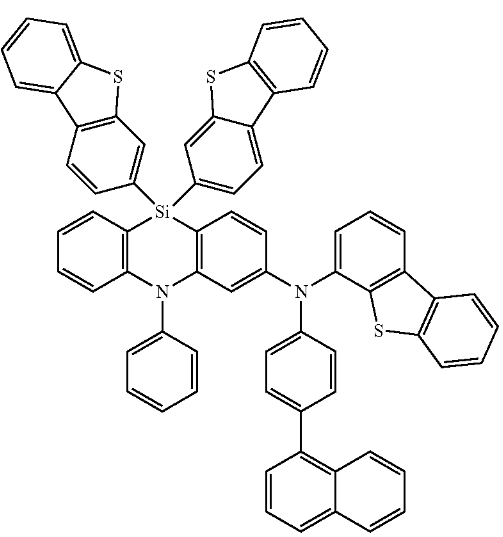
-continued
A133
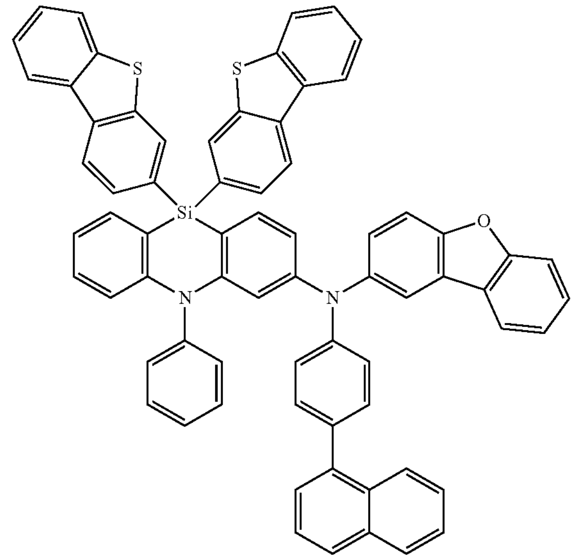
A134
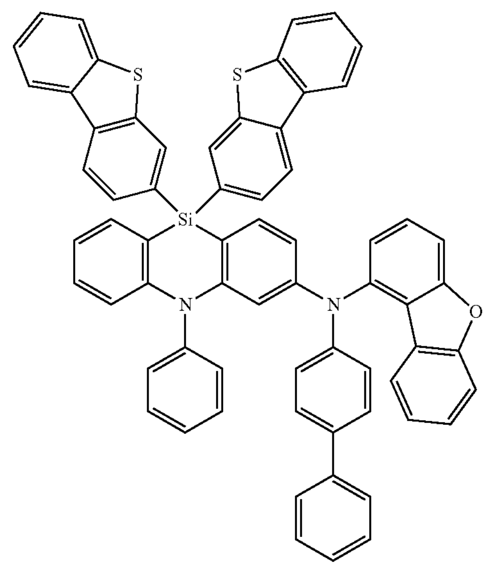
A135
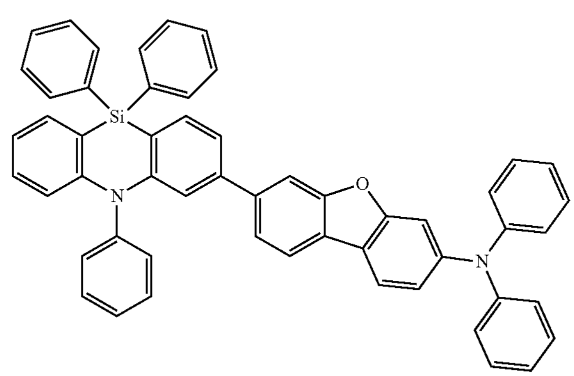

-continued
A136
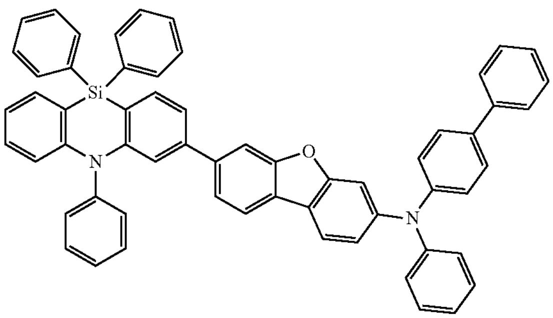
A137
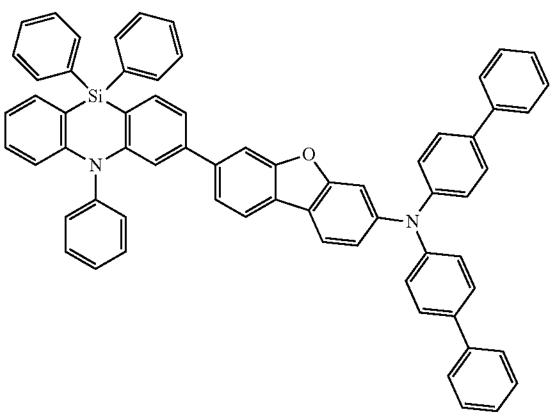
A138
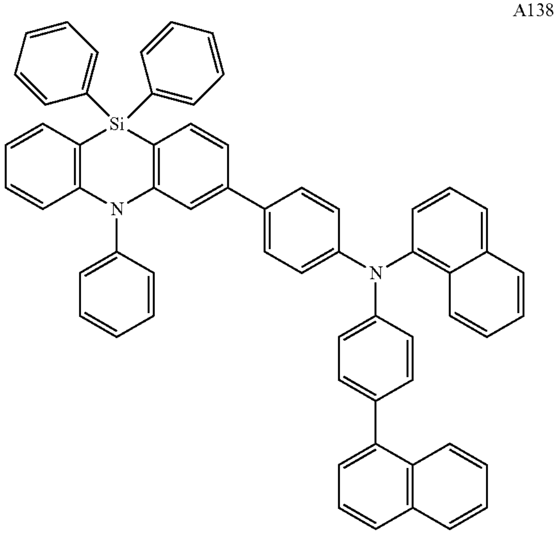
-continued
A139
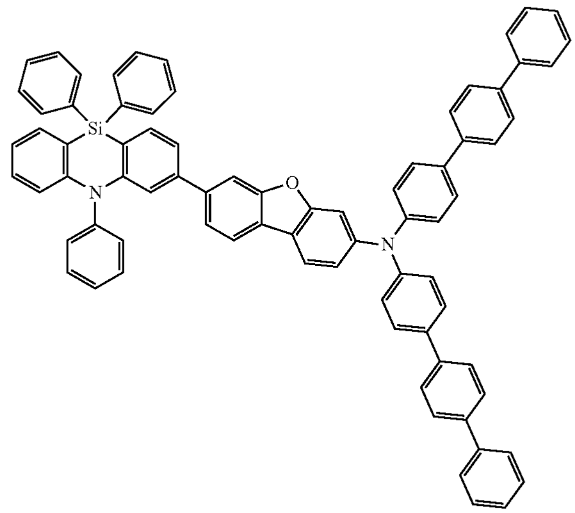
A140
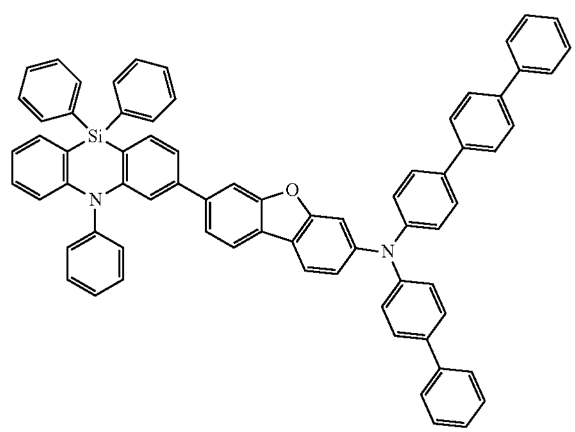
A141
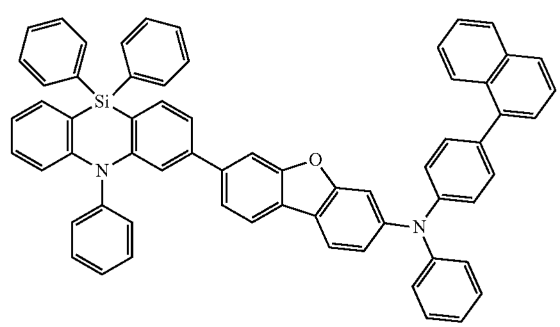

-continued
A142
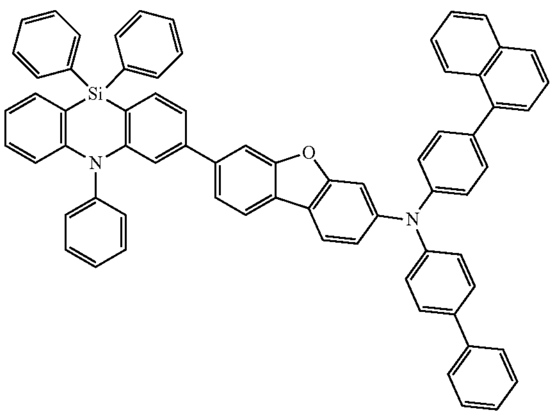
A143
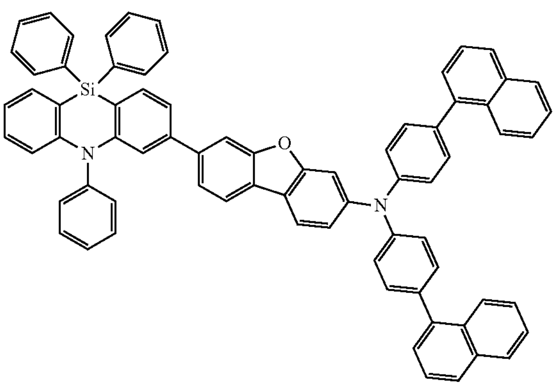
A144
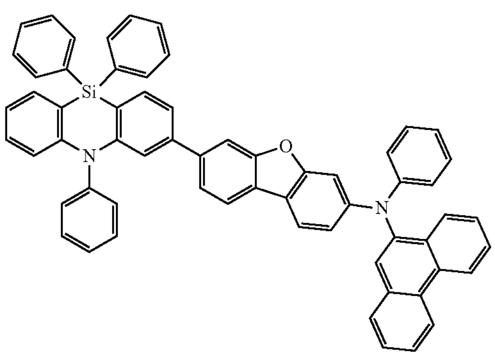
A145
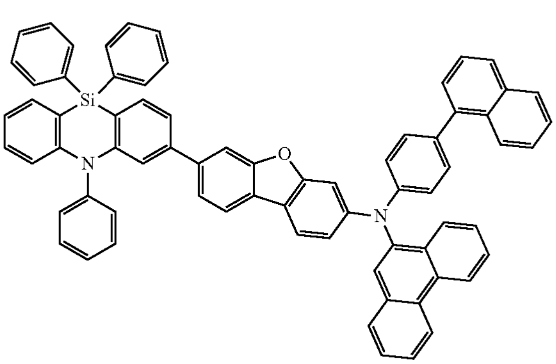
-continued
A146
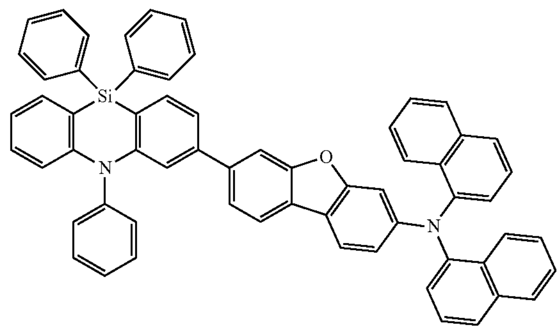
A147
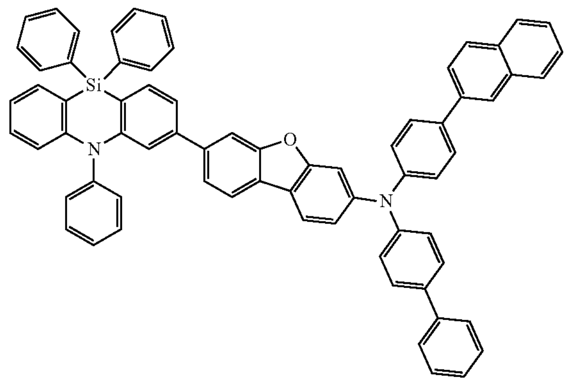
A148
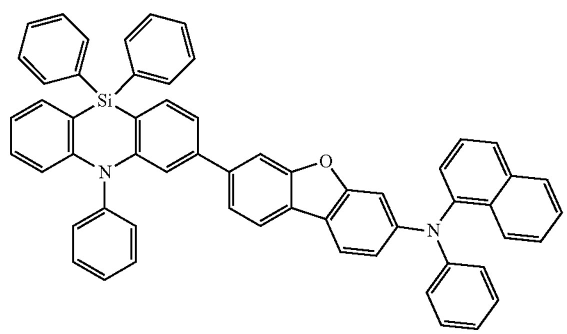
A149
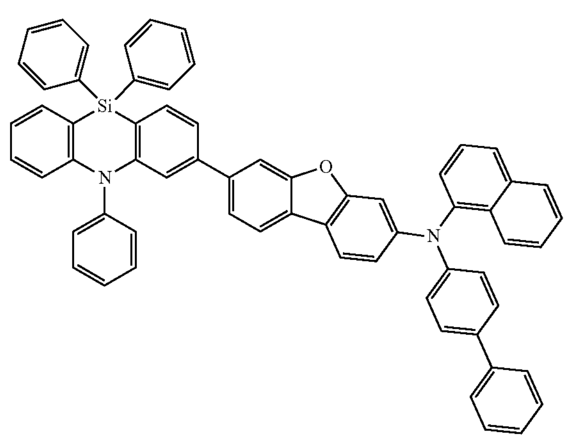

-continued
A150
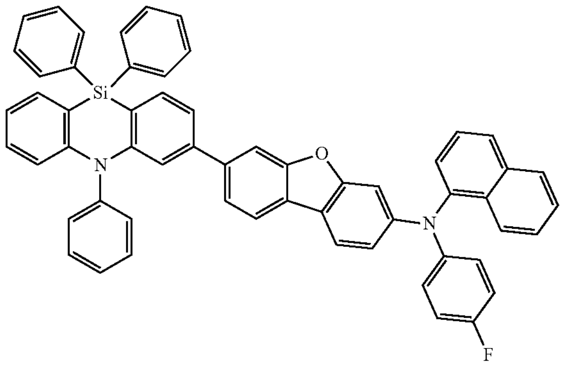
A151
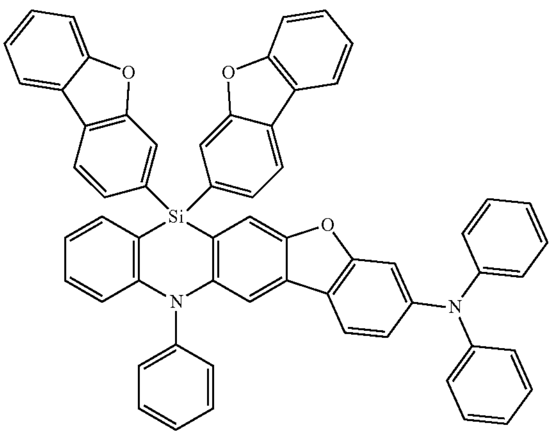
A152
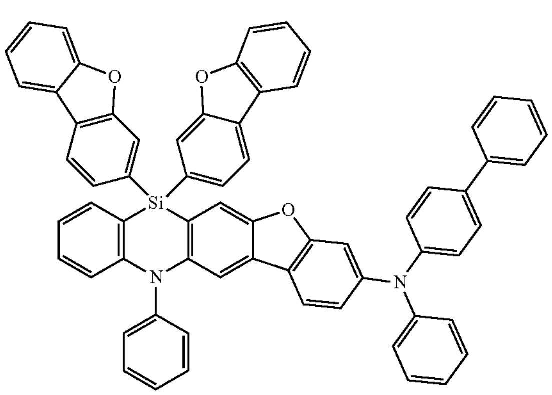
-continued
A153
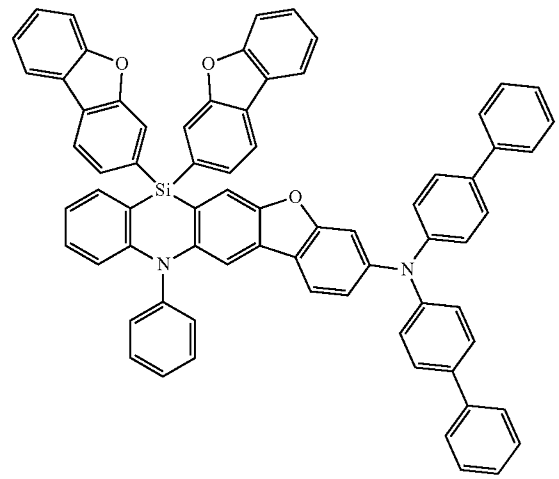
A154
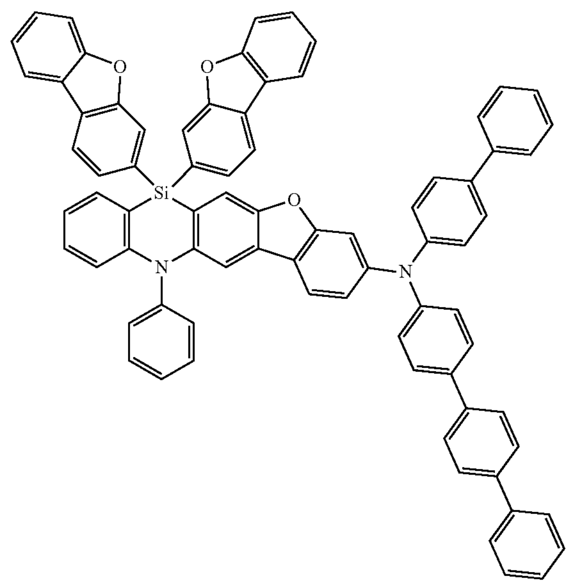
A155
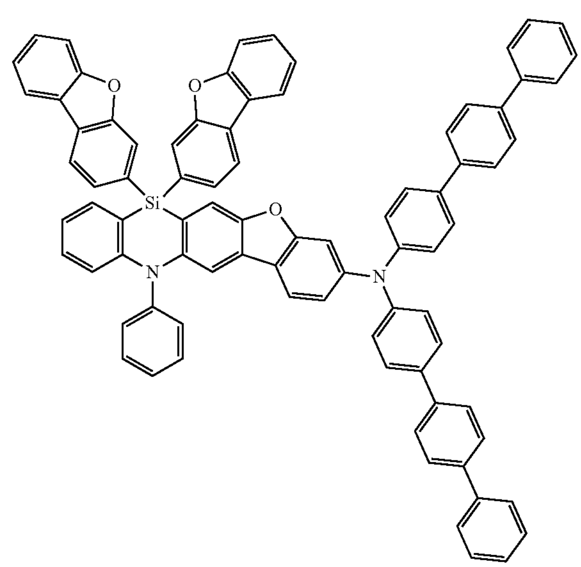

-continued
A156
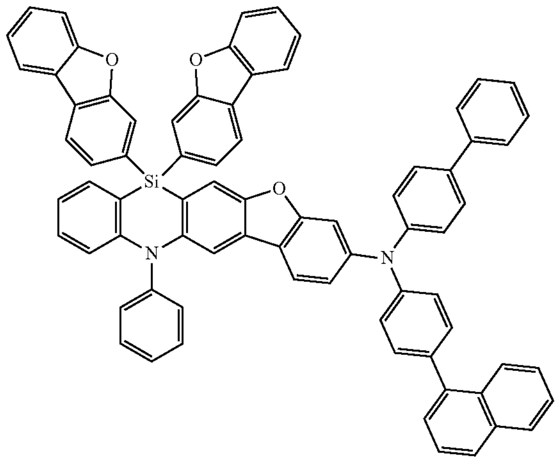
A157
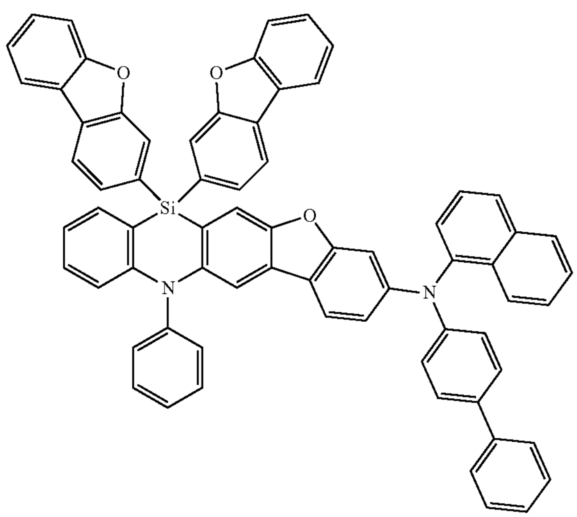
A158
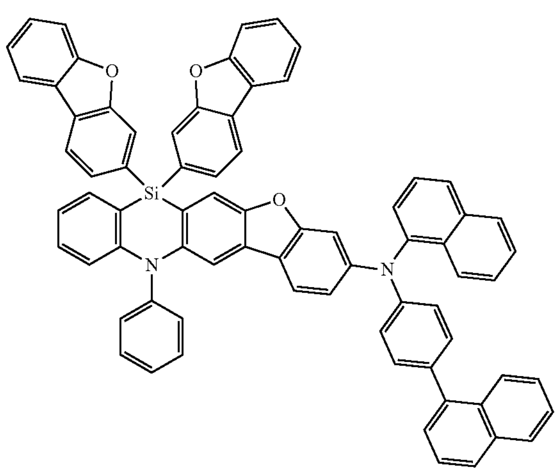
-continued
A159
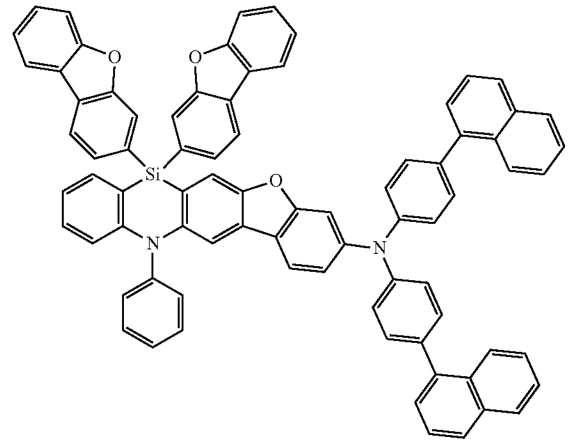
A160
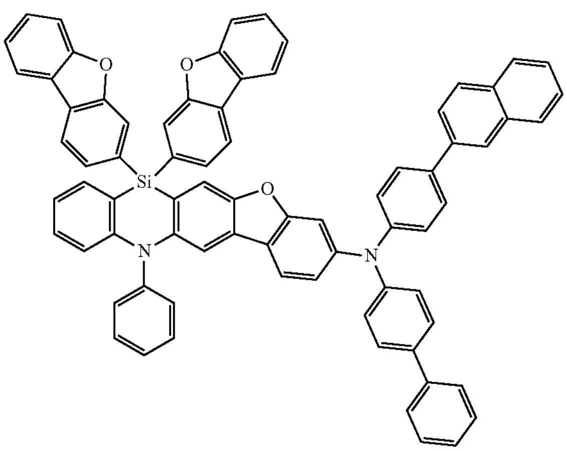
A161
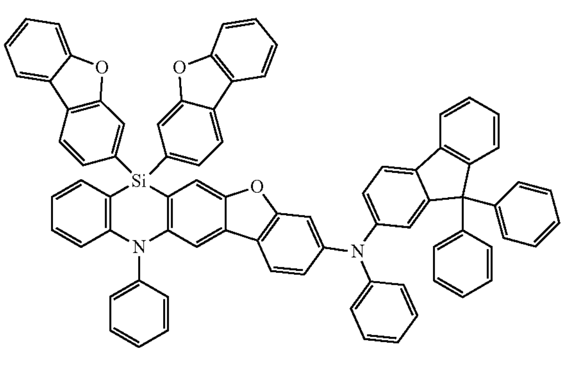

-continued
A162
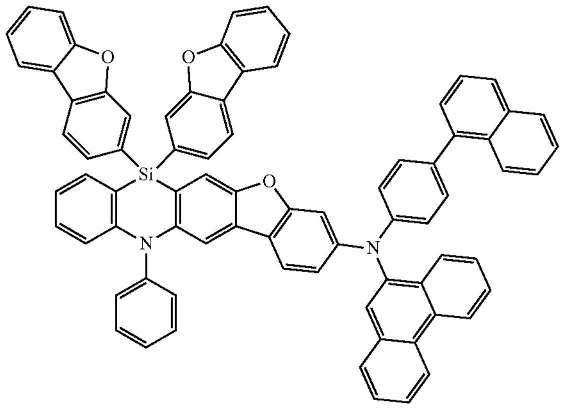
A163
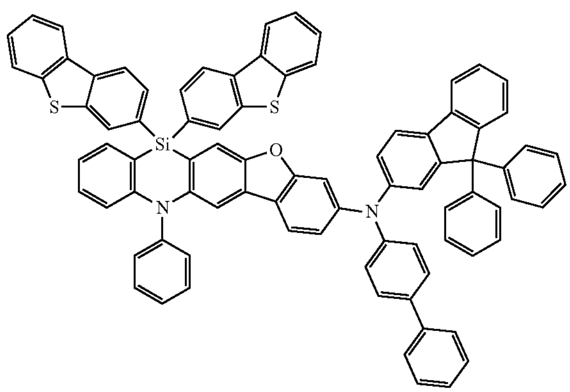
A164
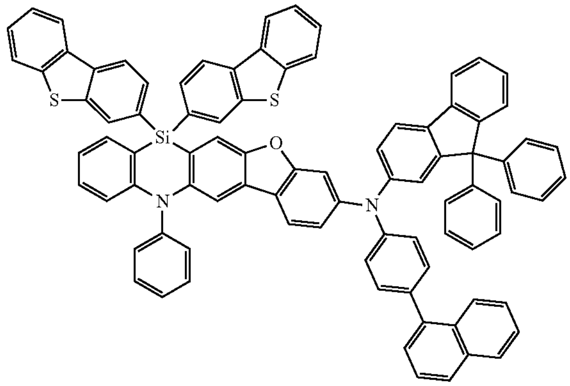
-continued
A165
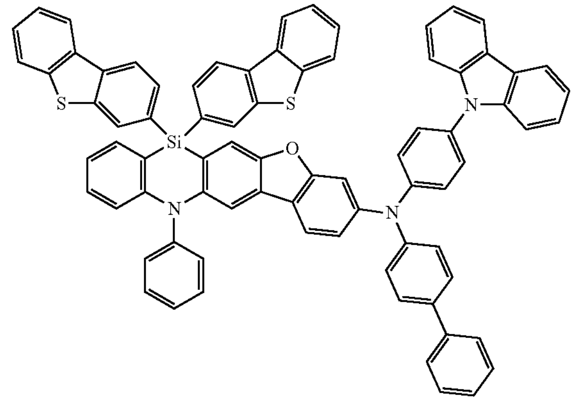
A166
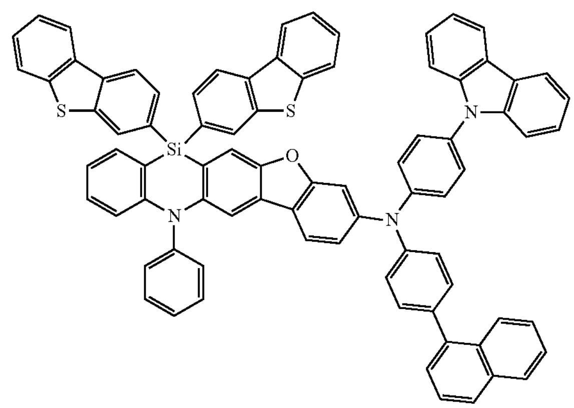
A167
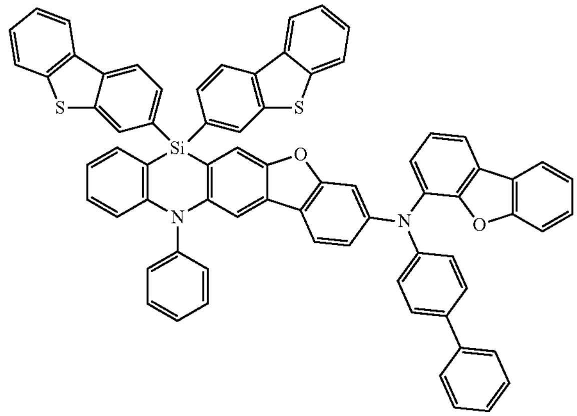

A168
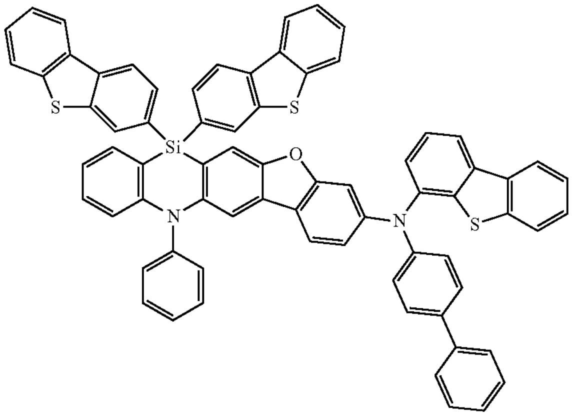
A169
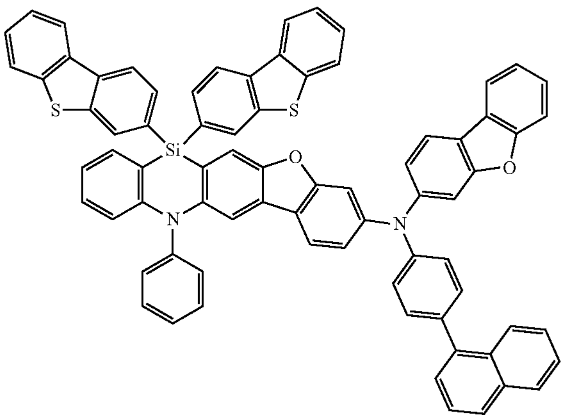
A170
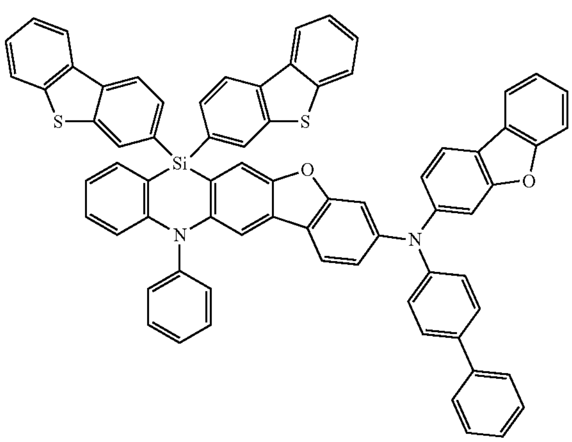
A171
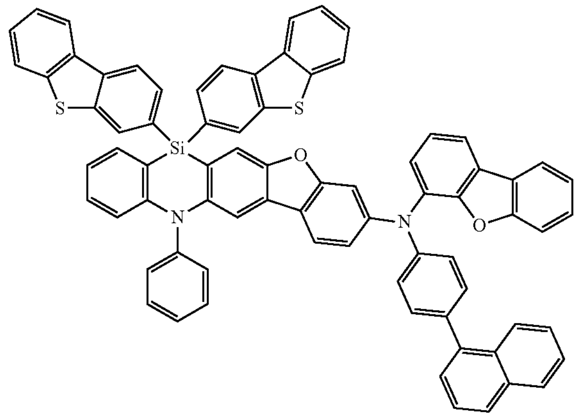
A172
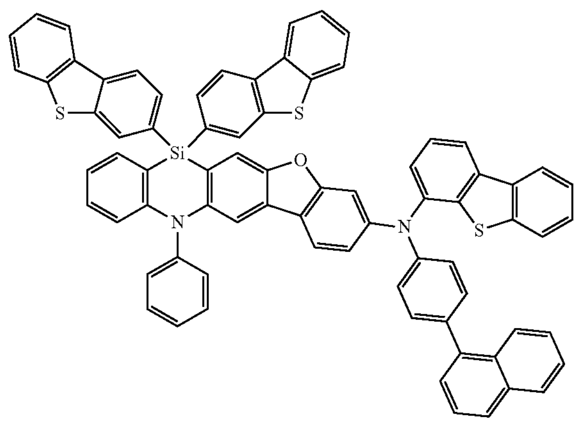
A173
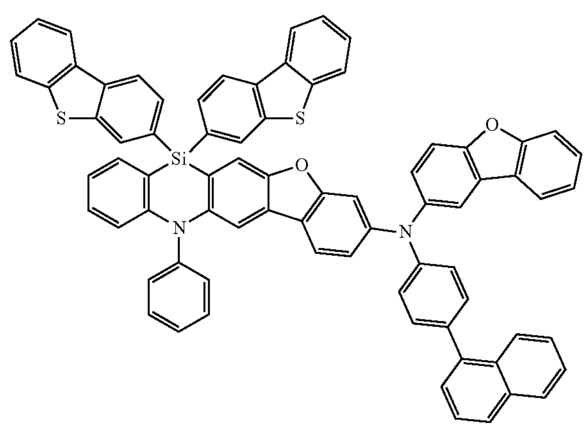

-continued
A174
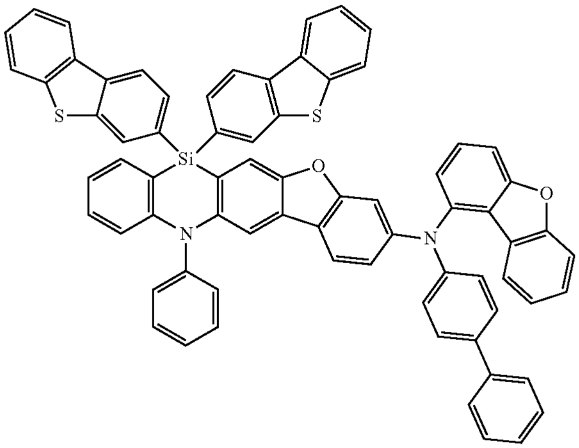
[Compound Group B]
B1
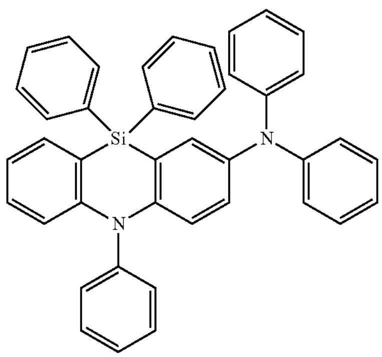
B2
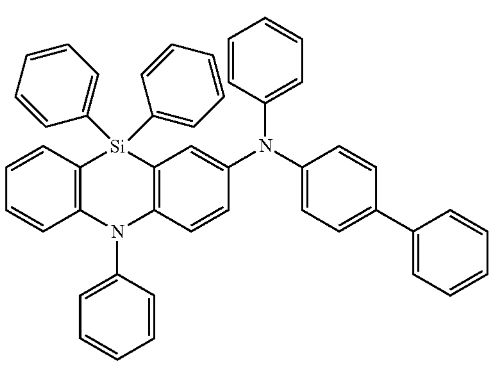
-continued
B3
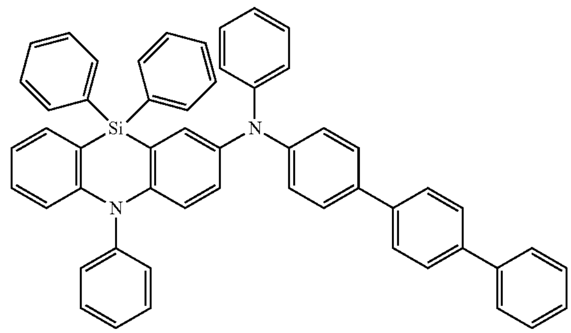
B4
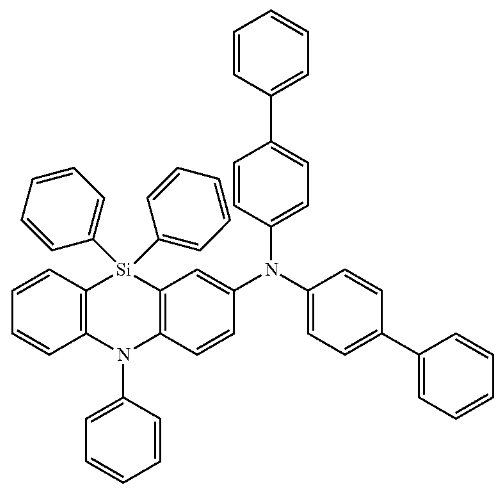
B5
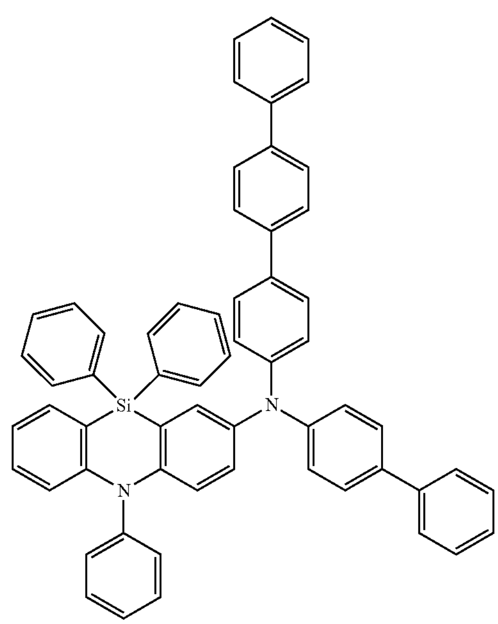

-continued
B6
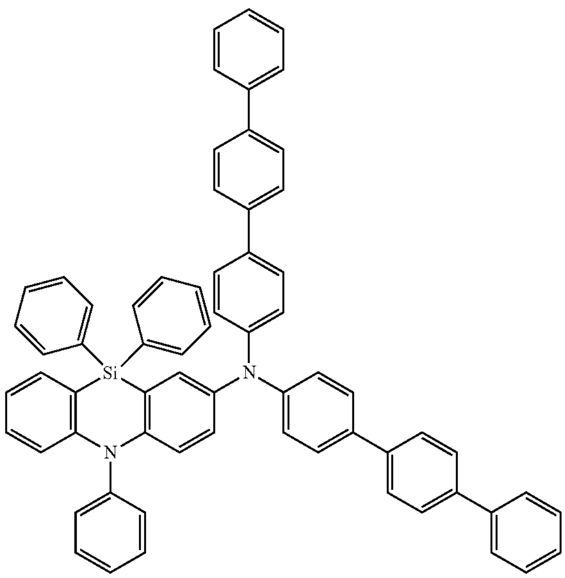
B7
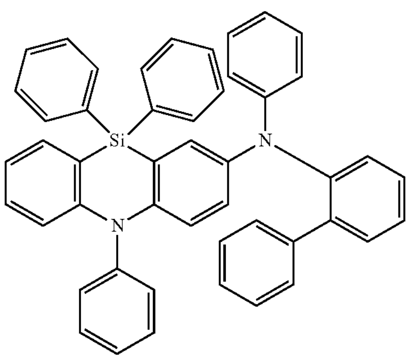
B8
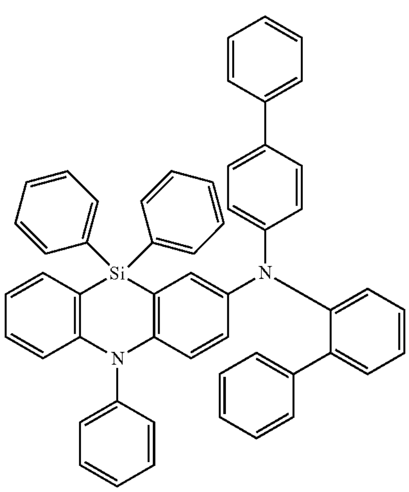
-continued
B9
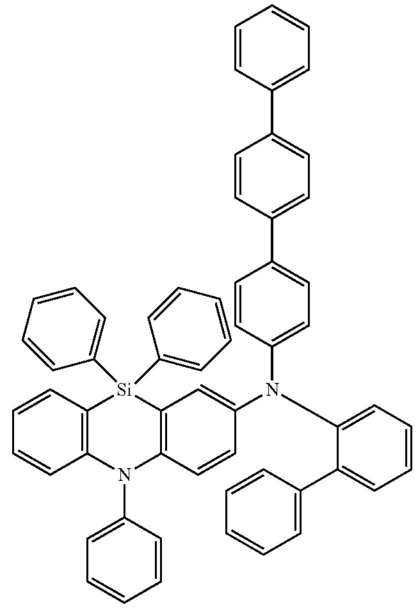
B10
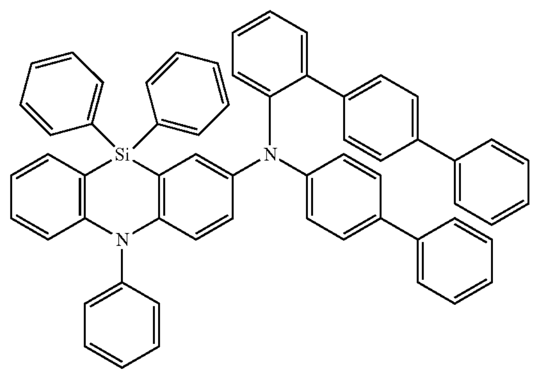
B11
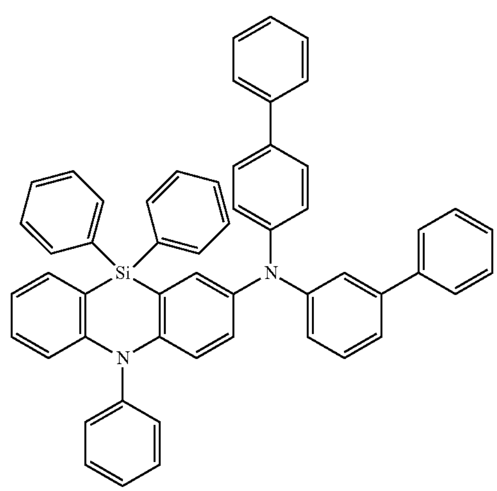

-continued
B12
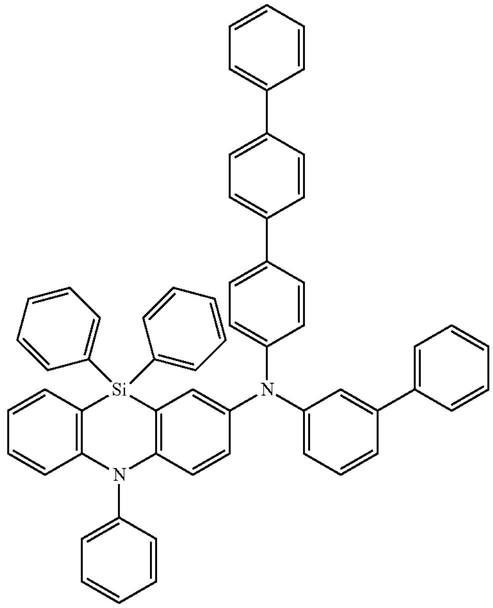
B13
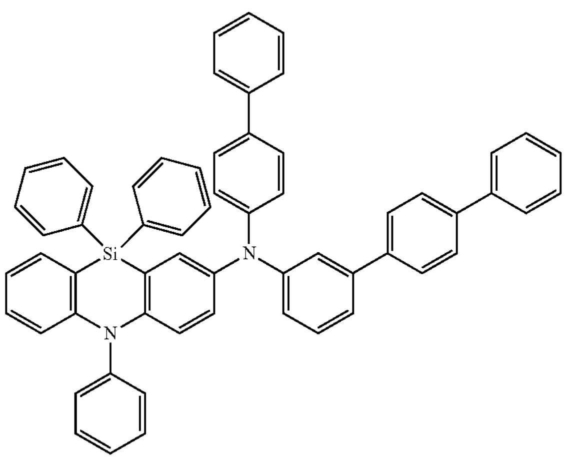
B14
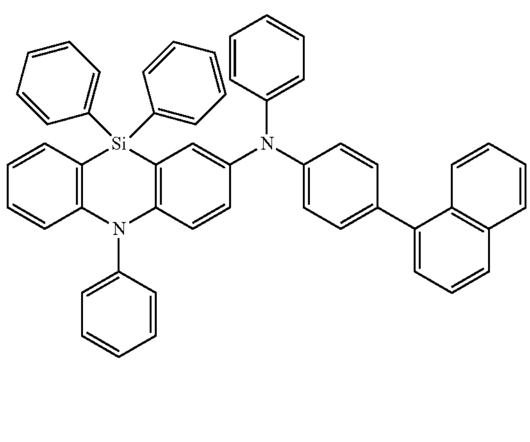
-continued
B15
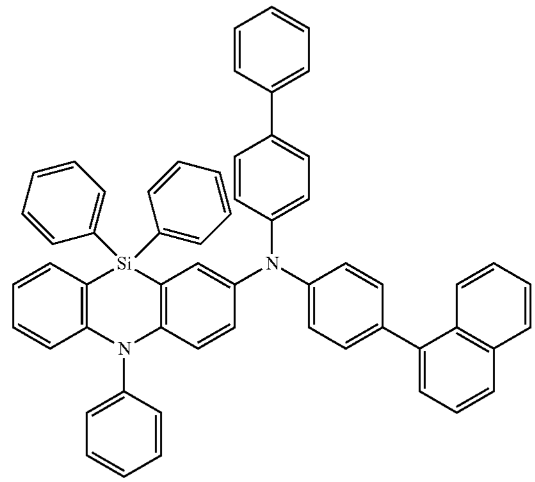
B16
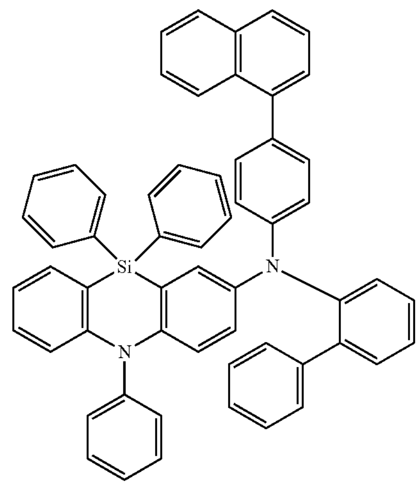
B17
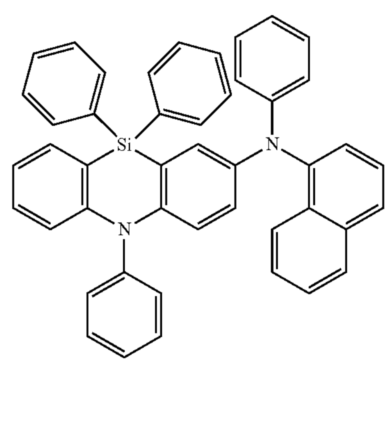

-continued
B18
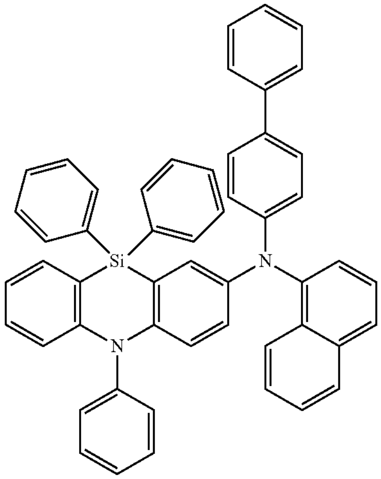
B19
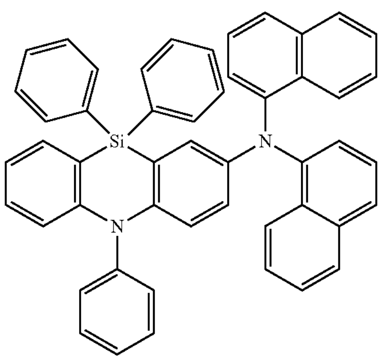
B20
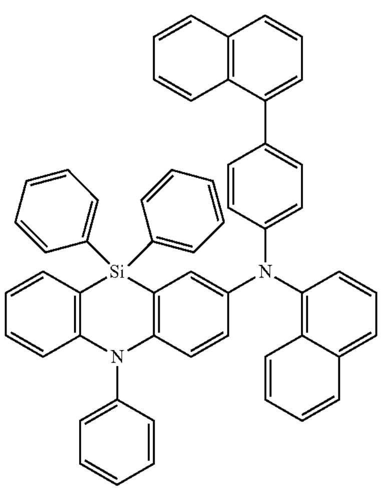
-continued
B21
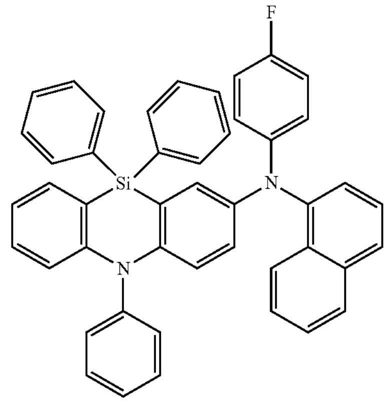
B22
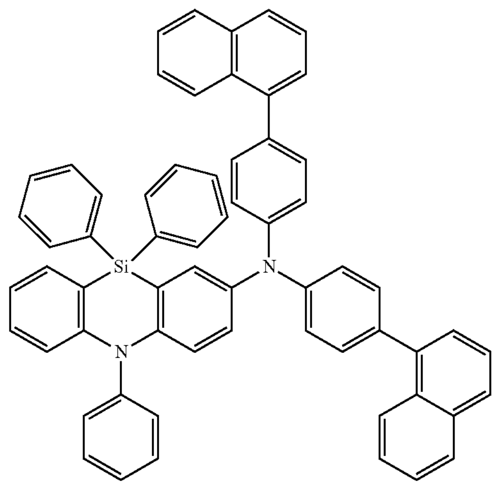
B23
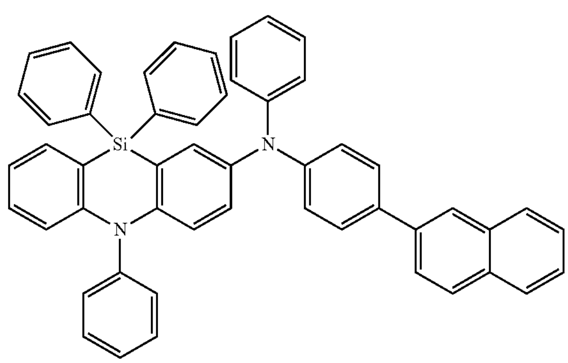

-continued
B24
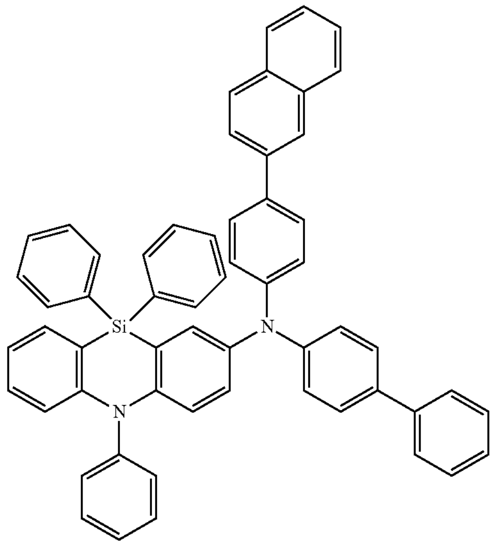
B25
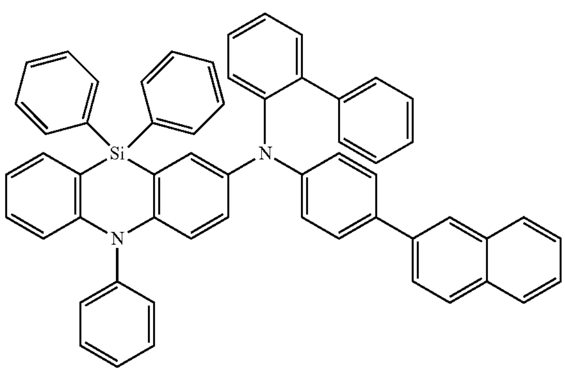
B26
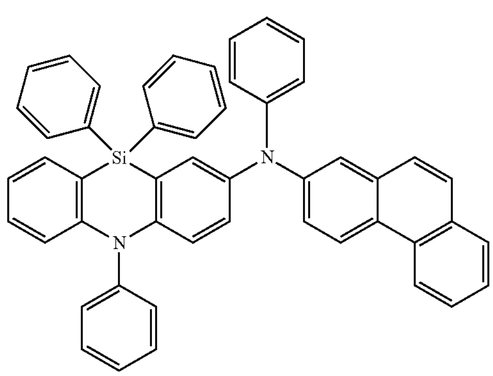
-continued
B27
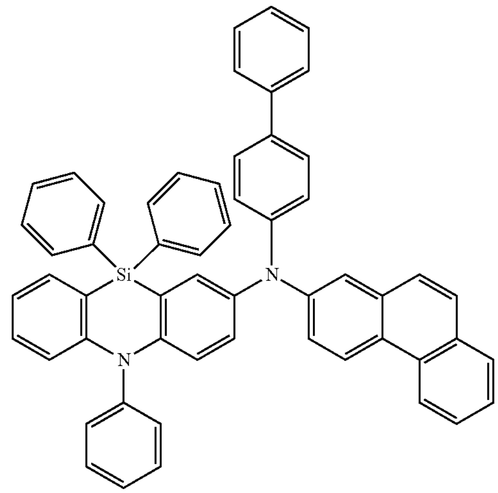
B28
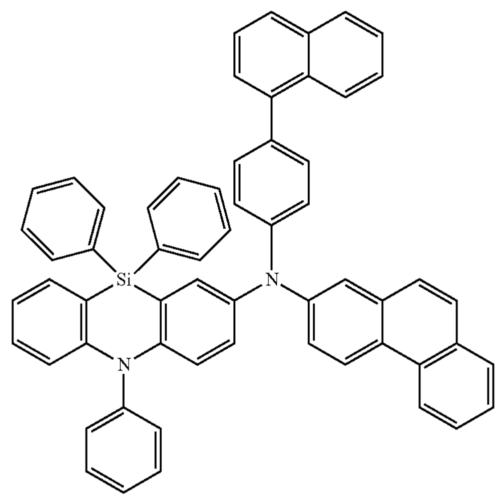
B29
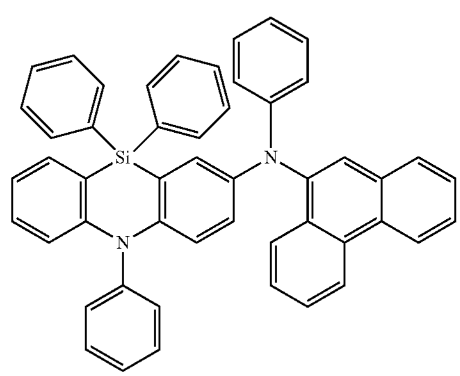

-continued
B30
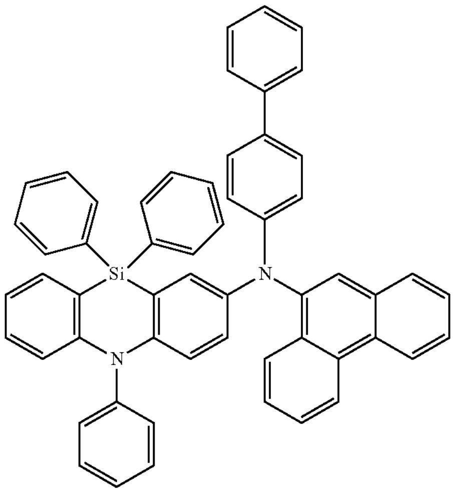
B31
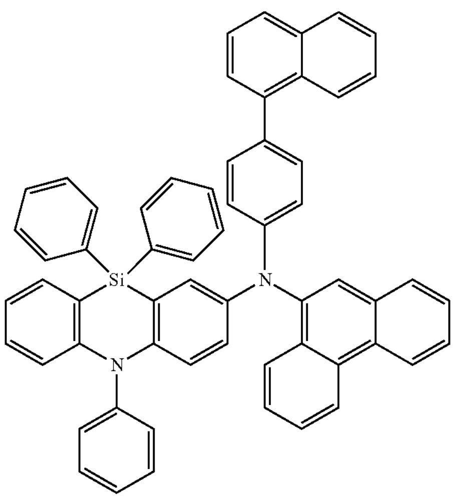
B32
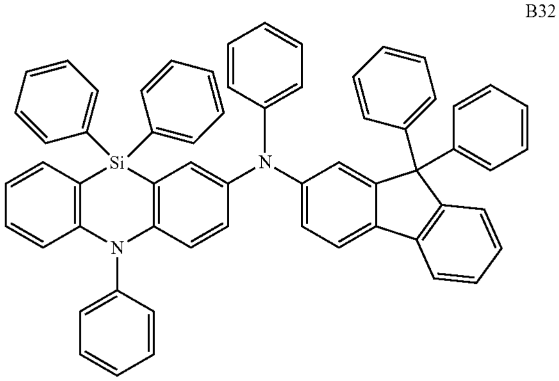
-continued
B33
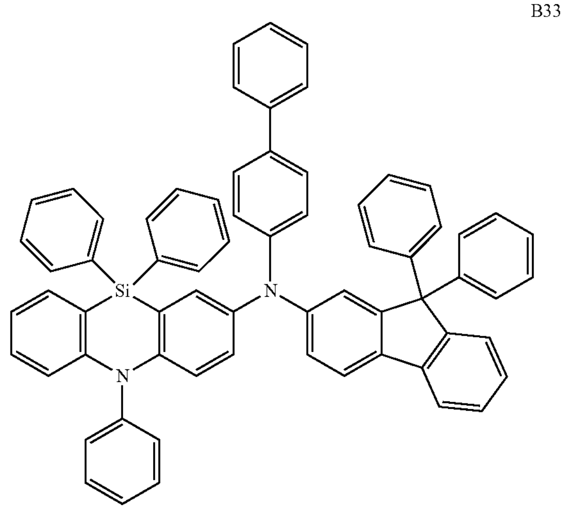
B34
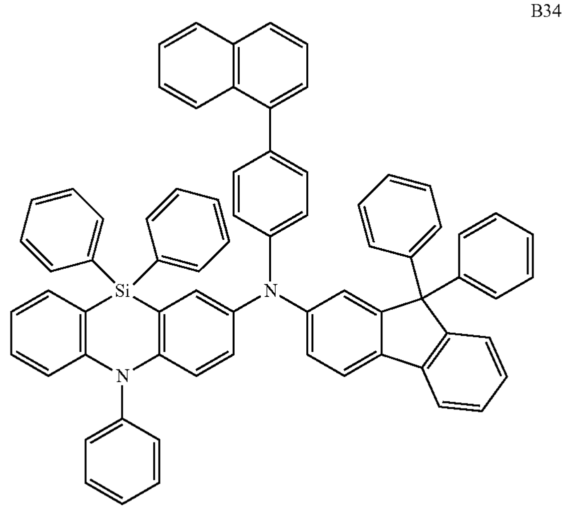
B35
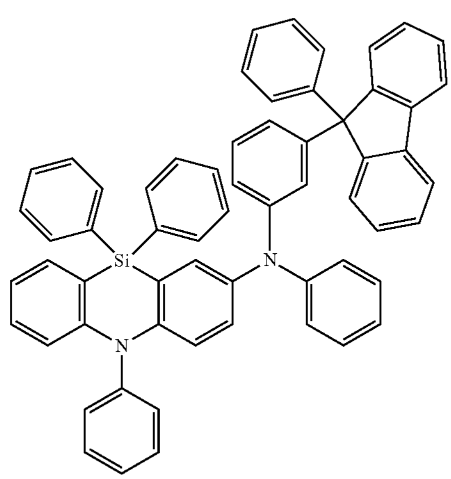

-continued
B36
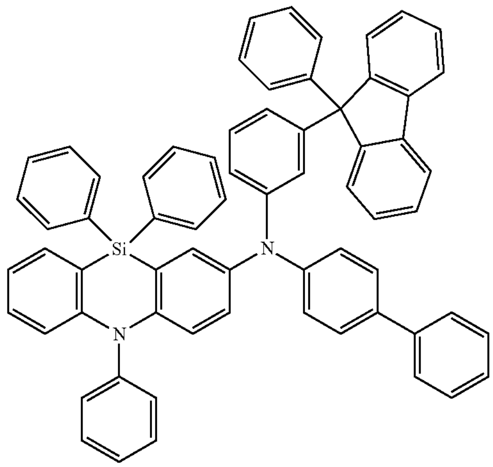
B37
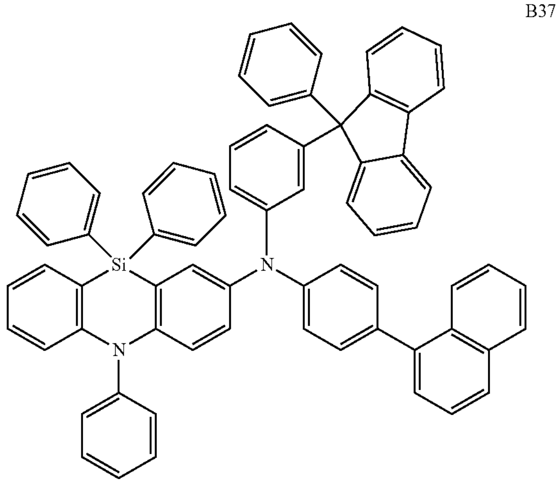
B38
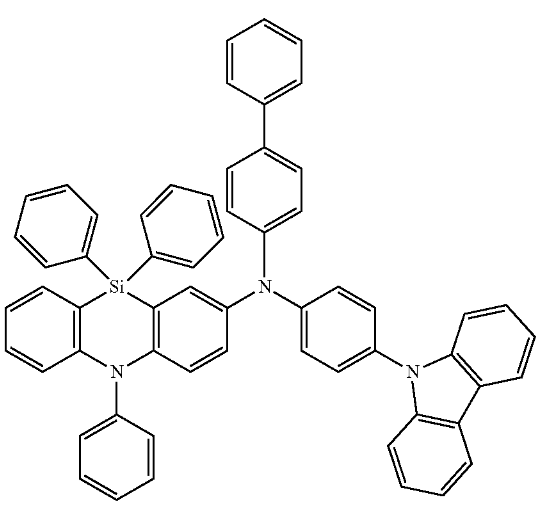
-continued
B39
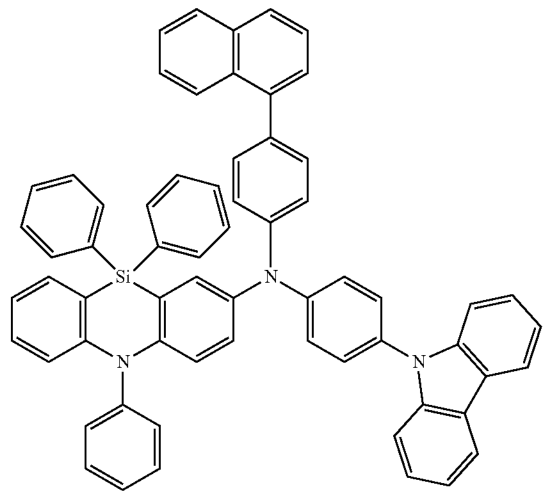
B40
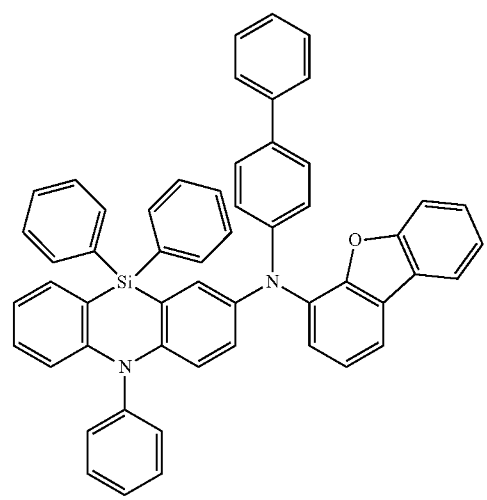
B41
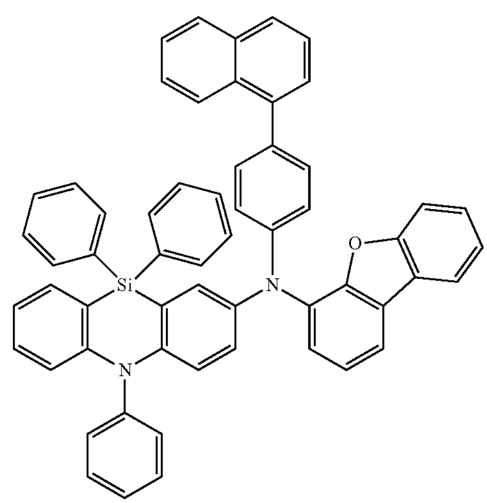

-continued
B42
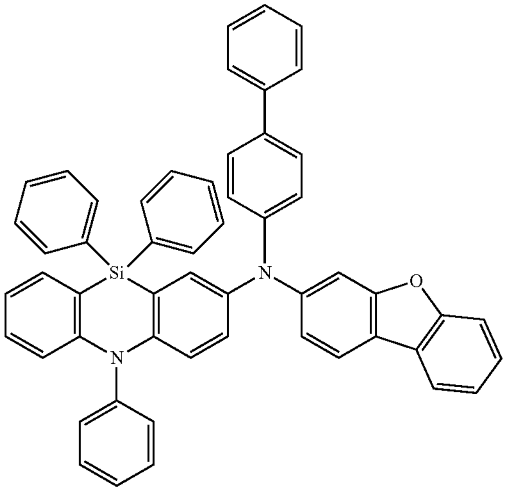
B43
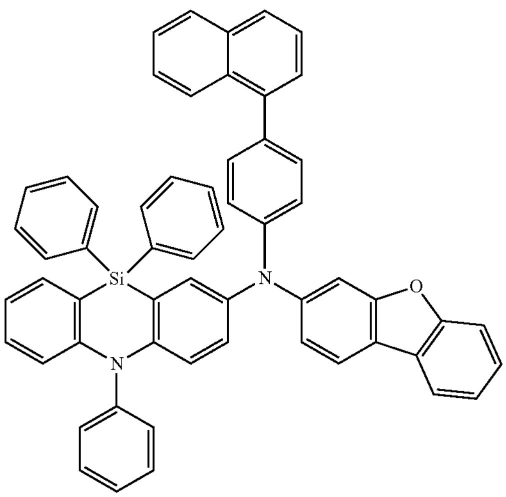
B44
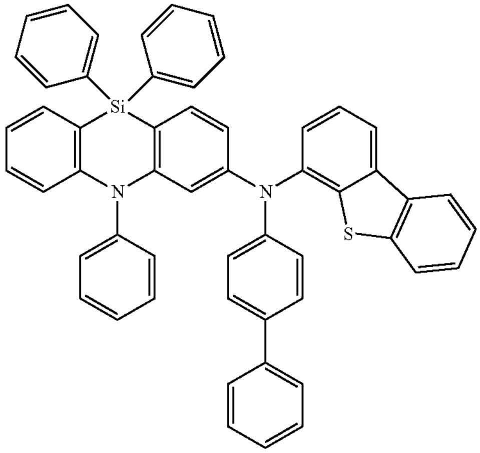
-continued
B45
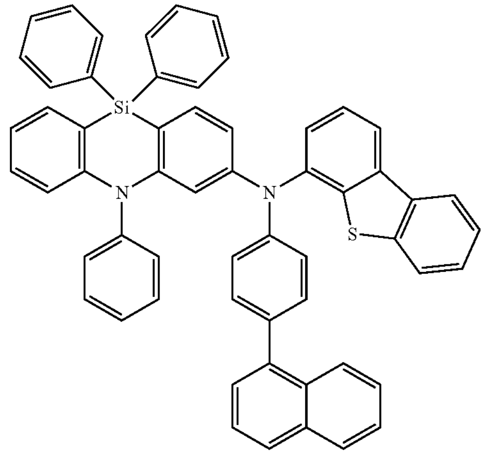
B46
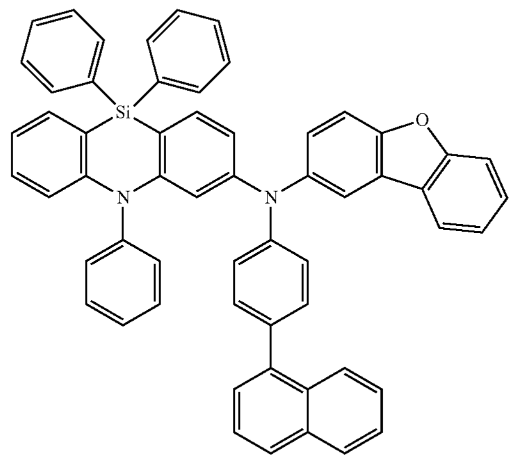
B47
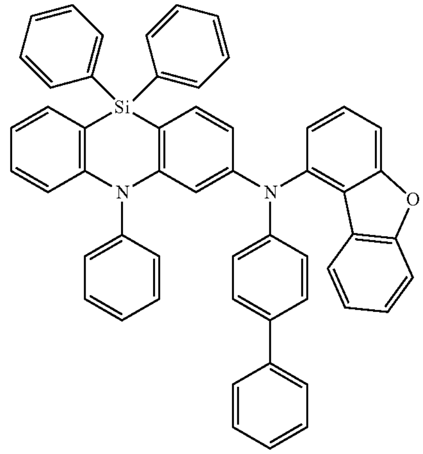

-continued
B48
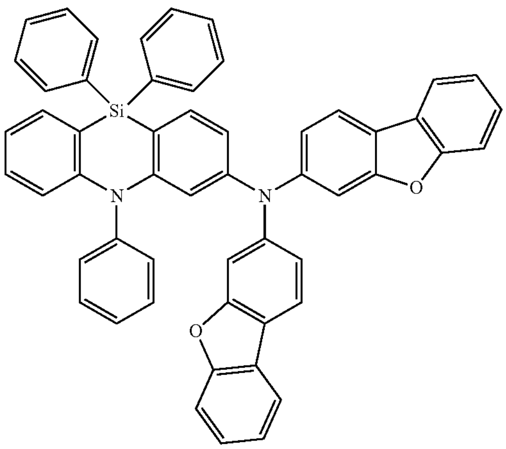
B49
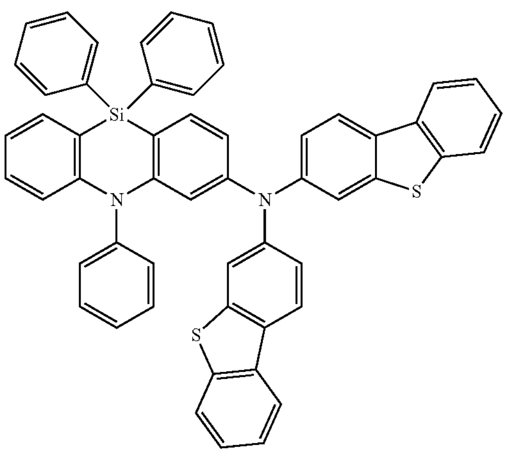
B50
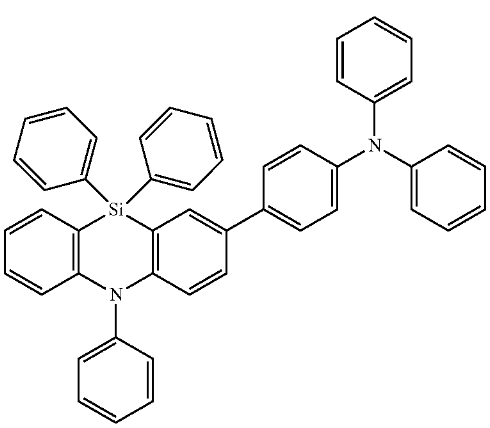
-continued
B51
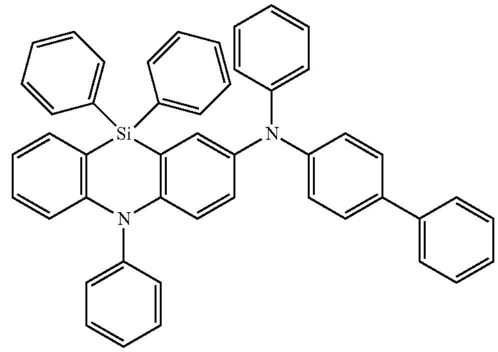
B52
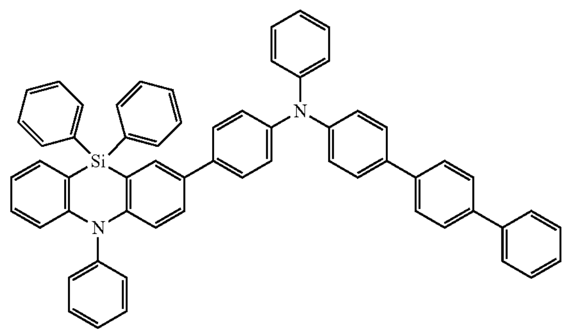
B53
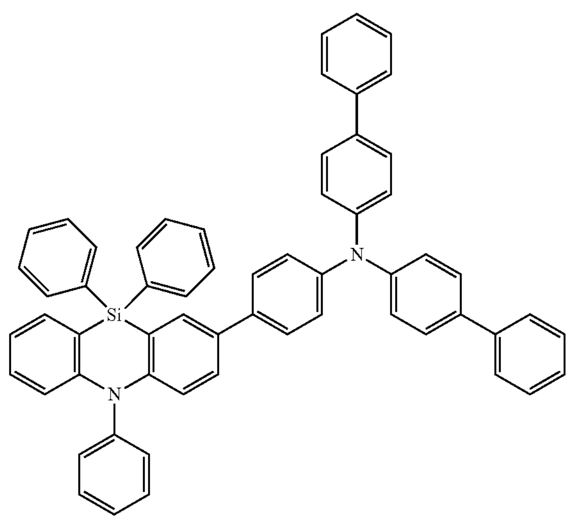

B54
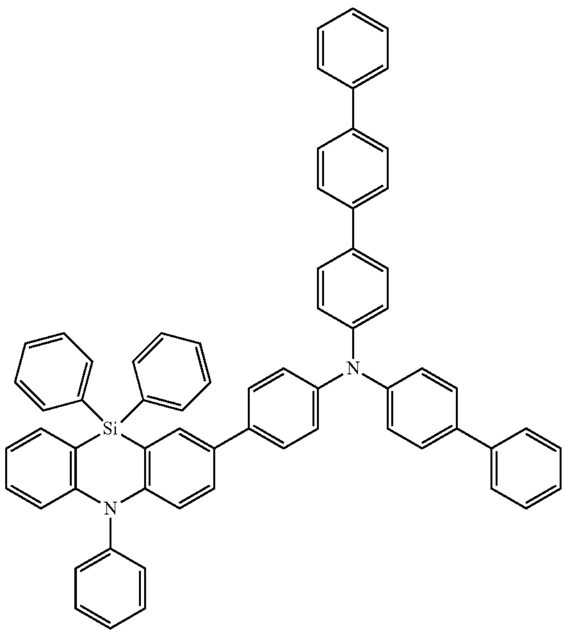
B55
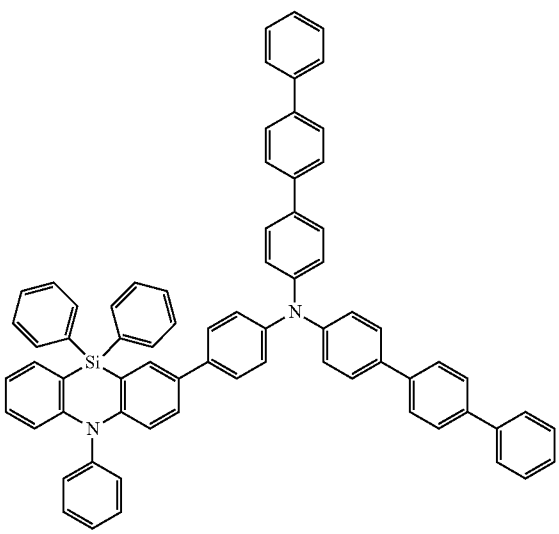
B56
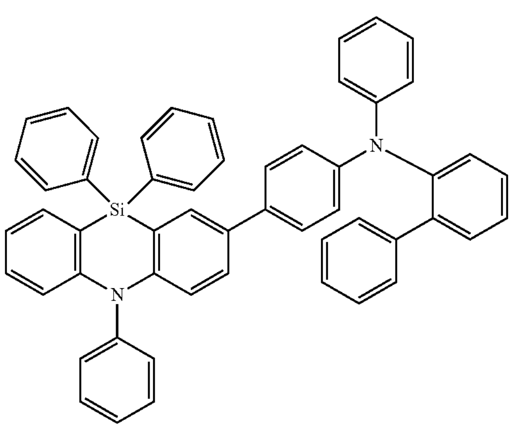
B57
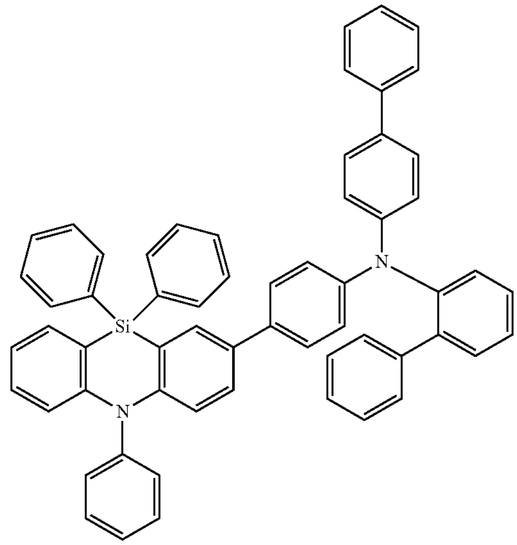
B58
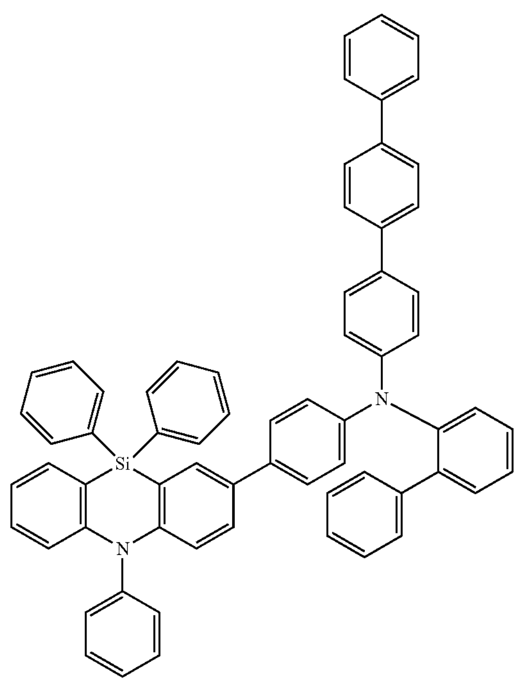

-continued
B59
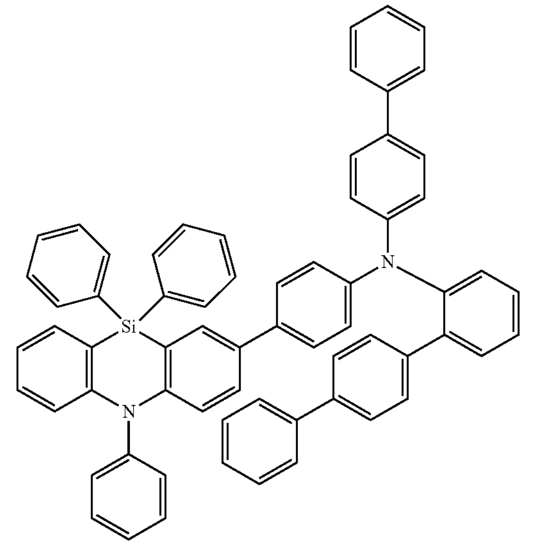
B60
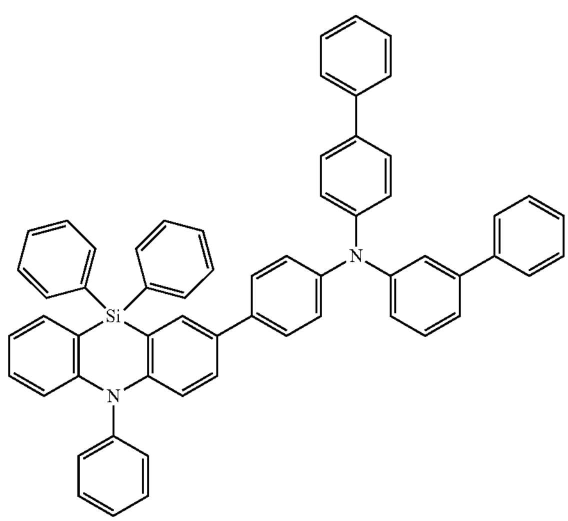
-continued
B61
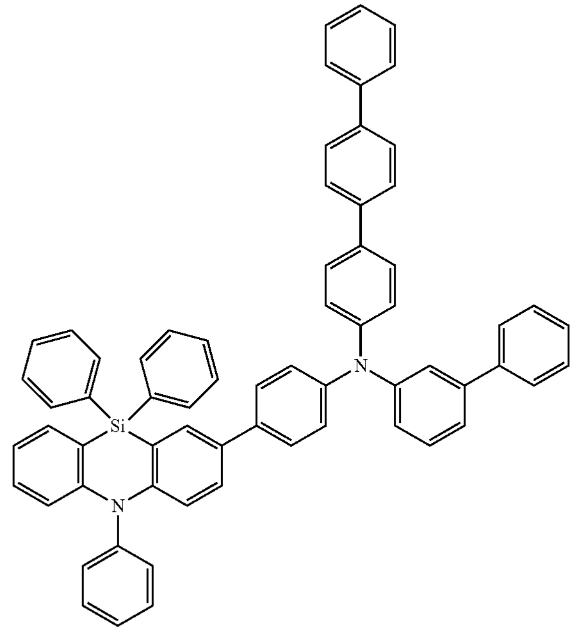
B62
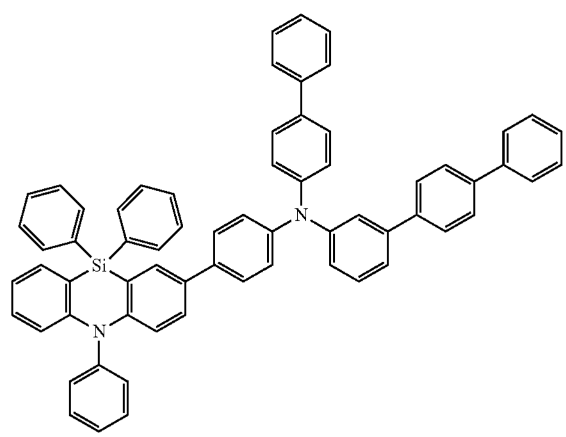
B63
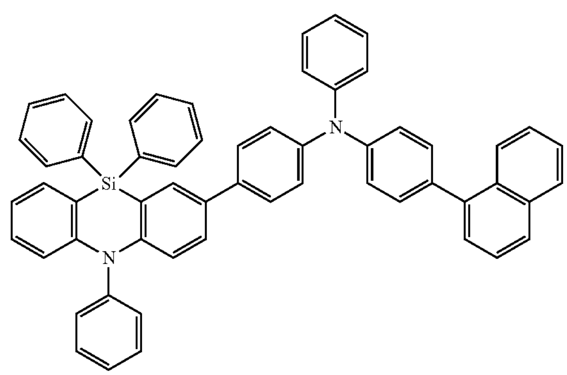

-continued
B64
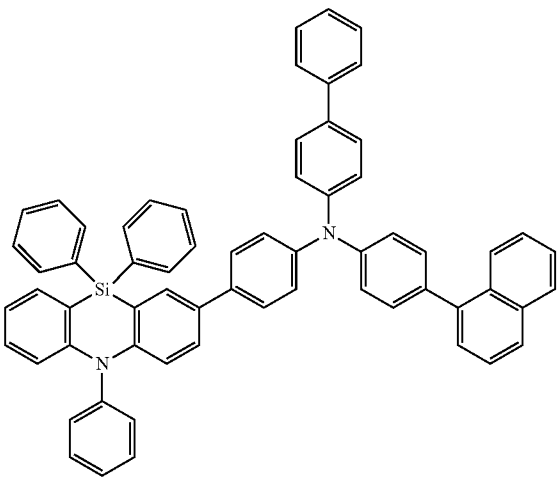
B65
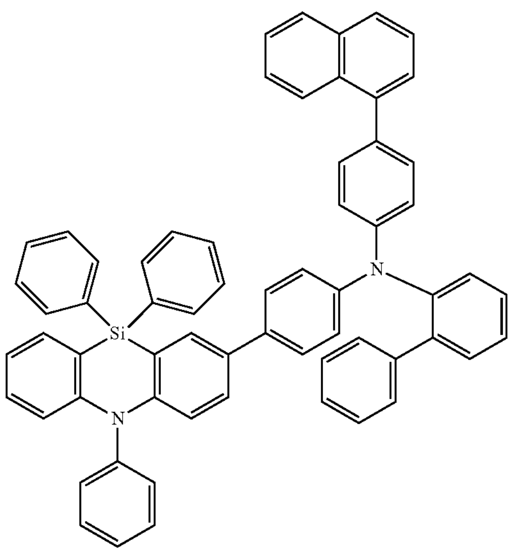
B66
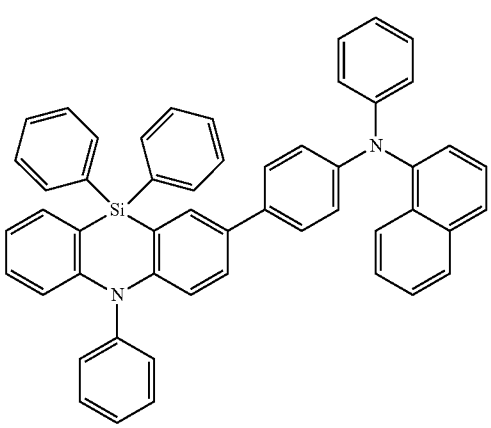
-continued
B67
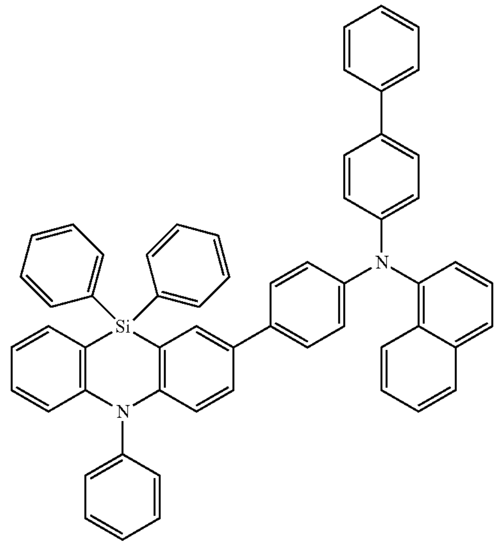
B68
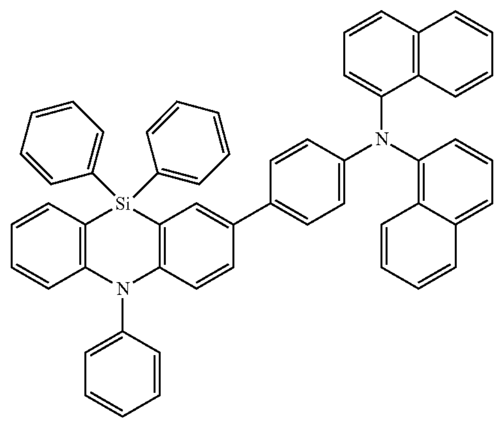
B69
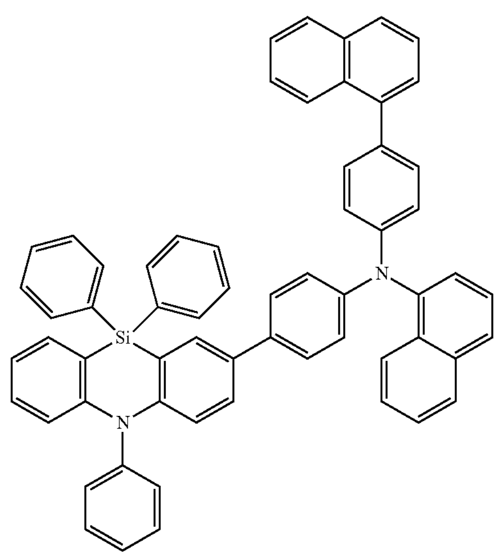

-continued
B70
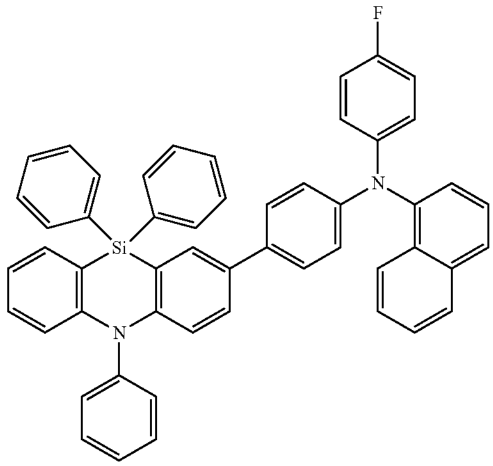
B71
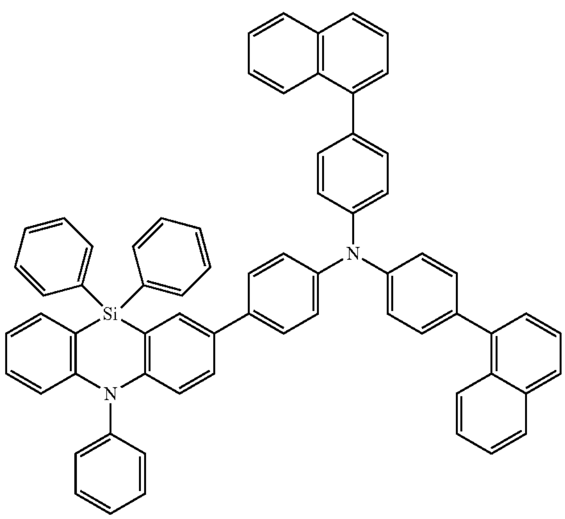
B72
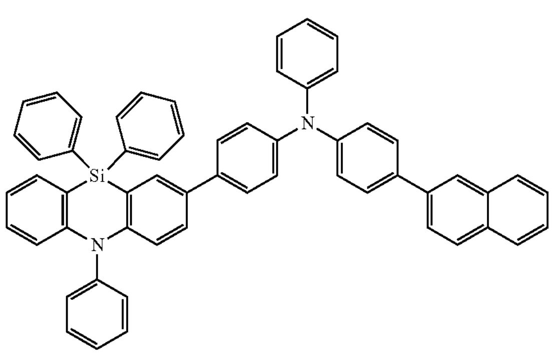
-continued
B73
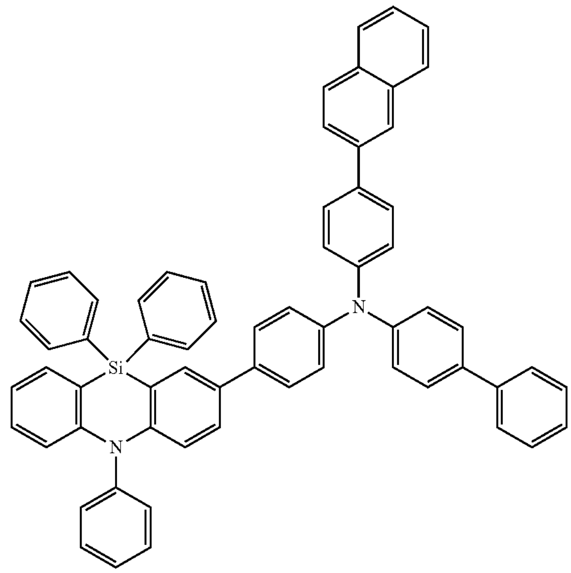
B74
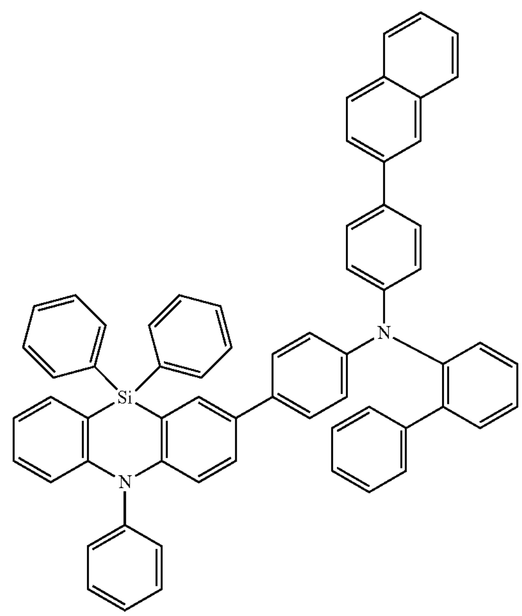
B75
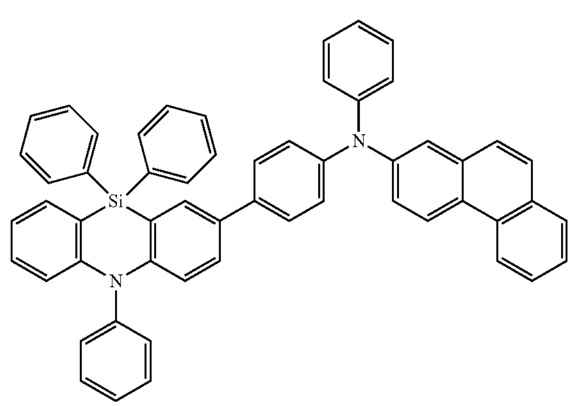

-continued
B76
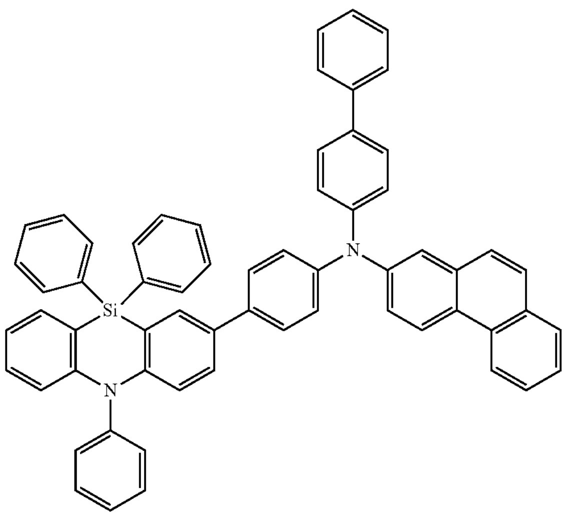
B77
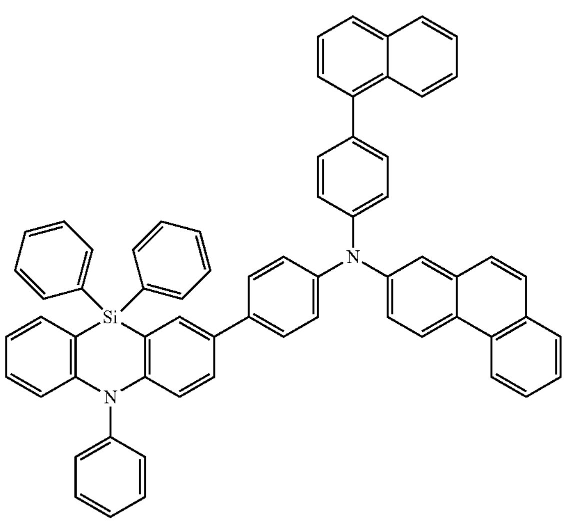
B78
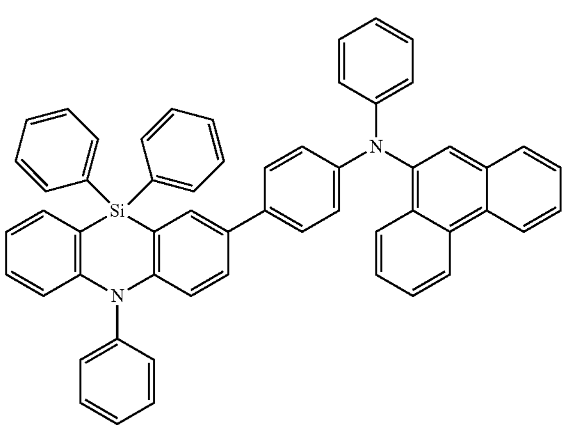
-continued
B79
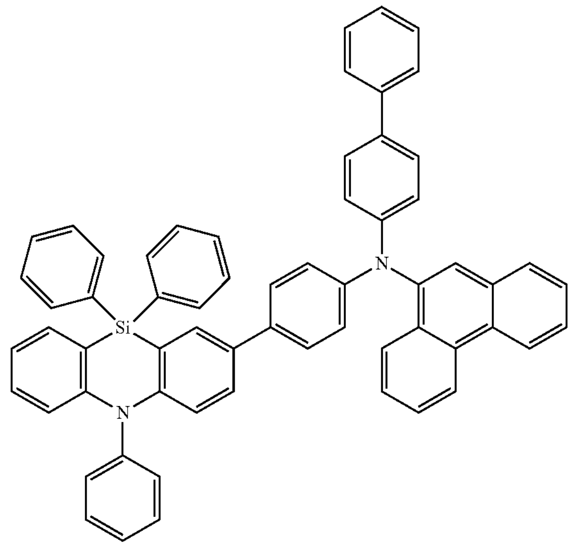
B80
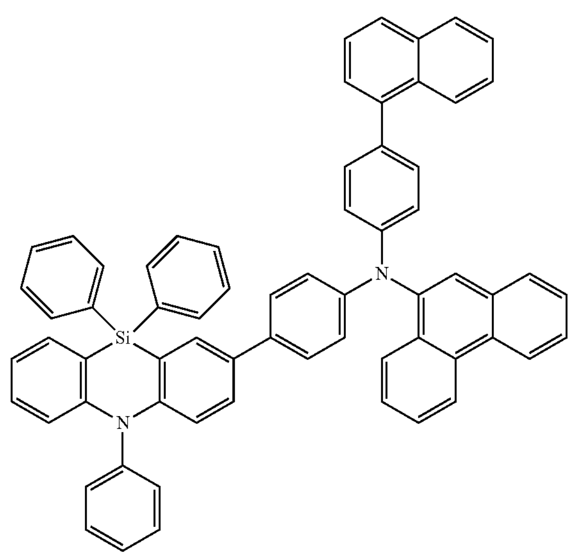
B81
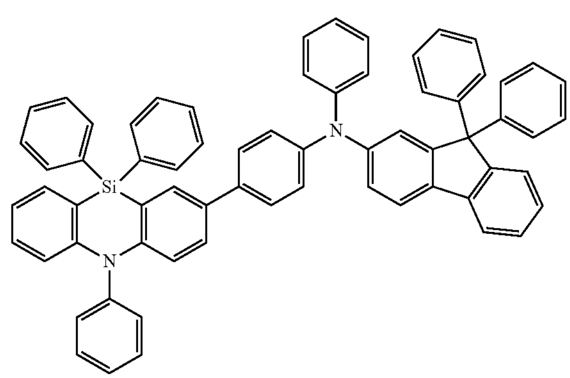

-continued
B82
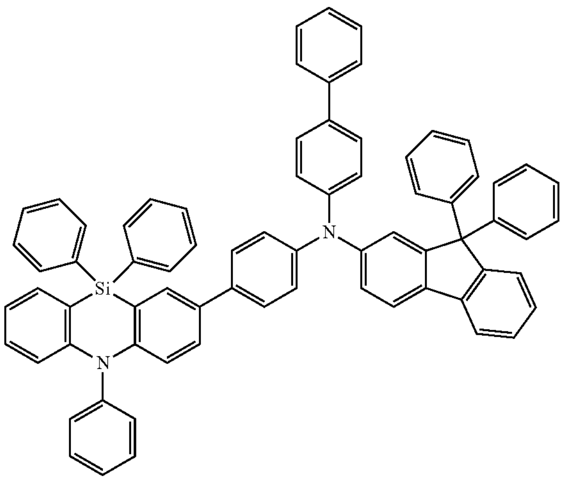
B83
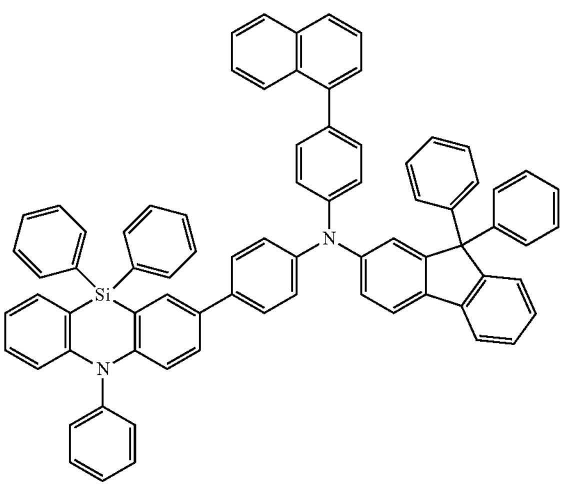
B84
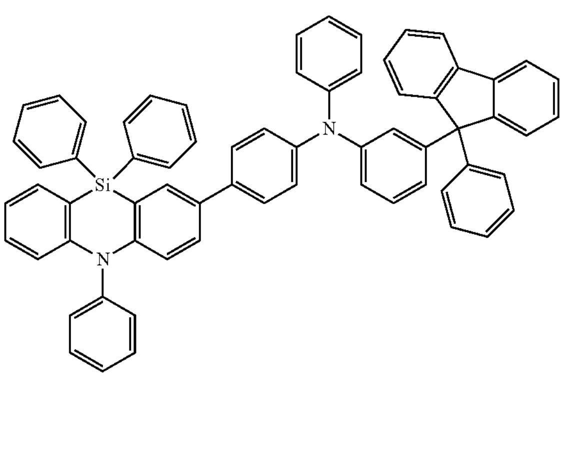
-continued
B85
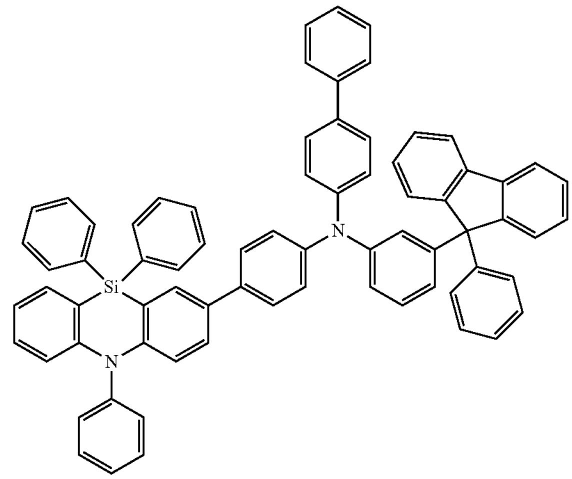
B86
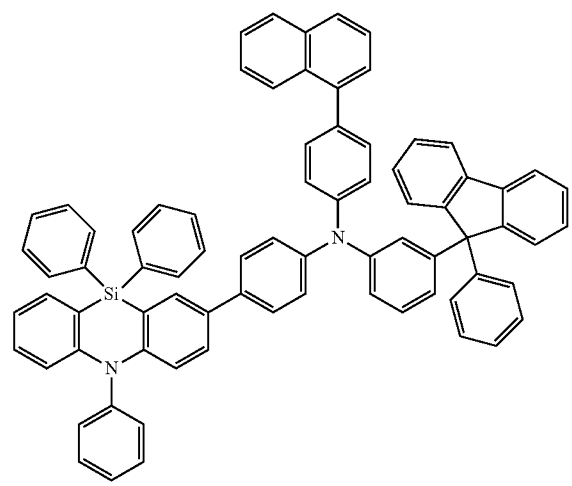
B87
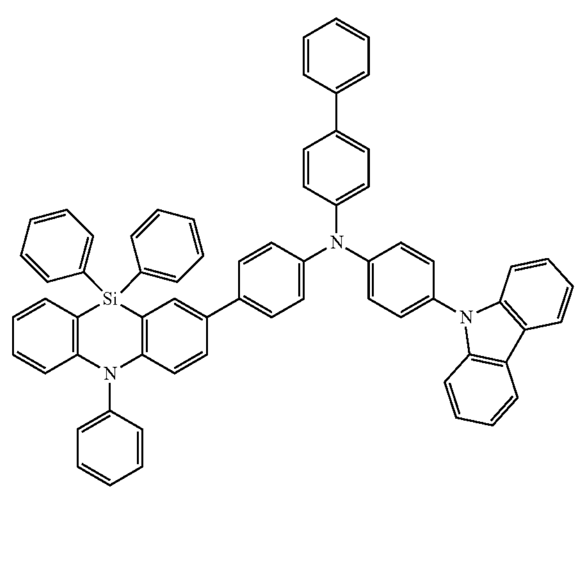

B88
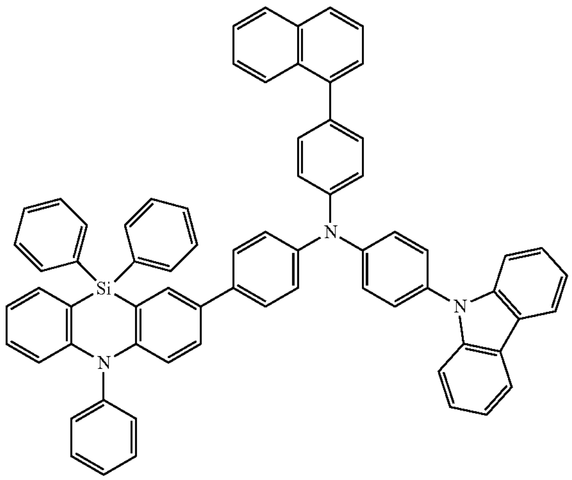
B89
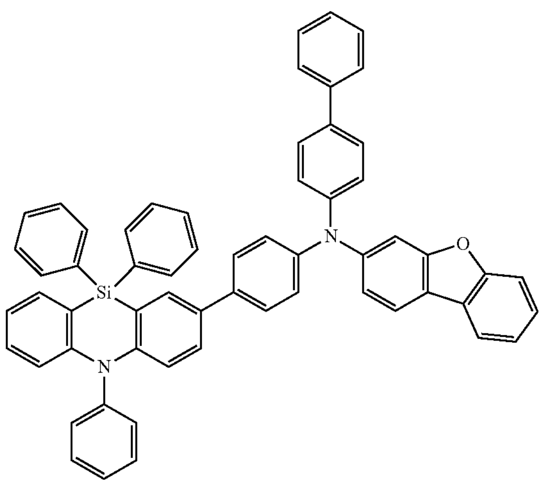
B90
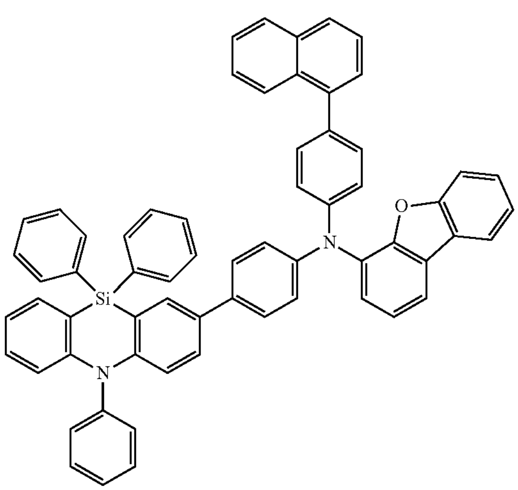
B91
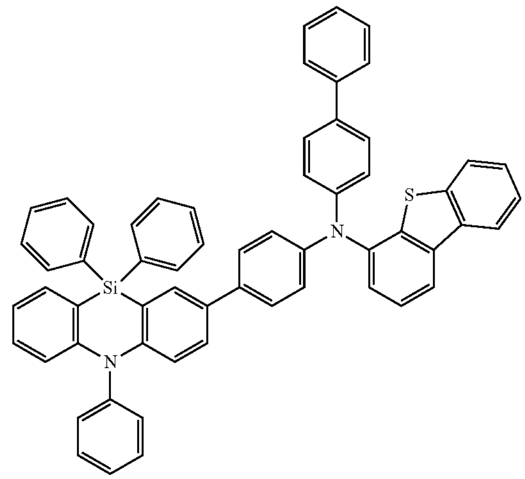
B92
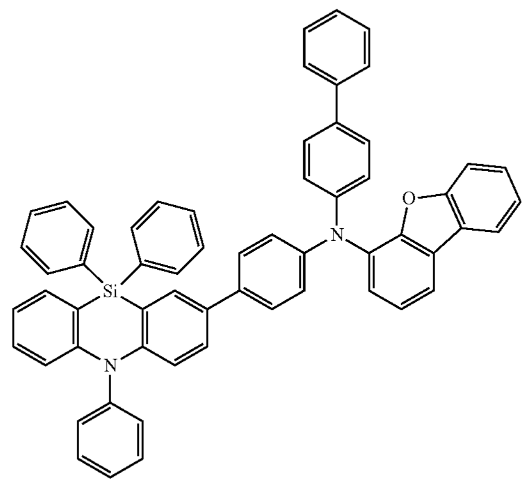
B93
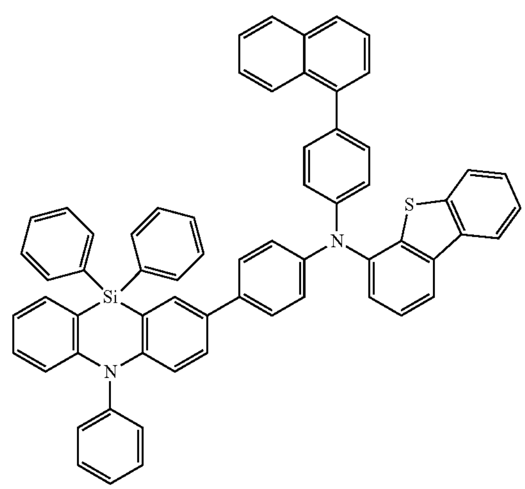

-continued
B94
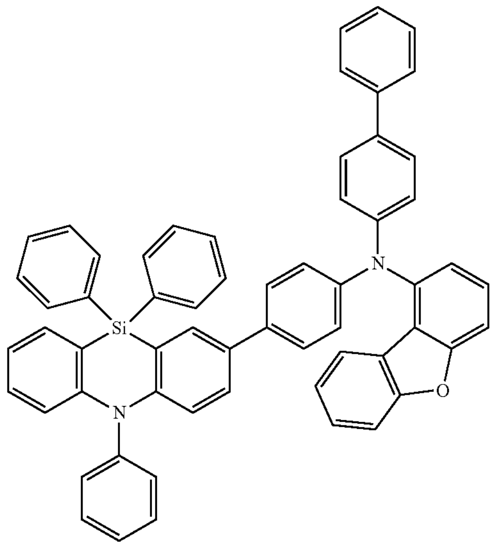
B95
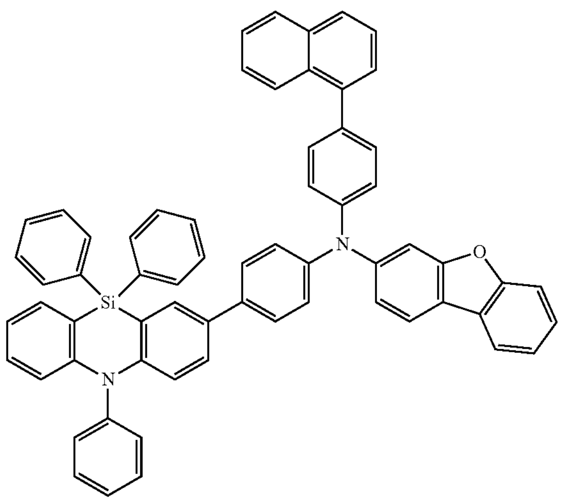
B96
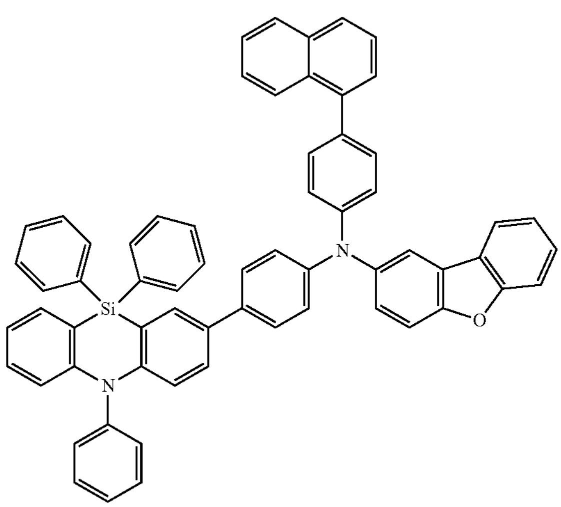
-continued
B97
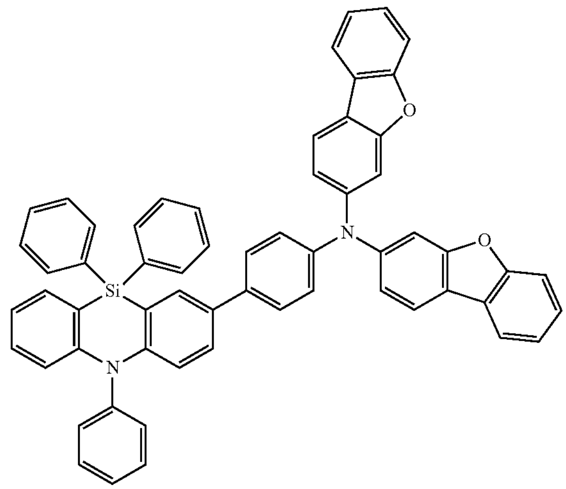
B98
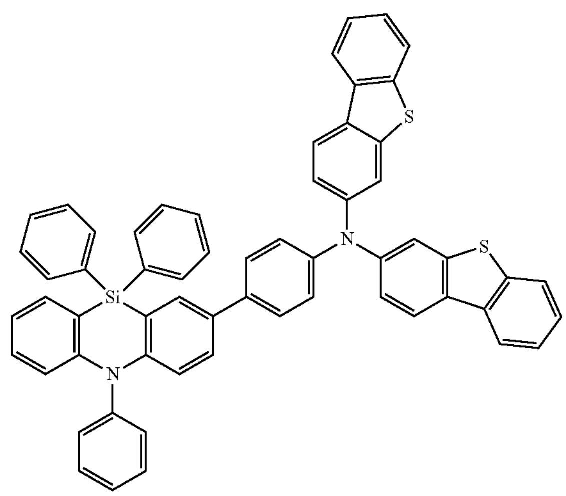
B99
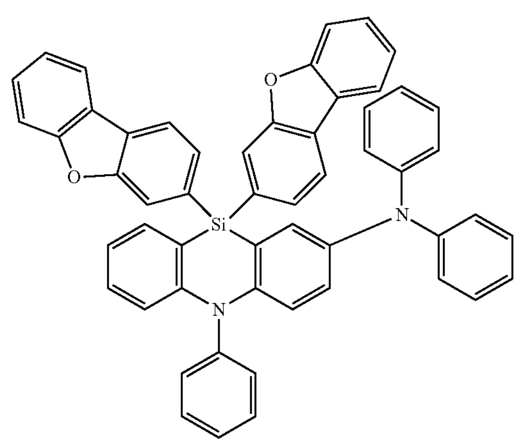

-continued
B100
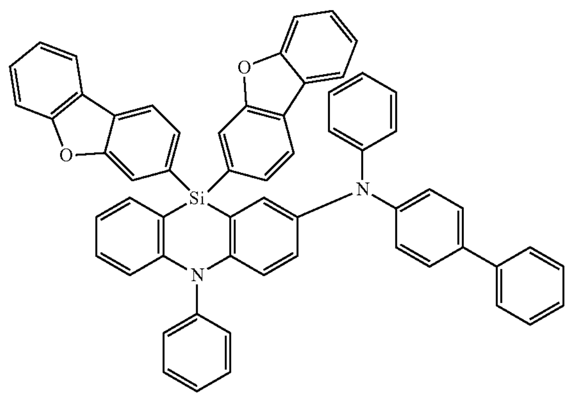
B101
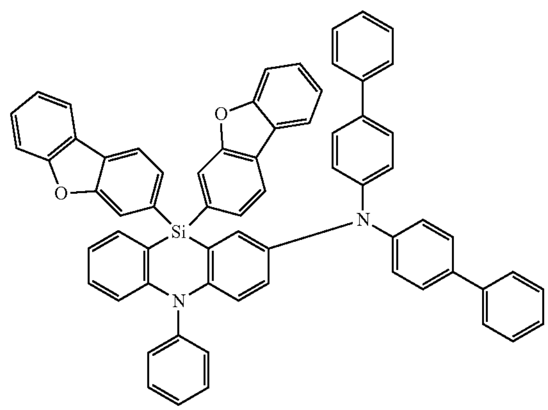
B102
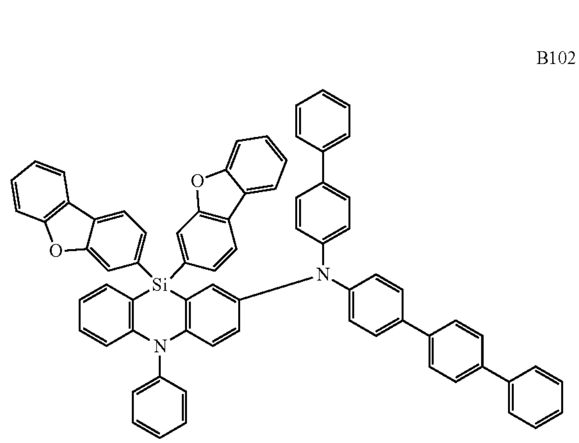
-continued
B103
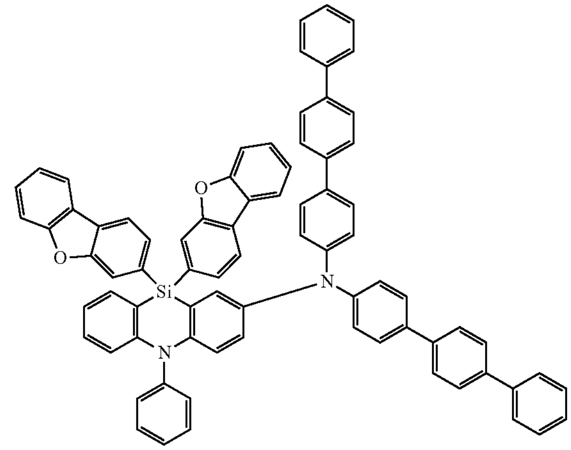
B104
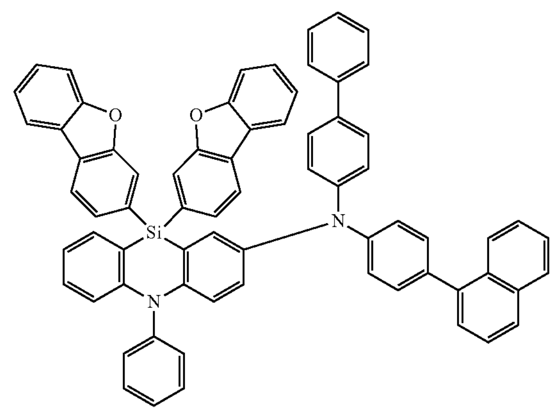
B105
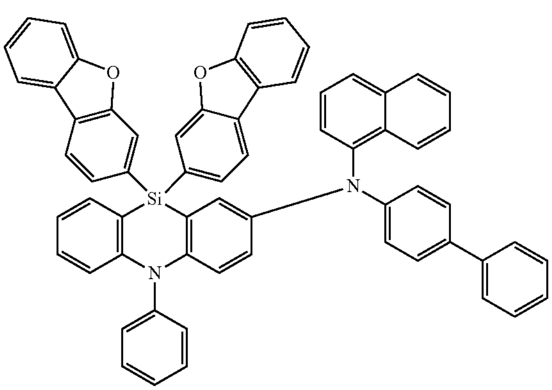

-continued
B106
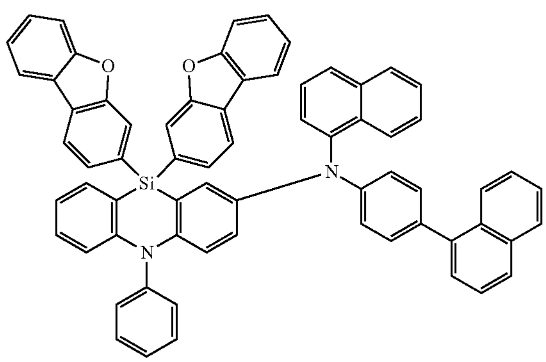
B107
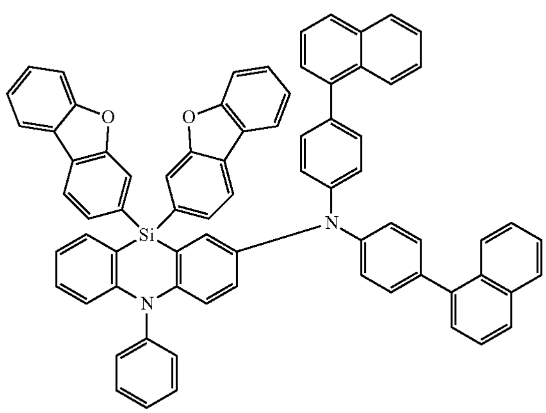
B108
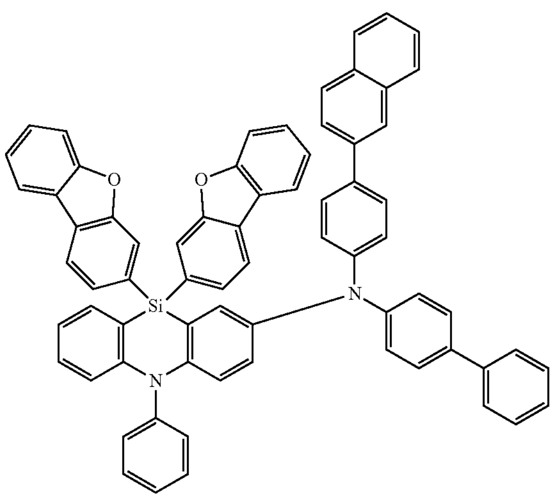
-continued
B109
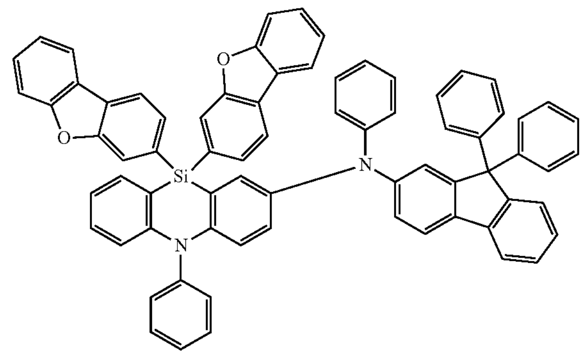
B110
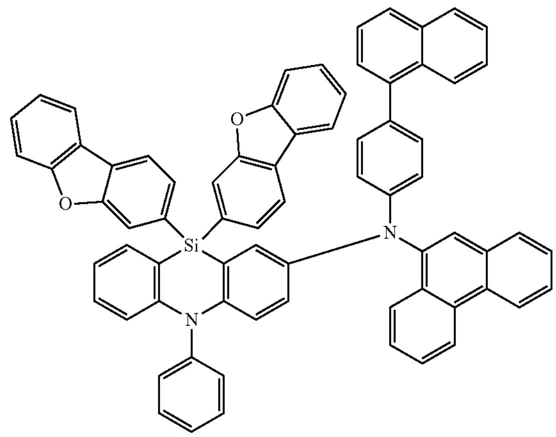
B111
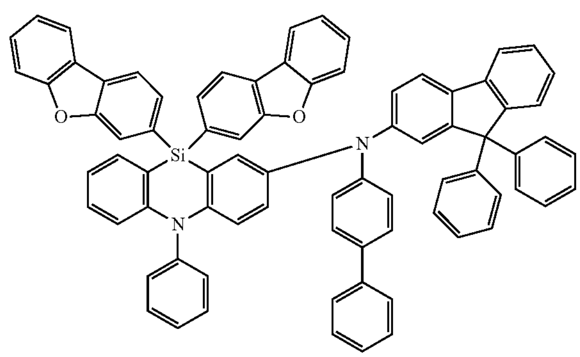
B112
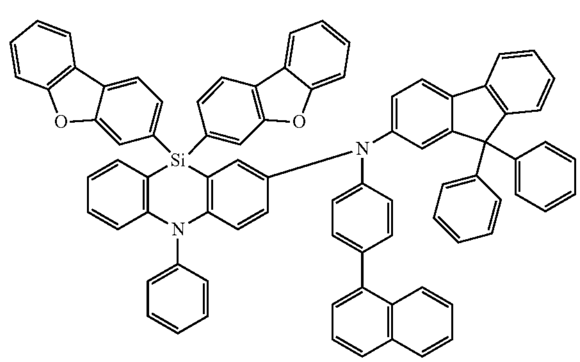

-continued
B113
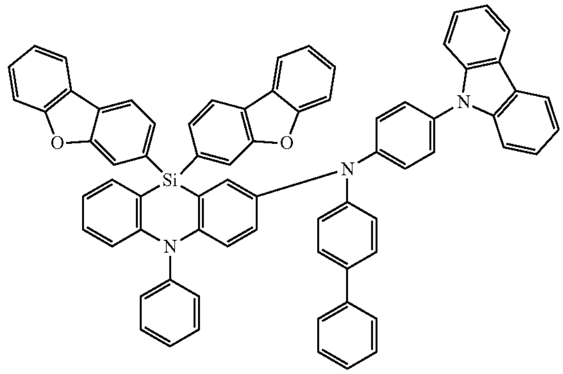
B114
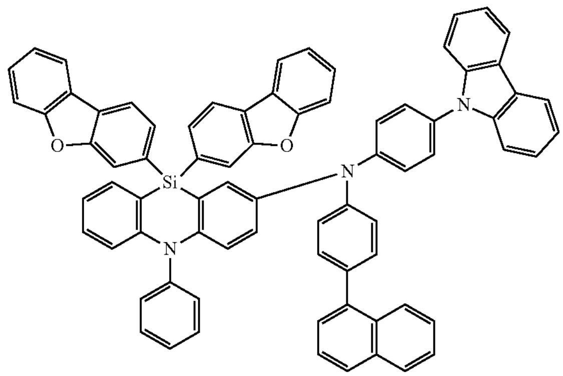
B115
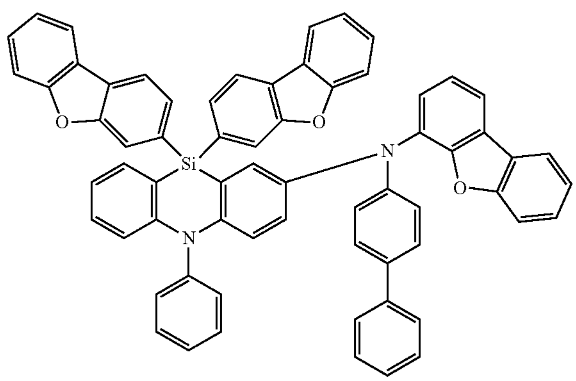
B116
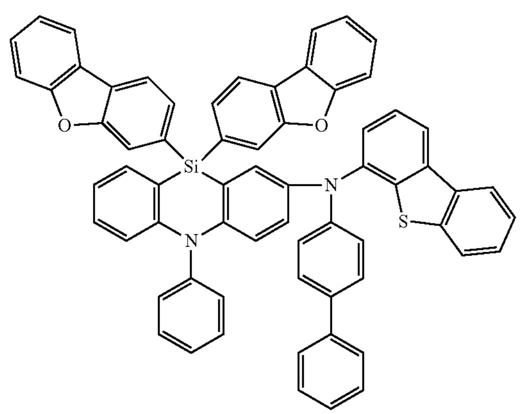
-continued
B117
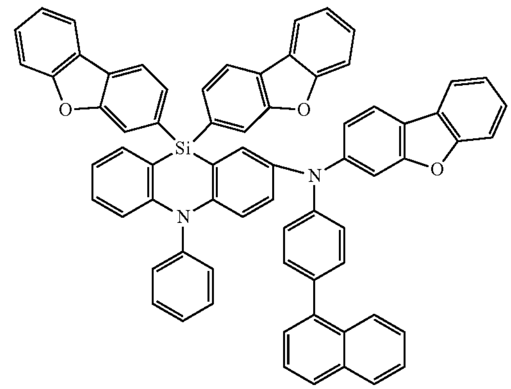
B118
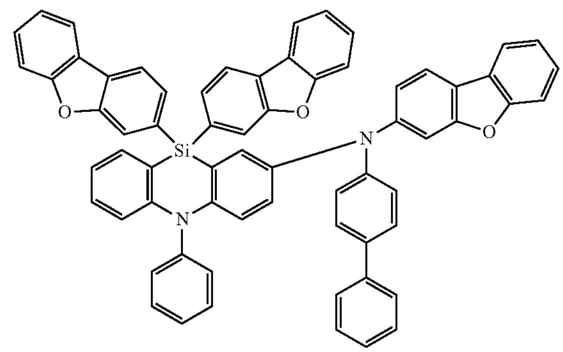
B119
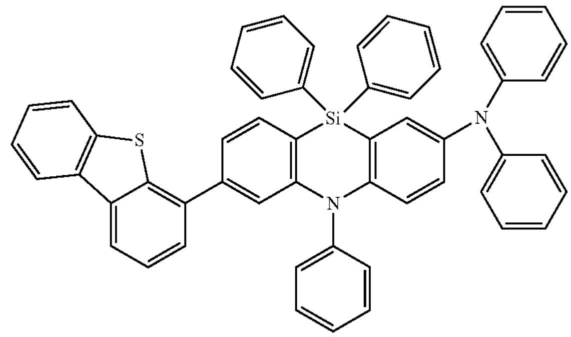
B120
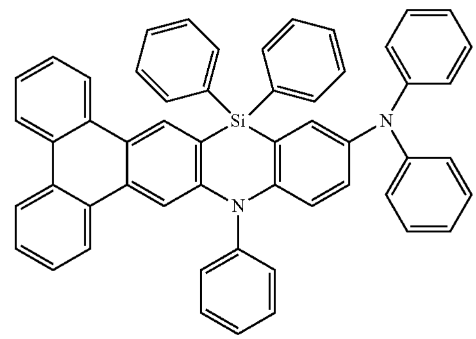

-continued

B121

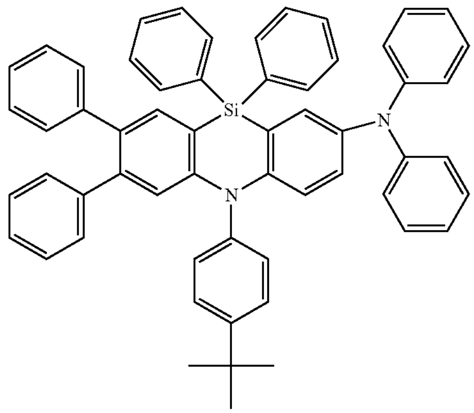

B122

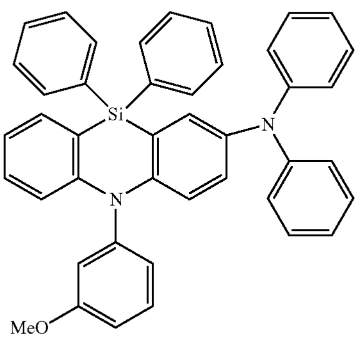

In the organic electroluminescence device 10 according to an example embodiment shown in FIGS. 1 to 3, the hole transport region HTR may include one or more of the amine compound represented in Compound Groups A and B. The hole transport region HTR may further include a suitable material in addition to the amine compound represented in Compound Groups A and B.

In case the organic electroluminescence device 10 according to an example embodiment includes a plurality of layers in the hole transport region HTR, at least one layer among the plurality of layers included in the hole transport region HTR may include the above-described amine compound according to an example embodiment. For example, the above-described amine compound according to an example embodiment may be included in the layer adjacent to the emission layer EML among the plurality of layers included in the hole transport region HTR. The layers that do not include the amine compound according to an example embodiment among the plurality of layers may include a suitable hole injection material or a suitable hole transport material. In addition, the layer which includes the amine compound according to an example embodiment may further include a suitable hole injection material or a suitable hole transport material.

For example, the amine compound according to an example embodiment may be included in the hole transport layer HTL of the hole transport region HTR. Furthermore, in case the hole transport layer HTL includes a plurality of organic layers, the amine compound according to an example embodiment may be included in the layer adjacent to the emission layer EML among the plurality of organic layers.

For example, in case the organic electroluminescence device 10 according to an example embodiment includes the hole injection layer HIL and the hole transport layer HTL in the hole transport region HTR, the amine compound according to an example embodiment may be included in the hole transport layer HTL. In case the organic electroluminescence device 10 according to an example embodiment includes the hole injection layer HIL, the hole transport layer HTL and the electron blocking layer EBL in the hole transport region HTR, the amine compound according to an example embodiment may be included in the electron blocking layer EBL.

In the organic electroluminescence device 10 according to an example embodiment, in case the hole transport layer HTL include the amine compound according to an example embodiment, the hole injection layer HIL may include a suitable hole injection material. For example, the hole injection layer HIL may include triphenylamine-containing polyether ketone (TPAPEK), 4-isopropyl-4'-methyldiphenyliodonium tetrakis(pentafluorophenyl) borate (PPBI), N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4"-tris(N,N-diphenylamino)triphenylamine (TDATA), 4,4',4"-tris(N,N-2-naphthyl phenylamino)-triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), dipyrazino[2,3-f:2',3'-h] quinoxaline-2,3,6,7,10,11-hexacarbonitrile (HAT-CN), 4,4',4"-tris(N-(1-naphthyl)-N-phenylamino)-triphenylamine (1-TNATA), etc.

In the organic electroluminescence device 10 according to an example embodiment, the hole transport layer HTL may further include a suitable hole transport material in addition to the amine compound according to an example embodiment. For example, the hole transport layer HTL may include 1,1-bis[(di-4-tolylamino)phenyl]cyclohexane (TAPC), carbazole derivatives such as N-phenyl carbazole, polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalen-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), etc.

As described above, in the organic electroluminescence device 10 according to an example embodiment, the hole transport region HTR may further include at least one of a hole buffer layer or an electron blocking layer EBL in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer.

In case the hole transport region HTR further includes the electron blocking layer EBL disposed between the hole transport layer HTL and the emission layer EML, the electron blocking layer EBL may prevent electron injection from the electron transport region ETR into the hole transport region HTR.

In the organic electroluminescence device 10 according to an example embodiment, in case the hole transport region HTR include the electron blocking layer EBL, the electron blocking layer EBL may include the amine compound according to an example embodiment. The electron blocking layer EBL may further include a suitable material in the art in addition to the amine compound according to an example embodiment. The electron blocking layer EBL may include, for example, carbazole derivatives such as N-phenyl carbazole, polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalen-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD) or mCP, etc.

In the organic electroluminescence device 10 according to an example embodiment, in case the hole transport region HTR has a single layer, the hole transport region HTR may include the amine compound according to an example embodiment. In this case, the hole transport region HTR may further include a suitable hole injection material, or a suitable hole transport material.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. In case the thicknesses of the hole transport region HTR, the hole injection layer HIL, the hole transport layer HTL and the electron blocking layer EBL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds. For example, non-limiting examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide and molybdenum oxide.

The emission layer EML is on the hole transport region HTR. The thickness of the emission layer EML may be, for example, from about 100 Å to about 300 Å. The emission layer EML may have a single layer formed using a single material, a single layer formed using a plurality of different materials, or a multilayer structure having a plurality of layers formed using a plurality of different materials.

The emission layer EML may emit one of red light, green light, blue light, white light, yellow light, or cyan light. The emission layer EML may include a fluorescent material or a phosphorescent material.

In the organic electroluminescence device 10 according to an example embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

The emission layer EML may include anthracene derivatives represented by the following Formula 3.

[Formula 3]

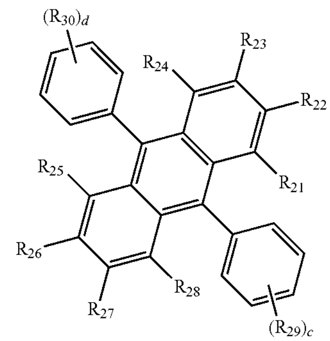

In Formula 3, $R_{21}$ to $R_{30}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms, or may form a ring by combining adjacent groups with each other. Meanwhile, $R_{21}$ to $R_{30}$ may form a saturated hydrocarbon ring or an unsaturated hydrocarbon ring by combining adjacent groups with each other.

In Formula 3, c and d may each independently be an integer of 0 to 5.

The compound represented by Formula 3 may be any one of the compounds represented by the following Formulae 3-1 to 3-12.

3-1

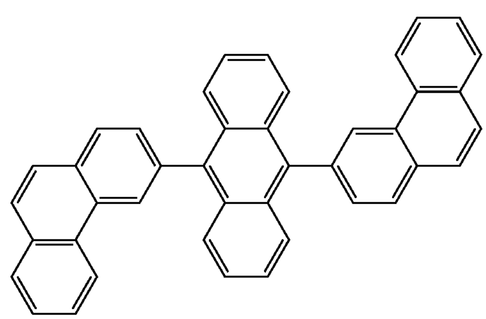

3-2

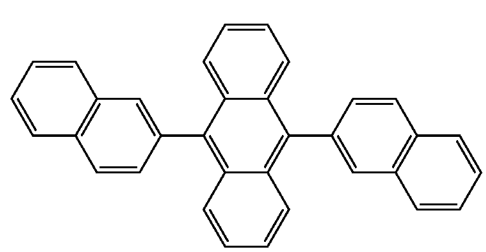

-continued
3-3
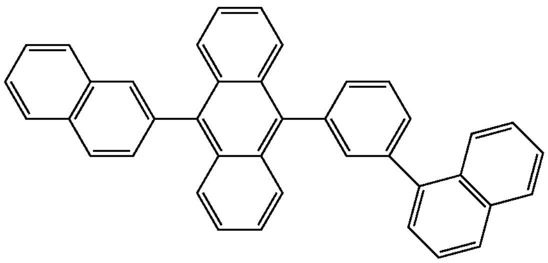
3-4
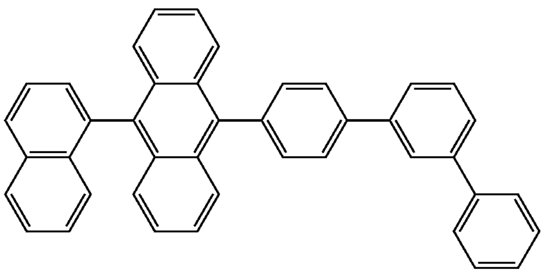
3-5
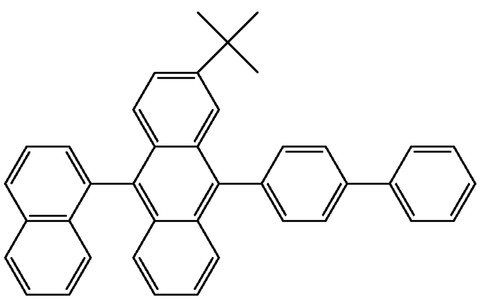
3-6
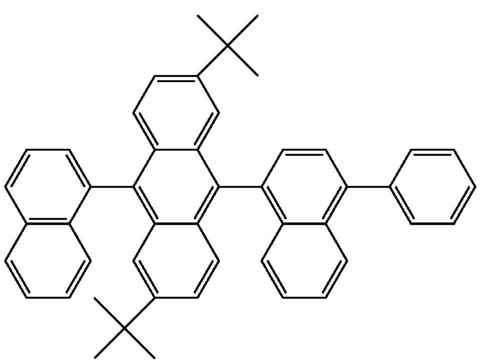
3-7
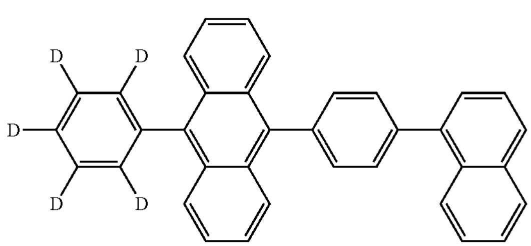
-continued
3-8
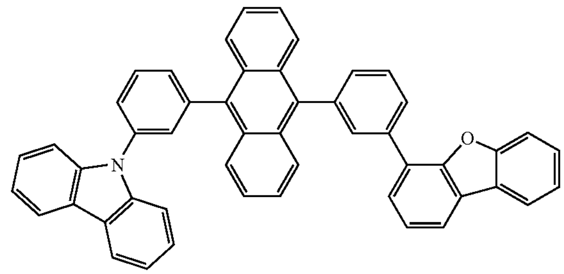
3-9
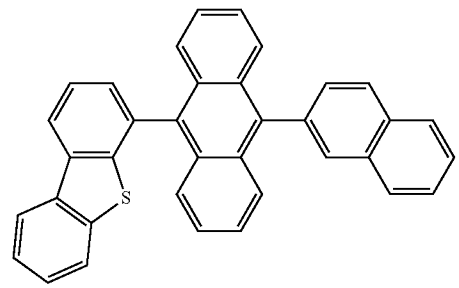
3-10
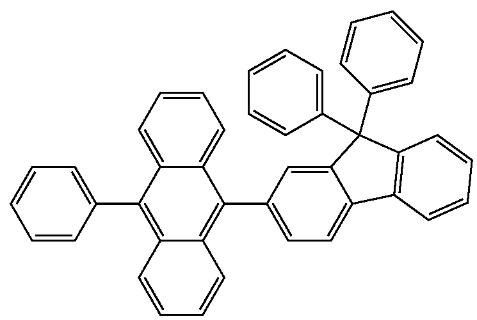
3-11
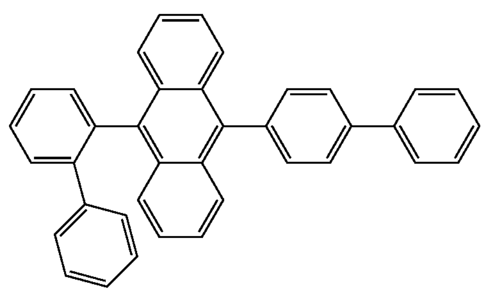
3-12
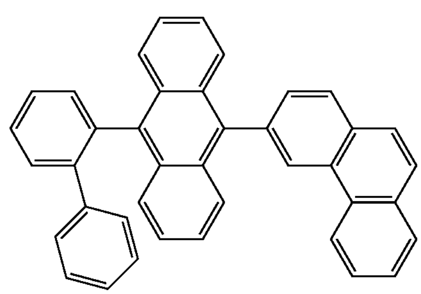
In the organic electroluminescence device 10 according to an example embodiment as shown in FIGS. 1 to 3, the emission layer EML may include a host and a dopant, and the emission layer EML may include the above-described compound represented by Formula 3 as a host material.

The emission layer EML may further include a suitable material as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TcTa) or 1,3,5-tris(N-phenylbenzimidazole-2-yl)benzene (TPBi). For example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc. may be used as a host material.

In an example embodiment, the emission layer EML may include, as a suitable dopant material, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

When the emission layer EML emits red light, the emission layer EML may further include, for example, tris(dibenzoylmethanato)phenanthroline europium (PBD:Eu$(DBM)_3$(Phen)), or a fluorescent material including perylene. In case the emission layer EML emits red light, the dopant included in the emission layer EML may be selected from a metal complex or an organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), rubrene and the derivatives thereof, or 4-dicyanomethylene-2-(p-dimethylaminostyryl)-6-methyl-4H-pyran (DCM) and the derivatives thereof.

When the emission layer EML emits green light, the emission layer EML may further include a fluorescent material including, for example, tris(8-hydroxyquinolino)aluminum (Alq3). In case the emission layer EML emits green light, the dopant included in the emission layer EML may be selected from a metal complex or organometallic complex such as fac-tris(2-phenylpyridine)iridium (Ir(ppy)3), or coumarin and the derivatives thereof.

When the emission layer EML emits blue light, the emission layer EML may further include a fluorescent material including at least one selected from the group consisting of, for example, spiro-DPVBi, spiro-6P, distyrylbenzene (DSB) distyryl-arylene (DSA), a polyfluorene (PFO)-based polymer, and a poly(p-phenylene vinylene) (PPV)-based polymer. In case the emission layer EML emits blue light, the dopant included in the emission layer EML may be selected from a metal complex or an organometallic complexes such as (4,6-F2ppy)2Irpic, or perylene and the derivatives thereof.

In the organic electroluminescence device 10 according to an example embodiment, the emission layer EML may emit blue light or green light. The emission layer EML may emit blue light having a wavelength range of 450 nm to 480 nm, or green light having a wavelength range of 490 nm to 560 nm.

In the organic electroluminescence device 10 according to an example embodiment, the electron transport region ETR is provided on the emission layer EML. The electron transport region ETR may include at least one of a hole blocking layer HBL, an electron transport layer ETL or an electron injection layer EIL.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In addition, the electron transport region ETR may have a single layer structure having a plurality of different materials, or a laminated structure of electron transport layer ETL/electron injection layer EIL, or hole blocking layer HBL/electron transport layer ETL/electron injection layer EIL, laminated in order from the emission layer EML. The thickness of the electron transport region ETR may be, for example, from about 100 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In case the electron transport region ETR includes the electron transport layer ETL, the electron transport region ETR may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAlq), berylliumbis(benzoquinolin-10-olate) ($Bebq_2$), 9,10-di(naphthalen-2-yl)anthracene (ADN) and a mixture thereof.

In case the electron transport region ETR includes the electron transport layer ETL, the thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without substantial increase of a driving voltage.

When the electron transport region ETR includes the electron injection layer EIL, the electron transport region ETR may use LiF, 8-hydroxyquinolinolato-lithium (LIQ), $Li_2O$, BaO, NaCl, CsF, a metal in lanthanides such as Yb, or a metal halide such as RbCl, RbI and KI. The electron injection layer EIL also may be formed using a mixture material of an electron transport material and an insulating organometal salt. The organometal salt may be a material having an energy band gap of about 4 eV or more. Particularly, the organometal salt may include, for example, a metal acetate, a metal benzoate, a metal acetoacetate, a metal acetylacetonate, or a metal stearate.

In case the electron transport region ETR includes the electron injection layer EIL, the thickness of the electron injection layer EIL may be from about 1 Å to about 100 Å, for example, from about 3 Å to about 90 Å. If the thickness of the electron injection layer EIL satisfies the above described range, satisfactory electron injection properties may be obtained without inducing the substantial increase of a driving voltage.

The electron transport region ETR may include a hole blocking layer HBL, as described above. The hole blocking layer HBL may include, for example, at least one of 2,9-dimethyl-4,7-diphenyl-1,10-phenanthroline (BCP), or 4,7-diphenyl-1,10-phenanthroline (Bphen).

The second electrode EL2 is on the electron transport region ETR. The second electrode EL2 has conductivity. The second electrode EL2 may be formed by a metal alloy or a conductive compound. The second electrode EL2 may be a cathode. The second electrode EL2 may be a transmissive electrode, a transflective electrode or a reflective electrode. In case the second electrode EL2 is the transmissive electrode, the second electrode EL2 may be formed using transparent metal oxides, for example, ITO, IZO, ZnO, ITZO, etc.

In case the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed using the above-described materials and a transparent conductive layer formed using ITO, IZO, ZnO, ITZO, etc.

Although not shown, the second electrode EL2 may be connected with an auxiliary electrode. In case the second electrode EL2 is connected with the auxiliary electrode, the resistance of the second electrode EL2 may decrease.

In the organic electroluminescence device 10, according to the application of a voltage to each of the first electrode EL1 and the second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

In case the organic electroluminescence device 10 is a top emission type, the first electrode EL1 may be a reflective electrode, and the second electrode EL2 may be a transmissive electrode or a transflective electrode. In case the organic electroluminescence device 10 is a bottom emission type, the first electrode EL1 may be a transmissive electrode or a transflective electrode, and the second electrode EL2 may be a reflective electrode.

The organic electroluminescence device 10 according to an example embodiment may include a capping layer (not shown) on the second electrode EL2. The capping layer (not shown) may include, for example, α-NPD, NPB, TPD, m-MTDATA, Alq3, CuPc, N4,N4,N4',N4'-tetra(biphenyl-4-yl)biphenyl-4,4'-diamine (TPD15), 4,4',4"-tris(carbazol-9-yl)-triphenylamine (TCTA), N,N'-bis(naphthalen-1-yl), etc.

The above-described amine compound according to an example embodiment may be included in an organic layer other than the hole transport region HTR as a material for an organic electroluminescence device 10. The organic electroluminescence device 10 according to an example embodiment may include the above-described amine compound in at least one of organic layers disposed between the first electrode EL1 and the second electrode EL2 or in the capping layer (not shown) on the second electrode EL2.

The organic electroluminescence device 10 according to an example embodiment includes the above-described amine compound in the hole transport region HTR, and may provide high emission efficiency and an improved device life.

For example, the organic electroluminescence device 10 according to an example embodiment includes the amine compound according to an example embodiment in an organic layer adjacent to the emission layer among the plurality of organic layers of the hole transport region, which may help enable the hole transport region to maintain high hole transport capability and blocking electron transfer to secure improved emission efficiency.

The amine compound according to an example embodiment includes both a phenazasiline moiety and an arylamine moiety, which may provide excellent reliability. An organic electroluminescence device according to an example embodiment includes the amine compound having both a phenazasiline moiety and an arylamine moiety in the hole transport region, which may provide extended device life. Without being bound by theory, it is believed that the nitrogen atom included in the phenazasiline moiety enhances hole transport capability of the whole molecule of the amine compound to increase the chance of recombining holes and electrons in the emission layer of the organic electroluminescence device, which may enable the organic electroluminescence device according to an example embodiment to have improved emission efficiency and low driving voltage.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

1. Synthesis of Amine Compound

A synthesis of an amine compound according to an example embodiment will be explained in detail with reference to the exemplified synthetic methods of Compounds A4, A15, A45 and A53 in Compound Group A, and Compounds B4, B15 and B53 in Compound Group B.

(Synthesis of Compound A4)

Compound A4, an amine compound according to an example embodiment, may be synthesized as shown in the following Reaction scheme 1, for example.

[Reaction scheme 1]
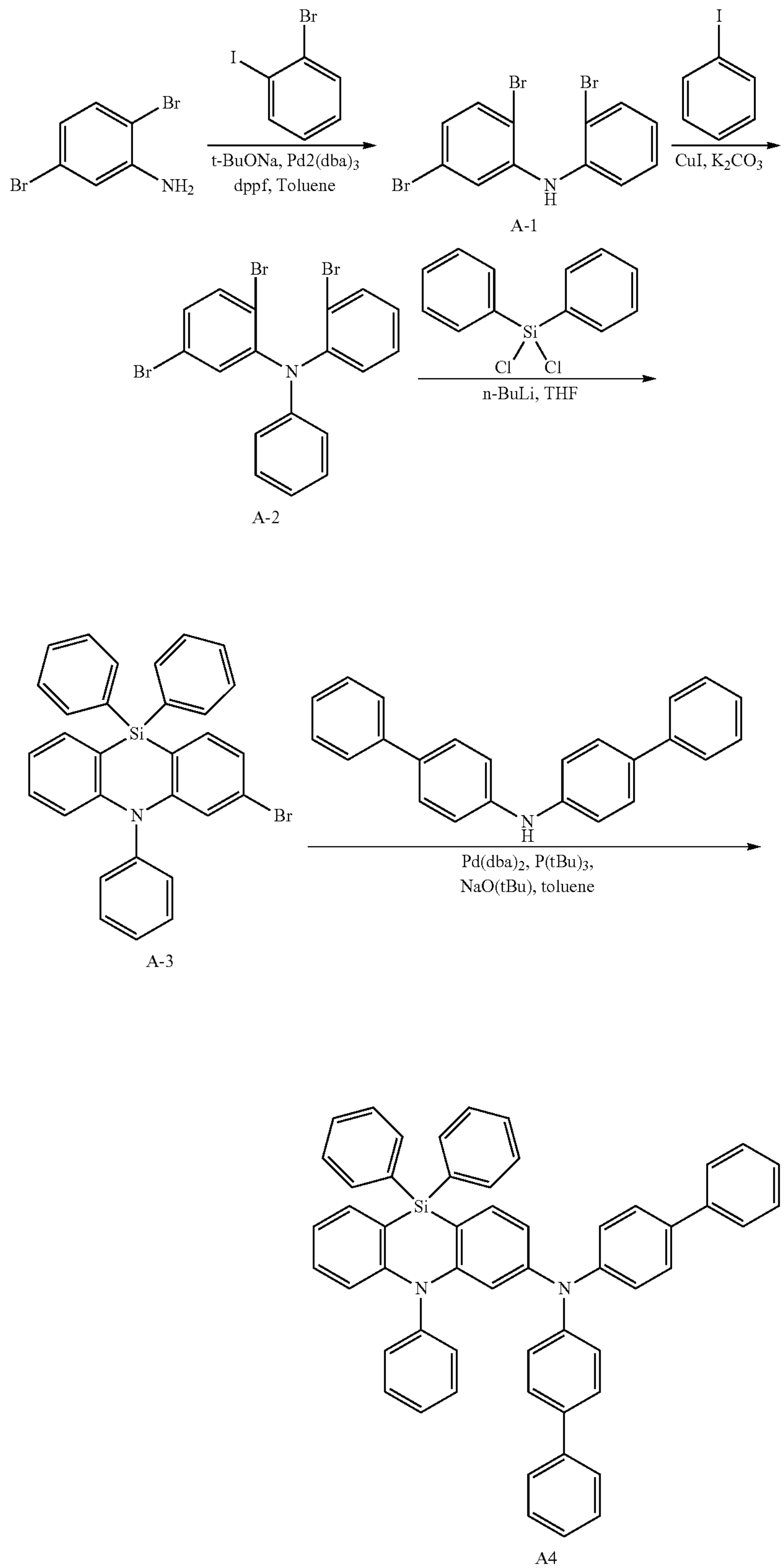

<Synthesis of Intermediate A-1>

Under an argon (Ar) atmosphere, 2,5-dibromoaniline (25.1 g, 100 mmol), t-BuONa (14.4 g, 150 mmol), and toluene (250 mL) were added to a 500 mL three-neck flask, and the mixture was stirred at room temperature for about 30 minutes. After adding 2-iodobenzene (28.3 g, 100 mmol), $Pd_2(dba)_3$ (0.46 g, 0.5 mmol), and 1,1'-bis(diphenylphosphino)ferrocene (dppf, 0.54 g, 1.0 mmol) in sequential order to the reaction solution, the mixture was stirred and heated to reflux for about 6 hours. After cooling in the air to room temperature, the reaction solution was filtered through Celite to remove insoluble residue and the filtrate was concentrated. The crude product thus obtained was purified by silica gel column chromatography (developing solvent: hexane/$CH_2Cl_2$=9:1) to obtain Intermediate A-1 (33.3 g, yield 82%) as a white solid. Intermediate A-1 was identified by measuring FAB-MS in which a molecular ion peak was observed at mass m/z=406.

<Synthesis of Intermediate A-2>

Under an argon atmosphere, Intermediate A-1 (30.8 g, 75.8 mmol), iodobenzene (77.3 g, 379 mmol), CuI (14.4 g, 75.8 mmol), and $K_2CO_3$ (21.0 g, 151.6 mmol) were added in sequential order to a 500 mL three-neck flask, and the mixture was stirred and heated at about 190° C. for about 72 hours. After cooling in the air to room temperature, the reaction solvent was evaporated. The crude product thus obtained was purified by silica gel column chromatography (developing solvent: hexane/$CH_2Cl_2$=9:1) to obtain Intermediate A-2 (39 g, yield 80%) as a white solid. Intermediate A-2 was identified by measuring FAB-MS in which a molecular ion peak was observed at mass m/z=482.

<Synthesis of Intermediate A-3>

Under an argon atmosphere, Intermediate A-2 (28.00 g, 58.0 mmol), and THF (290 mL) were added to a 500 mL three-neck flask, and the mixture was cooled to about −78° C. Next, n-butyl lithium (1.6 M, 72.5 mL, 31.8 mmol) was added thereto dropwise, followed by stirring at about −78° C. for about 30 minutes. Dichlorodiphenylsilane dissolved in THF (30 mL) was added thereto dropwise, and the mixture was stirred for about 1 hour. After cooling in the air to room temperature, the mixture was further stirred for about 2 hours, and then stirred and heated to reflux for about 1 hour. After cooling in the air to room temperature, water was added to the reaction solvent and an organic layer was separated and taken. Toluene was added to the remaining aqueous layer, followed by extraction of the aqueous layer to obtain another organic layer. Organic layers were combined and then dried over $MgSO_4$. $MgSO_4$ was filtered out and organic layer was concentrated. The crude product thus obtained was purified by silica gel column chromatography (developing solvent: hexane/$CH_2Cl_2$=9:1) to obtain Intermediate A-3 (16.10 g, yield 55%) as a white solid. Intermediate A-3 was identified by measuring FAB-MS in which a molecular ion peak was observed at mass m/z=504.

<Synthesis of Compound A4>

Under an argon atmosphere, Intermediate A-3 (8.02 g, 15.9 mmol), $Pd(dba)_2$ (0.27 g, 0.03 equiv, 0.5 mmol), NaOtBu (3.05 g, 2 equiv, 31.8 mmol), toluene (80 mL), bis(4-biphenyl)amine (5.62 g, 1.1 equiv, 17.5 mmol) and tBu3P (0.32 g, 0.1 equiv, 1.6 mmol) were added in sequential order to a 500 mL three-neck flask, and the mixture was stirred and heated to reflux for about 6 hour. After cooling in the air to room temperature, water was added to the reaction solvent and an organic layer was separated and taken. Toluene was added to the remaining aqueous layer, followed by extraction of the aqueous layer to obtain another organic layer. Organic layers were combined and washed with saline, and then dried over $MgSO_4$. $MgSO_4$ was filtered out and organic layer was concentrated. The crude product thus obtained was purified by silica gel column chromatography (using a mixture of hexane and toluene as developing solvent) to obtain Compound A4 (9.48 g, yield 80%) as a white solid. Compound A4 was identified by measuring FAB-MS in which a molecular ion peak was observed at mass m/z=745.

(Synthesis of Compound A15)

Compound A15, an amine compound according to an example embodiment, may be synthesized as shown in the following Reaction scheme 2, for example.

[Reaction scheme 2]

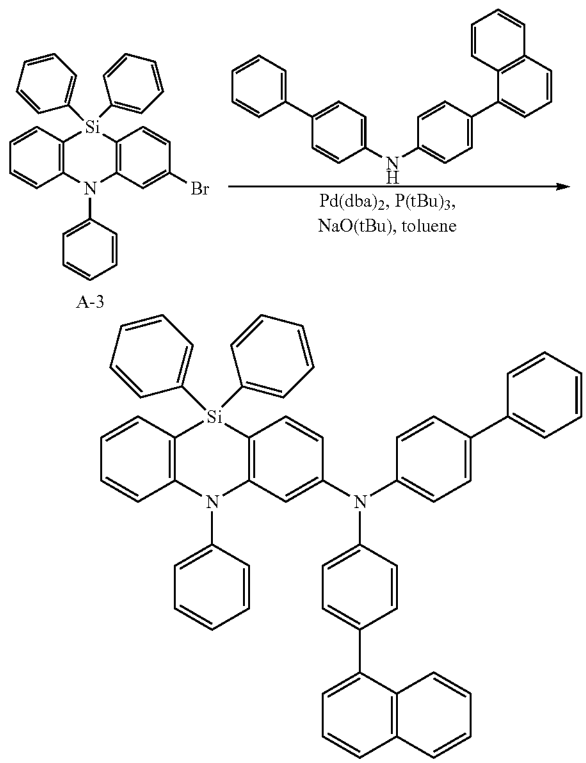

A15

Under an argon atmosphere, Intermediate A-3 (8.02 g, 15.9 mmol), $Pd(dba)_2$ (0.27 g, 0.03 equiv, 0.5 mmol), NaOtBu (3.05 g, 2 equiv, 31.8 mmol), toluene (80 mL), N-(4-(naphthalen-1-yl)phenyl)-[1,1'-biphenyl]-4-amine (6.50 g, 1.1 equiv, 17.5 mmol) and tBu3P (0.32 g, 0.1 equiv, 1.6 mmol) were added in sequential order to a 500 mL three-neck flask, and the mixture was stirred and heated to reflux for about 6 hour. After cooling in the air to room temperature, water was added to the reaction solvent and an organic layer was separated and taken. Toluene was added to the remaining aqueous layer, followed by extraction of the aqueous layer to obtain another organic layer. Organic layers were combined and washed with saline, and then dried over $MgSO_4$. $MgSO_4$ was filtered out and organic layer was concentrated. The crude product thus obtained was purified by silica gel column chromatography (using a mixture of hexane and toluene as developing solvent) to obtain Compound A15 (10.75 g, yield 85%) as a white solid. Compound A15 was identified by measuring FAB-MS in which a molecular ion peak was observed at mass m/z=795.

(Synthesis of Compound A45)

Compound A45, an amine compound according to an example embodiment, may be synthesized as shown in the following Reaction scheme 3, for example.

[Reaction scheme 3]

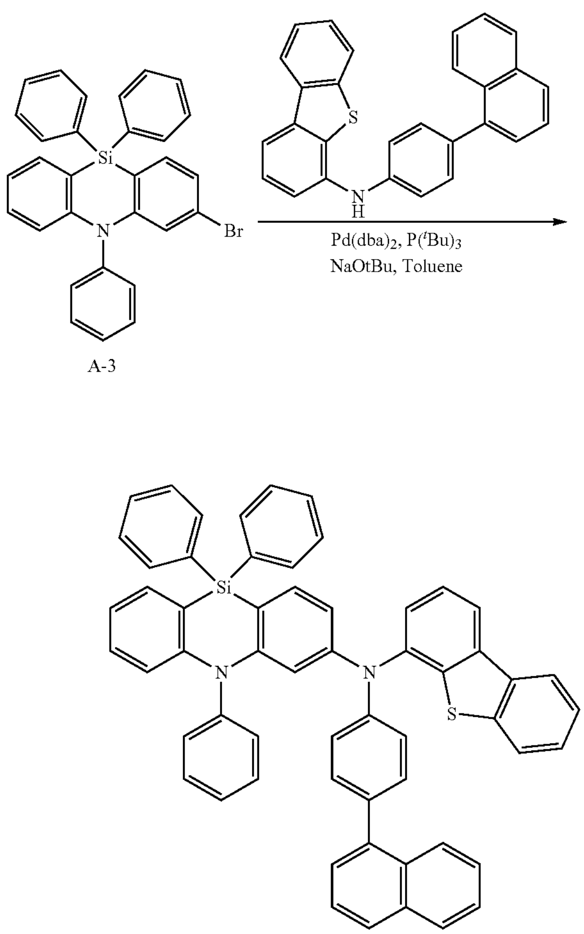

A45

Under an argon atmosphere, Intermediate A-3 (6.91 g, 13.7 mmol), $Pd(dba)_2$ (0.24 g, 0.03 equiv, 0.4 mmol), NaOtBu (2.63 g, 2 equiv, 27.4 mmol), toluene (69 mL), N-[4-(1-naphthalenyl)phenyl]-4-dibenzothiophenyl-4-amine (6.05 g, 1.1 equiv, 15.1 mmol) and tBu3P (0.28 g, 0.1 equiv, 1.4 mmol) were added in sequential order to a 500 mL three-neck flask, and the mixture was stirred and heated to reflux for about 6 hour. After cooling in the air to room temperature, water was added to the reaction solvent and an organic layer was separated and taken. Toluene was added to the remaining aqueous layer, followed by extraction of the aqueous layer to obtain another organic layer. Organic layers were combined and washed with saline, and then dried over $MgSO_4$. $MgSO_4$ was filtered out and organic layer was concentrated. The crude product thus obtained was purified by silica gel column chromatography (using a mixture of hexane and toluene as developing solvent) to obtain Compound A45 (8.93 g, yield 79%) as a white solid. Compound A45 was identified by measuring FAB-MS in which a molecular ion peak was observed at mass m/z=825.

(Synthesis of Compound A53)

Compound A53, an amine compound according to an example embodiment, may be synthesized as shown in the following Reaction scheme 4, for example.

[Reaction scheme 4]

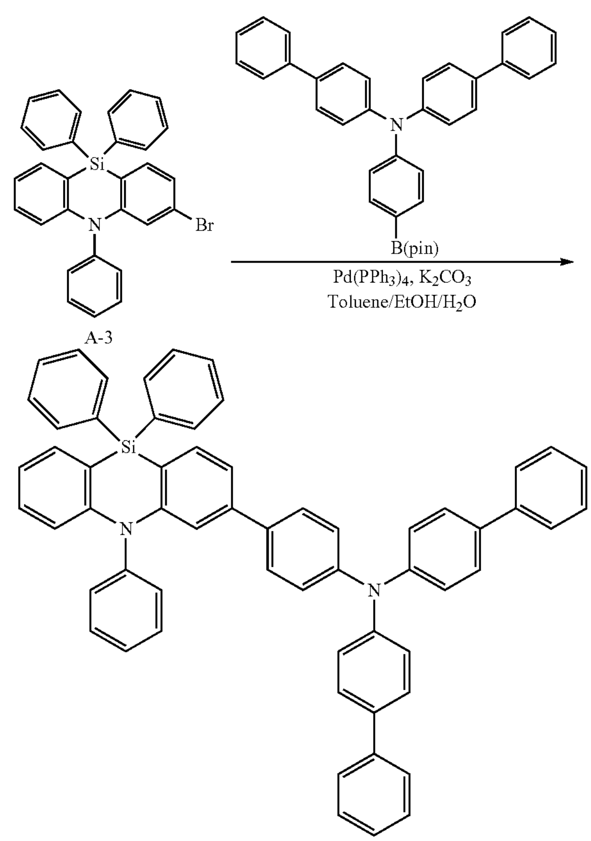

A53

Under an argon atmosphere, Intermediate A-3 (8.02 g, 15.9 mmol), N,N-di(4-biphenylyl)-4-(4,4,5,5-tetramethyl-1,3,2-dioxaborolan-2-yl)aniline (9.15 g, 1.1 equiv, 17.5 mmol), $K_2CO_3$ (6.59 g, 3 equiv, 47.7 mmol), $Pd(PPh_3)_4$ (0.92 g, 0.05 equiv, 0.8 mmol) and a mixture solution of toluene/EtOH/water (4/2/1) (110 mL) were added in sequential order to a 300 mL three-neck flask, and the mixture was stirred and heated at about 80° C. for about 5 hour. After cooling in the air to room temperature, the reaction solution was extracted with toluene. After removing aqueous layer, organic layer was washed with saline, and then dried over $MgSO_4$. $MgSO_4$ was filtered out and organic layer was concentrated. The crude product thus obtained was purified by silica gel column chromatography (using a mixture of hexane and toluene as developing solvent) to obtain Compound A53 (11.3 g, yield 87%) as a white solid. Compound A53 was identified by measuring FAB-MS in which a molecular ion peak was observed at mass m/z=821.

(Synthesis of Compound B4)

Compound B4, an amine compound according to an example embodiment, may be synthesized as shown in the following Reaction scheme 5, for example.

[Reaction scheme 5]

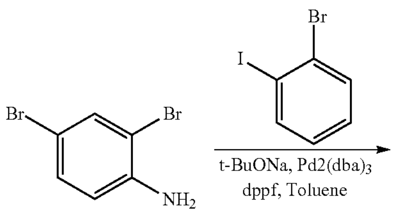

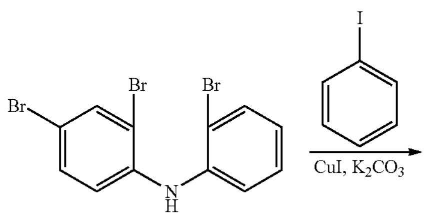

B-1

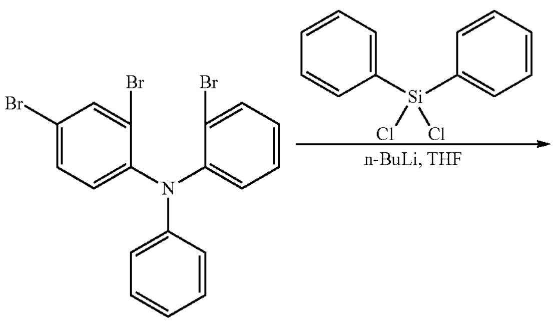

B-2

-continued

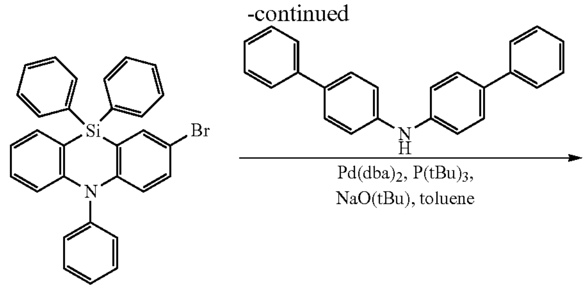

B-3

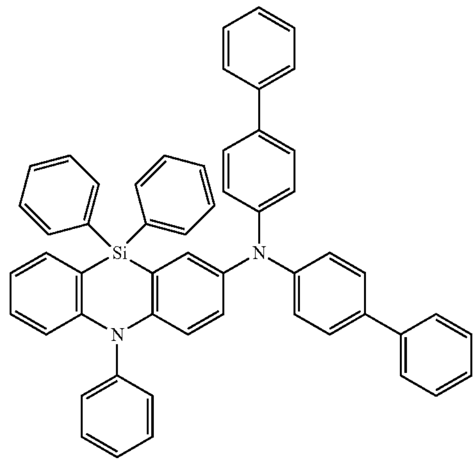

B4

Compound B4 was synthesized by conducting the same synthetic method of Compound A4 except for using 2,4-dibromoaniline instead of 2,5-dibromoaniline in the synthetic method of Compound A4. Compound B4 was identified by measuring FAB-MS in which a molecular ion peak was observed at mass m/z=745.

(Synthesis of Compound B15)

Compound B15, an amine compound according to an example embodiment, may be synthesized as shown in the following Reaction scheme 6, for example.

[Reaction scheme 6]

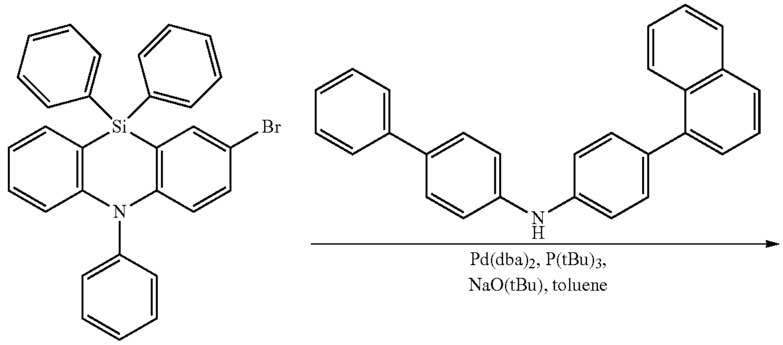

B-3

-continued

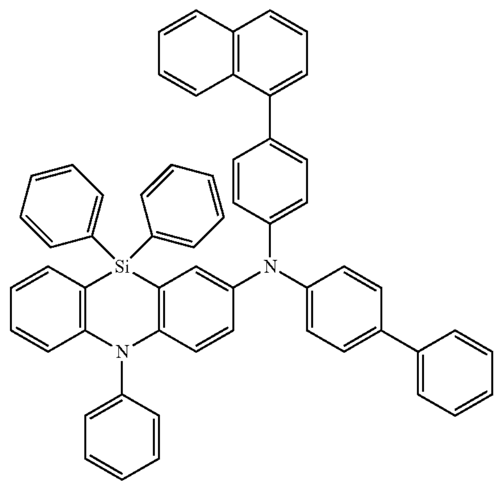

B15

Compound B15 was synthesized by conducting the same synthetic method of Compound A15 except for using Intermediate B-3 instead of Intermediate A-3 in the synthetic method of Compound A15. Compound B15 was identified by measuring FAB-MS in which a molecular ion peak was observed at mass m/z=795.

(Synthesis of Compound B53)

Compound B53, an amine compound according to an example embodiment, may be synthesized as shown in the following Reaction scheme 7, for example.

[Reaction scheme 7]

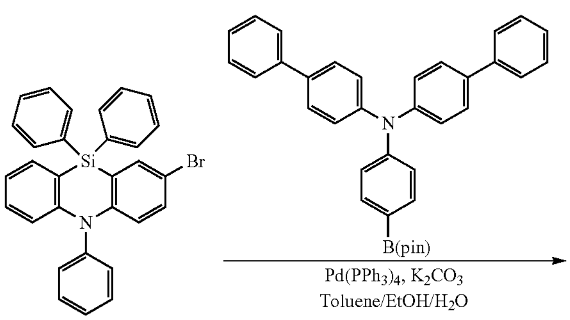

B-3

-continued

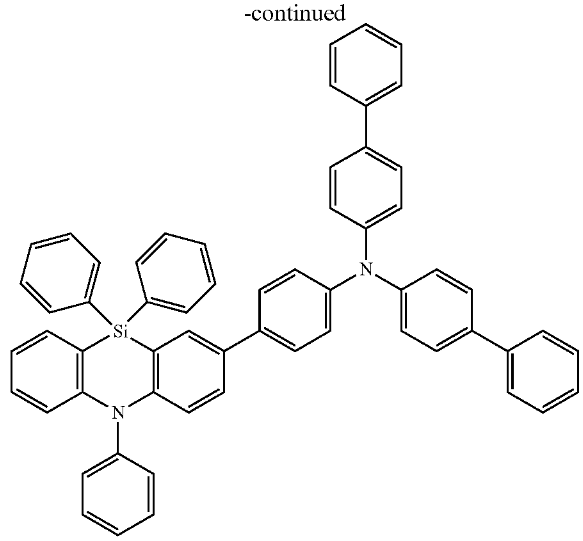

B53

Compound B53 was synthesized by conducting the same synthetic method of Compound A53 except for using Intermediate B-3 instead of Intermediate A-3 in the synthetic method of Compound A53. Compound B53 was identified by measuring FAB-MS in which a molecular ion peak was observed at mass m/z=821.

2. Manufacturing of Organic Electroluminescence Devices Including Amine Compounds and Evaluation Thereof (Manufacturing of Organic Electroluminescence Devices)

An organic electroluminescence device according to an example embodiment including an amine compound according to an example embodiment in the hole transport layer was manufactured by the following method. Organic electroluminescence devices of Examples 1 to 7 were manufactured by using the above-described Compounds A4, A15, A45, A53, B4, B15 and B53 as a material for hole transport layer. Organic electroluminescence devices of Comparative Examples 1 to 5 were manufactured by using the following Comparative Compounds R1 to R5 as a material for hole transport layer.

Table 1 shows the compounds used in the hole transport layer for Examples 1 to 7 and Comparative Examples 1 to 5.
TABLE 1
Compound A4
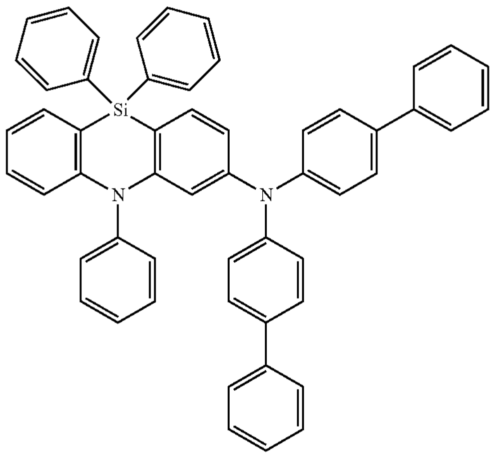
A4
Compound A15
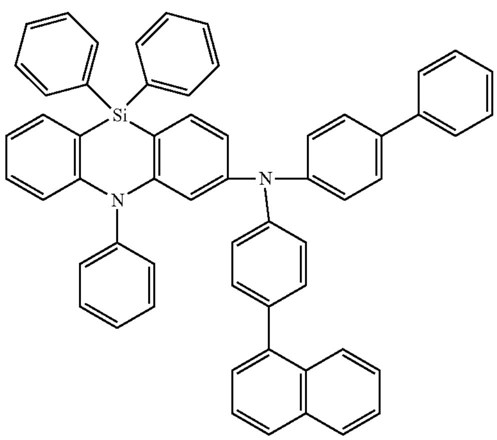
A15
Compound A45
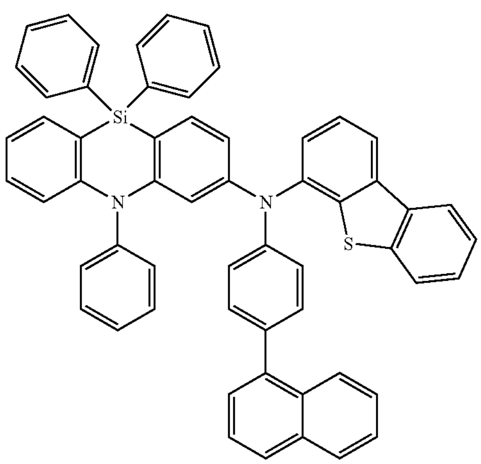
A45

TABLE 1-continued
Compound A53
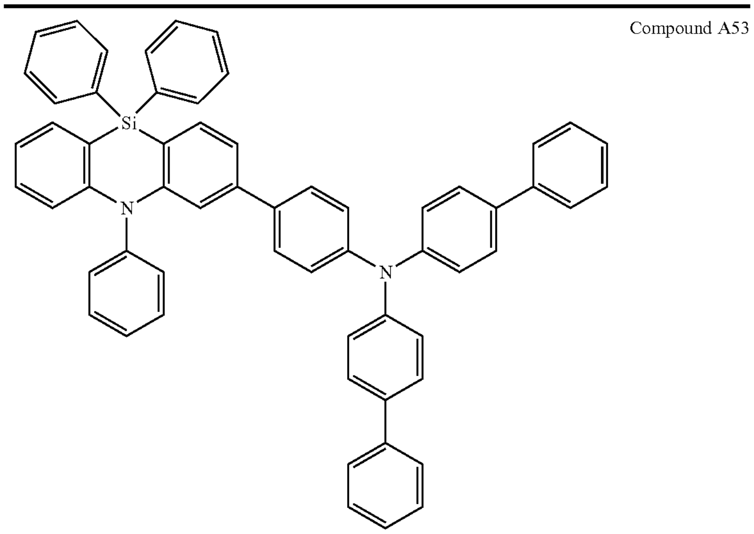
A53
Compound B4
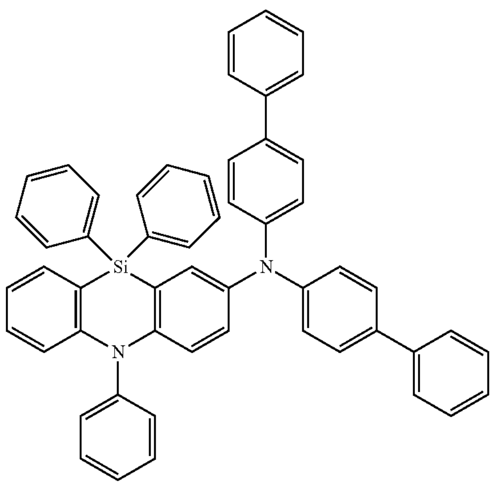
B4
Compound B15
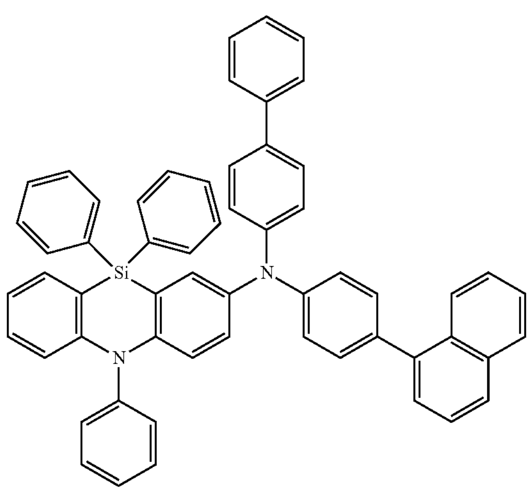
B15

TABLE 1-continued
Compound B53
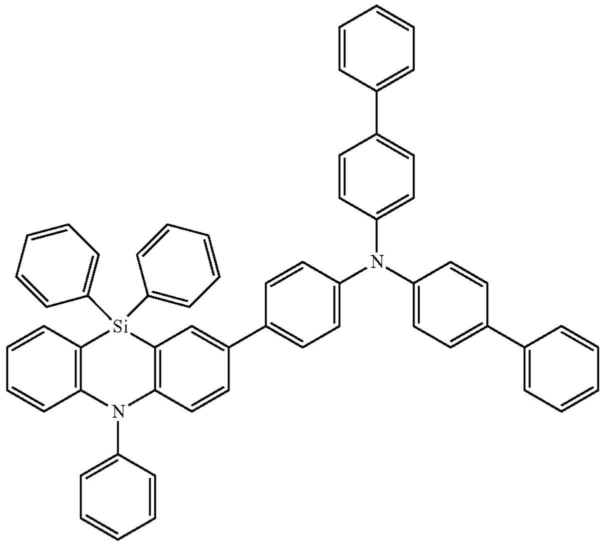
B53
Comparative
Compound R1
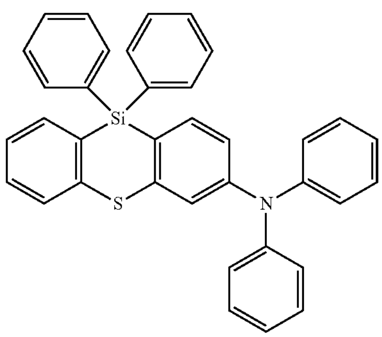
R1
Comparative
Compound R2
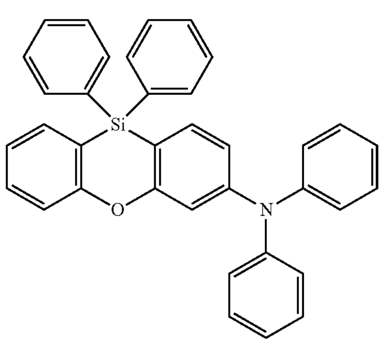
R2

TABLE 1-continued

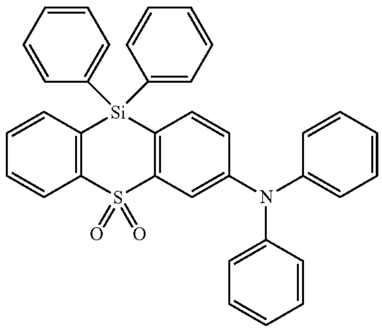

R3

Comparative Compound R3

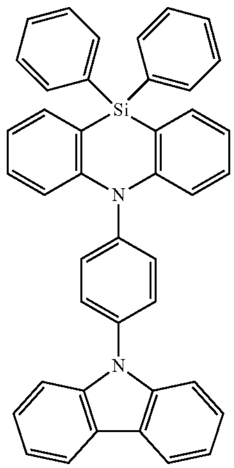

R4

Comparative Compound R4

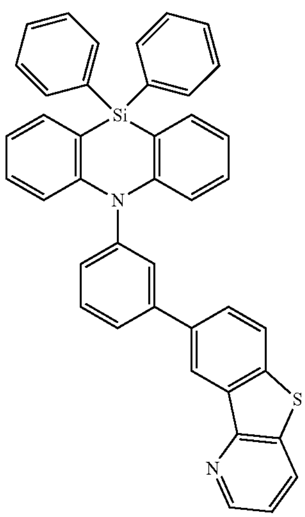

R5

Comparative Compound R5

ITO was patterned on a glass substrate to a thickness of about 1,500 Å, followed by washing with ultrapure water and performing UV ozone treatment for about 10 minutes. A hole injection layer was formed using 1-TNATA to a thickness of about 600 Å. After that, a hole transport layer was formed using the Example compounds or Comparative compounds to a thickness of about 300 Å.

Next, an emission layer was formed using ADN doped with 3% TBP to a thickness of about 250 Å. After that, an electron transport layer was formed using $Alq_3$ to a thickness of about 250 Å, and an electron injection layer was formed using LiF to a thickness of about 10 Å.

Next, a second electrode was formed using A1 to a thickness of about 1,000 Å.

The hole injection layer, hole transport layer, emission layer, electron transport layer, electron injection layer and second electrode were formed by using a vacuum deposition apparatus.

(Property Evaluation of Organic Electroluminescence Devices)

Property evaluation results of the organic electroluminescence devices manufactured in Examples 1 to 7 and Comparative Examples 1 to 5 are shown in Table 2 below. Table 2 shows a comparison of a driving voltage, emission efficiency and device life of the organic electroluminescence devices. In the property evaluation results of the organic electroluminescence devices as shown in Table 2, emission efficiency is a measured value at a current density of about 10 $mA/cm^2$, and device life means time required for a luminance half-time from an initial luminance of 1,000 $cd/m^2$.

The current density, voltage and emission efficiency of the organic electroluminescence devices manufactured in Examples and Comparative Examples were measured in a darkroom by using Source Meter 2400 series (Keithley Instruments), Chroma Meter CS-200 (Konica Minolta, Inc.) and PC Program LabVIEW 2.0 (Japan National Instruments Corporation).

TABLE 2

| Device manufacturing examples | Material for hole transport layer | Voltage (V) | Emission efficiency (cd/A) | Device life [LT50] (hrs) |
|---|---|---|---|---|
| Example 1 | Compound A4 | 5.7 | 8.1 | 2000 |
| Example 2 | Compound A15 | 5.8 | 7.7 | 2200 |
| Example 3 | Compound A45 | 5.6 | 7.6 | 2250 |
| Example 4 | Compound A53 | 5.7 | 7.6 | 2200 |
| Example 5 | Compound B4 | 5.6 | 7.9 | 2050 |
| Example 6 | Compound B15 | 5.8 | 7.8 | 2250 |
| Example 7 | Compound B53 | 5.8 | 7.8 | 2250 |
| Comparative Example 1 | Comparative Compound R1 | 6.0 | 6.2 | 1200 |
| Comparative Example 2 | Comparative Compound R2 | 6.0 | 6.0 | 1150 |
| Comparative Example 3 | Comparative Compound R3 | 5.9 | 6.1 | 1000 |
| Comparative Example 4 | Comparative Compound R4 | 5.9 | 6.5 | 1100 |
| Comparative Example 5 | Comparative Compound R5 | 6.1 | 6.0 | 1050 |

Referring to the results in Table 2, it can be seen that the organic electroluminescence devices of Examples, which used the amine compound according to an example embodiment as a material for the hole transport layer, had decreased driving voltage, enhanced efficiency, and extended device life. It can be seen that the organic electroluminescence devices of Examples 1 to 7 showed decreased driving voltage and enhanced emission efficiency, as well as remarkably improved half-life, when compared with those of Comparative Examples 1 to 5.

The amine compounds used in the Examples included a phenazasiline moiety having both of Si and N atoms in a condensed ring, and provided enhanced efficiency and extended life of a device using the compound. Furthermore, without being bound by theory, it is believed that the amine compounds used in Examples have increased amorphous property with the inhibition of crystallizability due to the amine group introduced into one side of the phenazasiline moiety; the asymmetry of the whole molecule according to an example embodiment may provide enhanced emission efficiency and extended device life when compared with, e.g., Comparative Compound R4. In addition, without being bound by theory, it is believed that the amine compounds used in Examples, which include a nitrogen atom in the phenazasiline condensed ring, further improve hole transport capability and increase the chance of recombining holes and electrons in the emission layer, thereby further enhancing emission efficiency of the organic electroluminescence device using the amine compounds.

Comparative compounds used in Comparative Examples 1 to 3, which are amine compounds with a condensed ring including Si as a heteroatom, have no nitrogen atom in the condensed ring, in contrast to the amine compounds used in Examples. The organic electroluminescence devices of Comparative Examples 1 to 3 showed decreased emission efficiency and short device life when compared with those of Examples. Without being bound by theory, it is believed that, in the amine compounds used in Examples, the nitrogen atom included in the condensed ring contributed to enhancing hole transport capability.

Comparative compounds used in Comparative Examples 4 and 5 have a phenazasiline moiety substituted with a heteroaryl group such as carbazole or benzothienopyridine. The organic electroluminescence devices of Comparative Examples 4 and 5 showed low emission efficiency and short device life when compared with those of Examples.

Referring to the results in Table 2, it may be seen that the organic electroluminescence devices of Examples which use the amine compound according to an example embodiment as a material for the hole transport layer had an extended device life and enhanced efficiency, when compared with those of Comparative Examples which use Comparative compounds as a material for the hole transport layer. The amine compound according to an example embodiment includes both a phenazasiline moiety and an arylamine moiety, and may improve the quality of layer with improved electron resistance and thermal stability due to the phenazasiline moiety while maintaining the characteristic of amine, and therefore, it may contribute to enhancing efficiency and life of the organic electroluminescence device.

By way of summation and review, development of a material for a hole transport layer which inhibits dispersal of exciton energy in an emission layer to implement an organic electroluminescence device with high efficiency is being investigated.

As described above, embodiments relate to an amine compound that may be used for a hole transport region and an organic electroluminescence device including the same.

An amine compound according to an example embodiment includes both a phenazasiline moiety and an arylamine moiety. The amine compound may exhibit a long life as well as provide enhanced efficiency of a device using the amine compound.

Without being bound by theory, it is believed that the amine compound according to an example embodiment has enhanced resistance to high temperature and electric charge due to a phenazasiline moiety having an excellent resistance to heat and electric charge to an arylamine moiety having an extended life property, and therefore, it may be used as a material for an organic electroluminescence device with further extended life. Furthermore, it is believed that the nitrogen atom included in the phenazasiline moiety enhances hole transport capability of the whole molecule of the amine compound to increase the chance of recombining holes and electrons in the emission layer of the organic electroluminescence device, which enables the organic electroluminescence device including the amine compound according to an example embodiment in the hole transport region to have enhanced emission efficiency.

The amine compound according to an example embodiment may improve emission efficiency and life of an organic electroluminescence device.

An organic electroluminescence device according to an example embodiment may include the amine compound according to an example embodiment, and may exhibit enhanced emission efficiency and extended life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescence device, comprising:
a first electrode;
a hole transport region that is on the first electrode and includes an amine compound represented by the following Formula 1;
an emission layer on the hole transport region;
an electron transport region on the emission layer; and
a second electrode on the electron transport region:

[Formula 1]

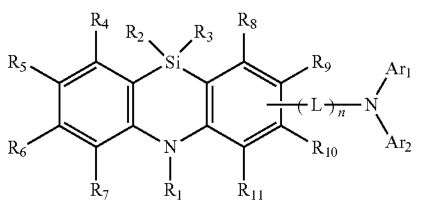

in Formula 1,
$R_1$ is a substituted or unsubstituted aryl group having 6 to 40 ring carbon atoms,
$R_2$ and $R_3$ are each independently a substituted or unsubstituted aryl group having 6 to 40 ring carbon atoms, or a substituted or unsubstituted heteroaryl group having 2 to 40 ring carbon atoms,
$R_4$ to $R_{11}$ are each independently a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, or form a ring by combining adjacent groups with each other,
$Ar_1$ and $Ar_2$ are each independently a substituted or unsubstituted aryl group having 6 to 40 ring carbon atoms, or a substituted or unsubstituted heteroaryl group having 2 to 40 ring carbon atoms,
L is a direct linkage, a substituted or unsubstituted arylene group having 6 to 30 ring carbon atoms, or a substituted or unsubstituted heteroarylene group having 2 to 30 ring carbon atoms, and
n is an integer of 1 to 4.

2. The organic electroluminescence device as claimed in claim 1, wherein:
the hole transport region includes a hole injection layer disposed between the first electrode and the emission layer and a hole transport layer disposed between the hole injection layer and the emission layer; and
the hole transport layer includes the amine compound represented by Formula 1.

3. The organic electroluminescence device as claimed in claim 1, wherein Formula 1 is represented by the following Formula 1-1 or 1-2:

[Formula 1-1]

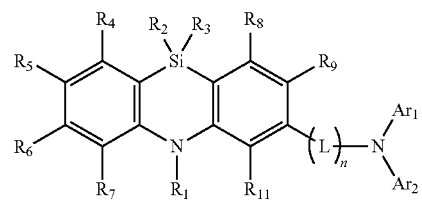

[Formula 1-2]

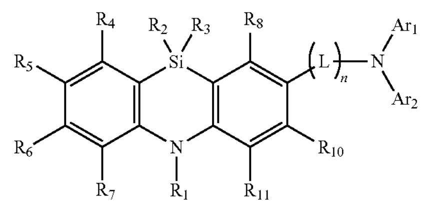

in Formula 1-1 and Formula 1-2, $R_1$ to $R_{11}$, $Ar_1$, $Ar_2$, L, and n are the same as defined in Formula 1.

4. The organic electroluminescence device as claimed in claim 1, wherein Formula 1 is represented by the following Formula 2-1 or 2-2:

[Formula 2-1]

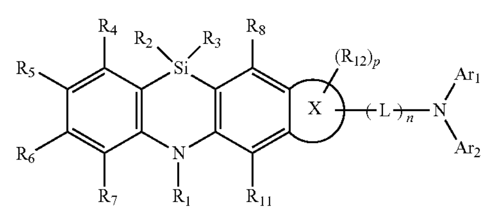

[Formula 2-2]

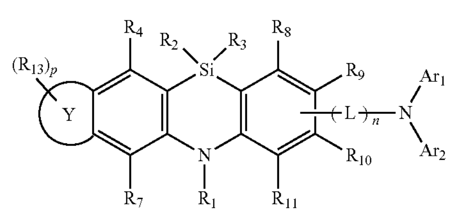

in Formula 2-1 and Formula 2-2,
X and Y are each independently a hydrocarbon ring having 6 to 40 ring carbon atoms, or a heterocycle having 2 to 40 ring carbon atoms,
$R_{12}$ and $R_{13}$ are each independently a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, p and q are each independently an integer of 0 to 3, and $R_1$ to $R_{11}$, $Ar_1$, $Ar_2$, L, and n are the same as defined in Formula 1.

5. The organic electroluminescence device as claimed in claim 4, wherein Formulae 2-1 and 2-2 are represented by the following Formulae 2-1A and 2-2A, respectively:

[Formula 2-1A]

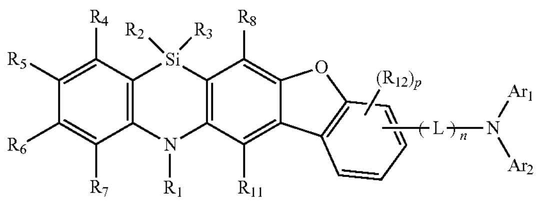

[Formula 2-2A]

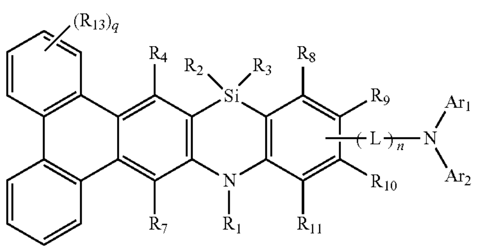

in Formula 2-1A and Formula 2-2A, $R_{12}$ and p are the same as defined in Formula 2-1, $R_{13}$ and q are the same as defined in Formula 2-2, and $R_1$ to $R_{11}$, $Ar_1$, $Ar_2$, L, and n are the same as defined in Formula 1.

6. The organic electroluminescence device as claimed in claim 1, wherein $R_1$ is an unsubstituted phenyl group.

7. The organic electroluminescence device as claimed in claim 1, wherein $R_2$ and $R_3$ are each independently an unsubstituted phenyl group, an unsubstituted dibenzofuranyl group, or an unsubstituted dibenzothiophenyl group.

8. The organic electroluminescence device as claimed in claim 1, wherein $Ar_1$ and $Ar_2$ are each independently a substituted or unsubstituted phenyl group, a substituted or unsubstituted naphthyl group, a substituted or unsubstituted phenanthrenyl group, a substituted or unsubstituted biphenyl group, a substituted or unsubstituted terphenyl group, a substituted or unsubstituted benzofuranyl group, a substituted or unsubstituted dibenzofuranyl group, a substituted or unsubstituted benzothiophenyl group, a substituted or unsubstituted dibenzothiophenyl group, a substituted or unsubstituted pyridinyl group, a substituted or unsubstituted quinolinyl group, or a substituted or unsubstituted fluorenyl group.

9. The organic electroluminescence device as claimed in claim 1, wherein the emission layer includes an anthracene derivative represented by the following Formula 3:

[Formula 3]

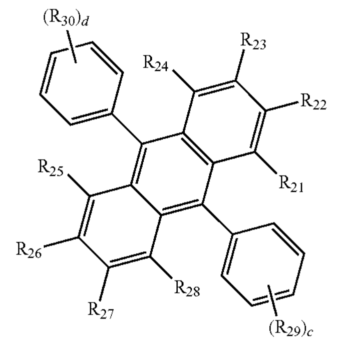

in Formula 3, $R_{21}$ to $R_{30}$ are each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms, or form a ring by combining adjacent groups with each other, and c and d are each independently an integer of 0 to 5.

10. The organic electroluminescence device as claimed in claim 1, wherein the hole transport region includes at least one selected from the group of compounds represented in the following Compound Groups A and B:

[Compound Group A]

A1

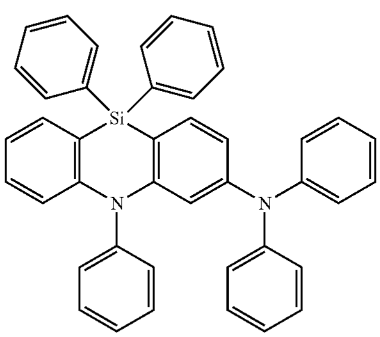

A2

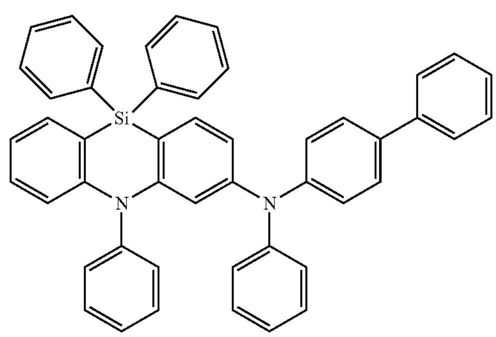

-continued
A3
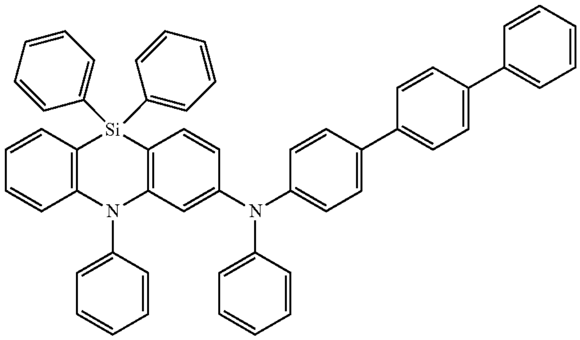
A4
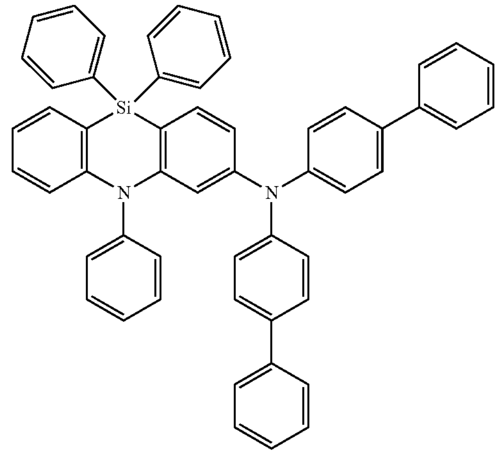
A5
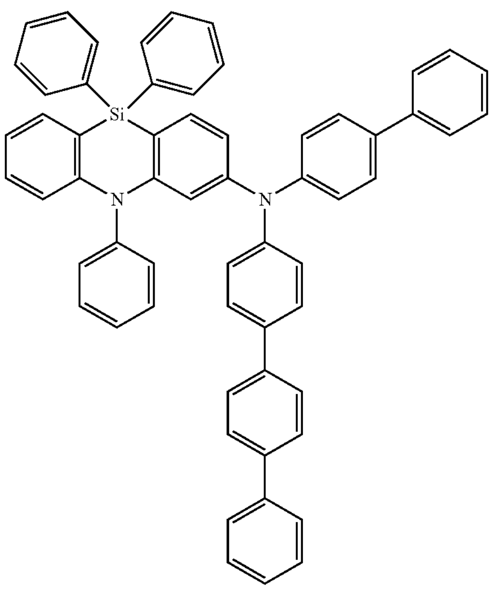
A6
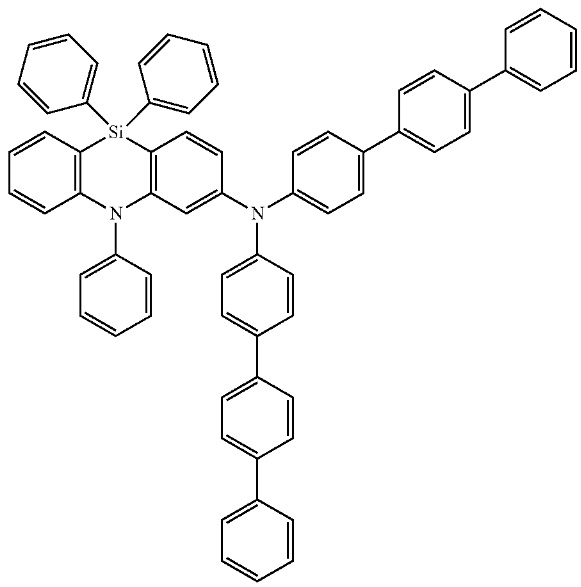
A7
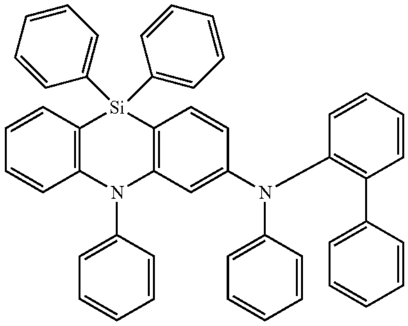
A8
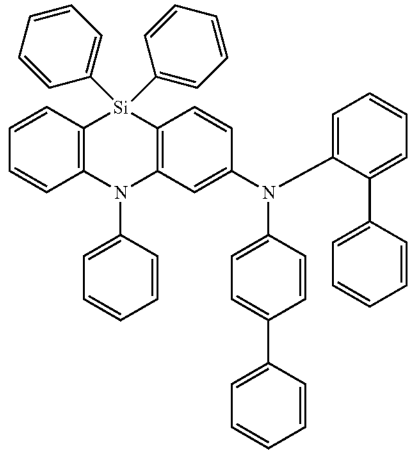

-continued
A9
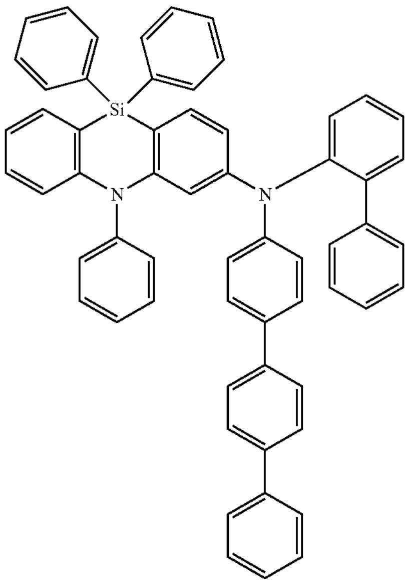
A10
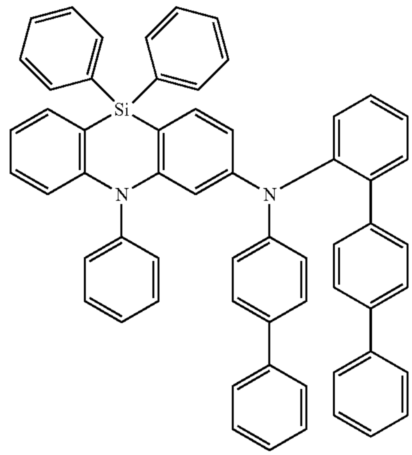
A11
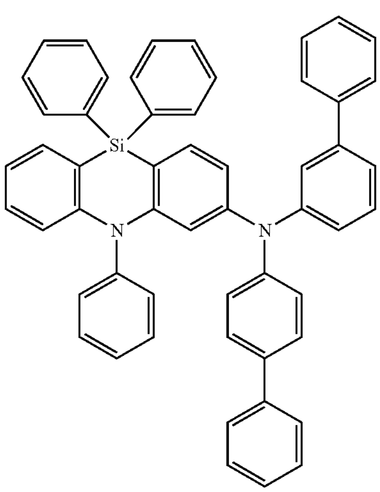
A12
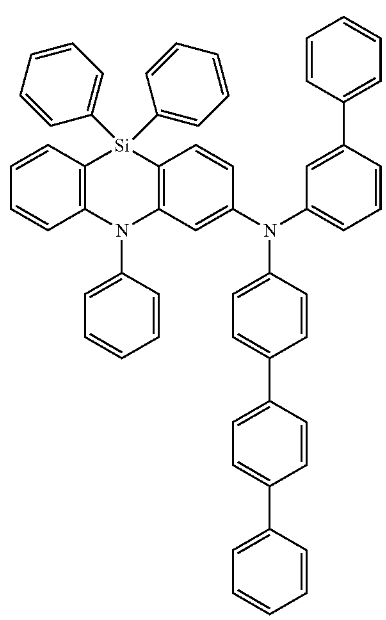

-continued
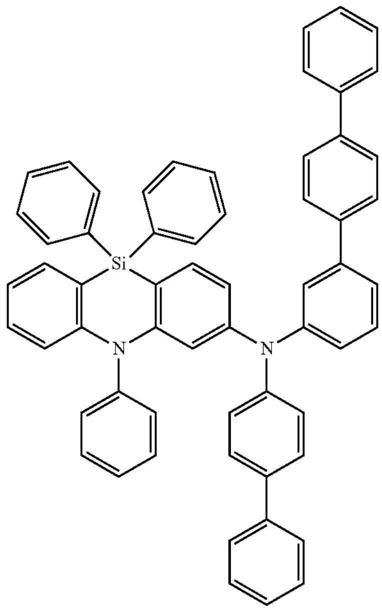
A13
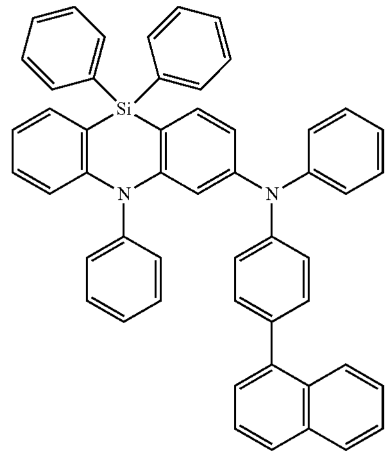
A14
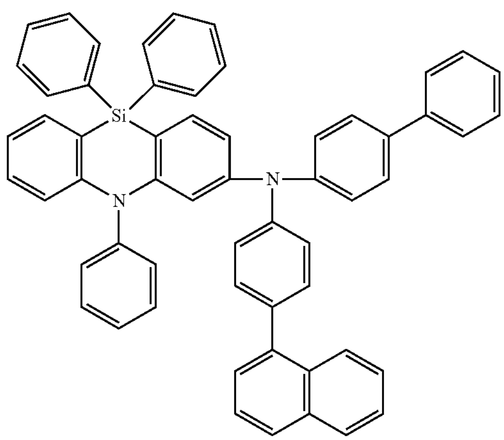
A15
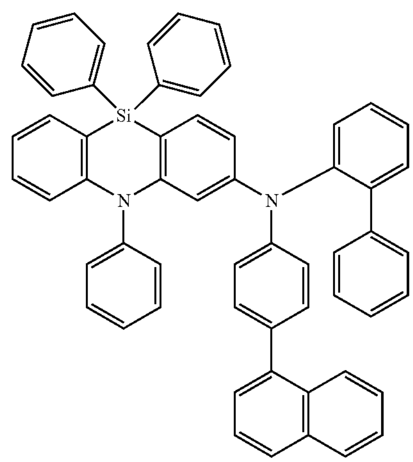
A16
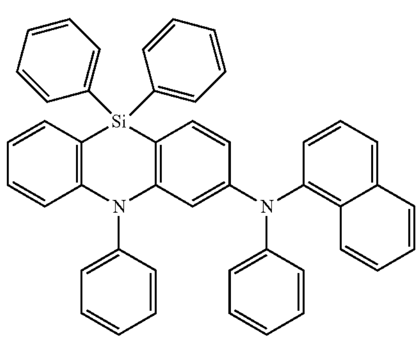
A17
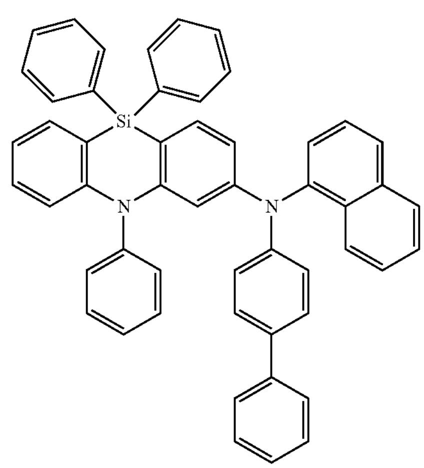
A18

-continued
A19
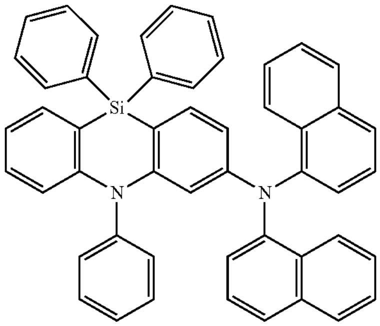
A20
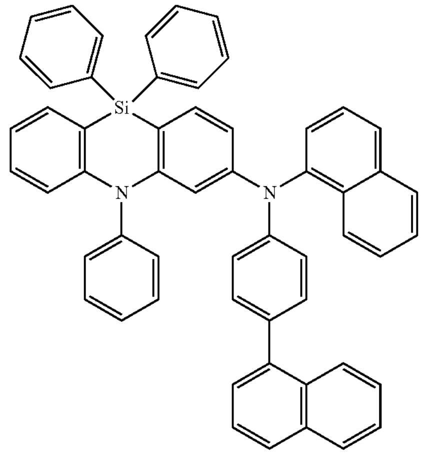
A21
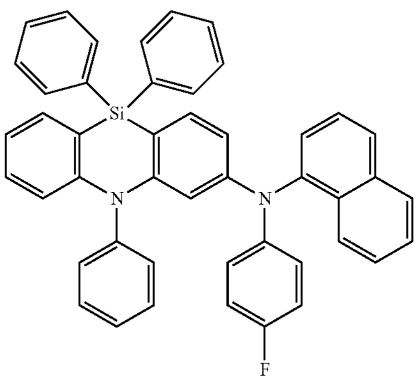
A22
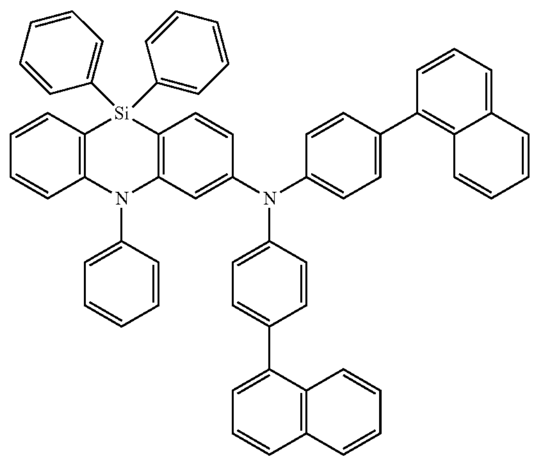
A23
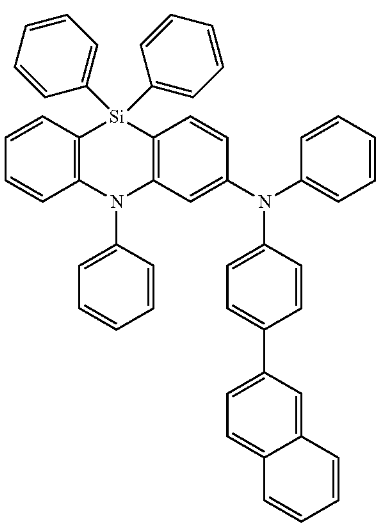
A24
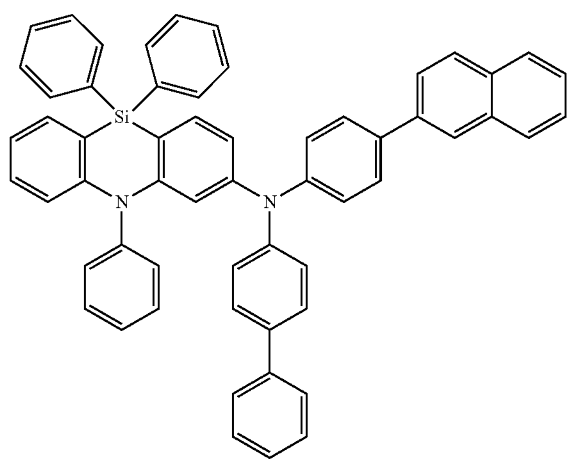

-continued
A25
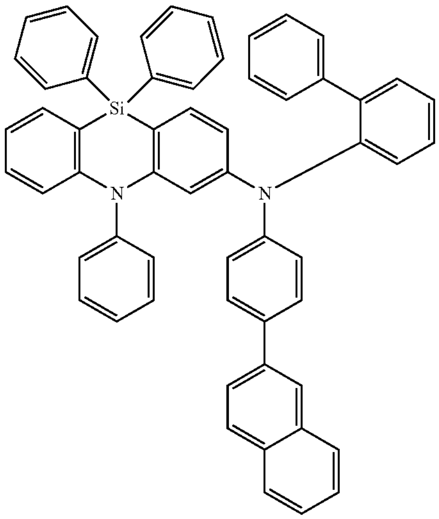
A26
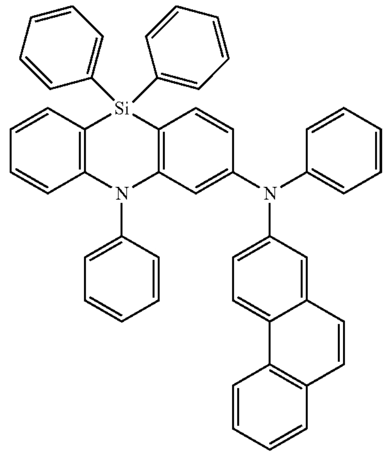
A27
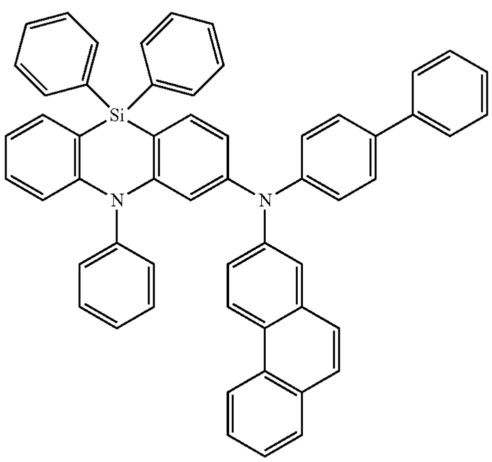
A28
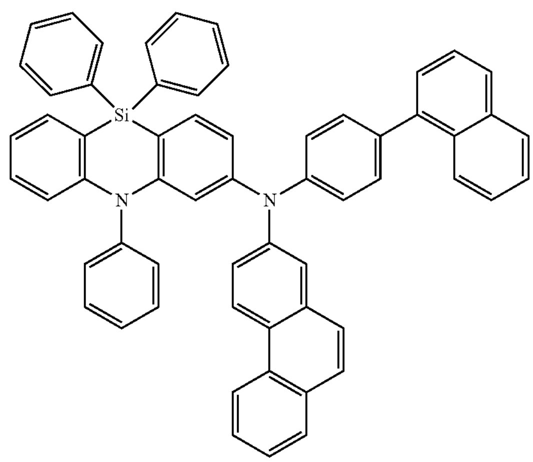
A29
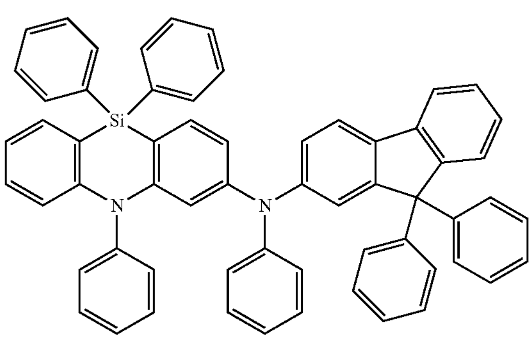
A30
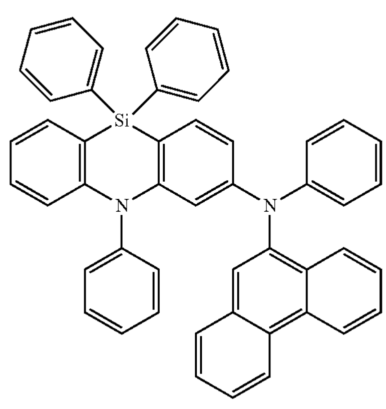

-continued
A31
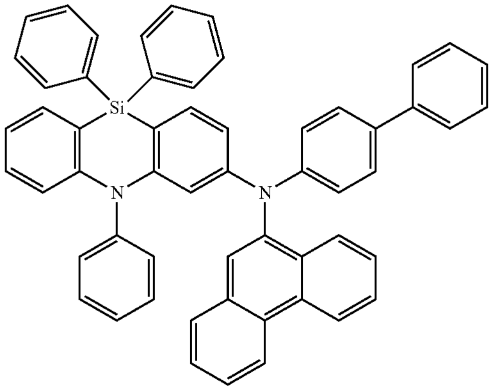
A32
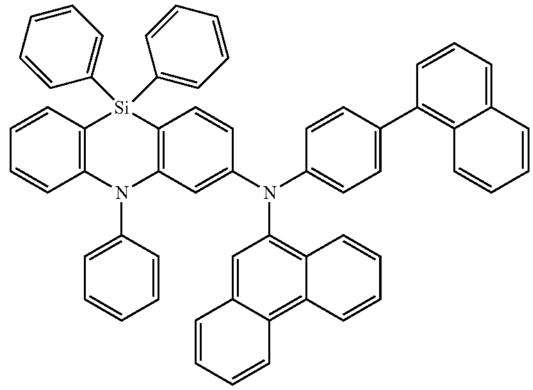
A33
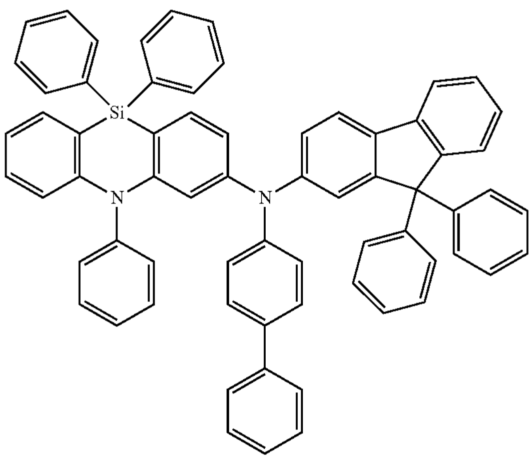
A34
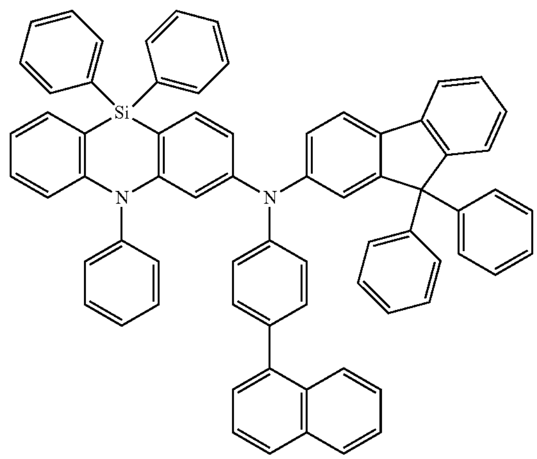
A35
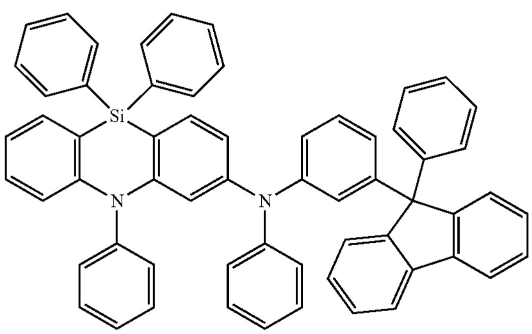
A36
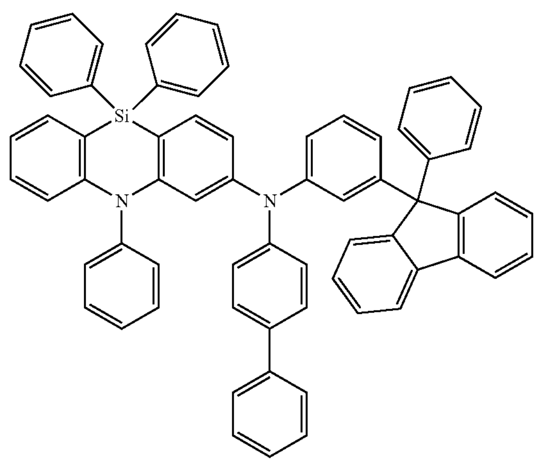

-continued
A37
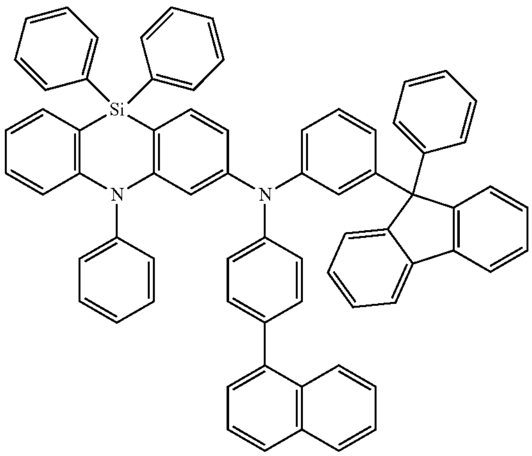
A38
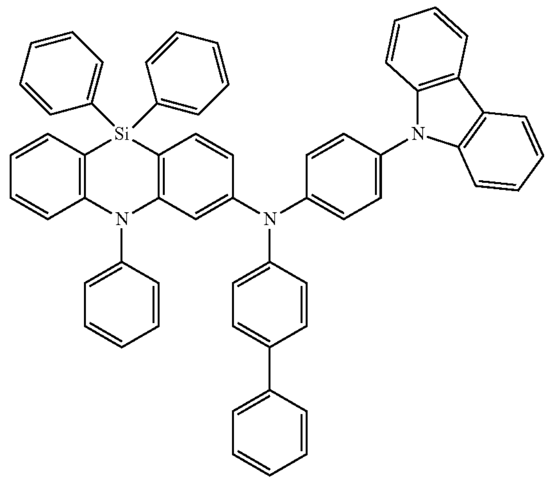
A39
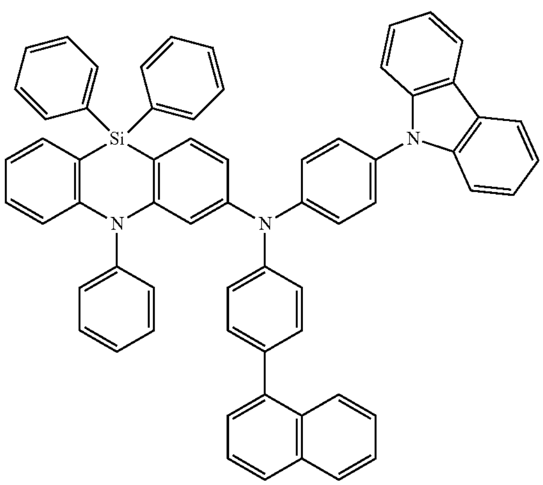
A40
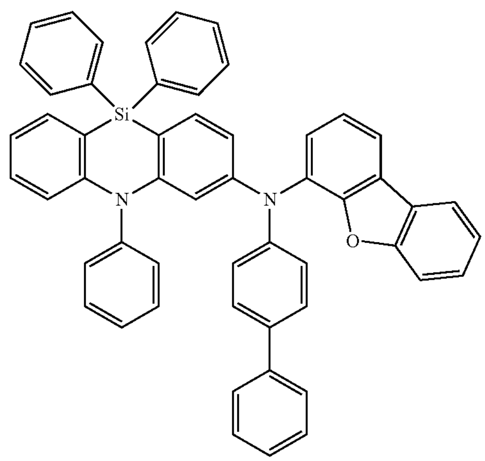
A41
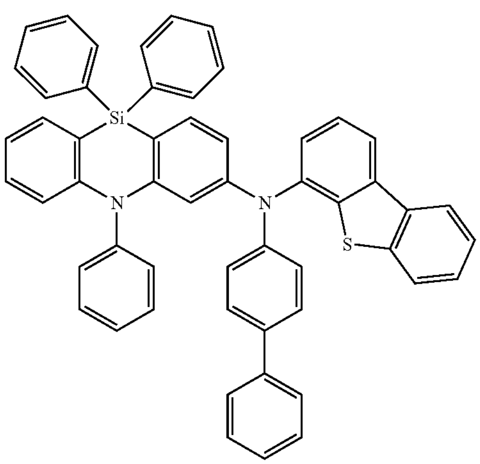
A42
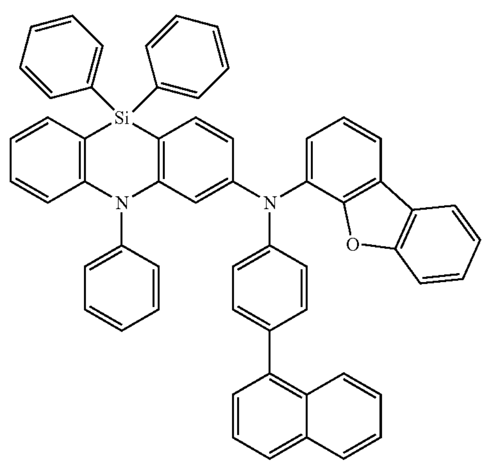

-continued
A43
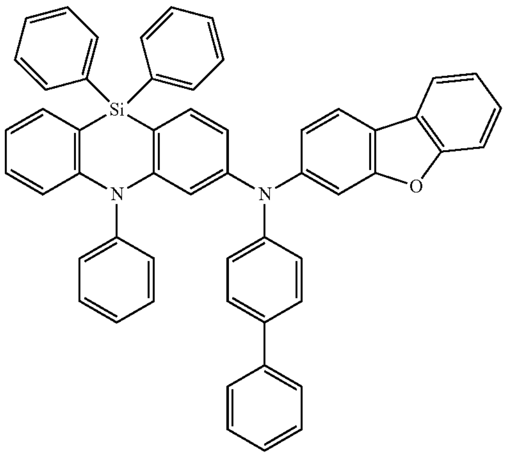
A44
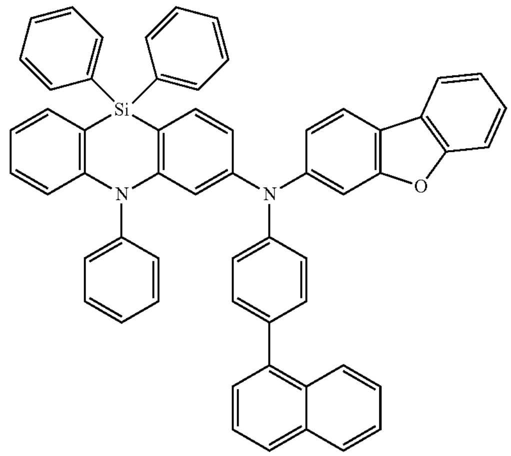
A45
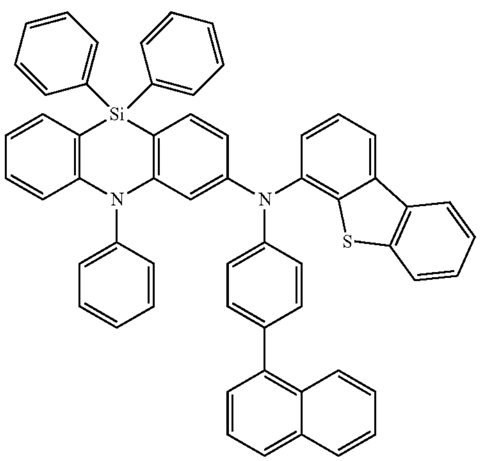
A46
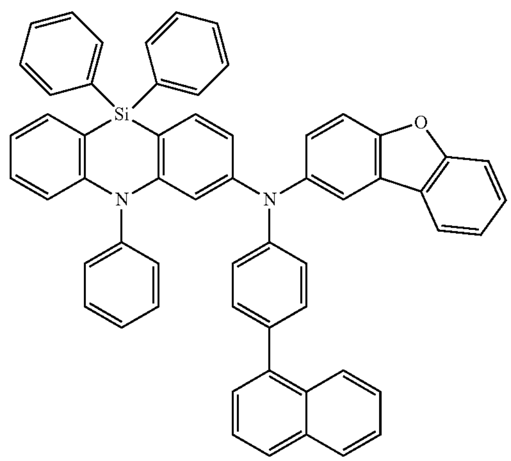
A47
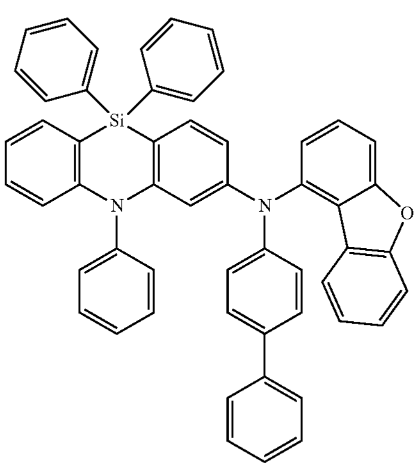
A48
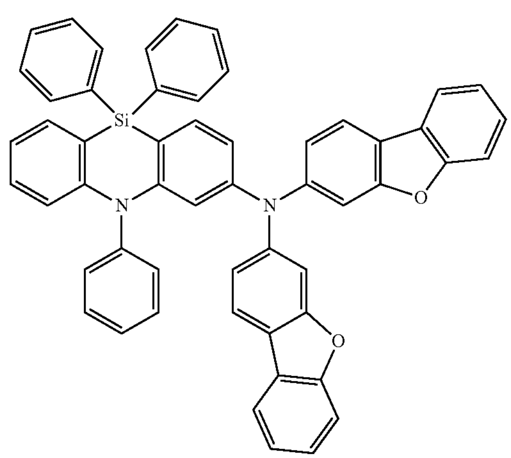

-continued
A49
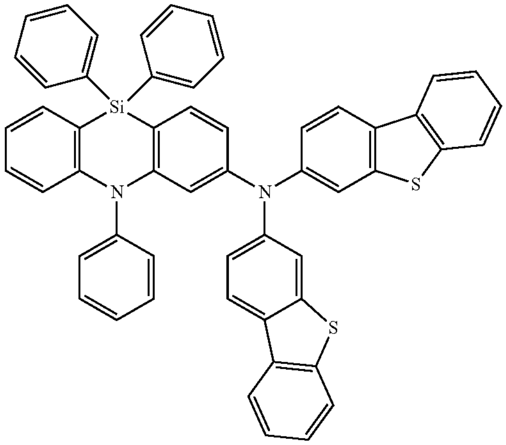
A50
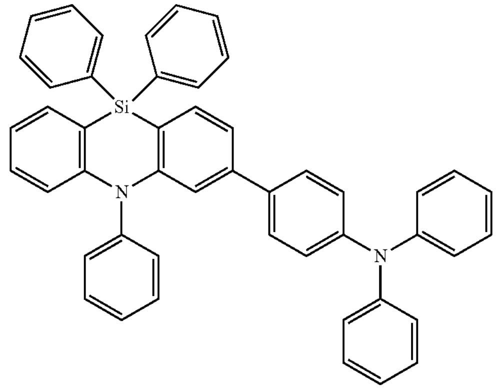
A51
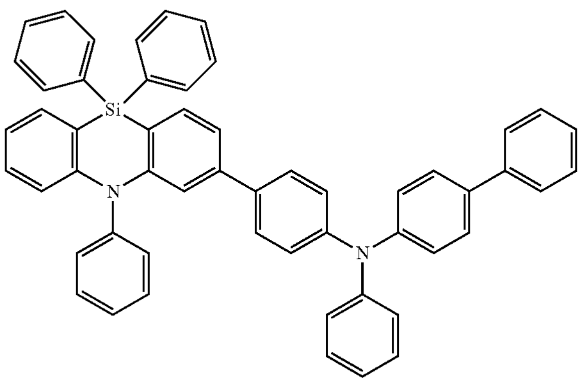
A52
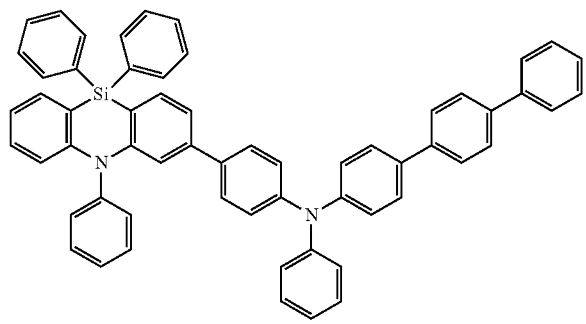
A53
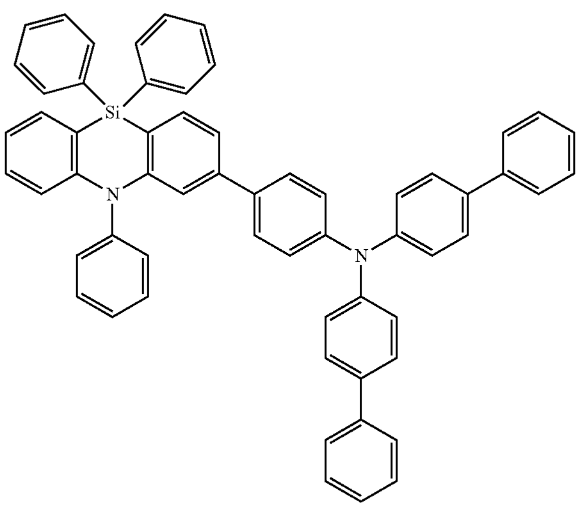
A54
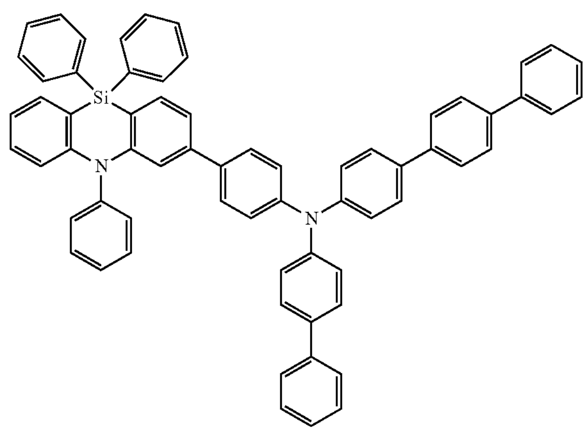

-continued
A55
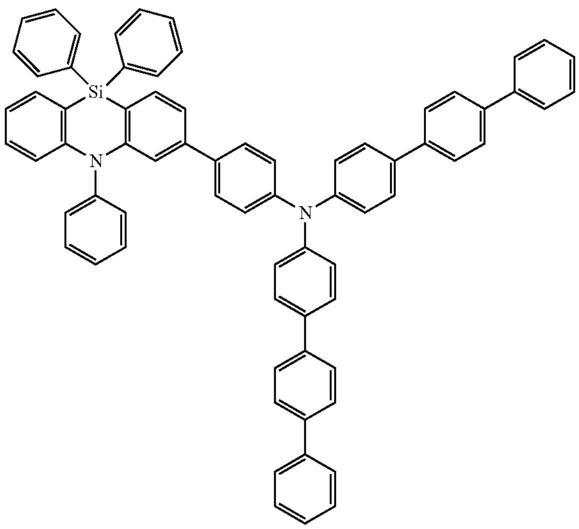
A56
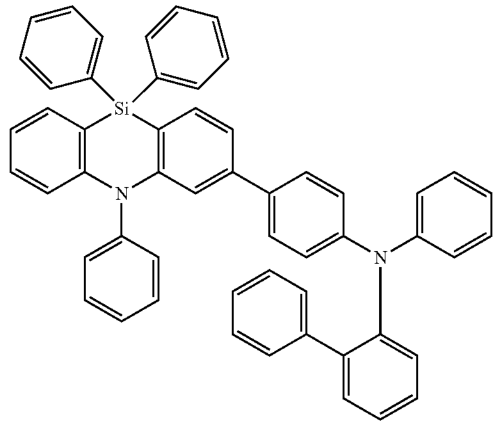
A57
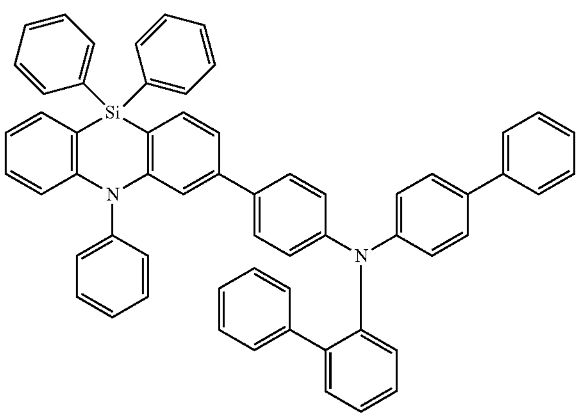
A58
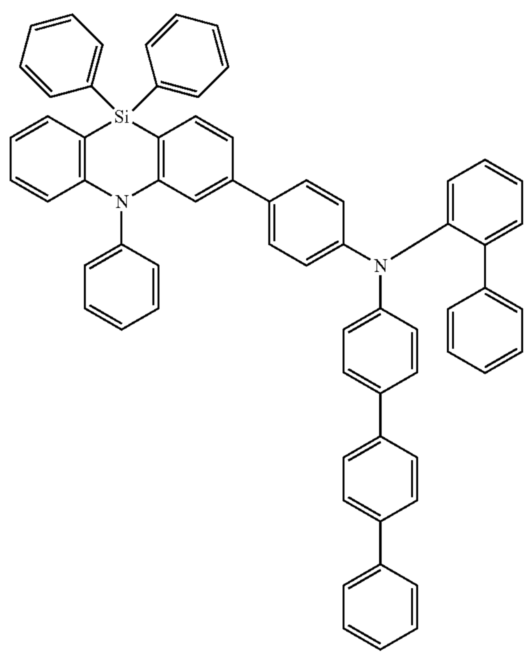

-continued
A59
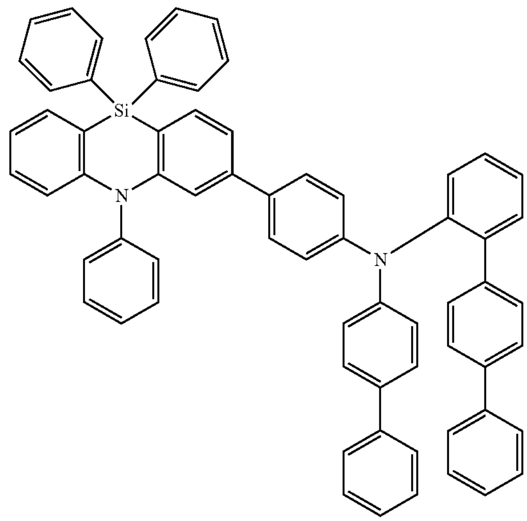
A60
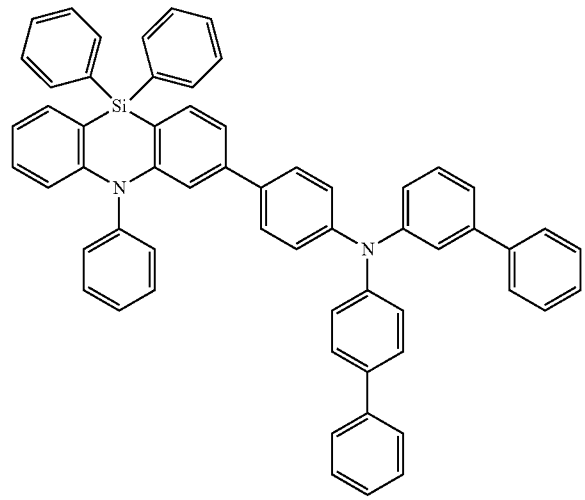
A61
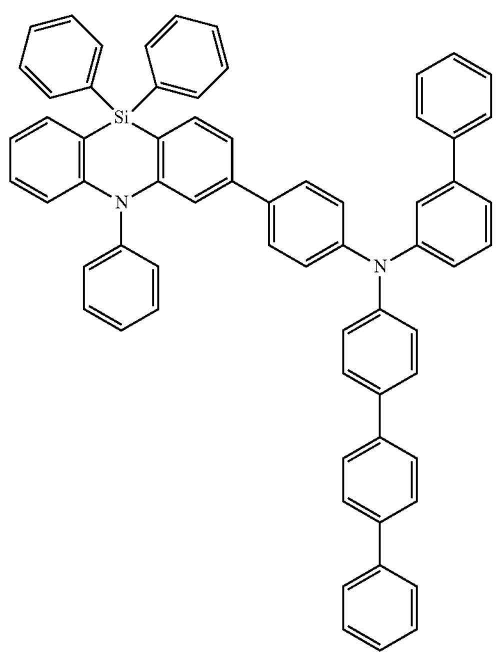
A62
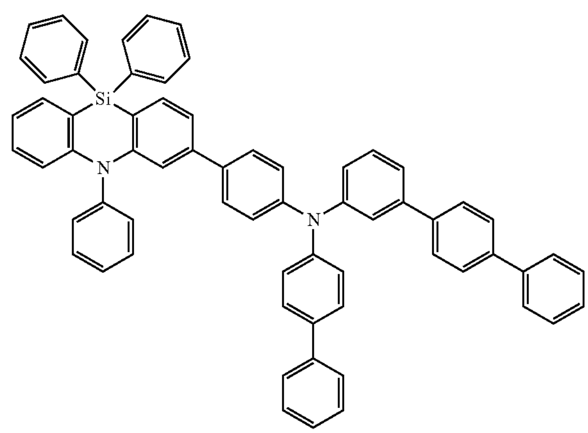

-continued
A63
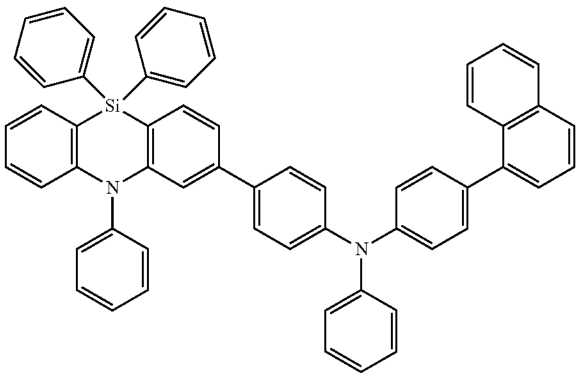
A64
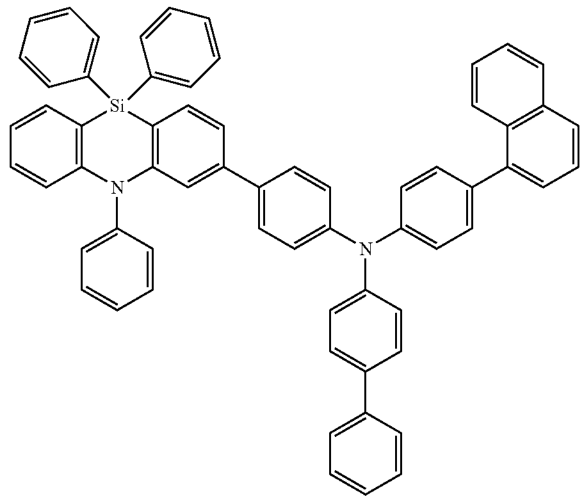
A65
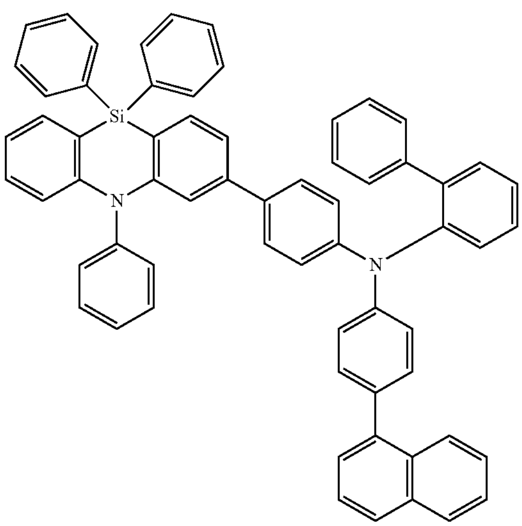
A66
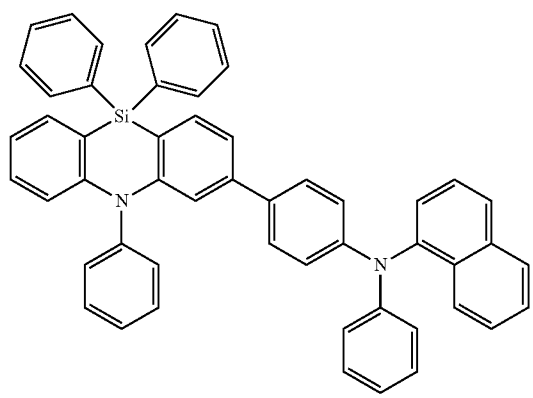
A67
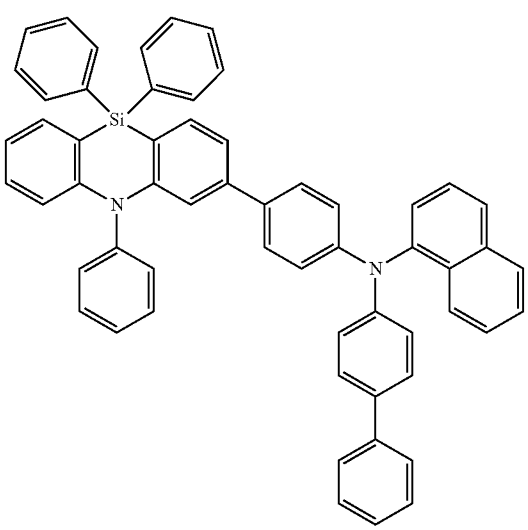
A68
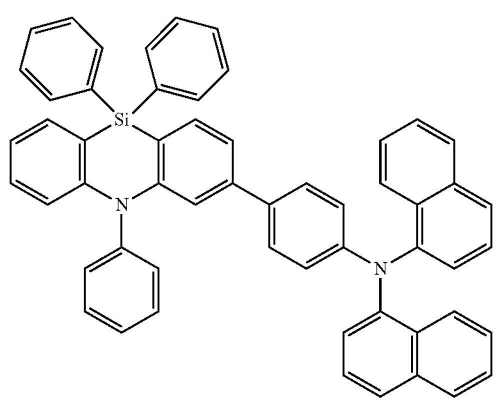

-continued
A69
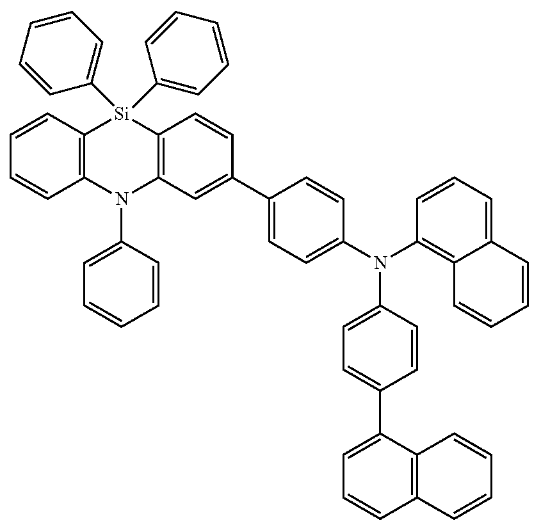
A70
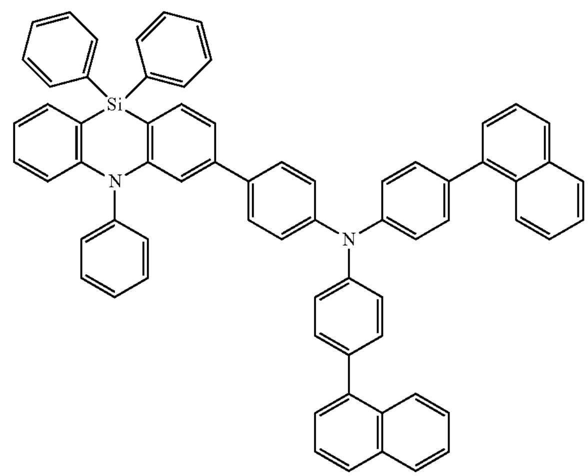
A71
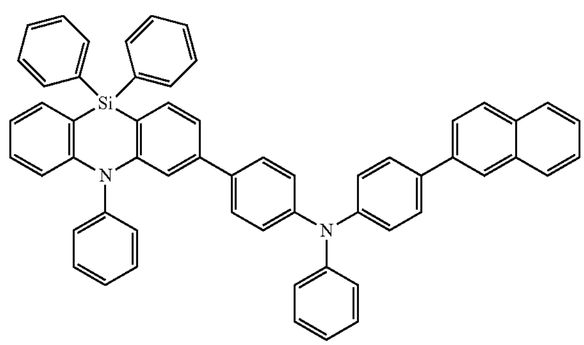
A72
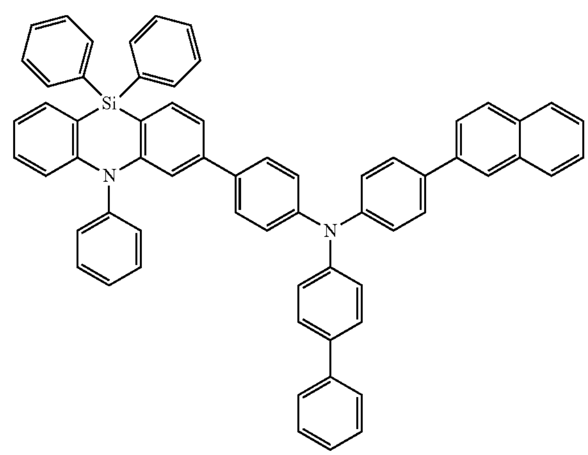
A73
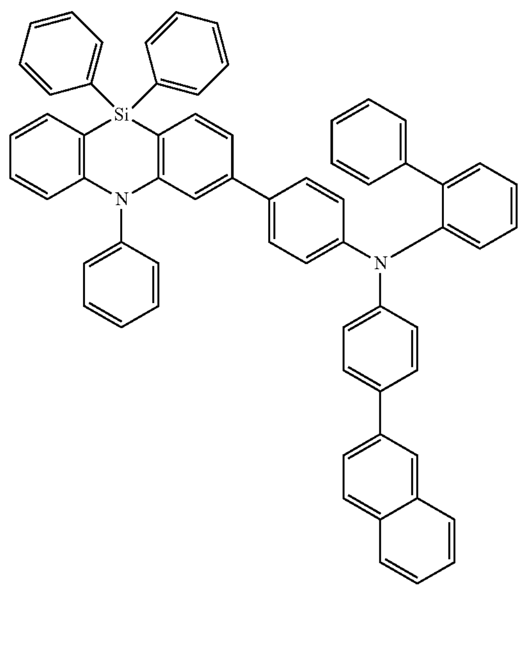
A74
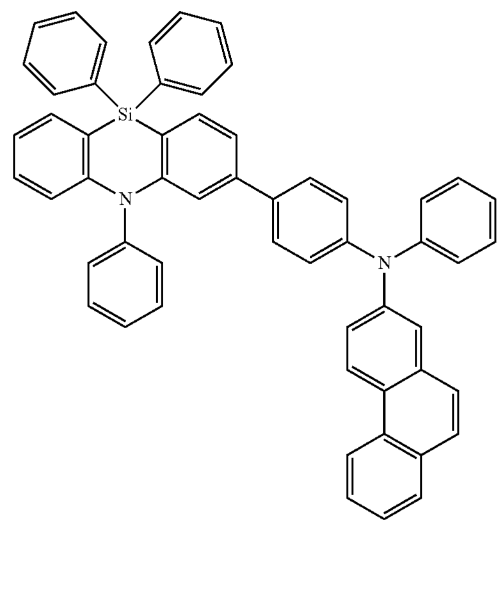

-continued
A75
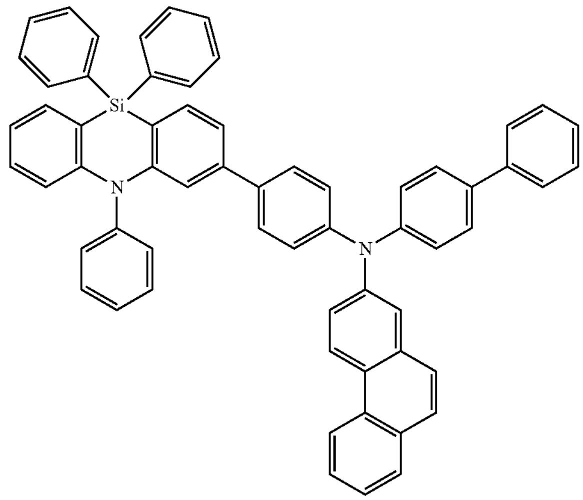
A76
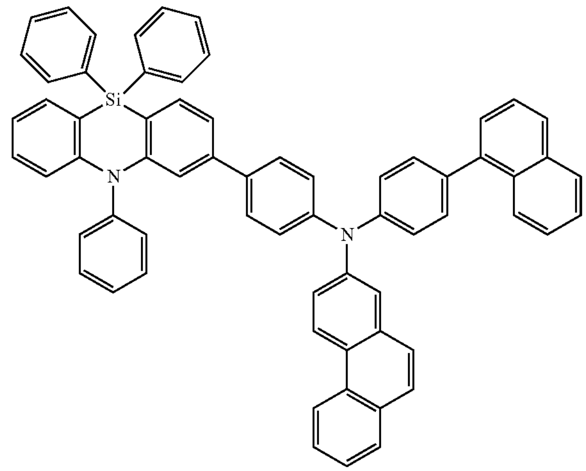
A77
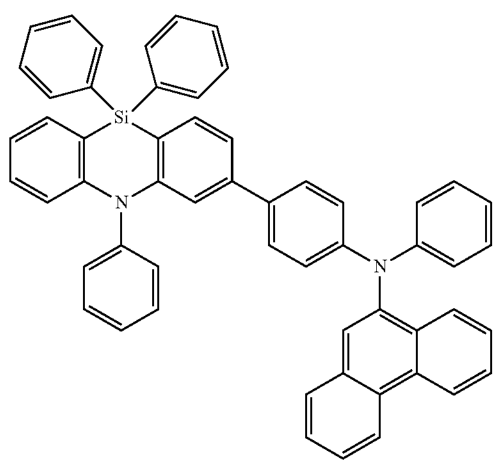
A78
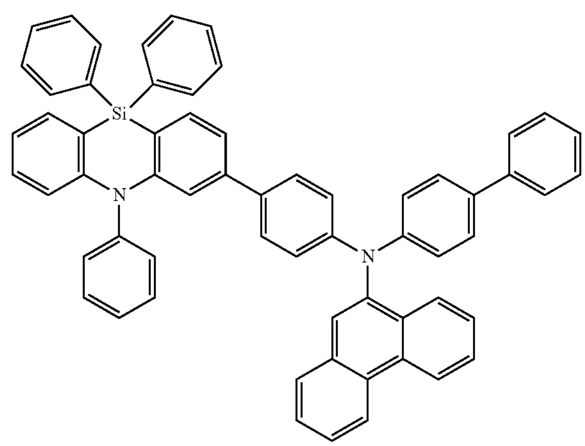
A79
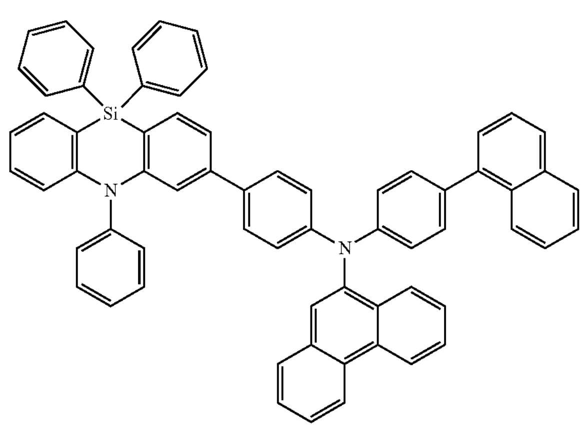
A80
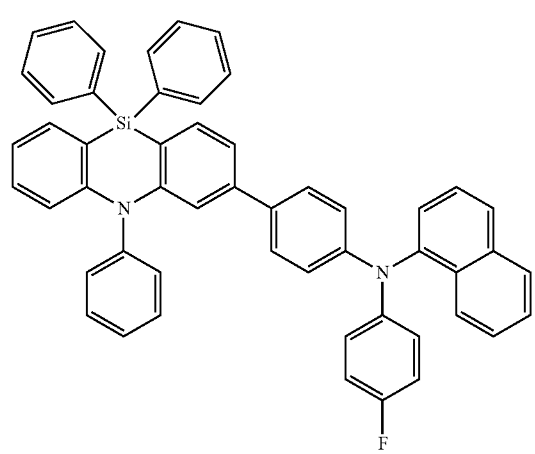

-continued
A81
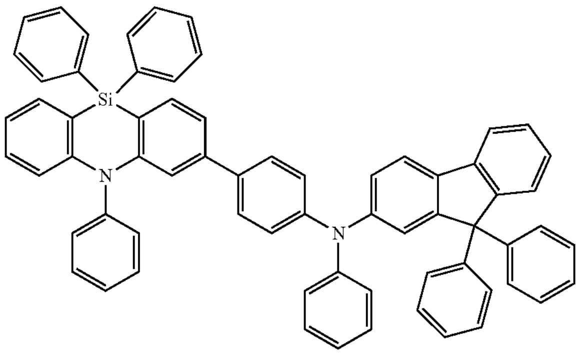
A82
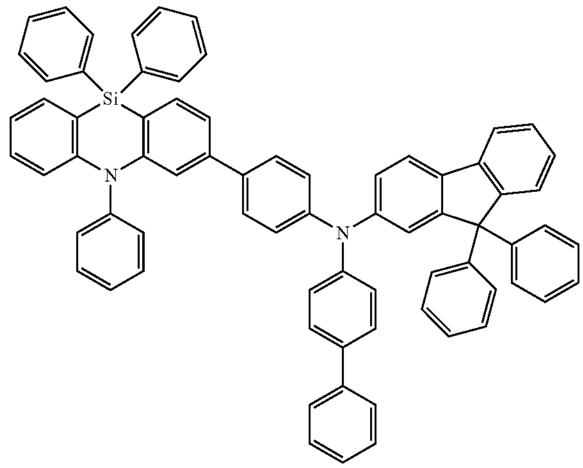
A83
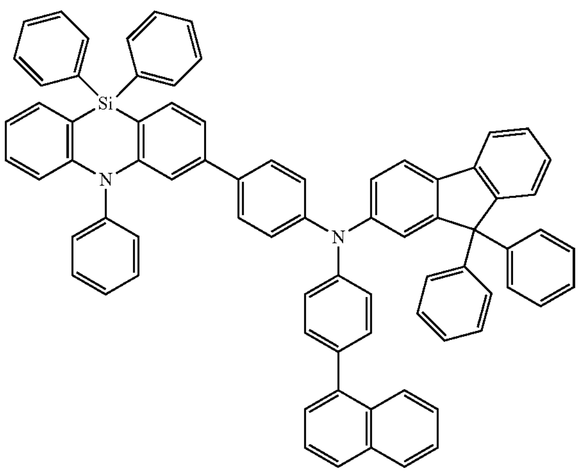
A84
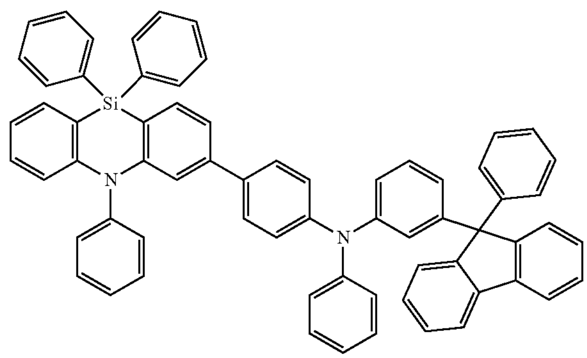
A85
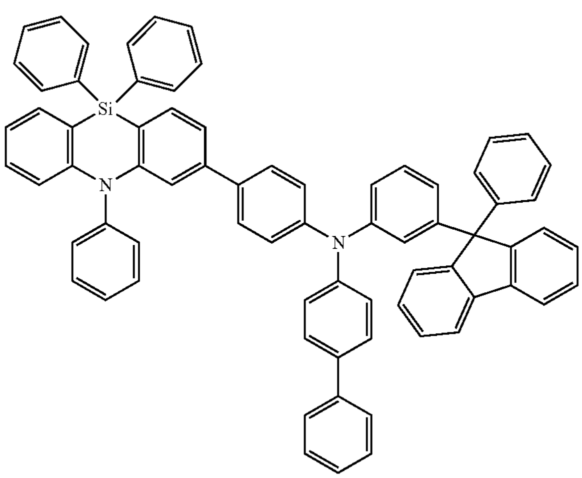
A86
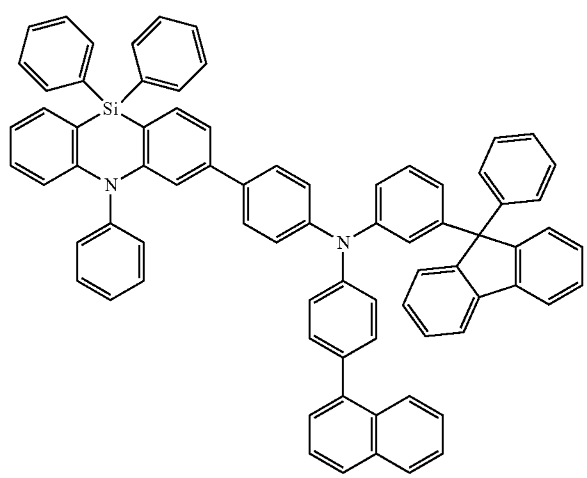

-continued
A87
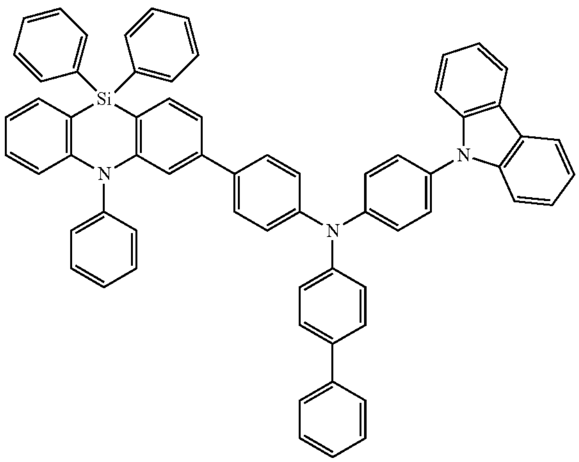
A88
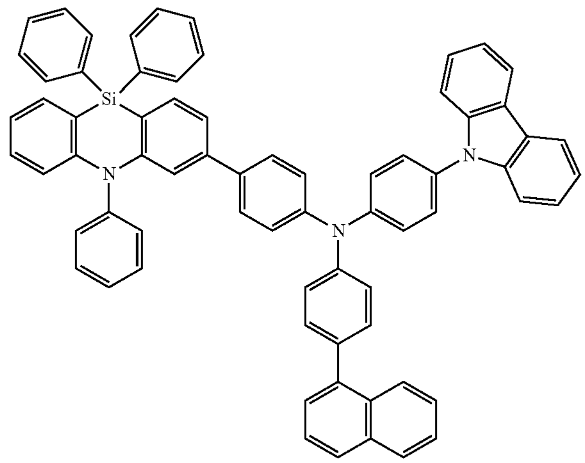
A89
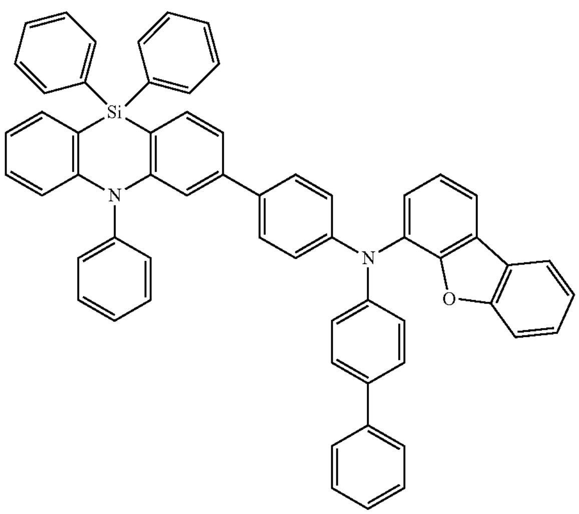
A90
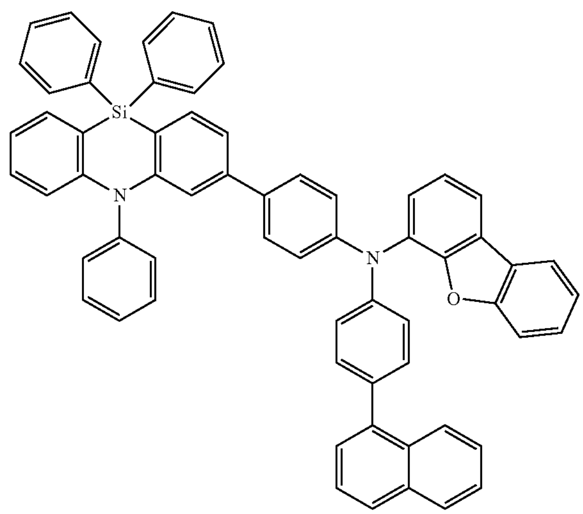
A91
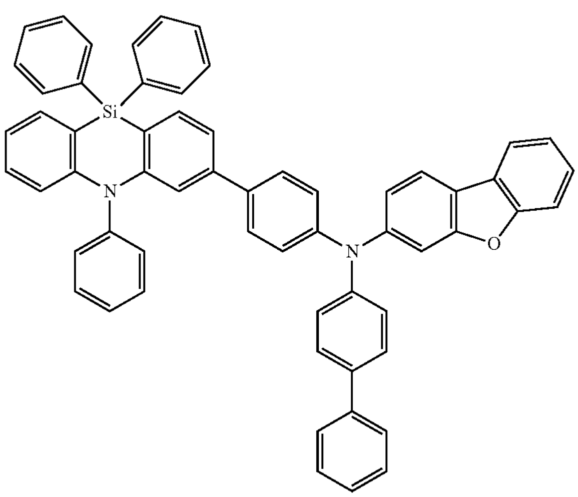
A92
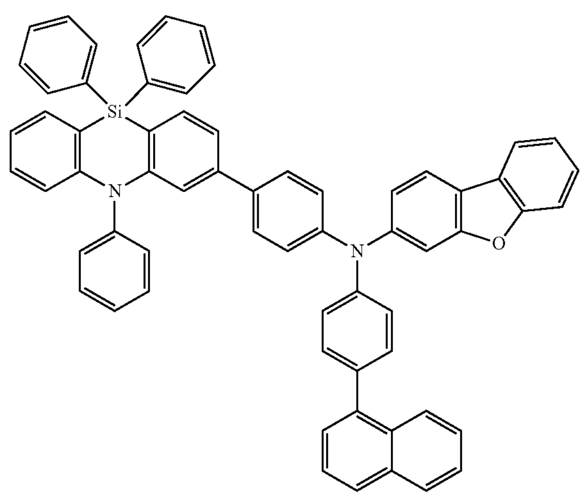

-continued
A93
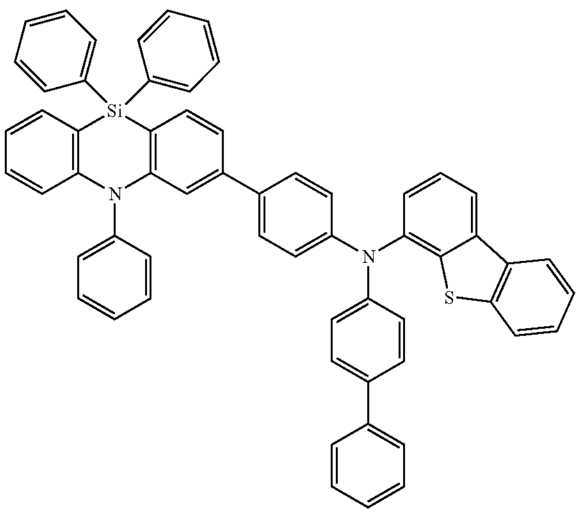
A94
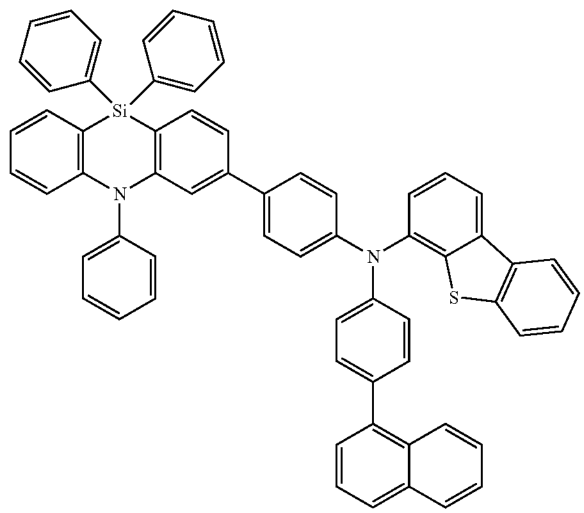
A95
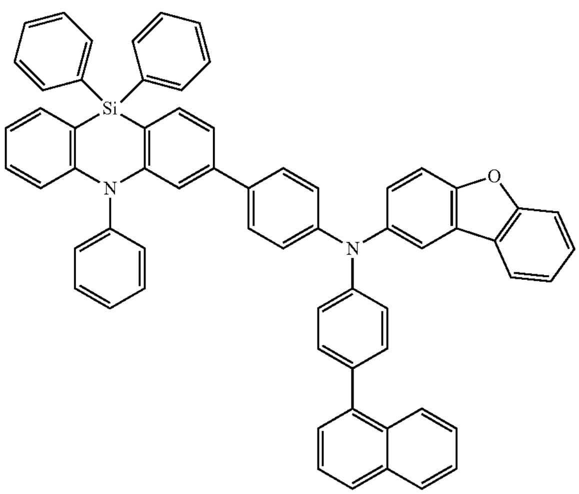
A96
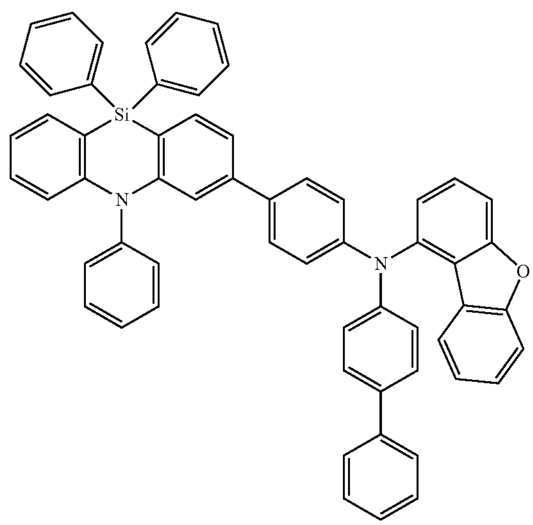
A97
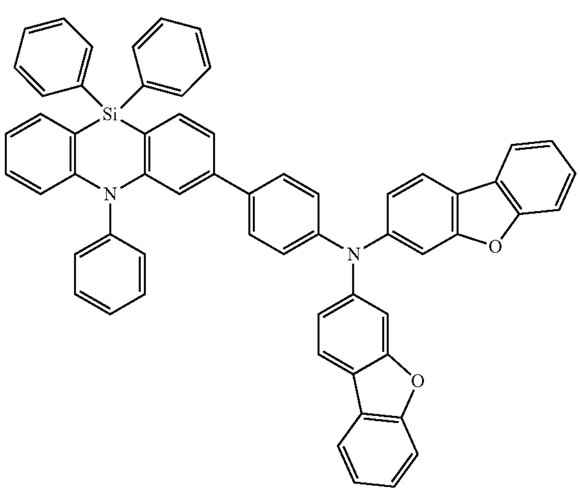
A98
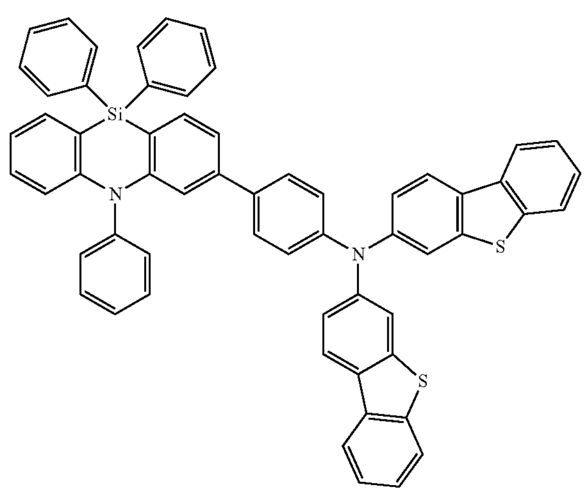

-continued
A99
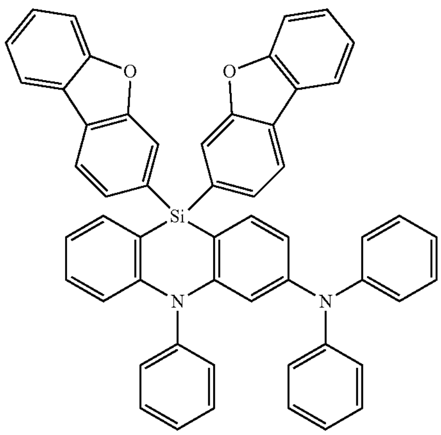
A100
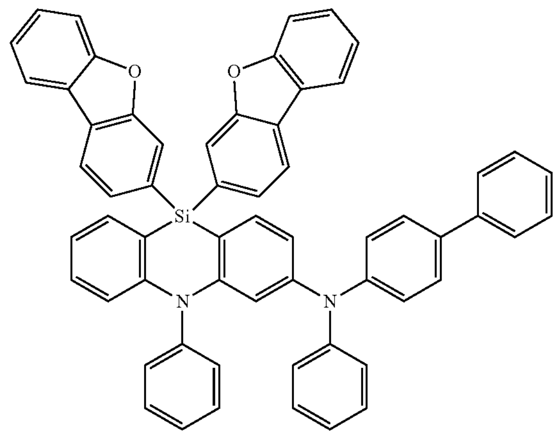
A101
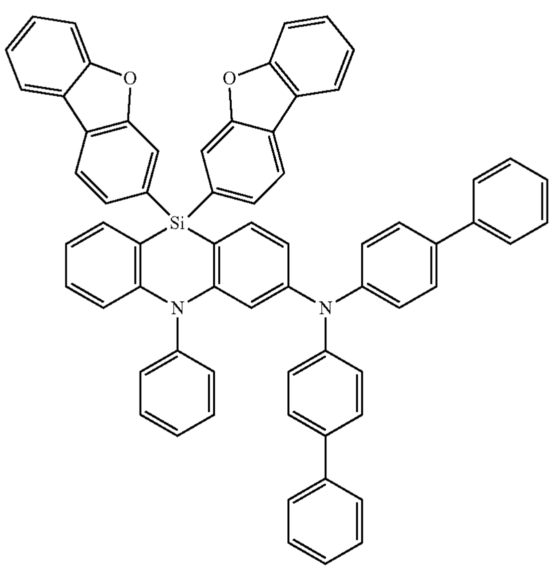
A102
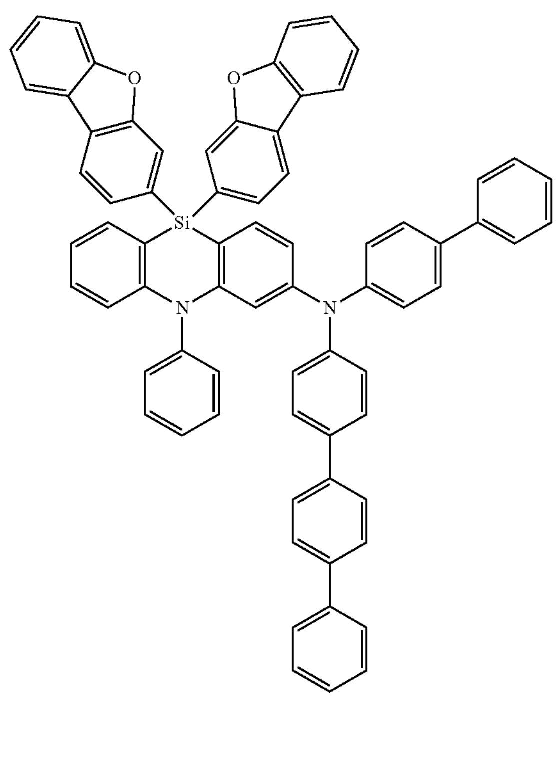

-continued
A103
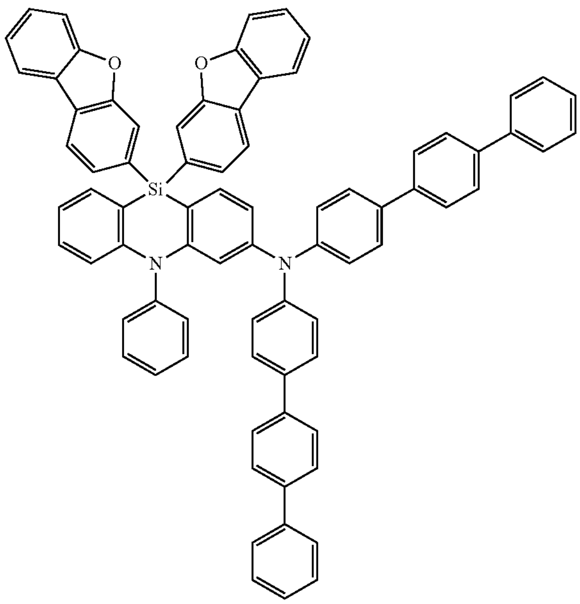
A104
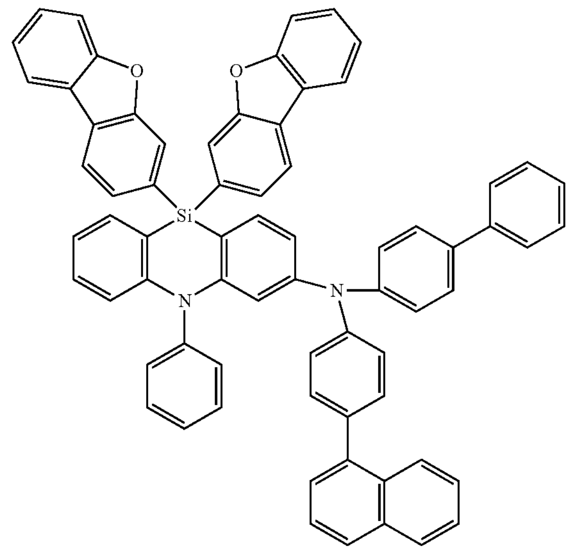
A105
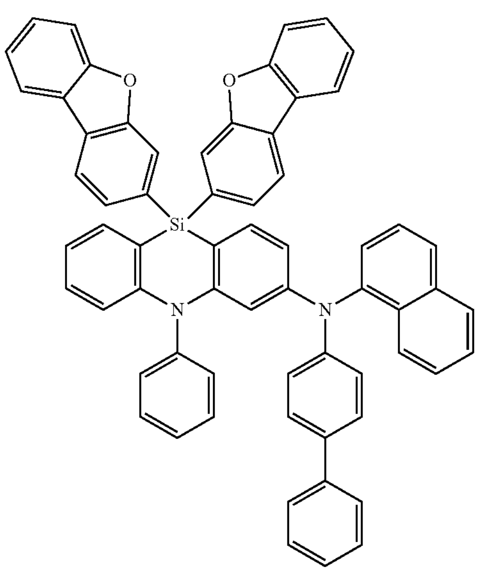
A106
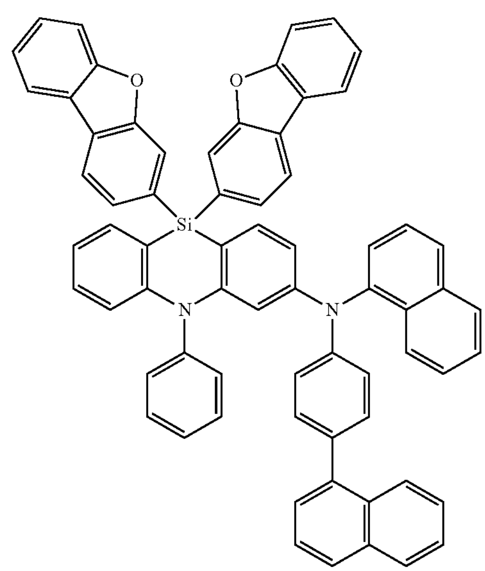

-continued
A107
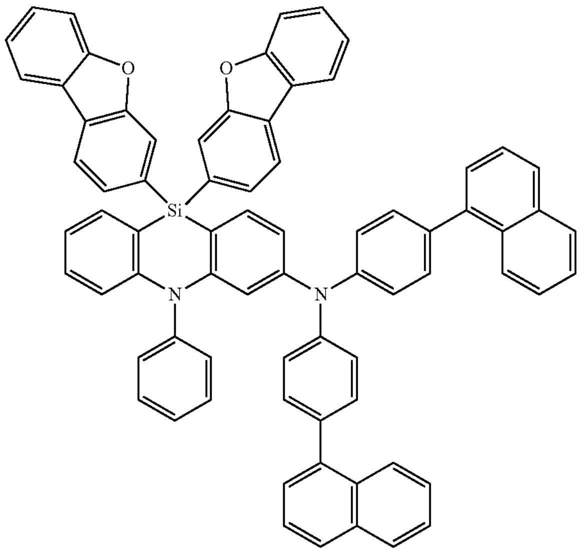
A108
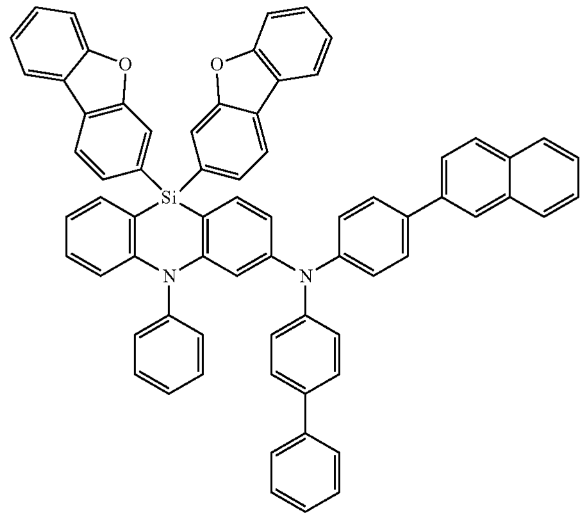
A109
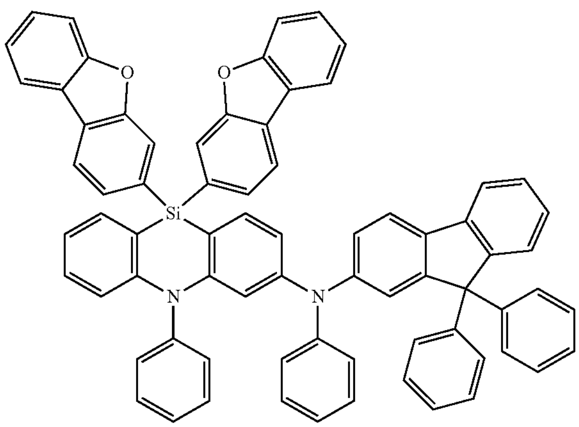
A110
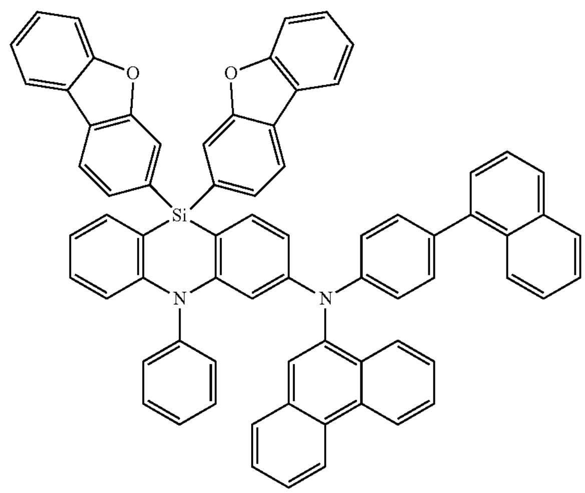
A111
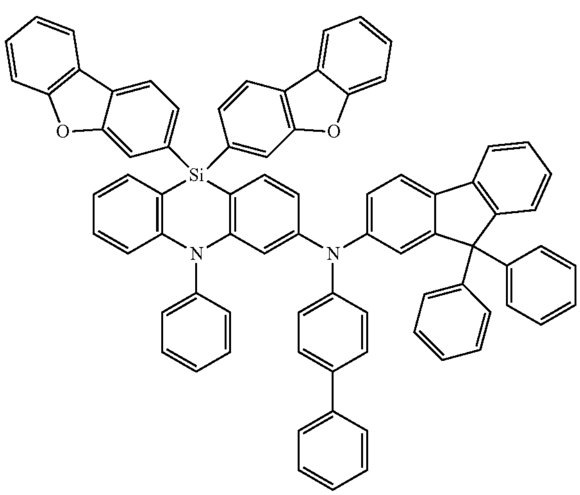
A112
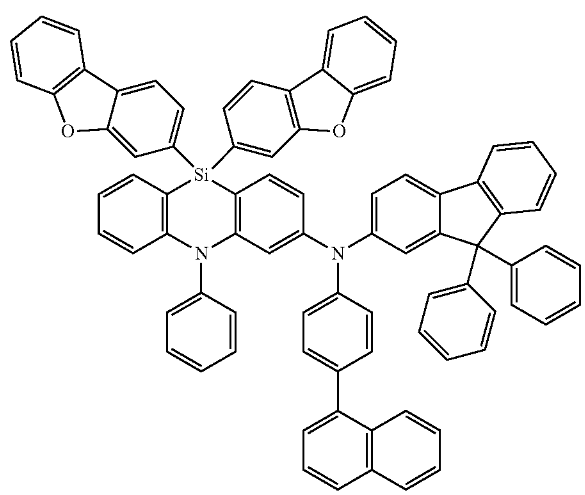

-continued
A113
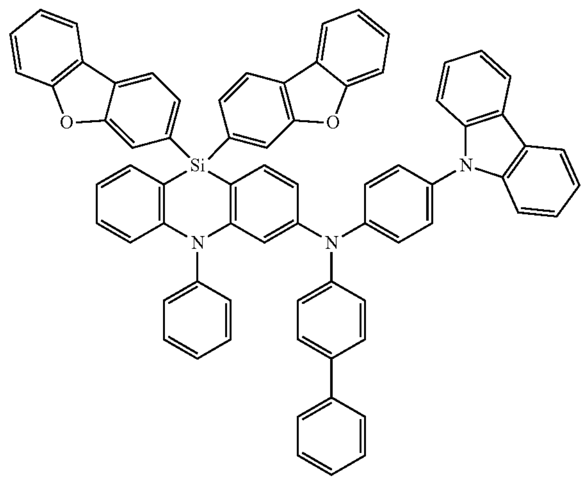
A114
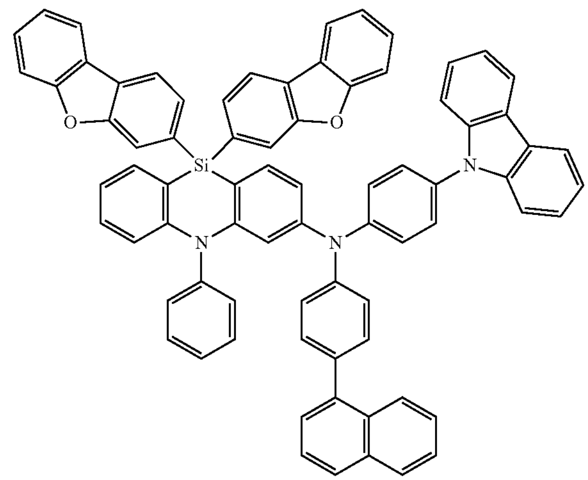
A115
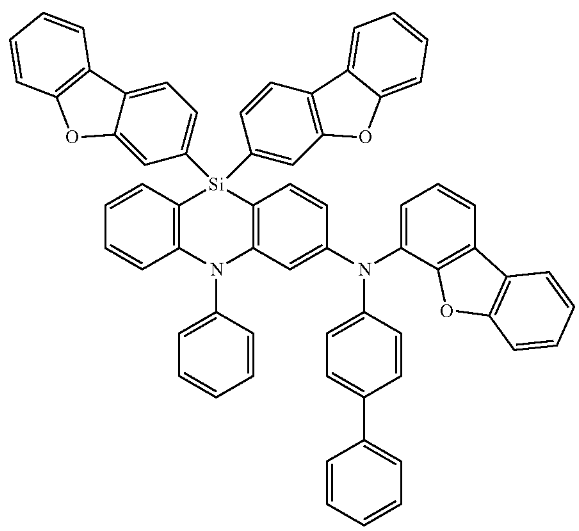
A116
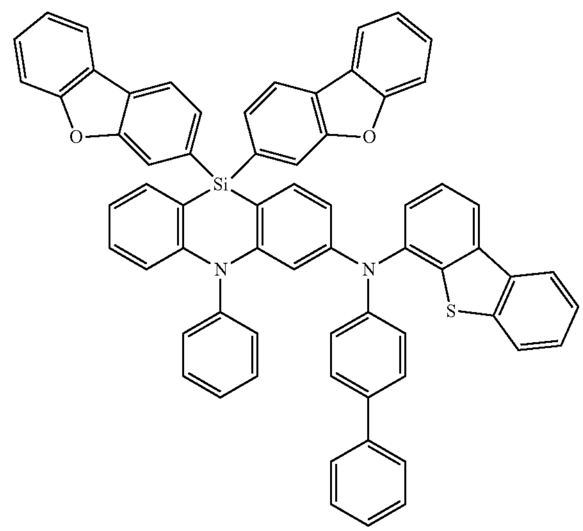
A117
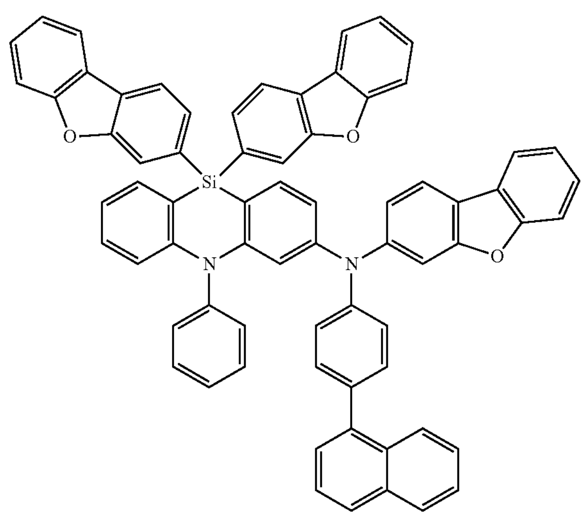
A118
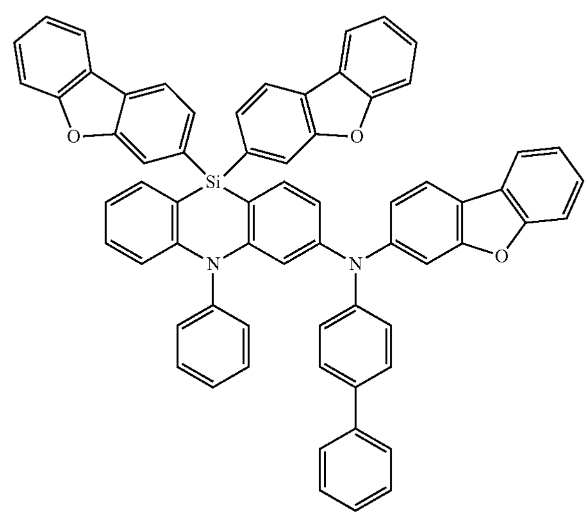

-continued
A119
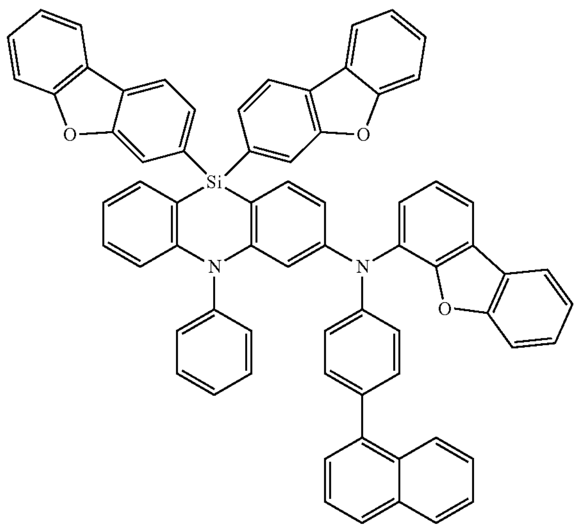
A120
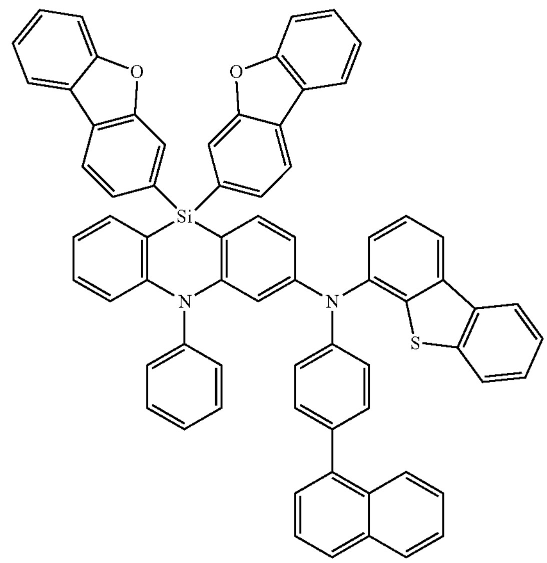
A121
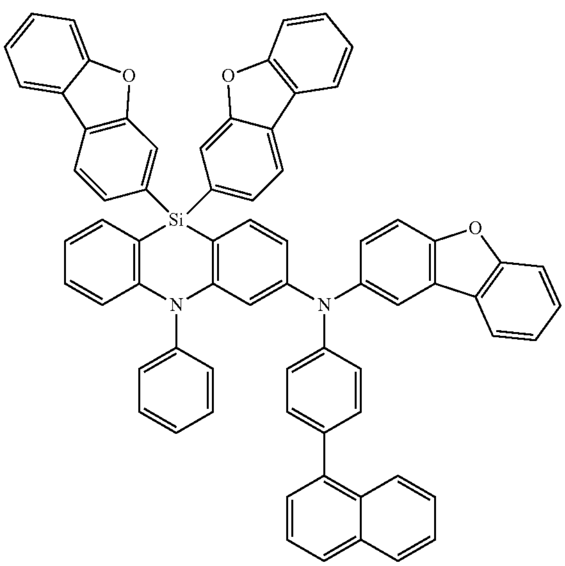
A122
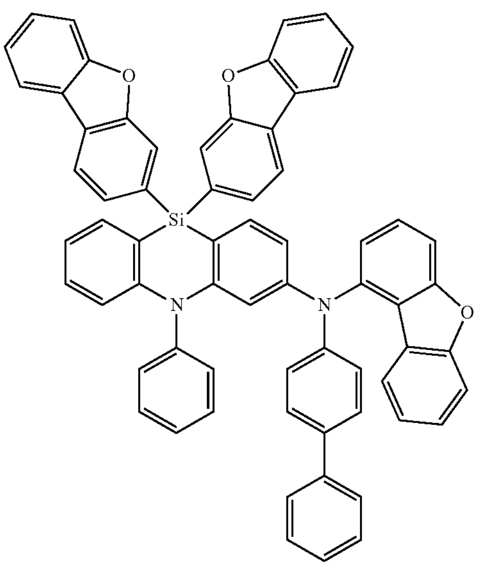
A123
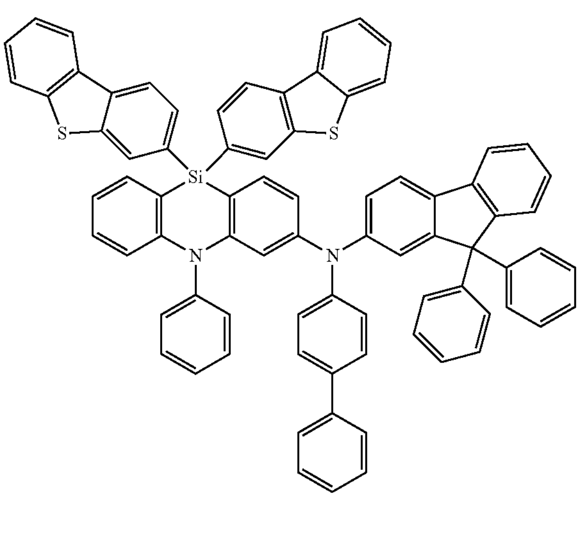
A124
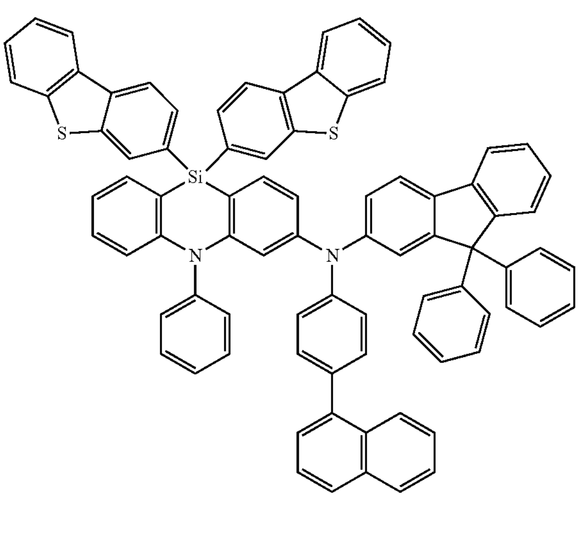

-continued
A125
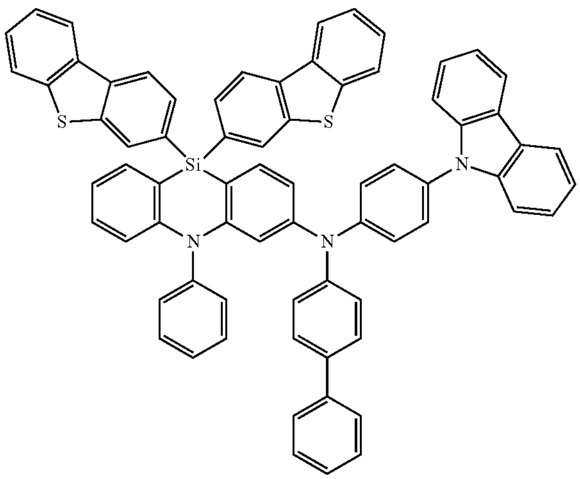
A126
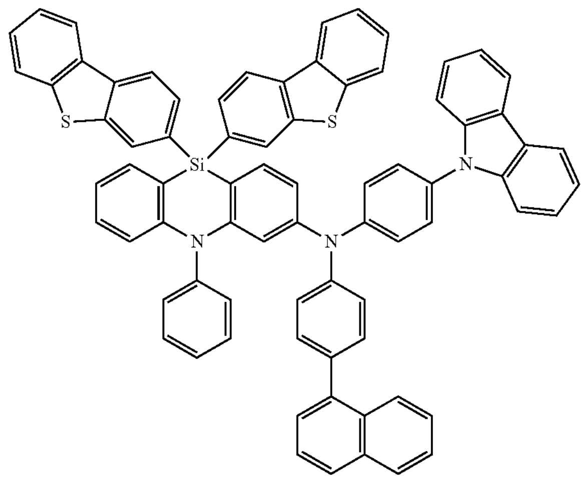
A127
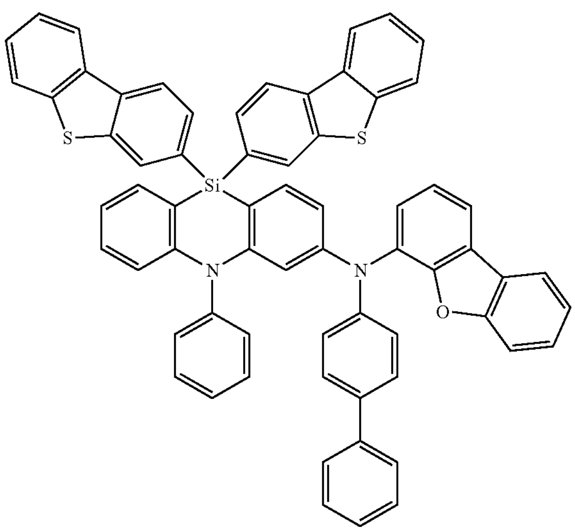
A128
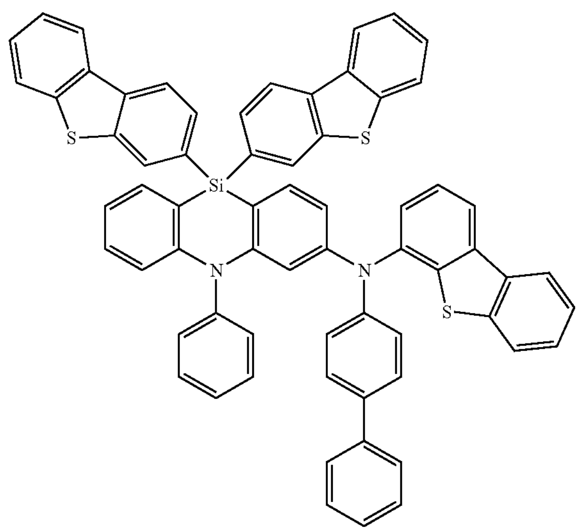
A129
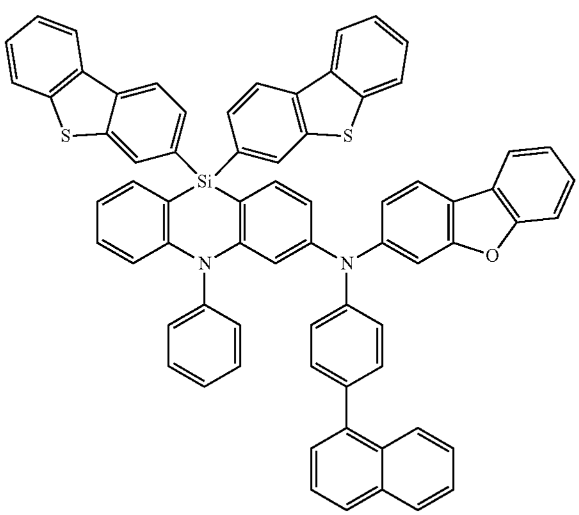
A130
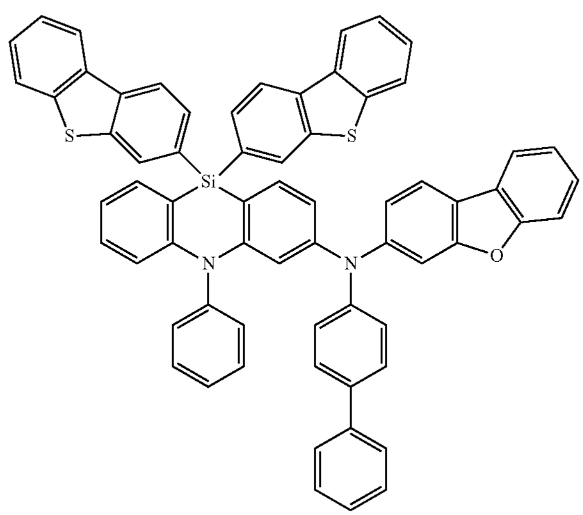

-continued
A131
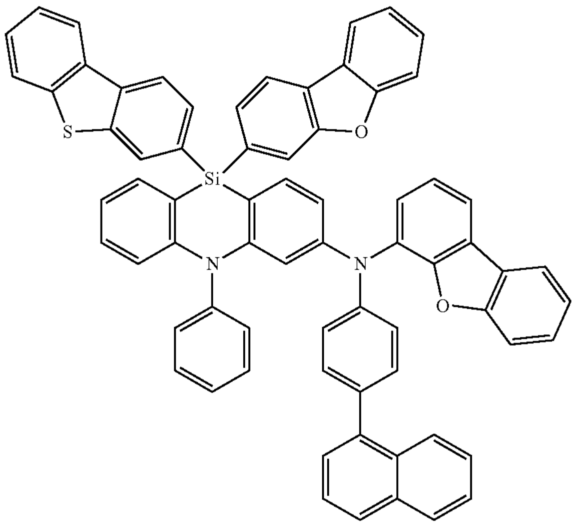
A132
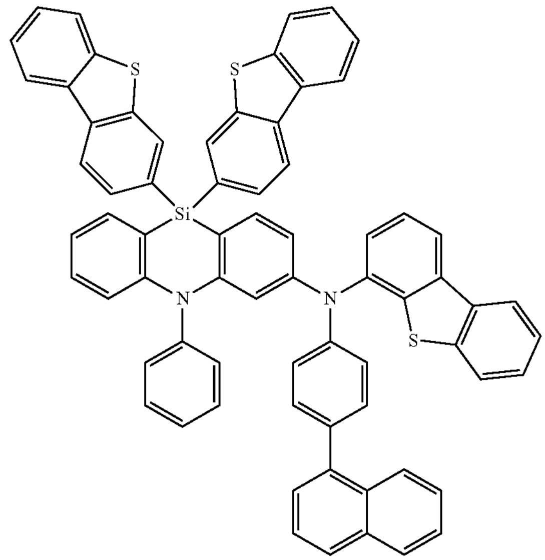
A133
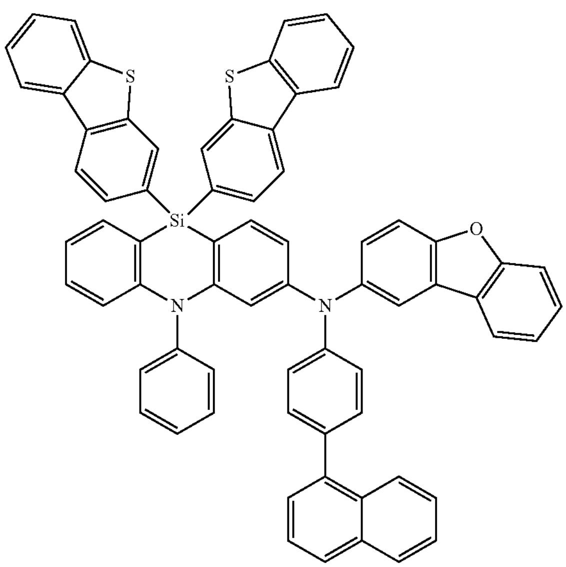
A134
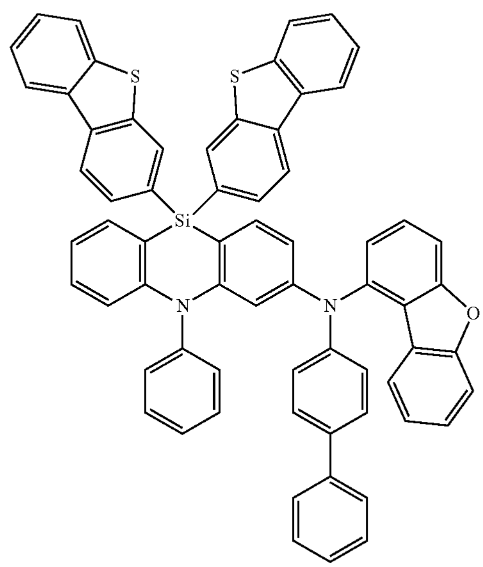
A135
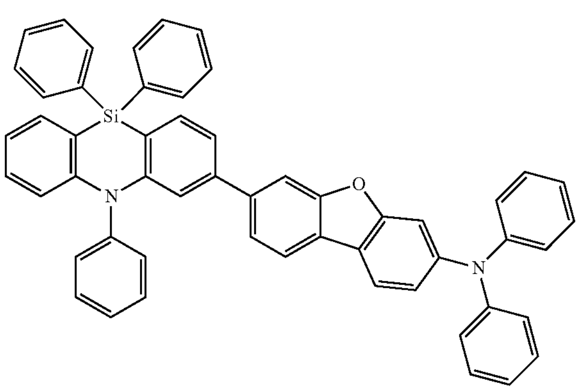
A136
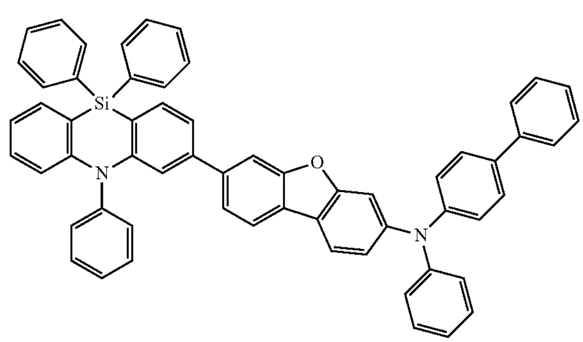

-continued
A137
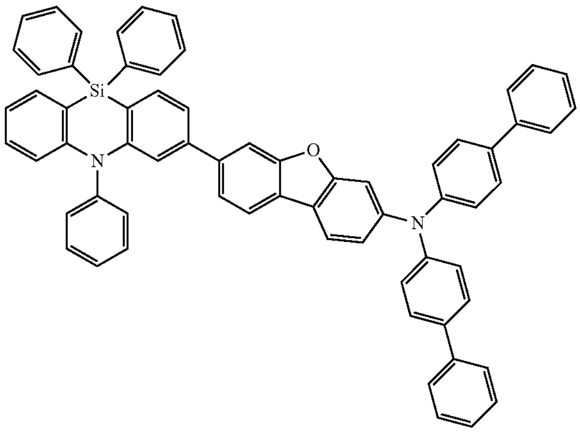
A138
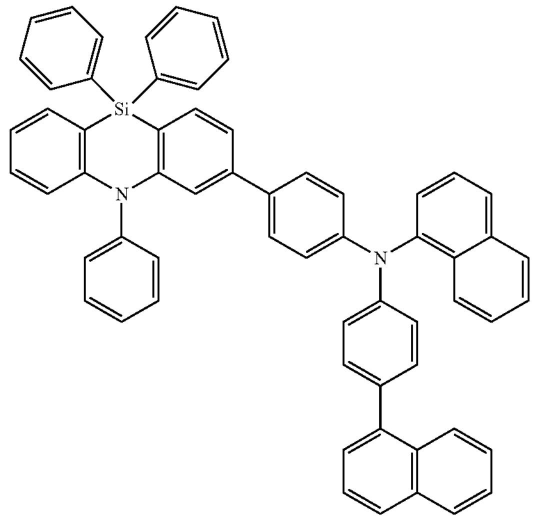
A139
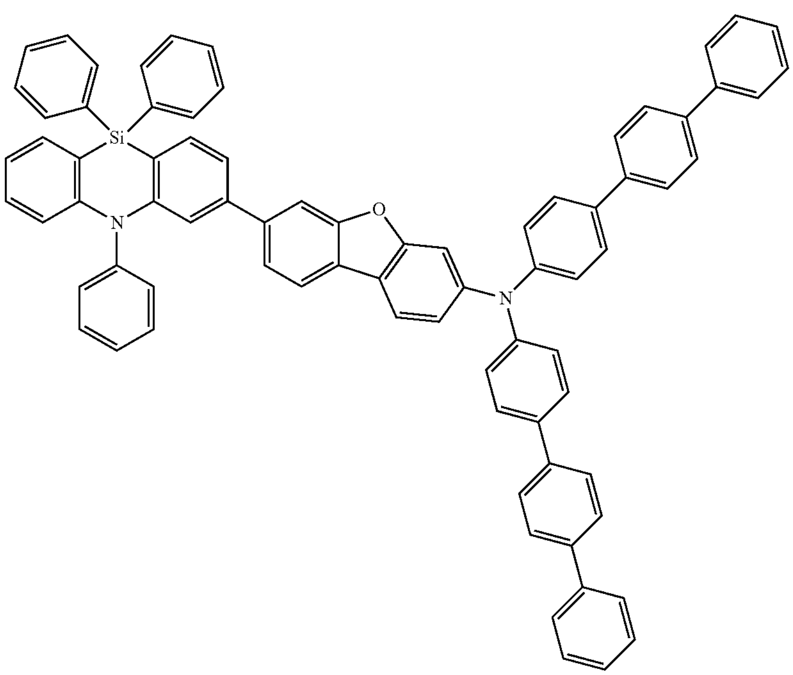

-continued
A140
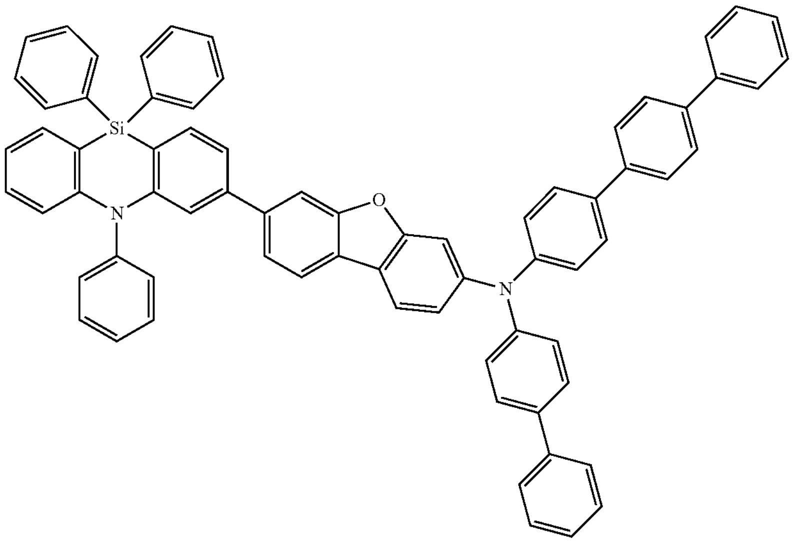
A141
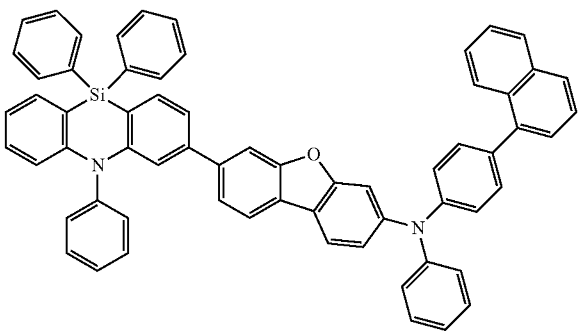
A142
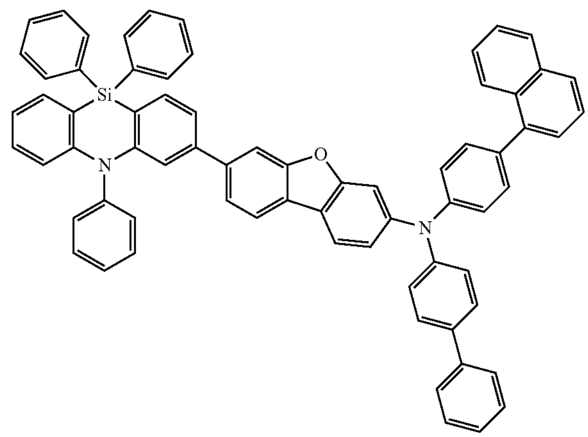
A143
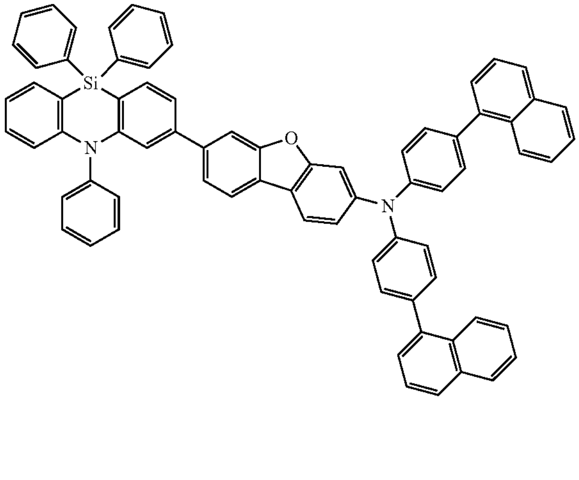
A144
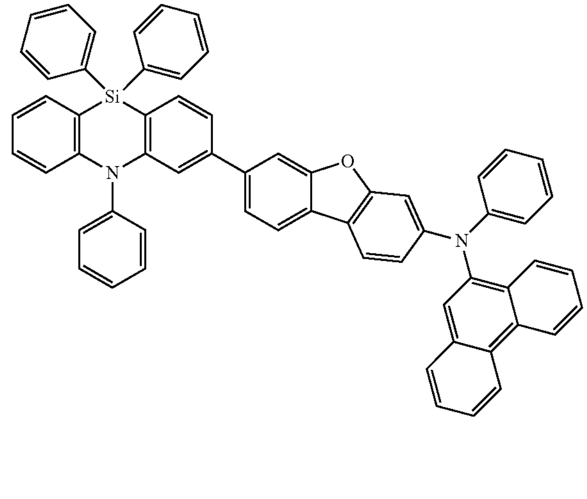

-continued
A145
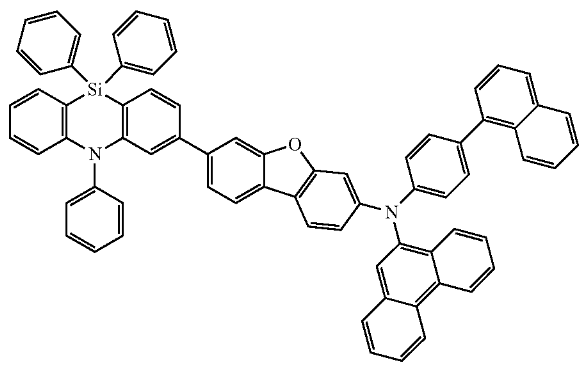
A146
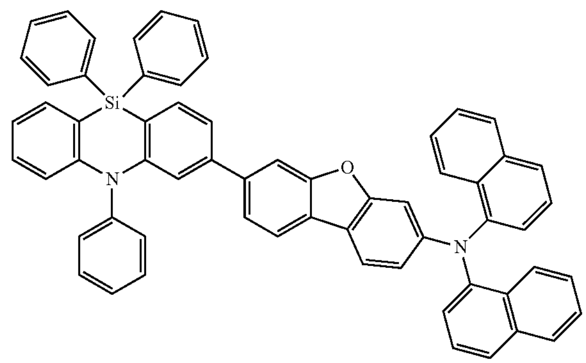
A147
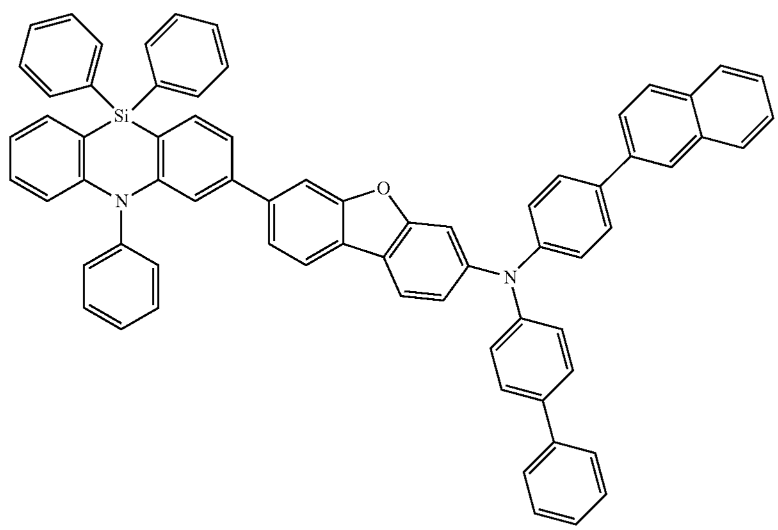
A148
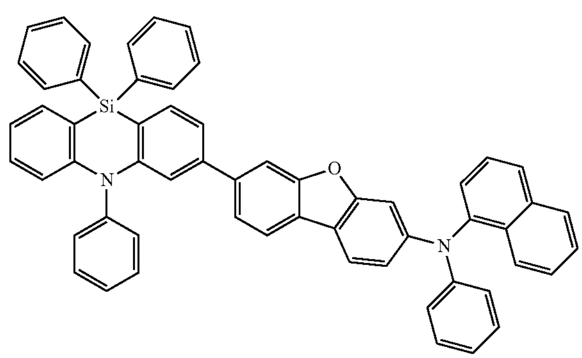
A149
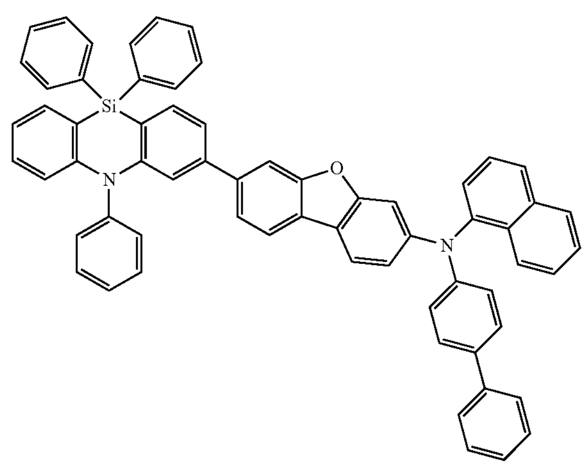

-continued
A150
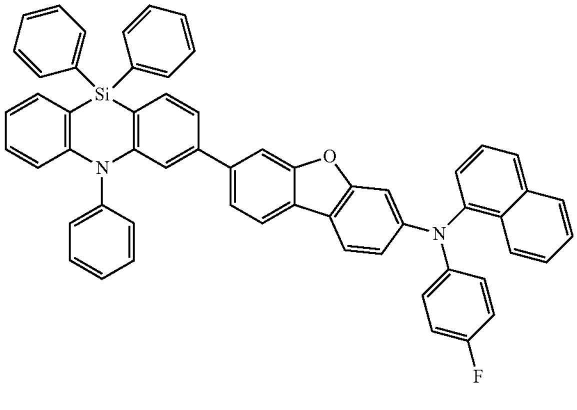
A151
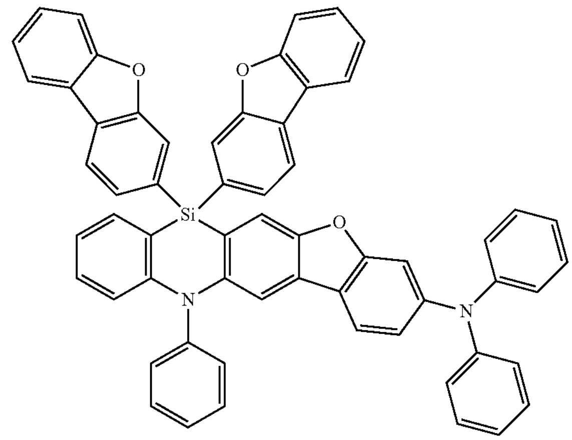
A152
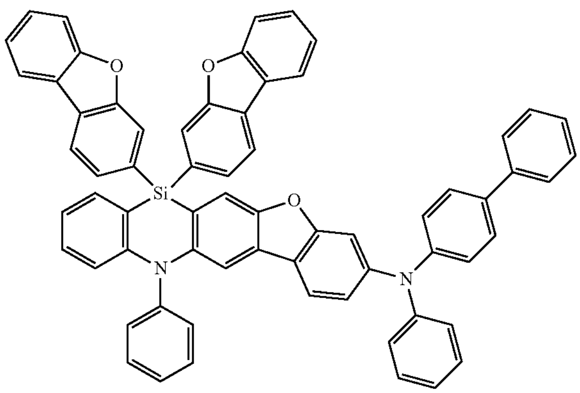
A153
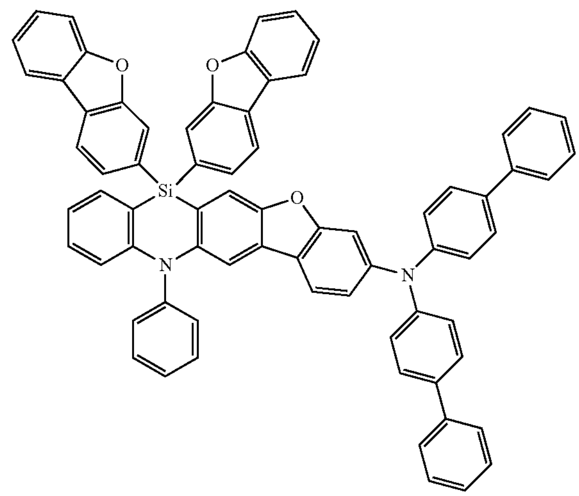
A154
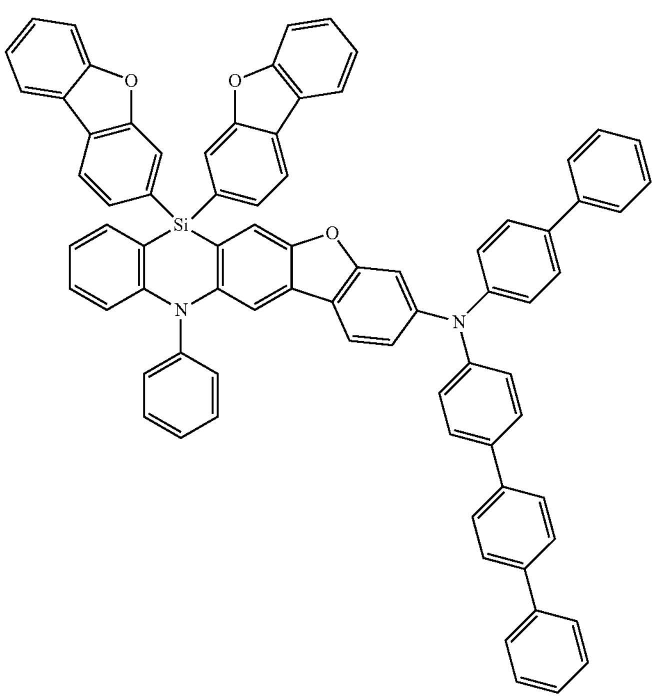

-continued
A155
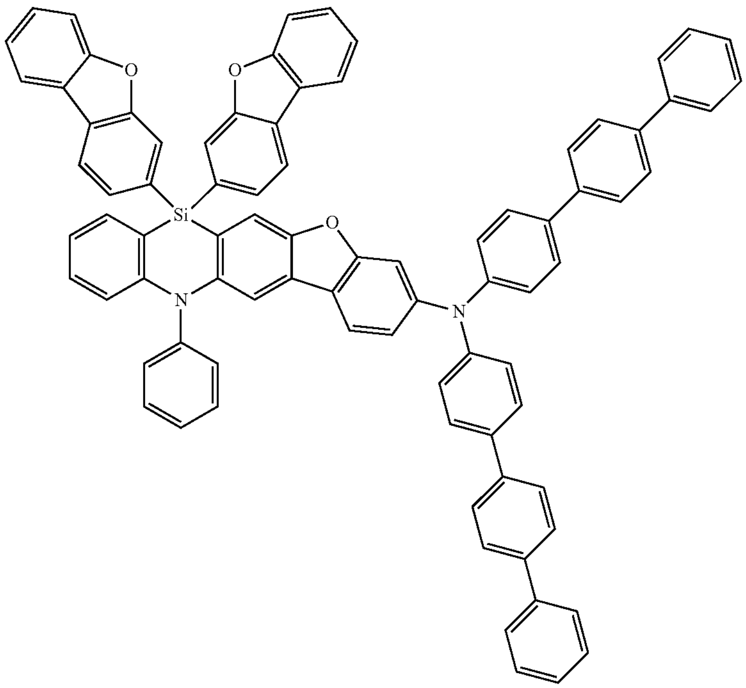
A156
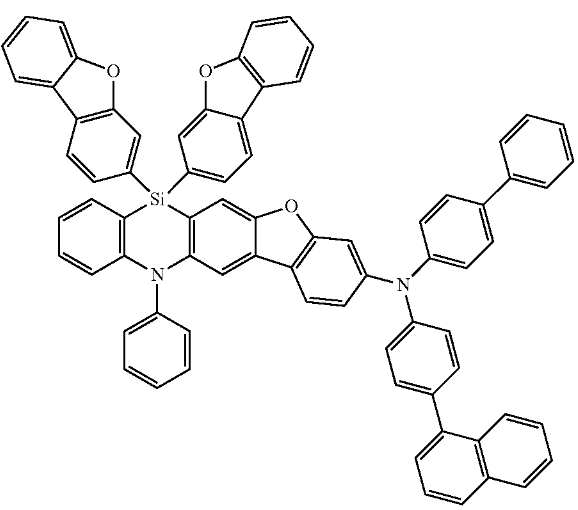
A157
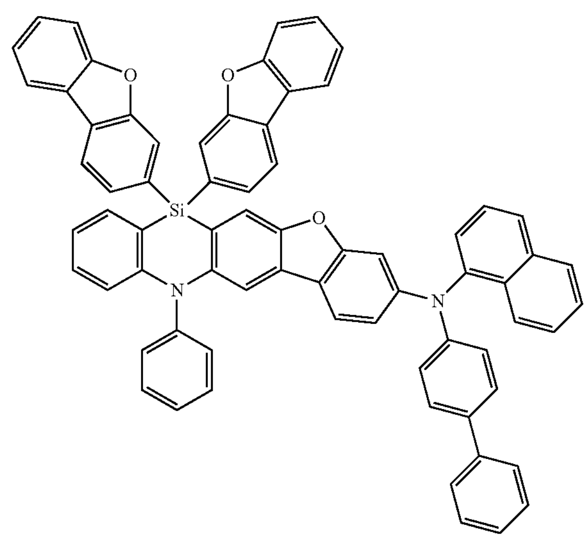

-continued
A158
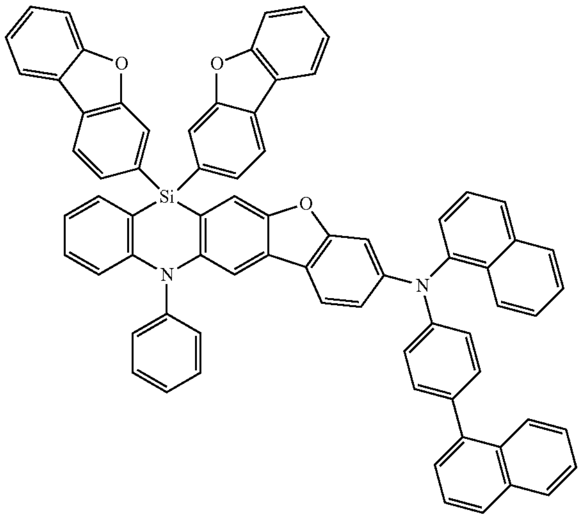
A159
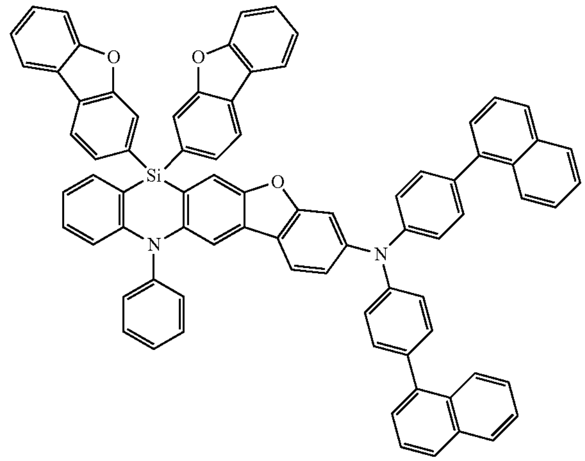
A160
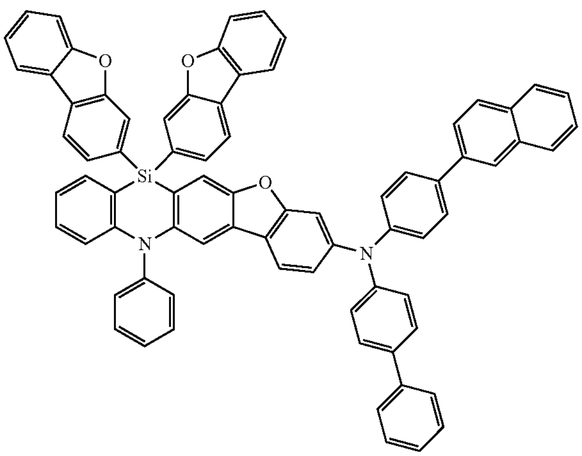
A161
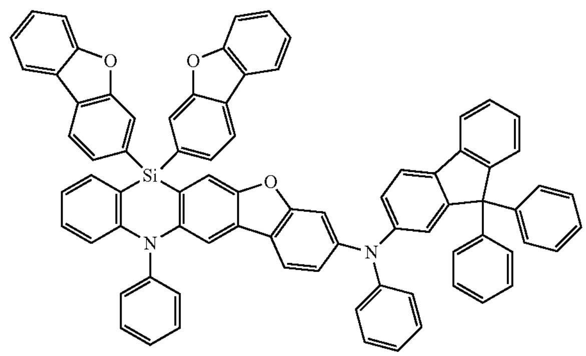
A162
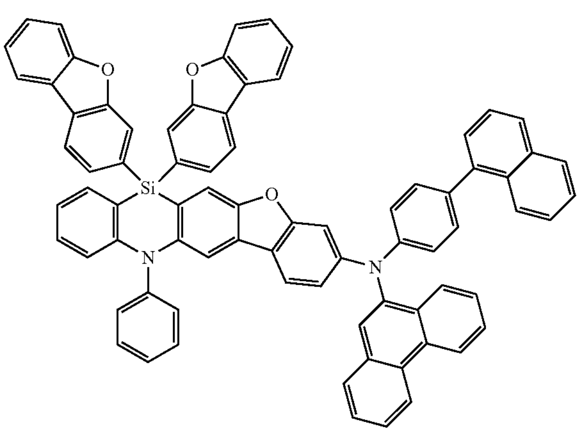
A163
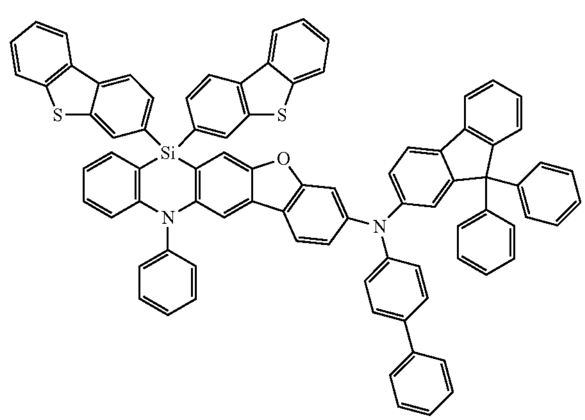

-continued
A164
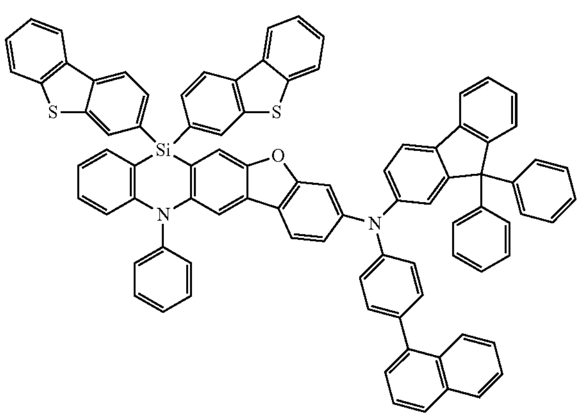
A165
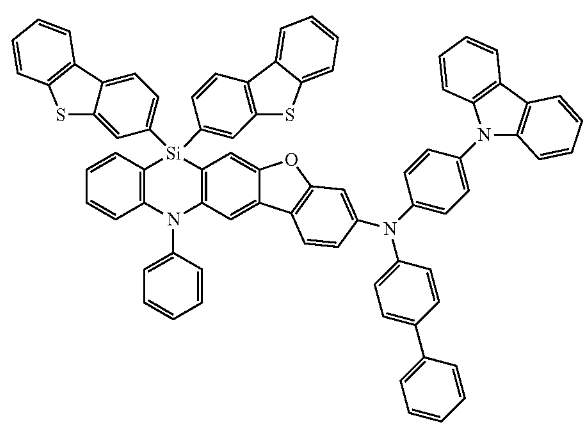
A166
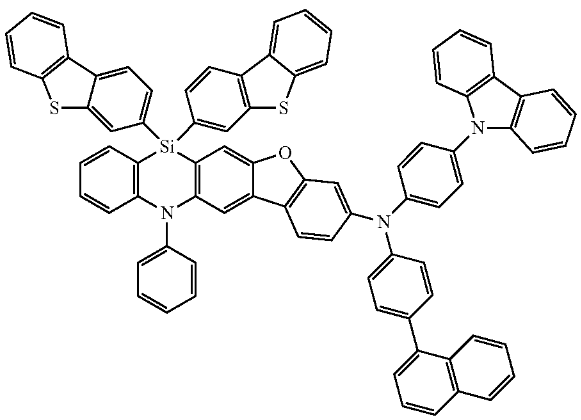
A167
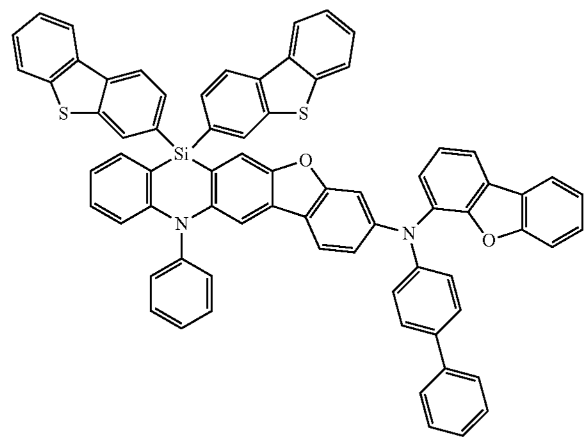
A168
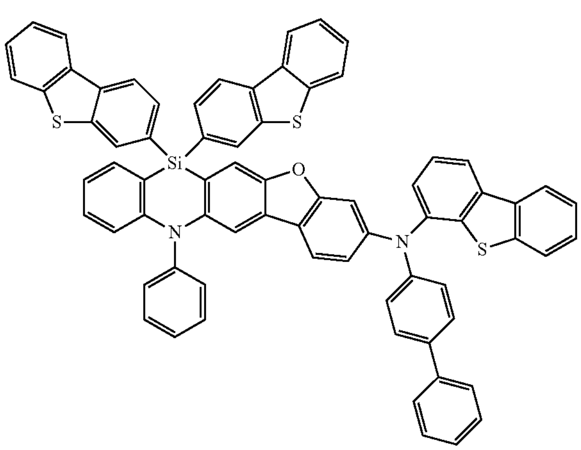
A169
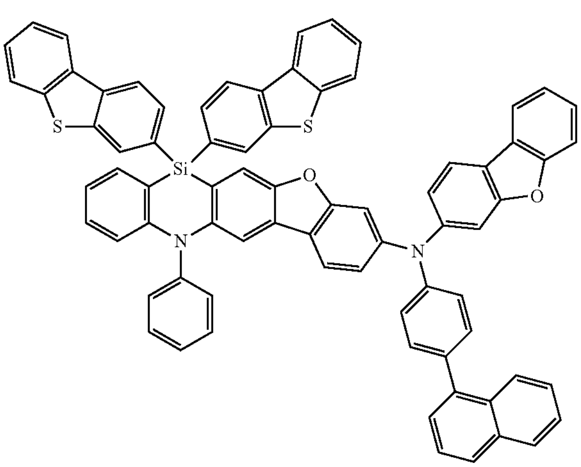

-continued
A170
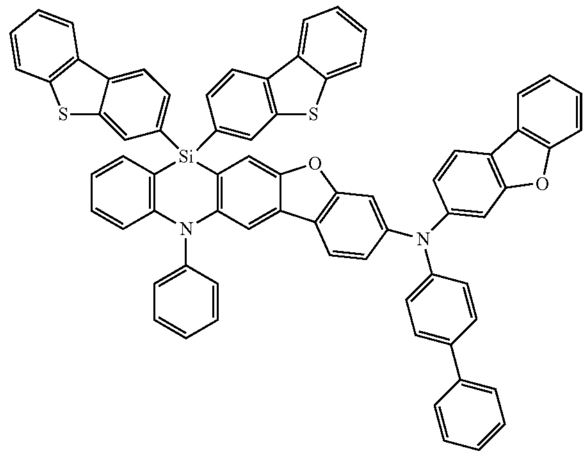
A171
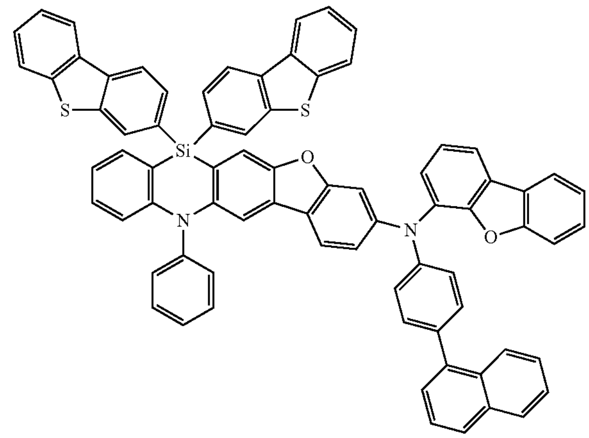
A172
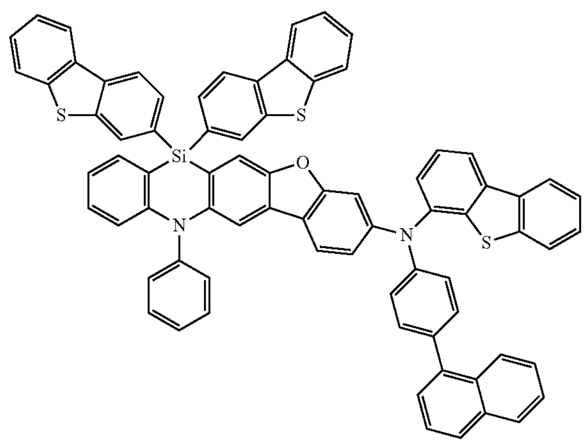
A173
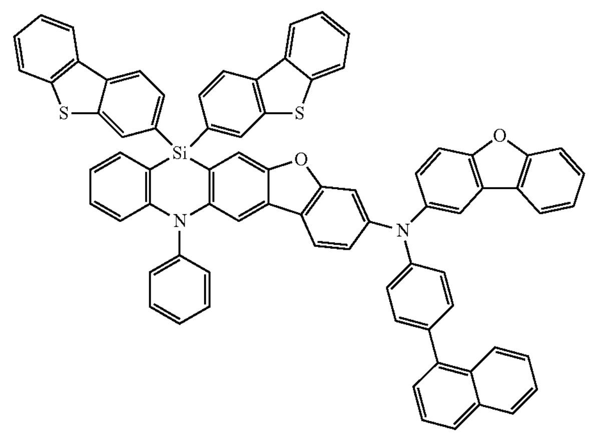
A174
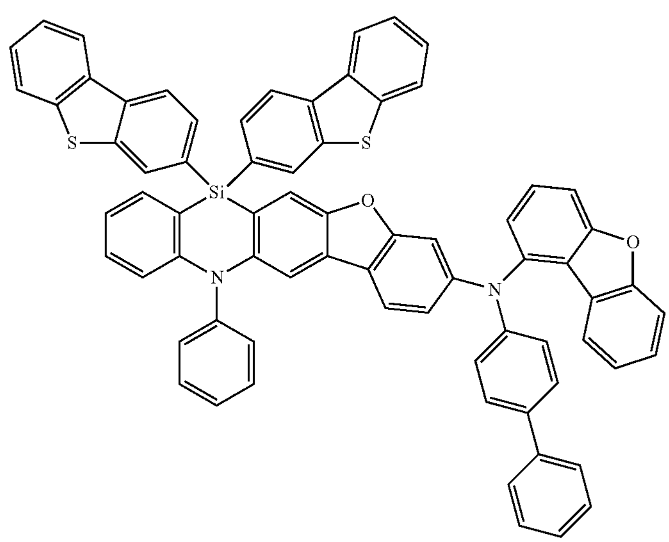

-continued
[Compound Group B]
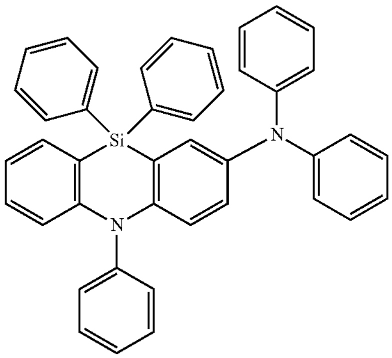
B1
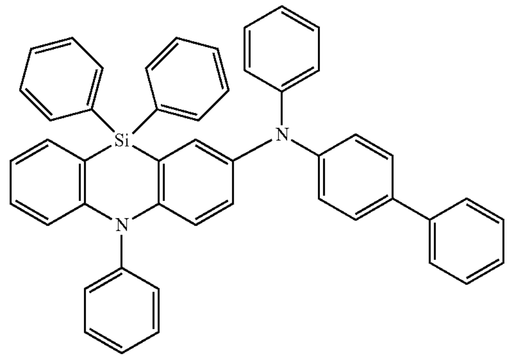
B2
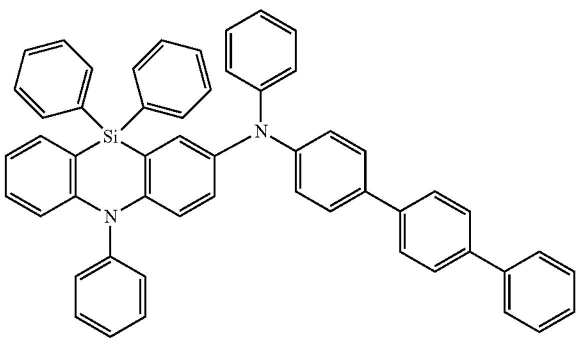
B3
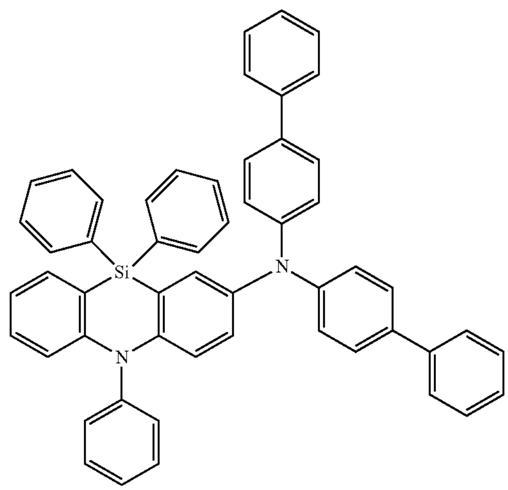
B4
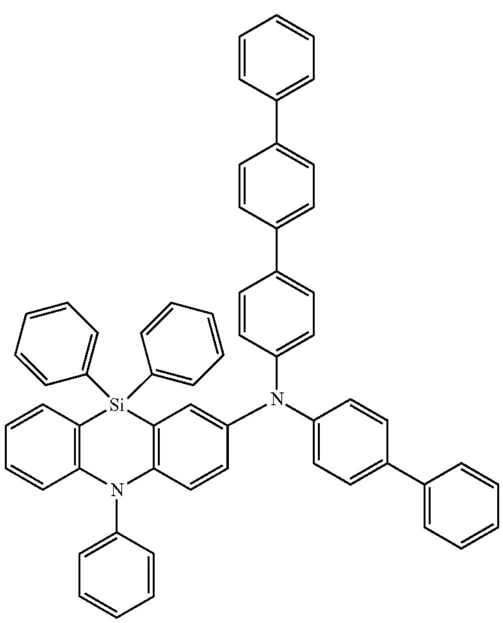
B5
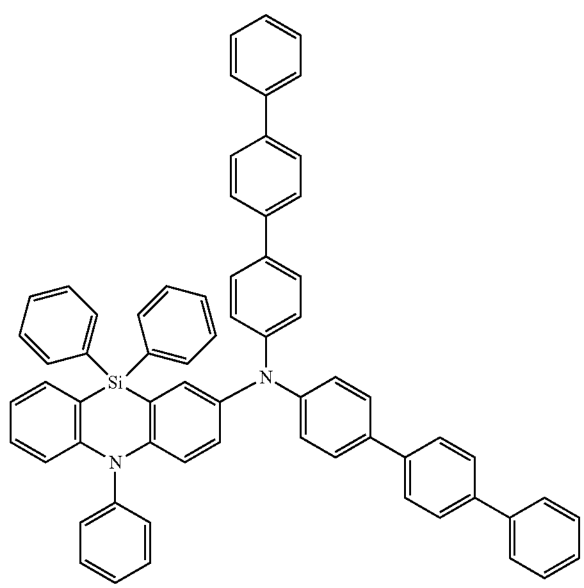
B6

-continued
B7
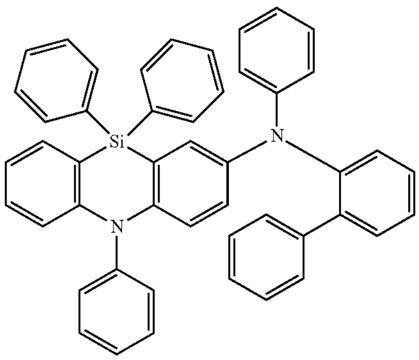
B8
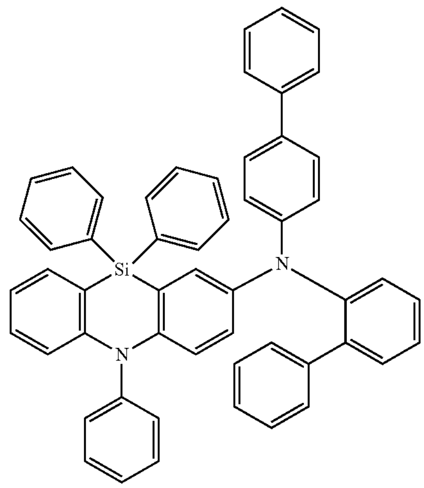
B9
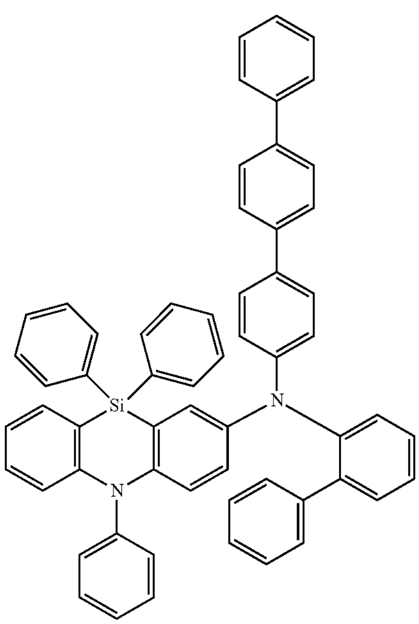
B10
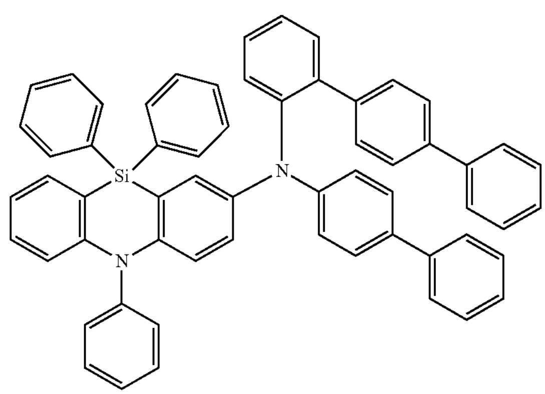

-continued
B11
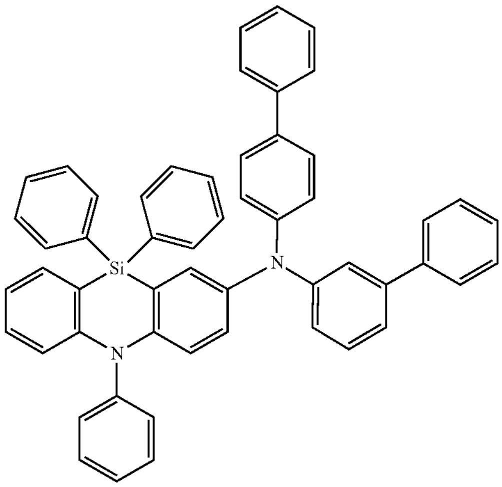
B12
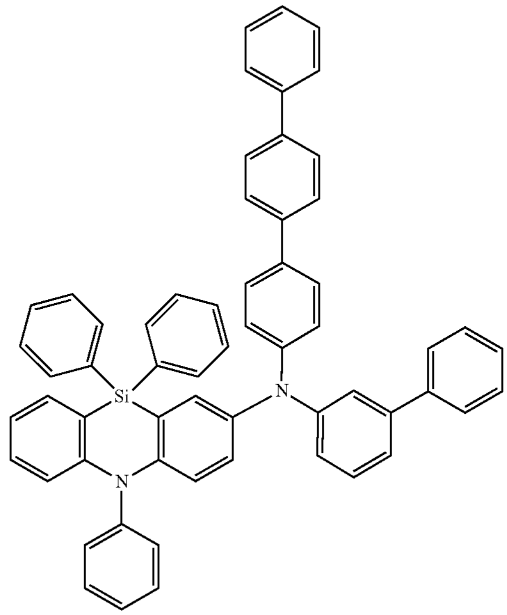
B13
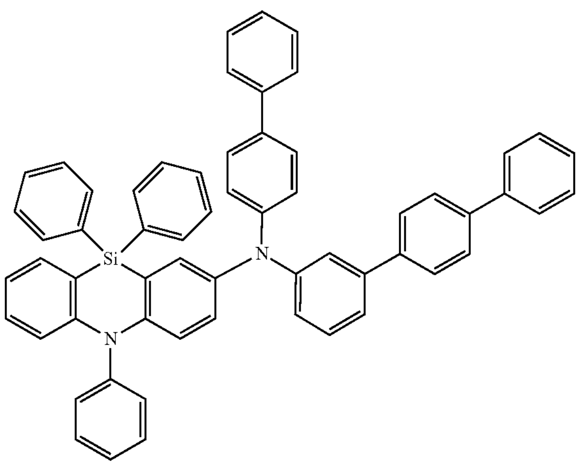
B14
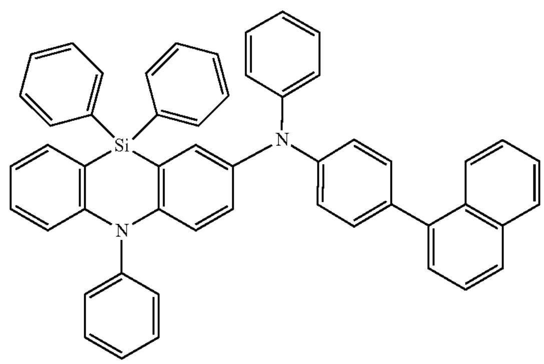
B15
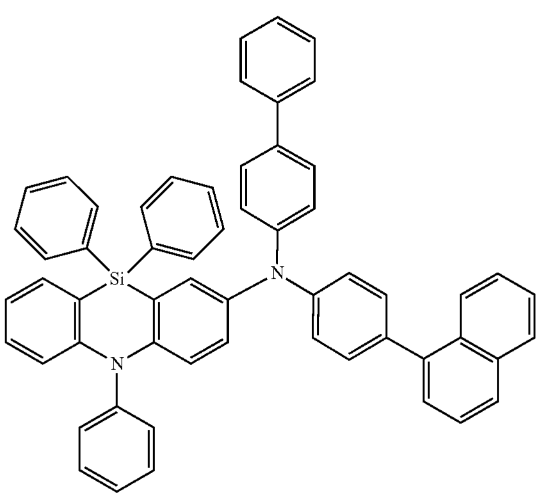
B16
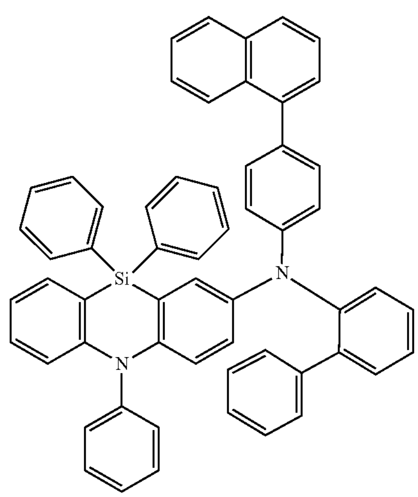

-continued
B17
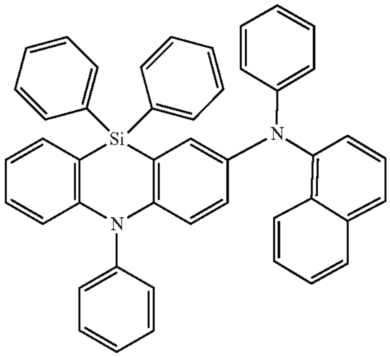
B18
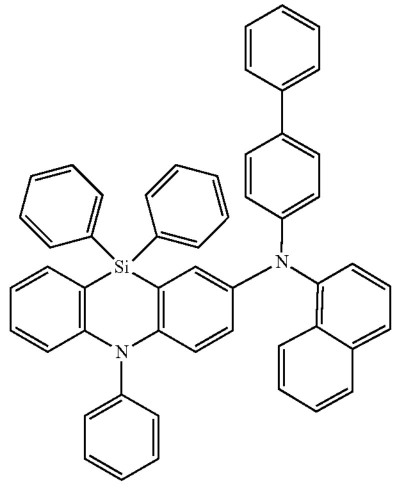
B19
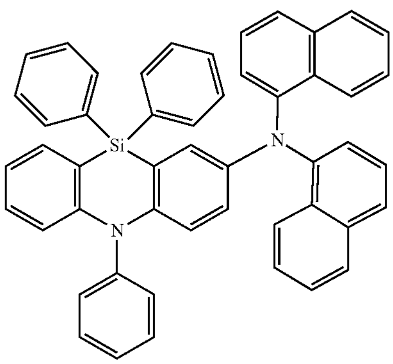
B20
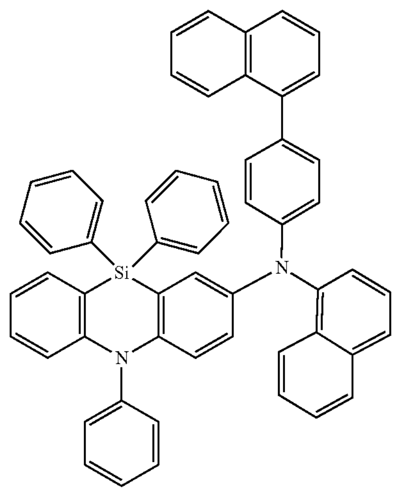
B21
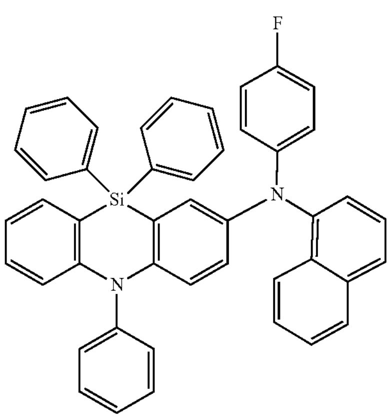
B22
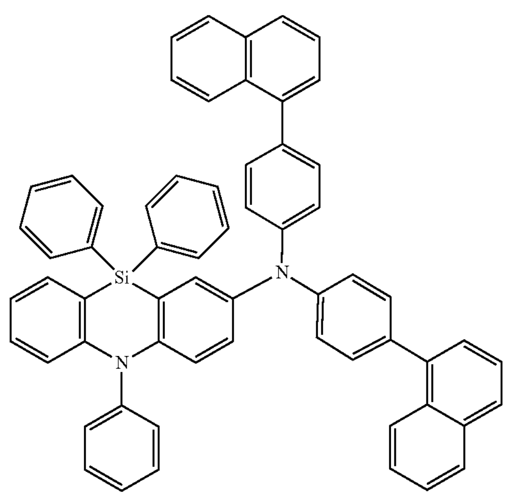

-continued
B23
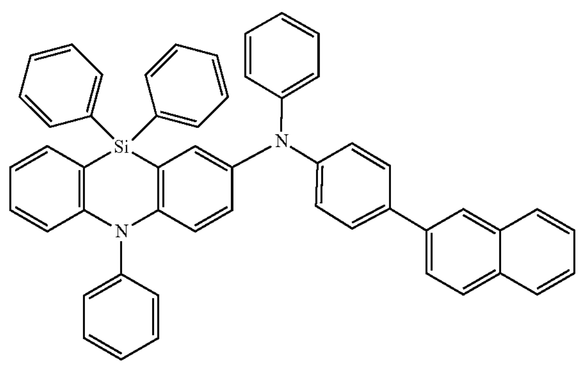
B24
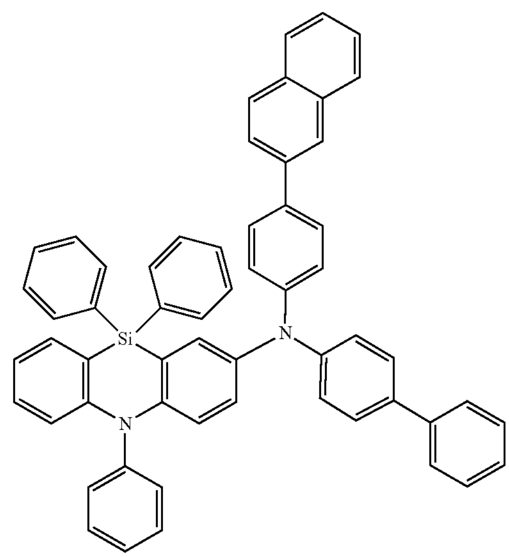
B25
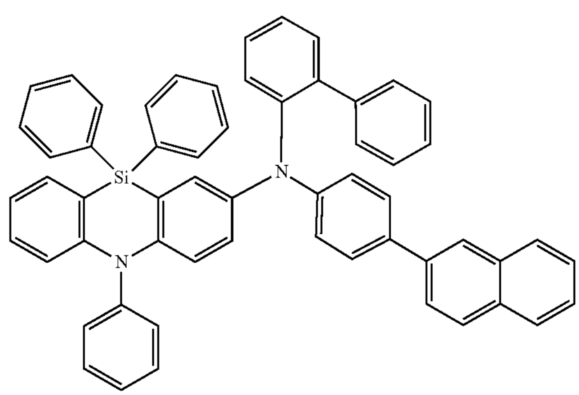
B26
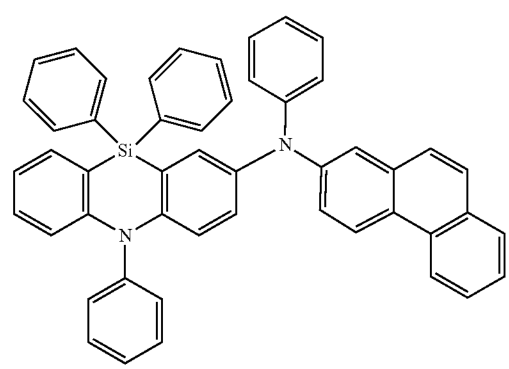
B27
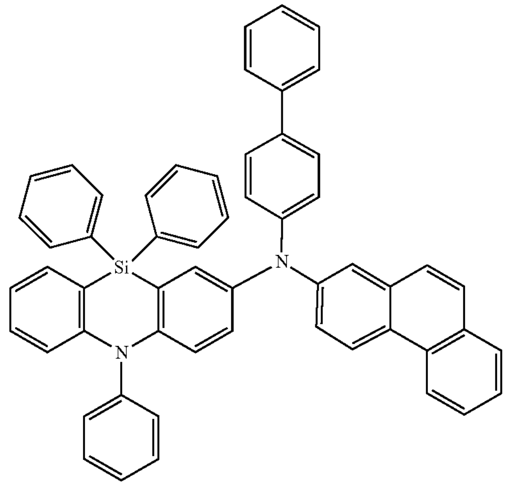
B28
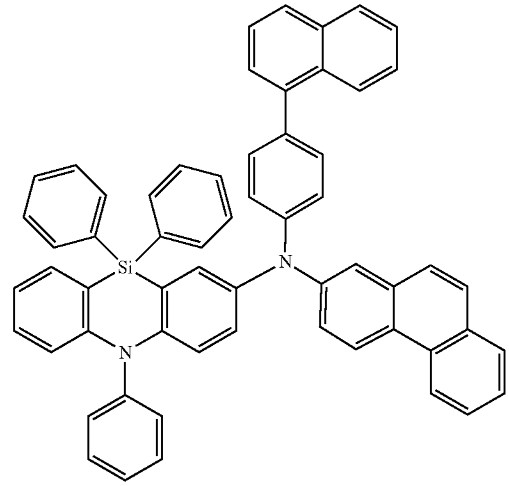

-continued
B29
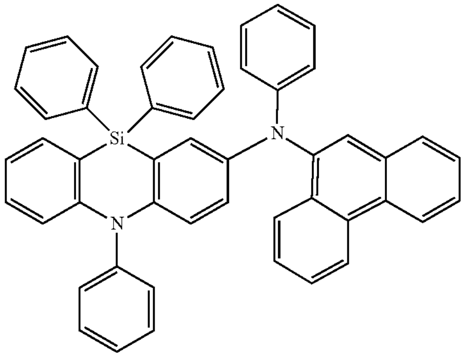
B30
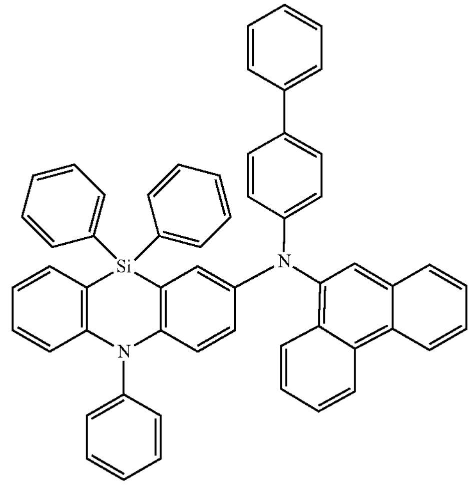
B31
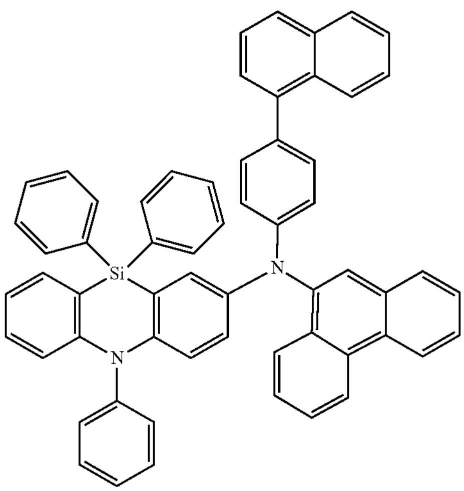
B32
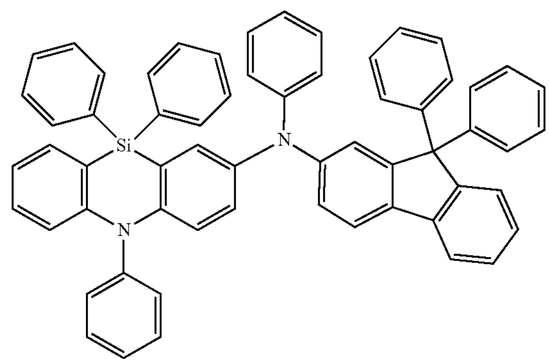
B33
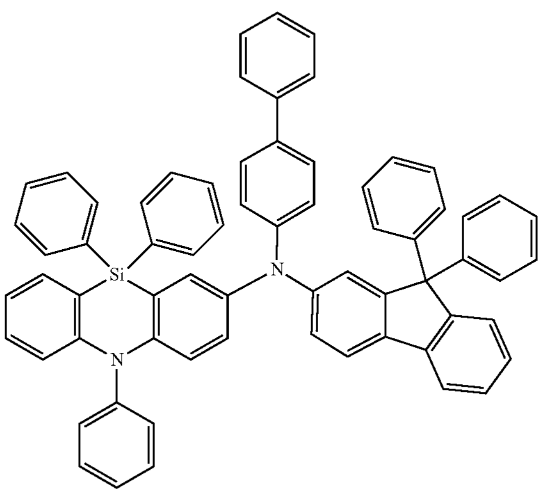
B34
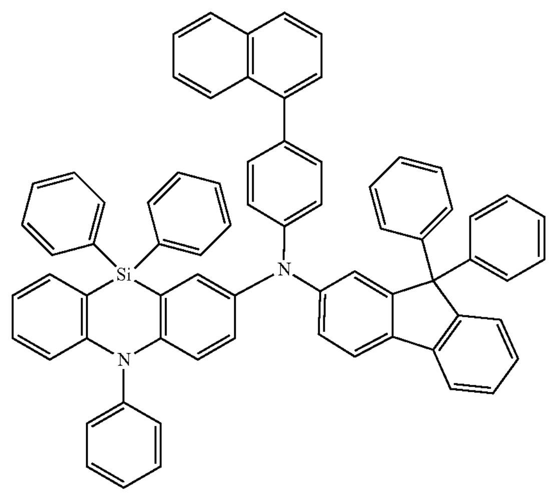

-continued
B35
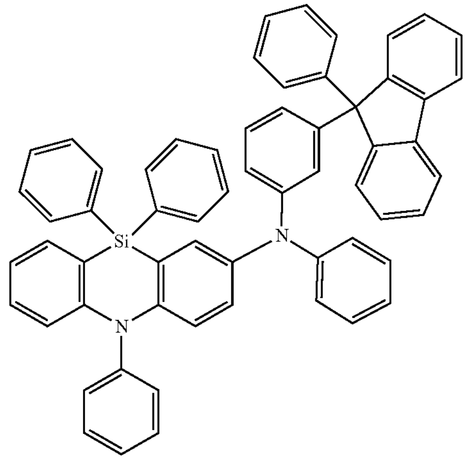
B36
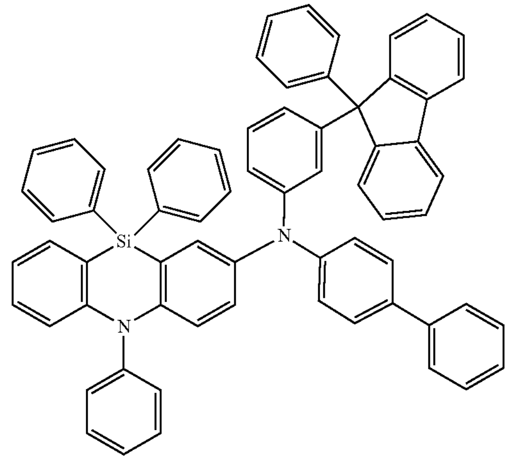
B37
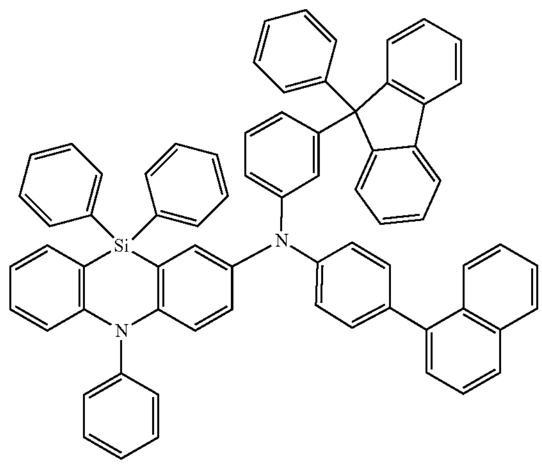
B38
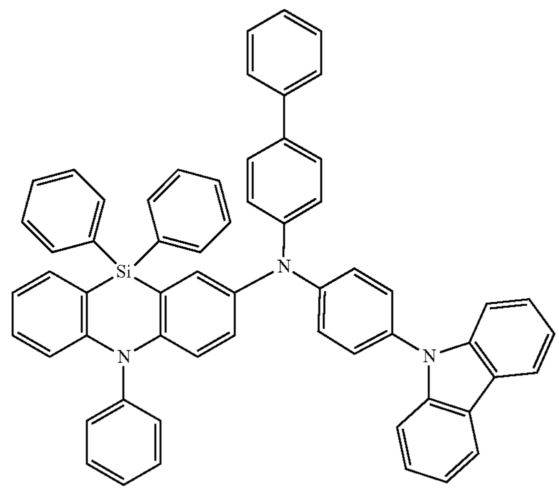
B39
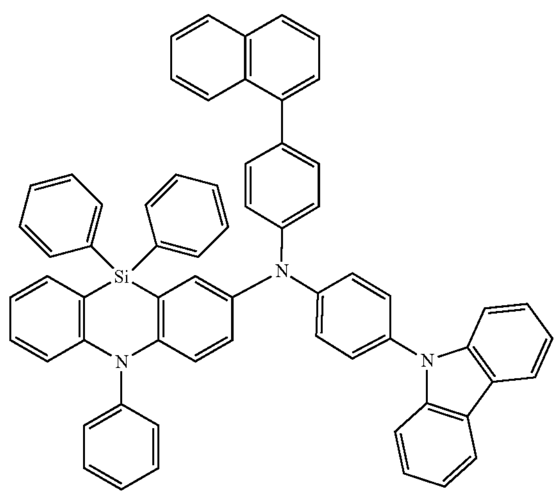
B40
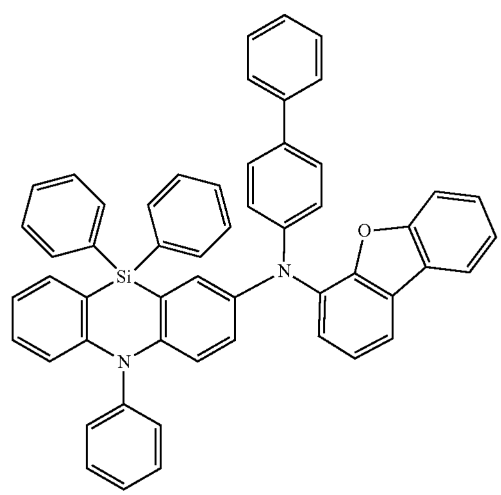

-continued
B41
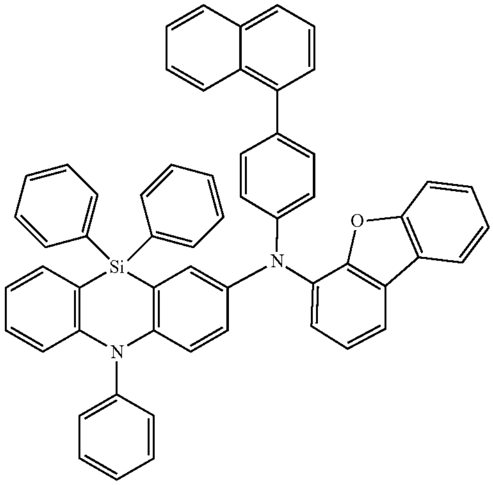
B42
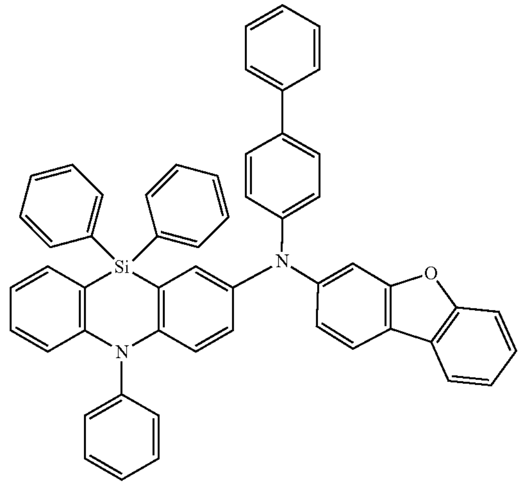
B43
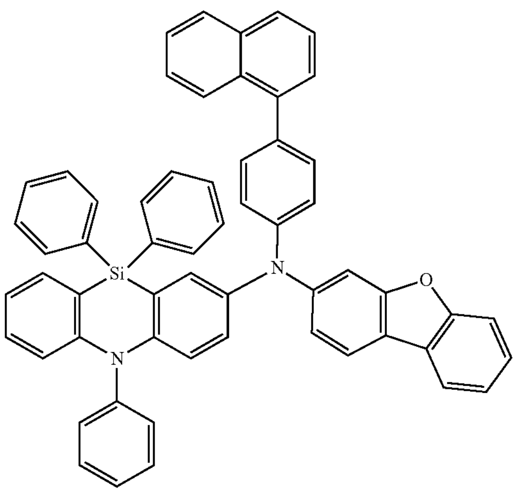
B44
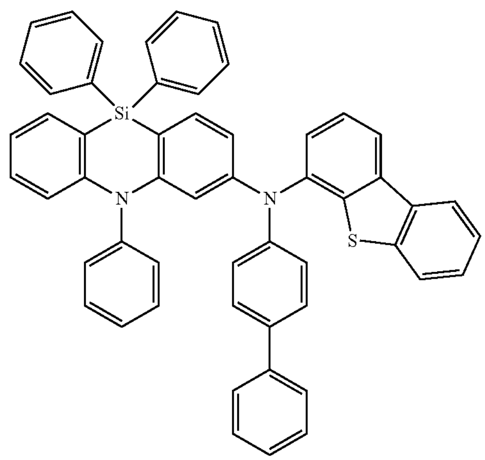
B45
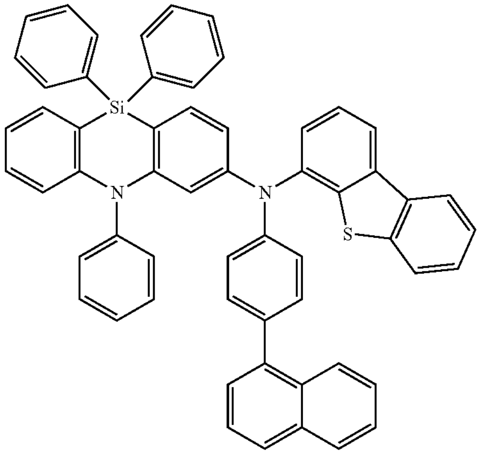
B46
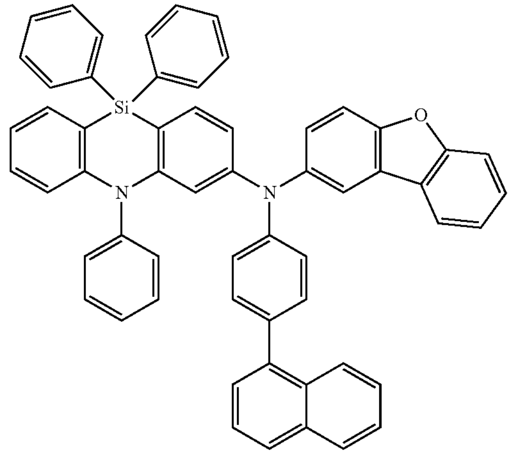

-continued
B47
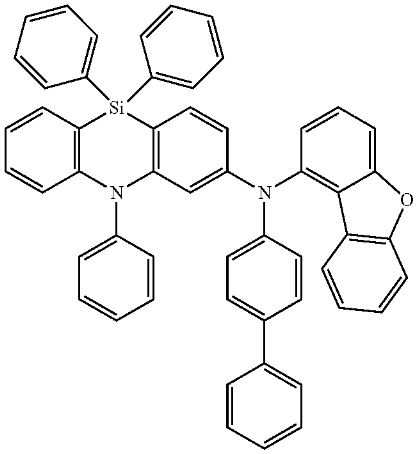
B48
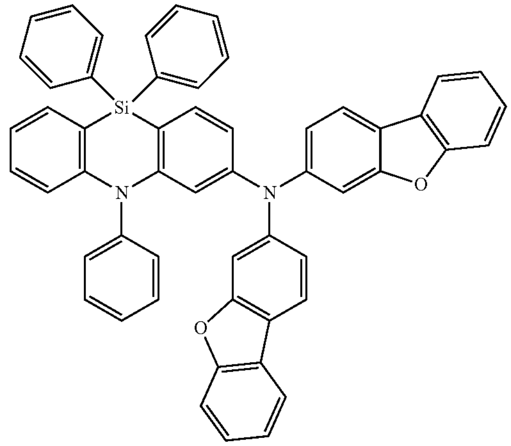
B49
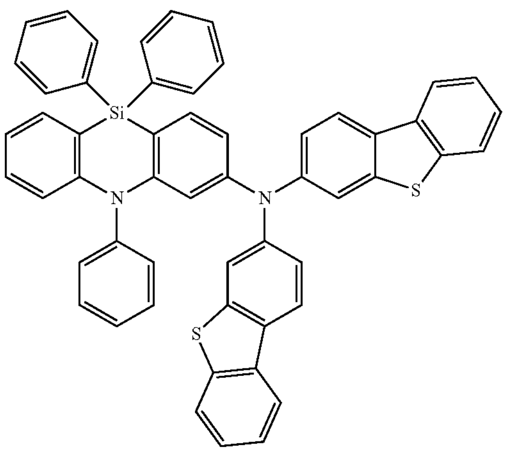
B50
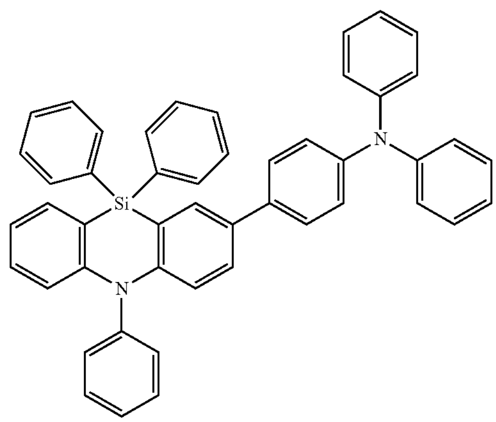
B51
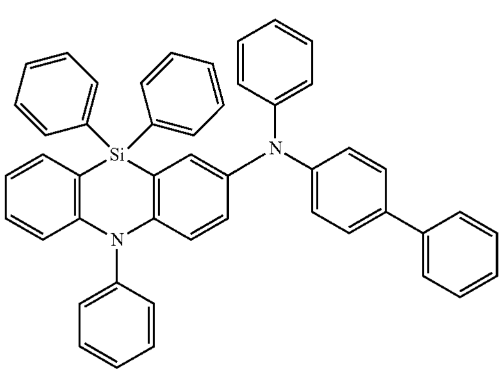
B52
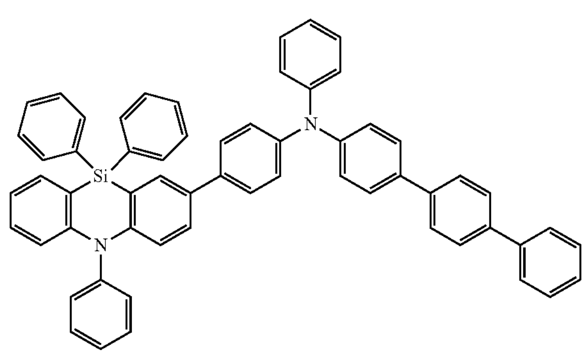

-continued
B53
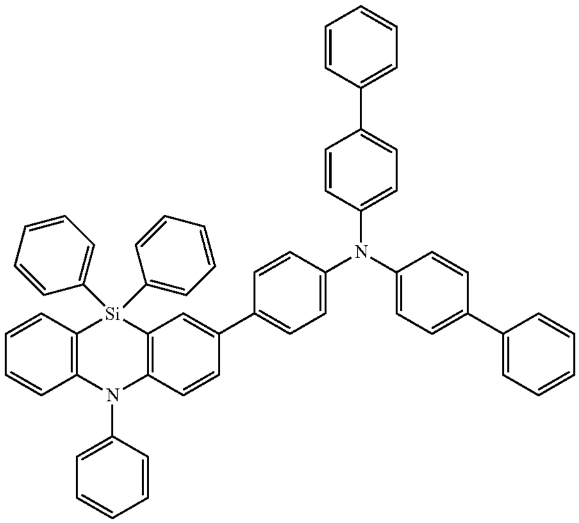
B54
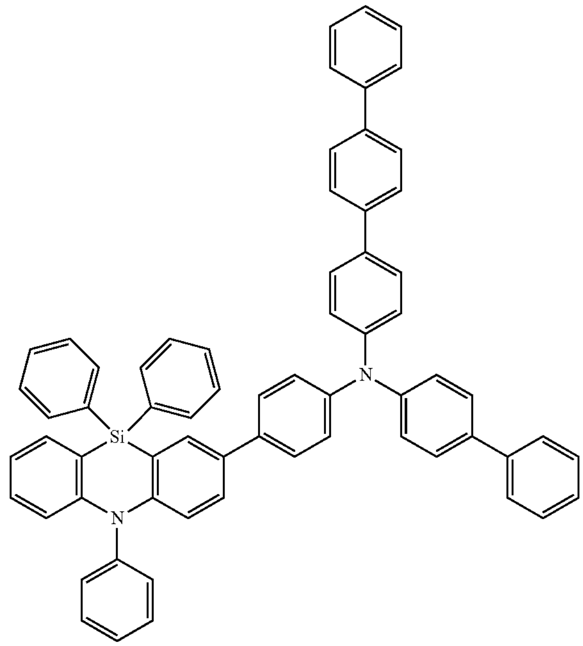
B55
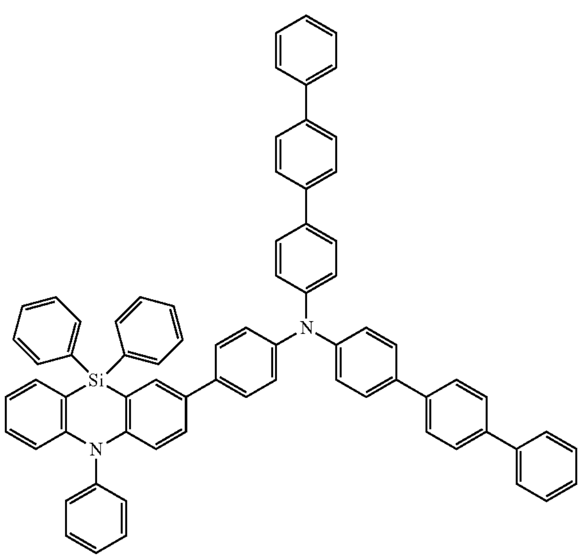
B56
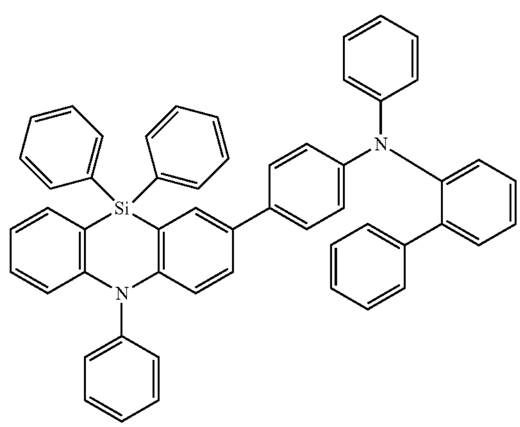

-continued
B57
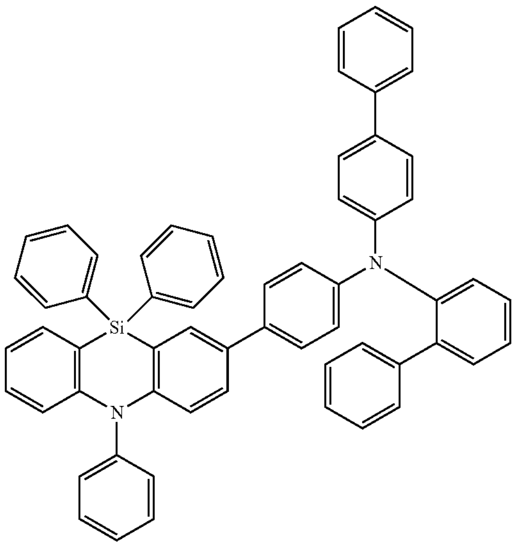
B58
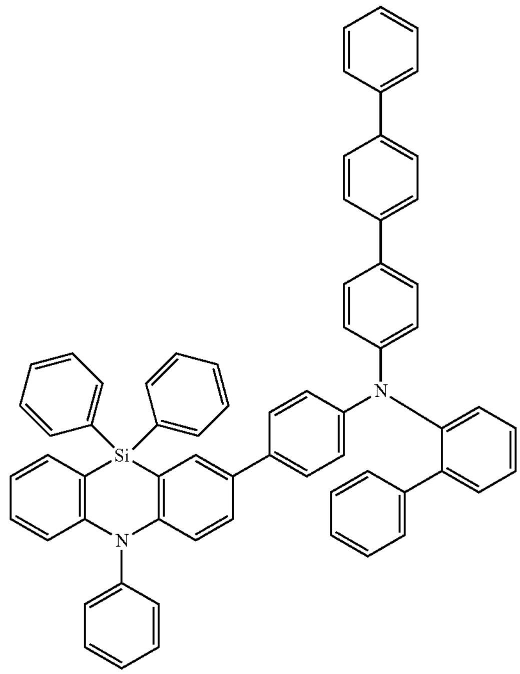
B59
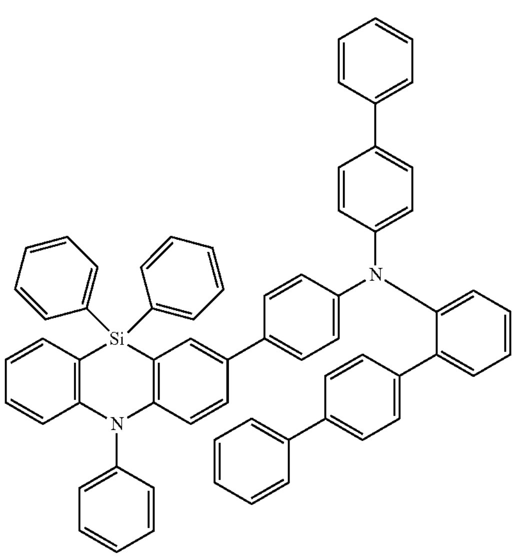
B60
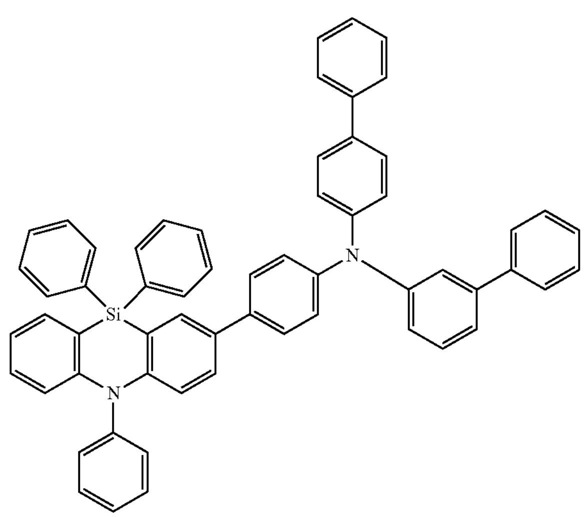

-continued
B61
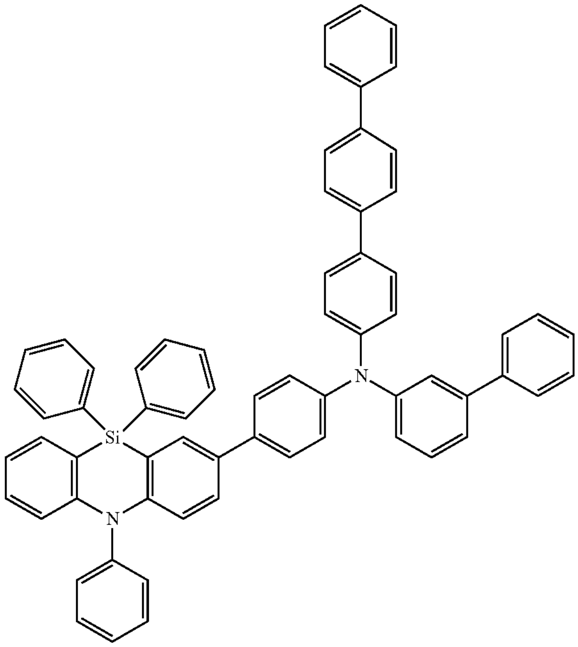
B62
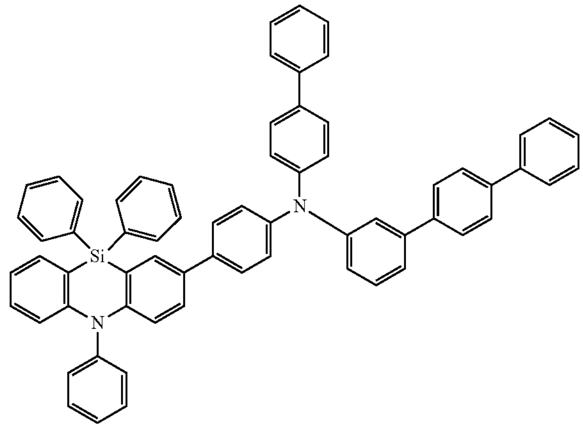
B63
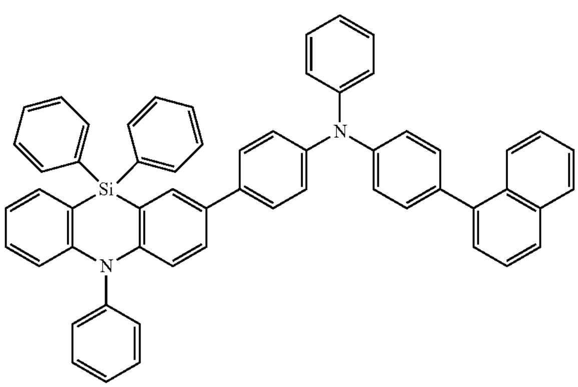
B64
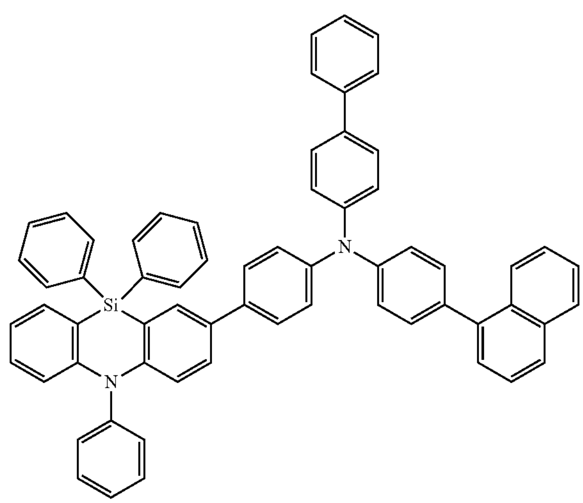

-continued
B65
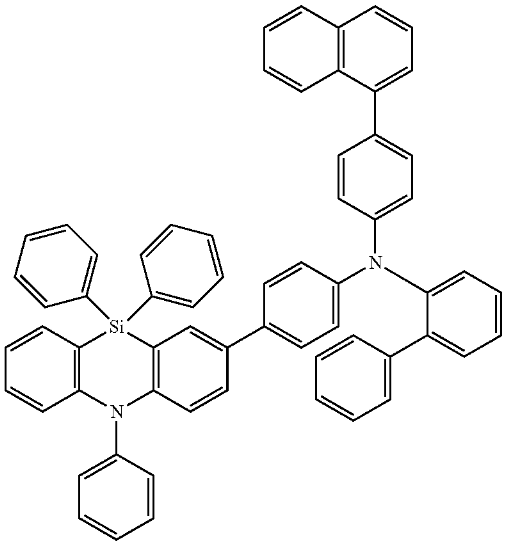
B66
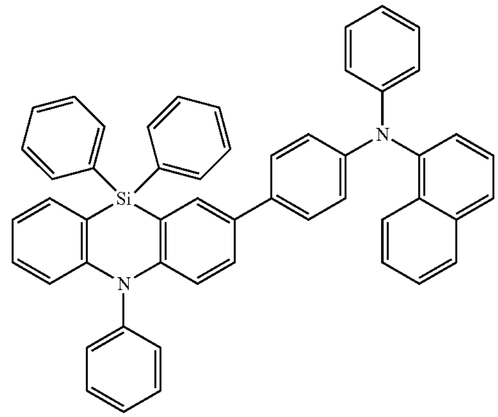
B67
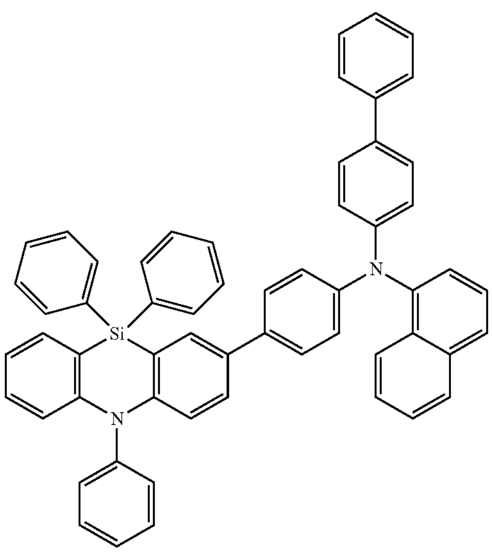
B68
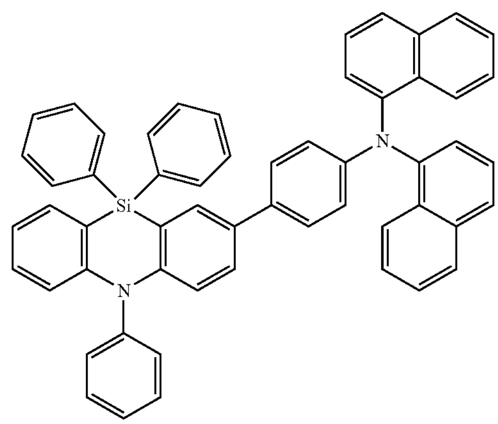
B69
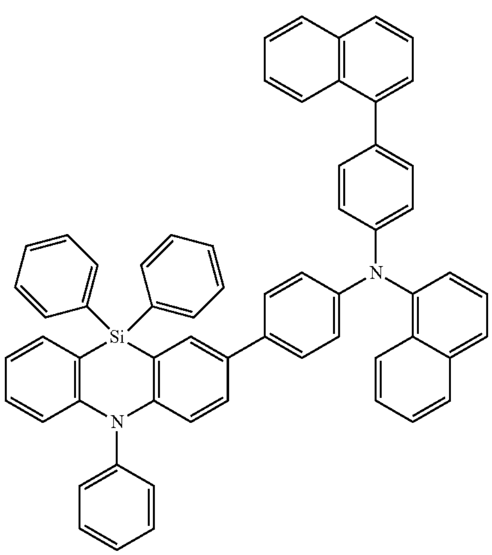
B70
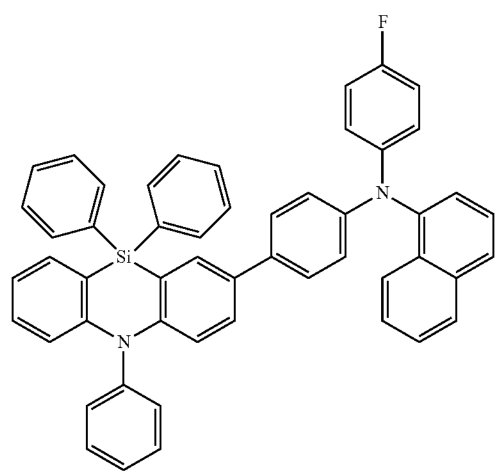

-continued
B71
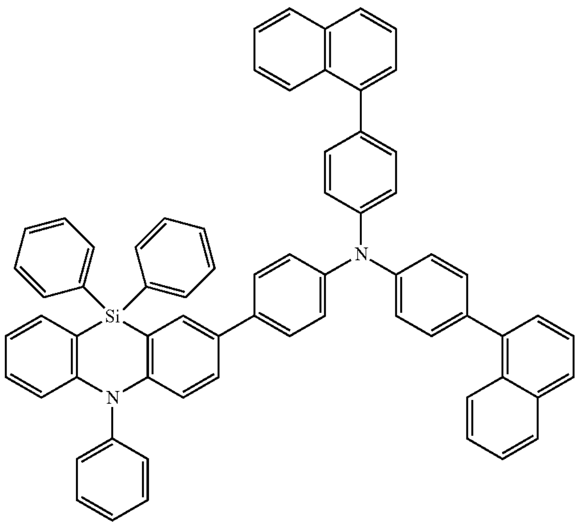
B72
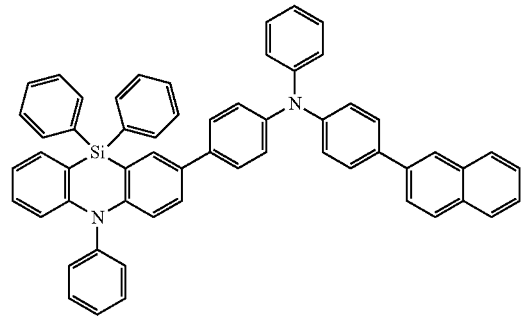
B73
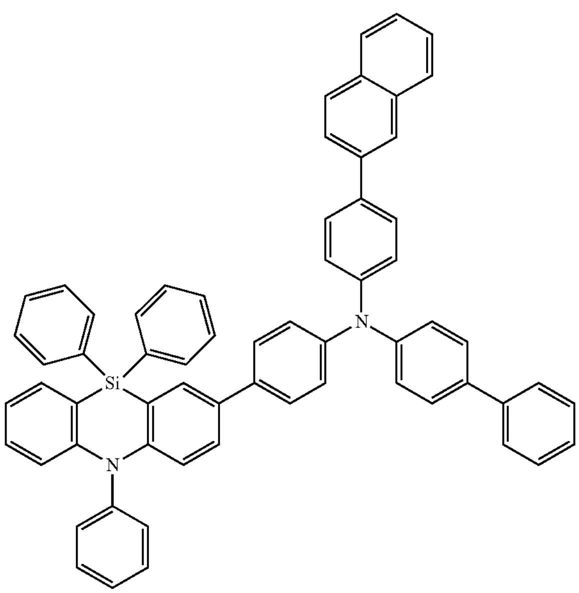
B74
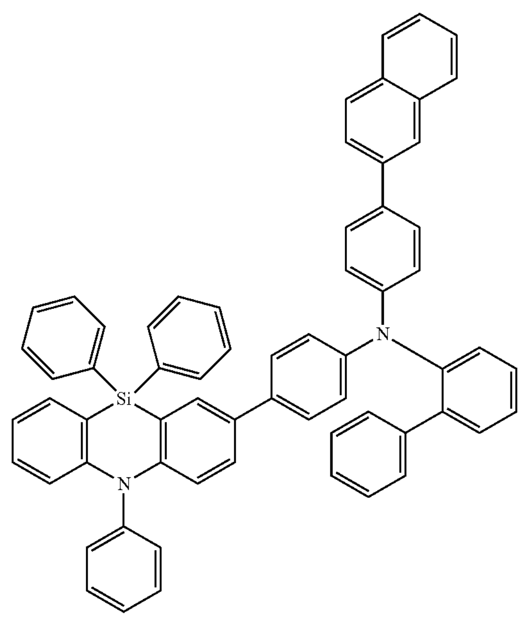

-continued
B75
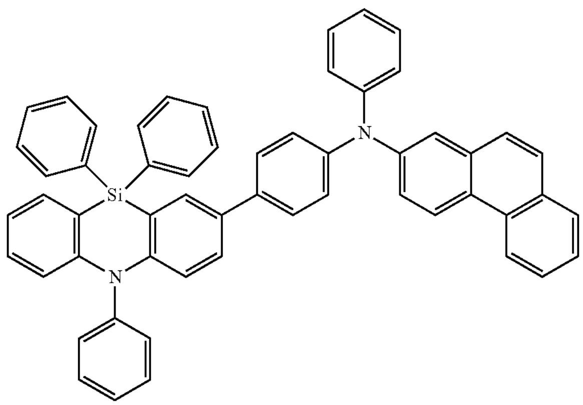
B76
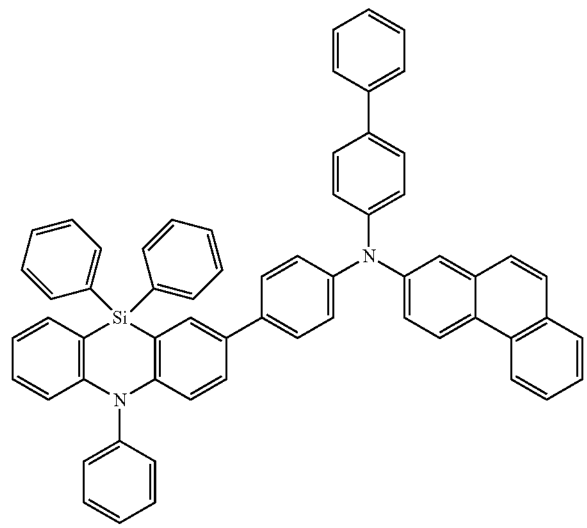
B77
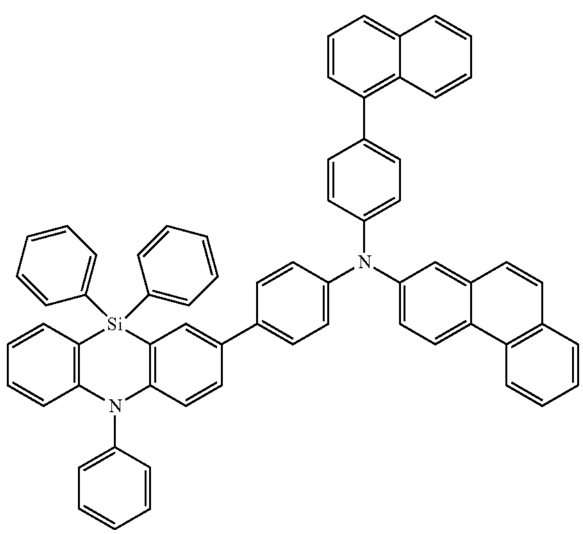
B78
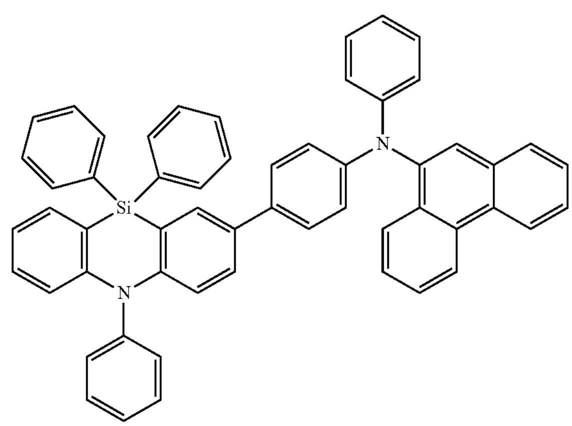
B79
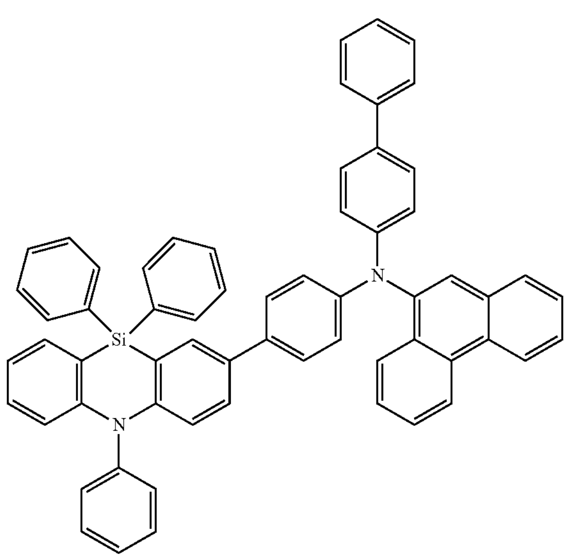
B80
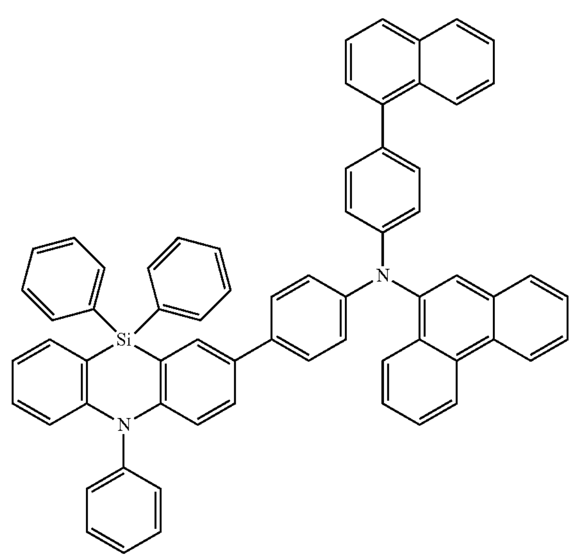

-continued
B81
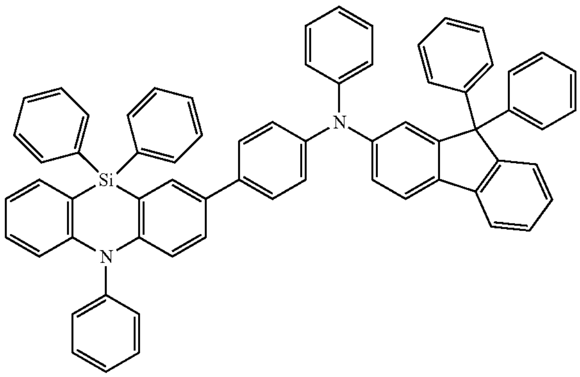
B82
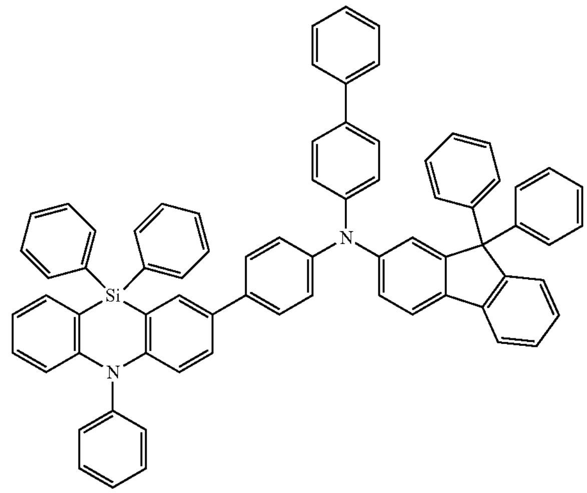
B83
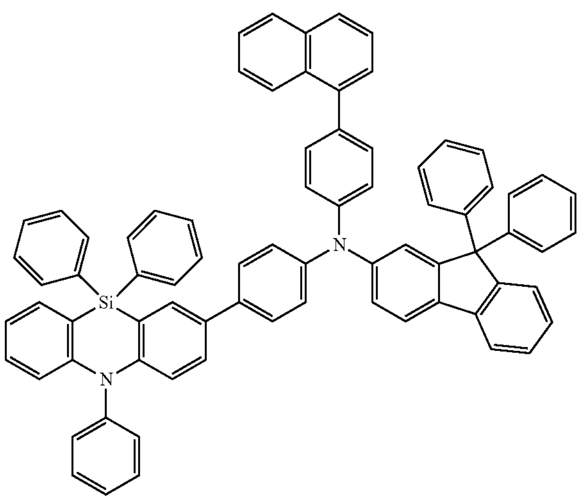
B84
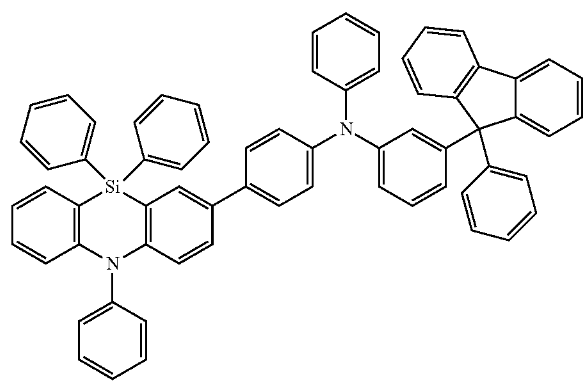
B85
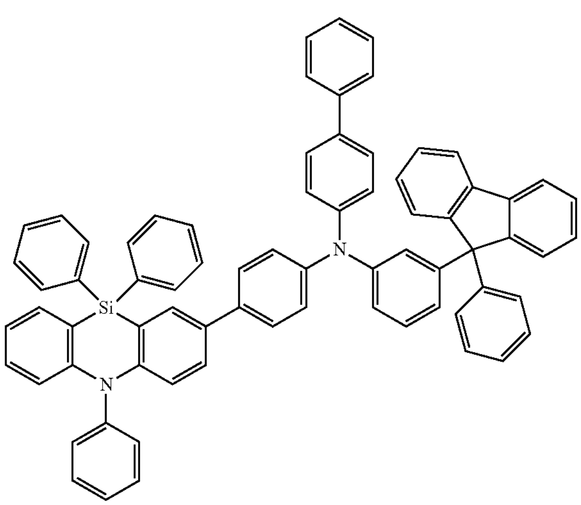
B86
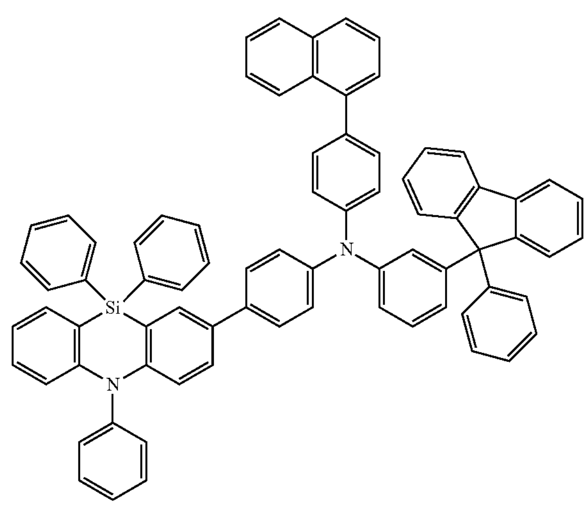

-continued
B87
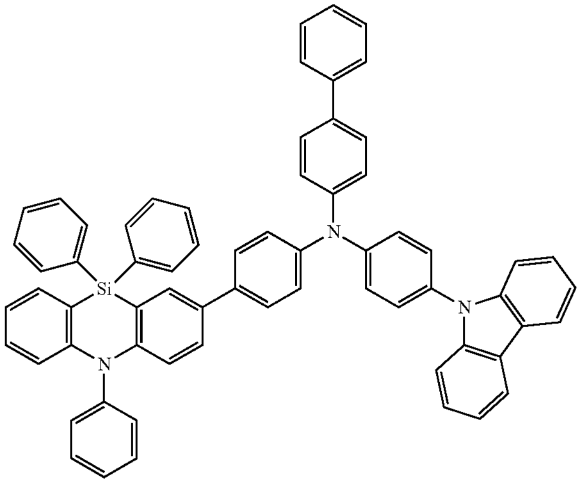
B88
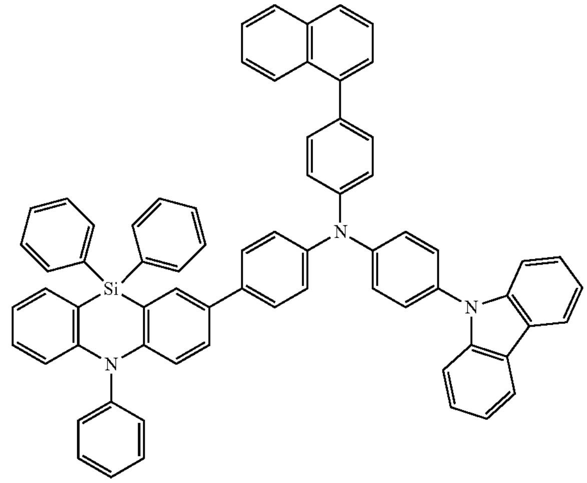
B89
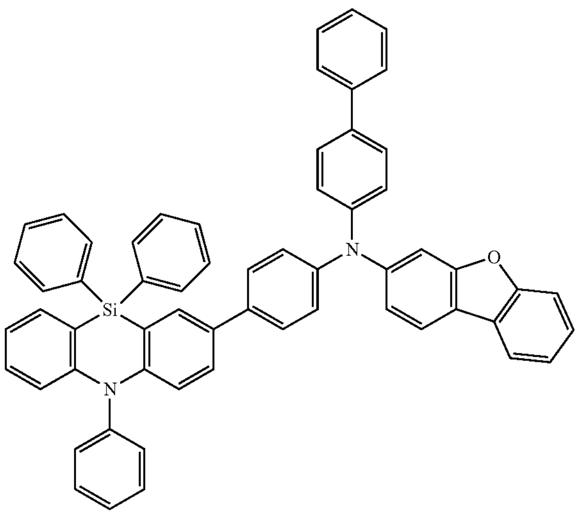
B90
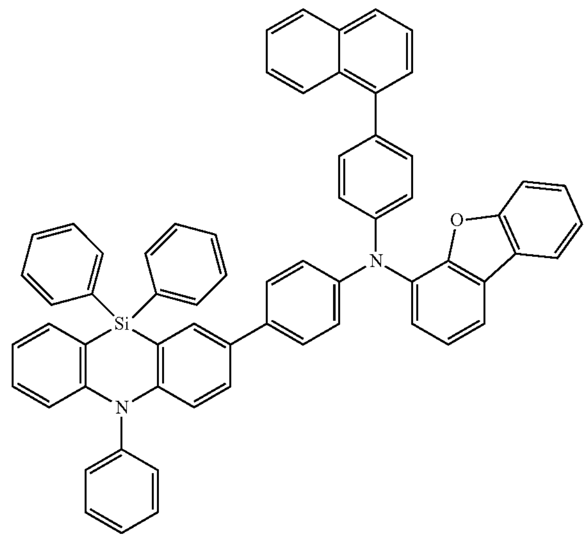
B91
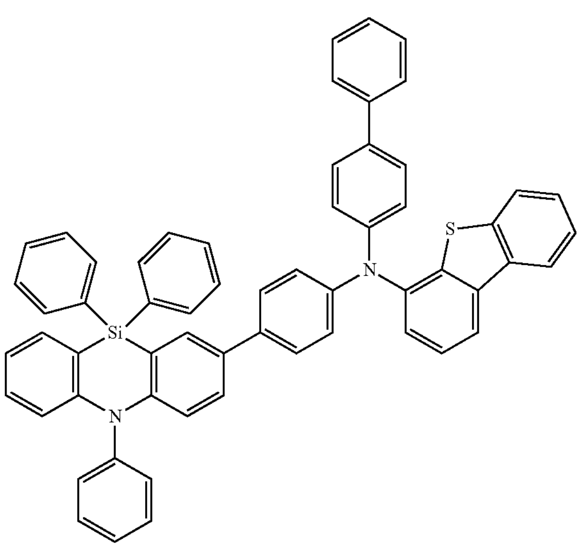
B92
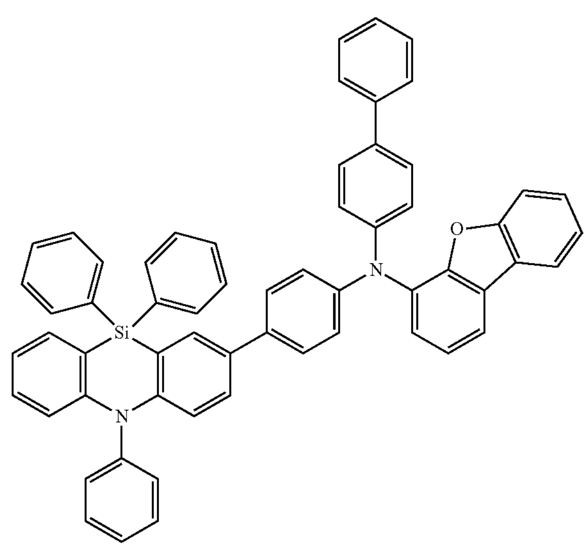

-continued
B93
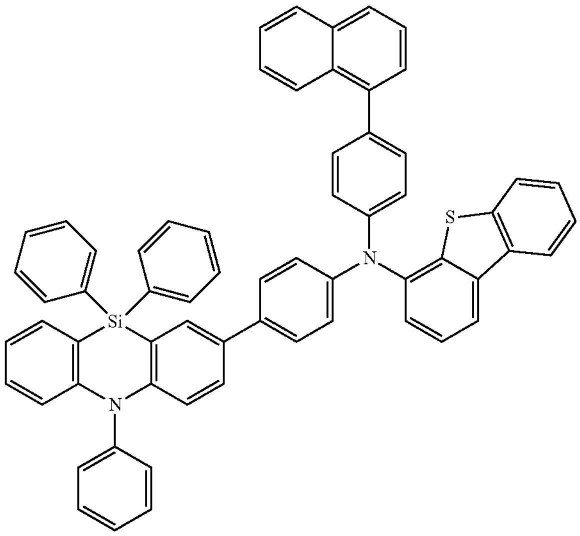
B94
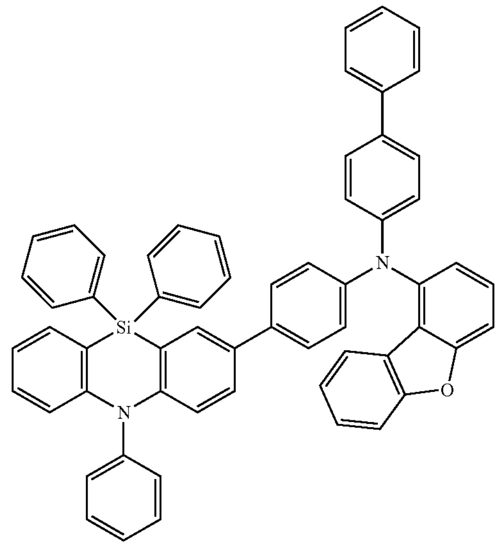
B95
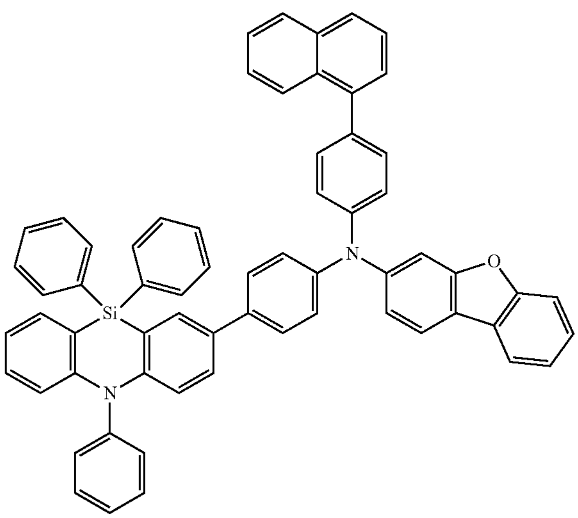
B96
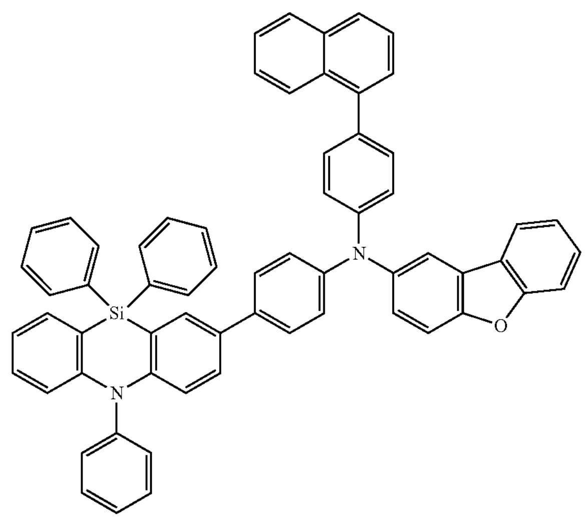
B97
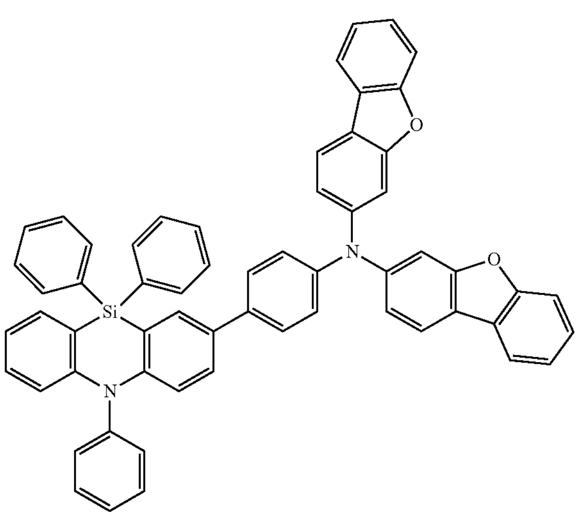
B98
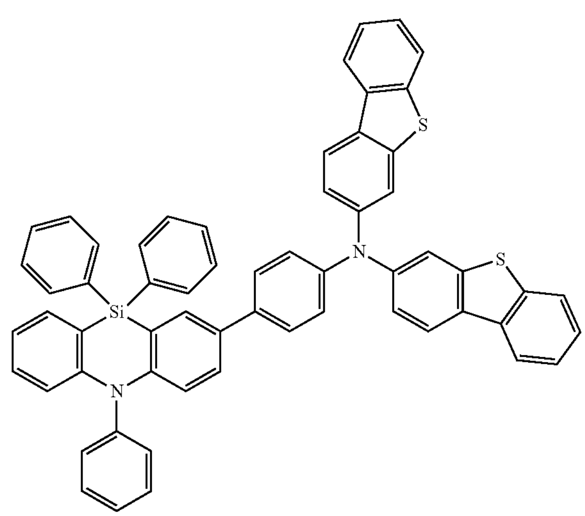

-continued
B99
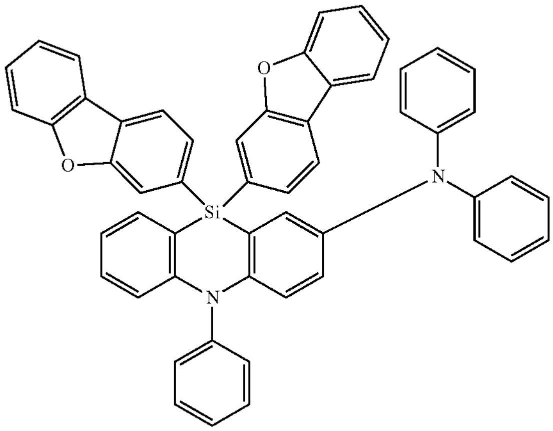
B100
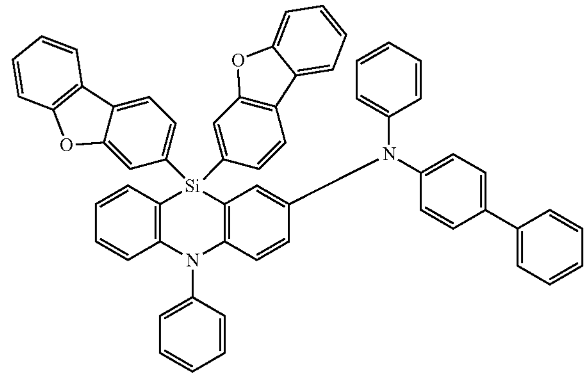
B101
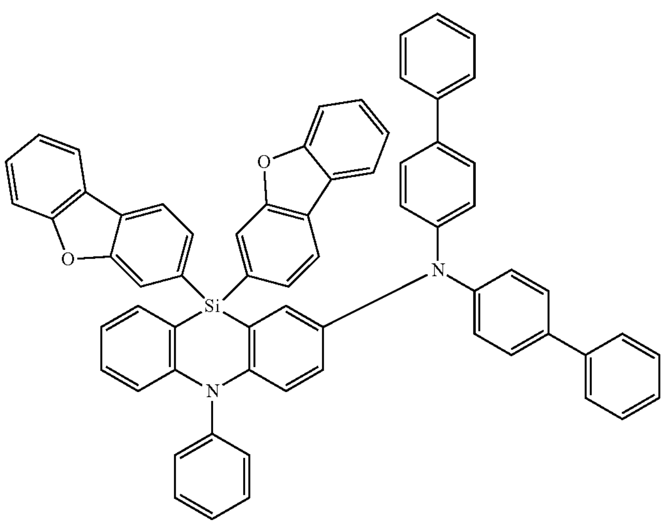
B102
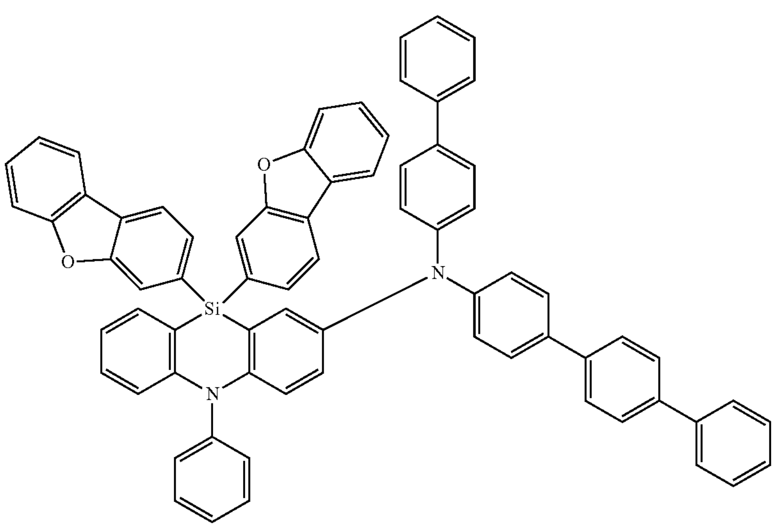

-continued
B103
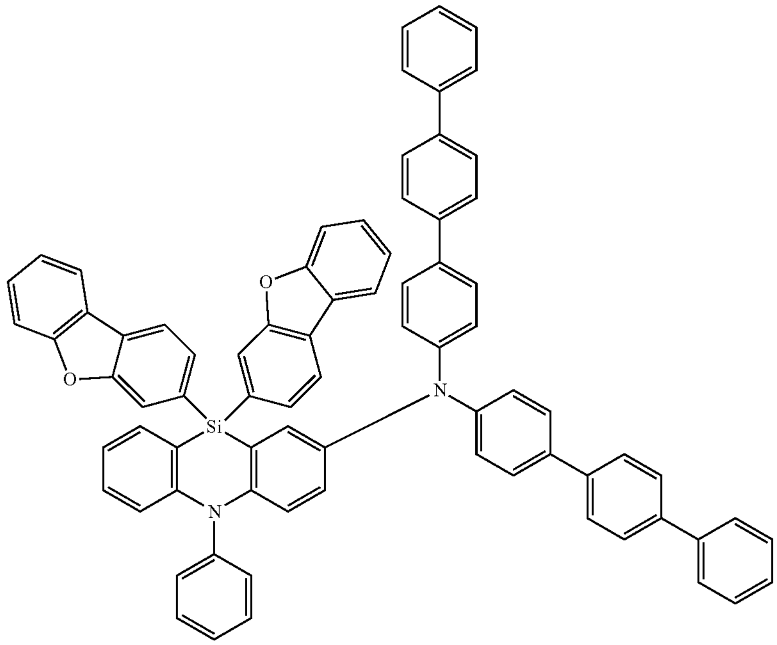
B104
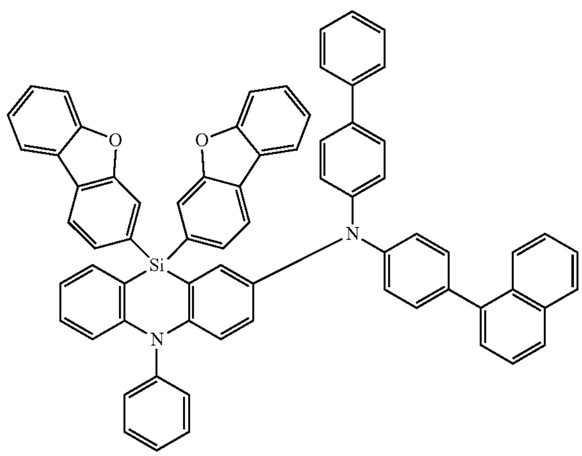
B105
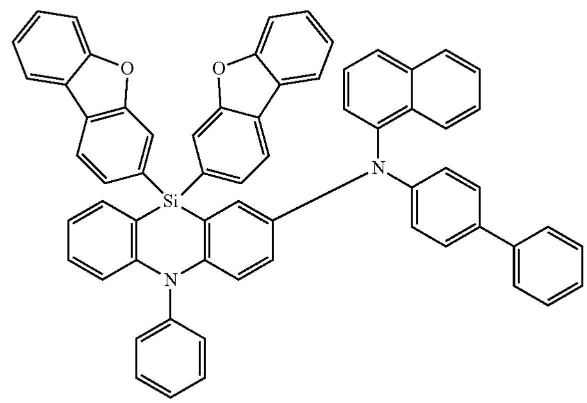
B106
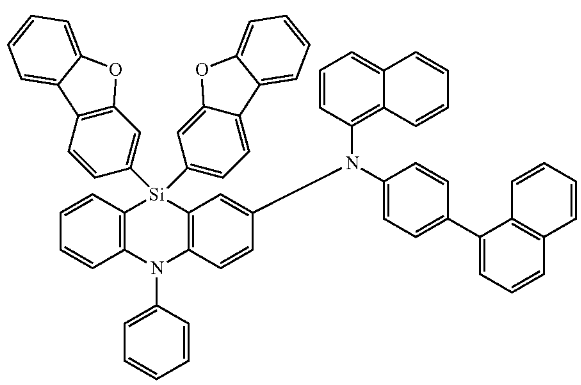
B107
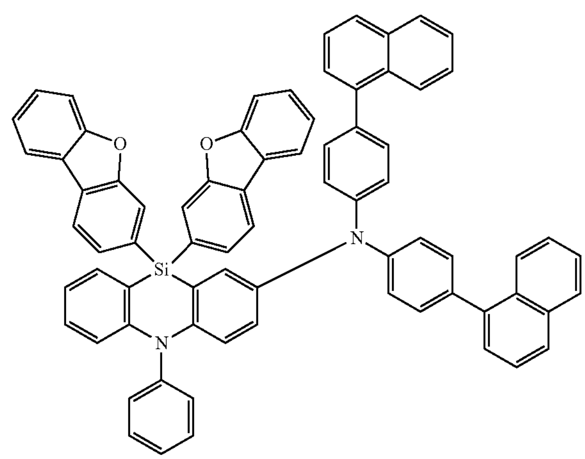

-continued
B108
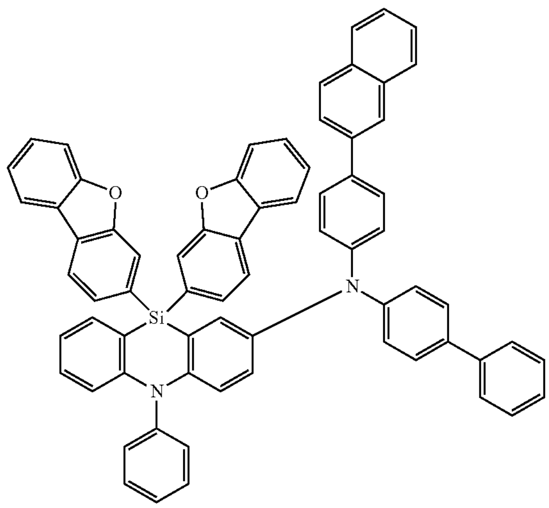
B109
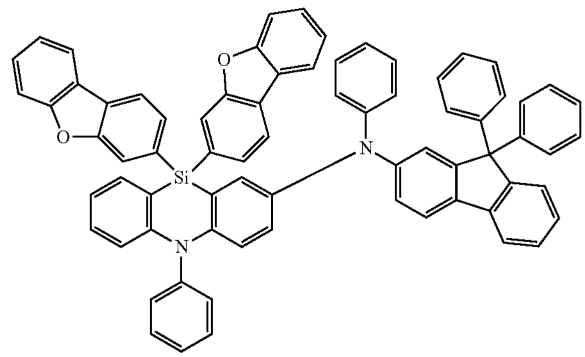
B110
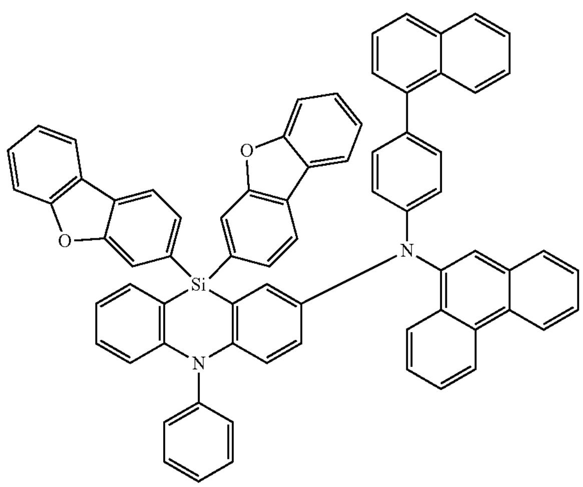
B111
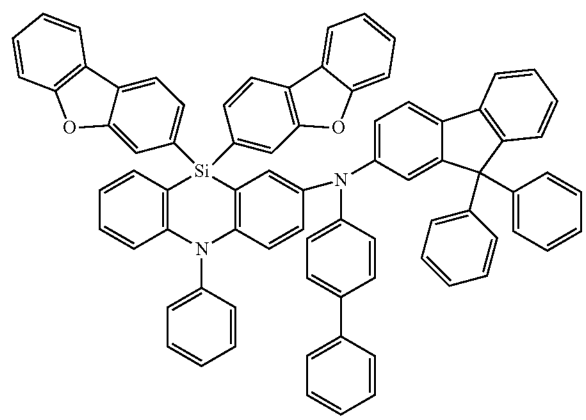
B112
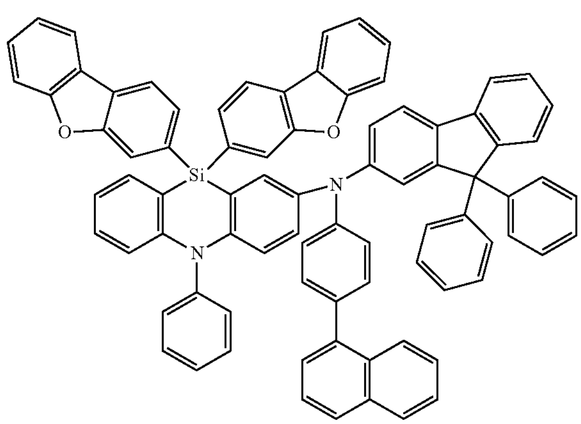
B113
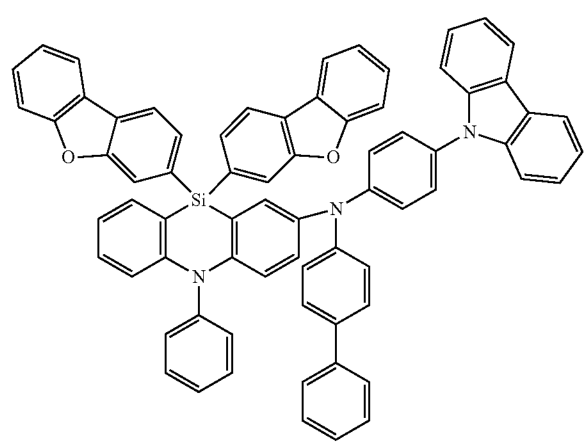

-continued
B114
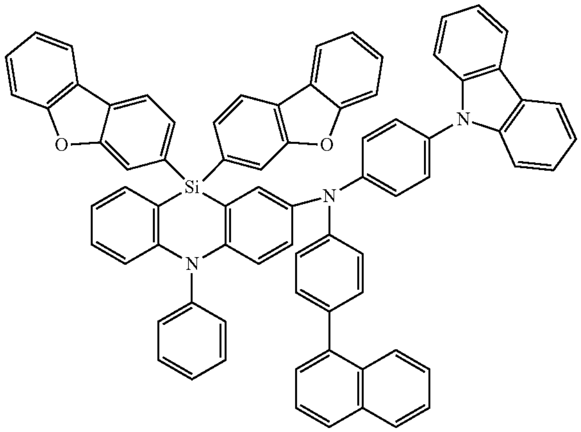
B115
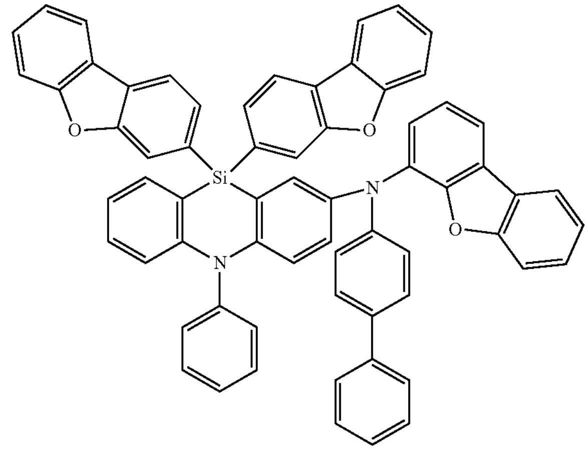
B116
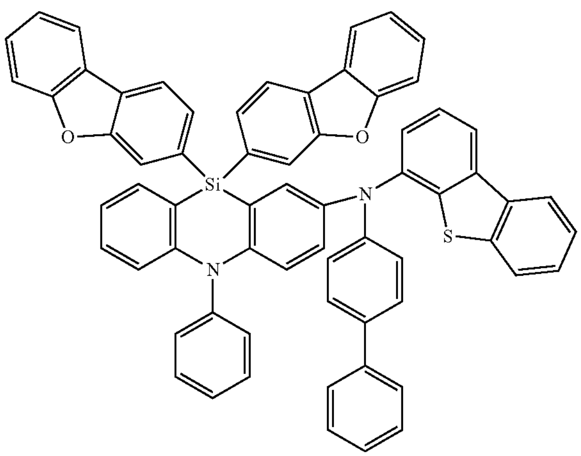
B117
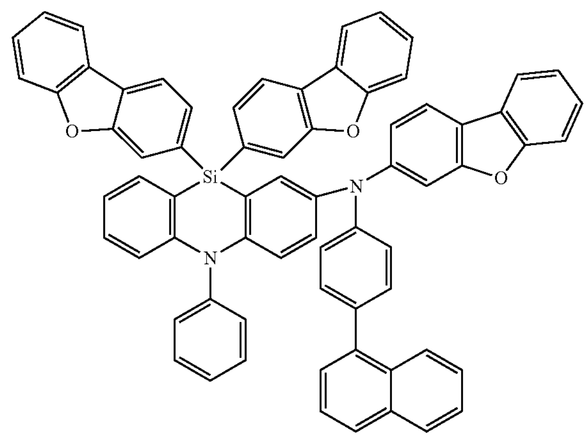
B118
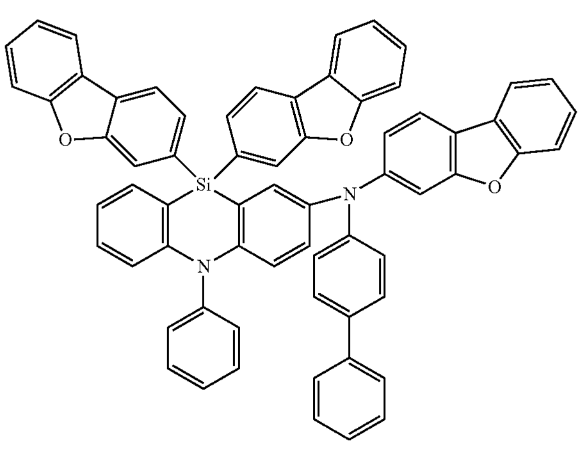
B119
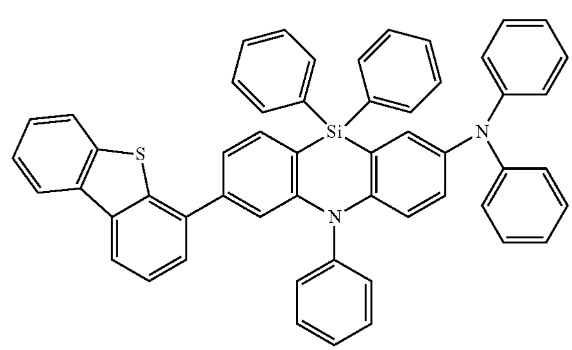

-continued

B120

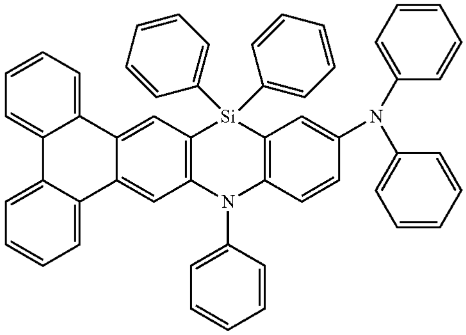

B121

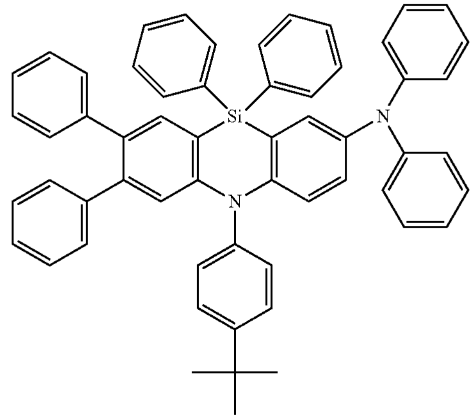

B122

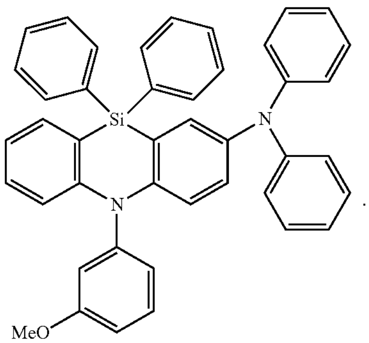

11. An amine compound represented by the following Formula 1:

[Formula 1]

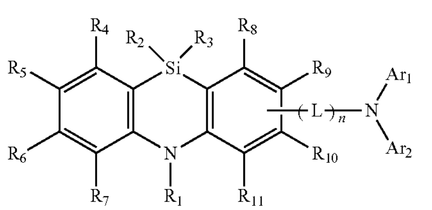

in Formula 1, $R_1$ is a substituted or unsubstituted aryl group having 6 to 40 ring carbon atoms, $R_2$ and $R_3$ are each independently a substituted or unsubstituted aryl group having 6 to 40 ring carbon atoms, or a substituted or unsubstituted heteroaryl group having 2 to 40 ring carbon atoms, $R_4$ to $R_{11}$ are each independently a hydrogen atom, a deuterium atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, or form a ring by combining adjacent groups with each other, $Ar_1$ and $Ar_2$ are each independently a substituted or unsubstituted aryl group having 6 to 40 ring carbon atoms, or a substituted or unsubstituted heteroaryl group having 2 to 40 ring carbon atoms, L is a direct linkage, a substituted or unsubstituted arylene group having 6 to 30 ring carbon atoms, or a substituted or unsubstituted heteroarylene group having 2 to 30 ring carbon atoms, and n is an integer of 1 to 4.

12. The amine compound as claimed in claim 11, wherein Formula 1 is represented by the following Formula 1-1 or 1-2:

[Formula 1-1]

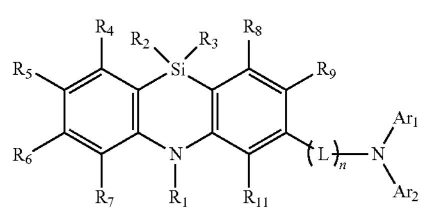

[Formula 1-2]

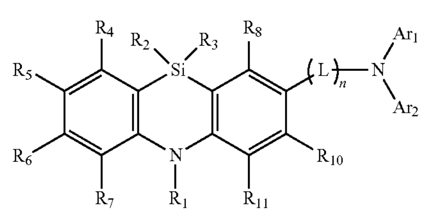

in Formula 1-1 and Formula 1-2, $R_1$ to $R_{11}$, $Ar_1$, $Ar_2$, L, and n are the same as defined in Formula 1.

13. The amine compound as claimed in claim 11, wherein $R_1$ is an unsubstituted phenyl group.

14. The amine compound as claimed in claim 11, wherein $R_2$ and $R_3$ are each independently an unsubstituted phenyl group, an unsubstituted dibenzofuranyl group, or an unsubstituted dibenzothiophenyl group.

15. The amine compound as claimed in claim 11, wherein $R_2$ and $R_3$ are the same as each other.

16. The amine compound as claimed in claim 11, wherein $Ar_1$ and $Ar_2$ are each independently a substituted or unsubstituted phenyl group, a substituted or unsubstituted naphthyl group, a substituted or unsubstituted phenanthrenyl group, a substituted or unsubstituted biphenyl group, a substituted or unsubstituted terphenyl group, a substituted or unsubstituted benzofuranyl group, a substituted or unsubstituted dibenzofuranyl group, a substituted or unsubstituted benzothiophenyl group, a substituted or unsubstituted dibenzothiophenyl group, a substituted or unsubstituted pyridinyl group, a substituted or unsubstituted quinolinyl group, or a substituted or unsubstituted fluorenyl group.

17. The amine compound as claimed in claim 11, wherein L is a direct linkage, a substituted or unsubstituted phenylene group, or a substituted or unsubstituted divalent dibenzofuran group.

18. The amine compound as claimed in claim 11, wherein the amine compound represented by Formula 1 is any one selected from the group of compounds represented in the following Compound Groups A and B:

[Compound Group A]

A1

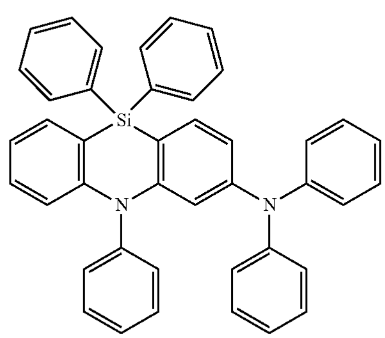

A2

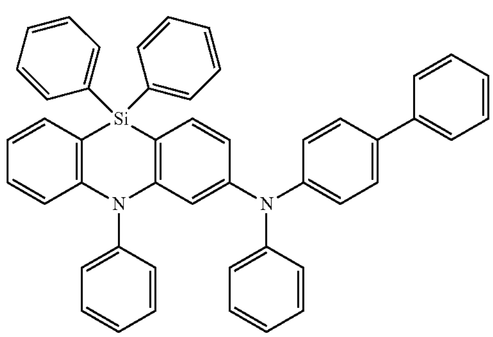

-continued

A3

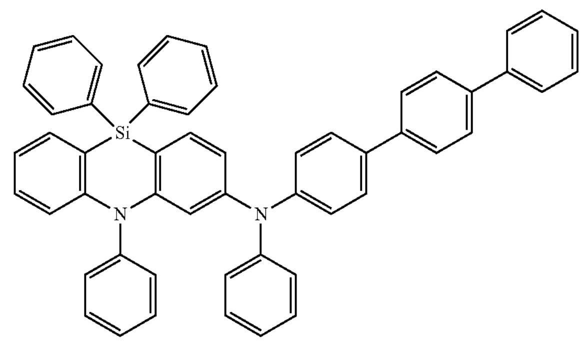

A4

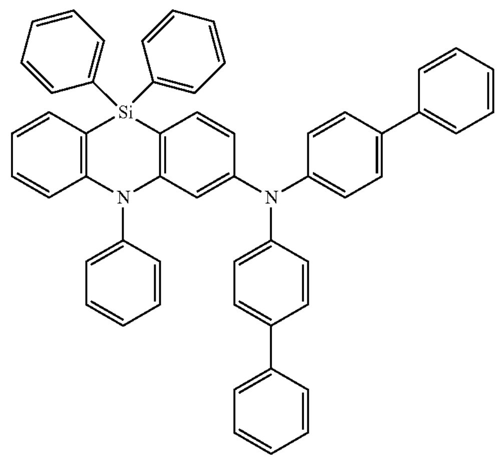

A5

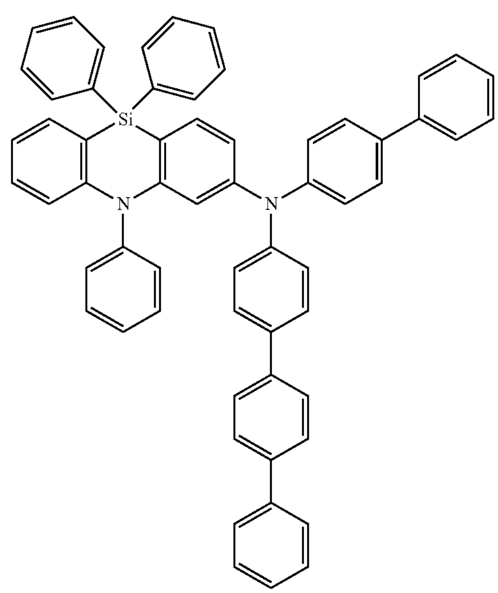

-continued
A6
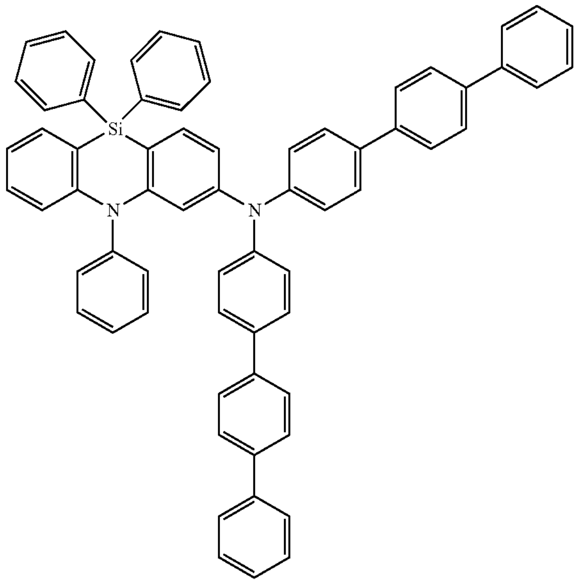
A7
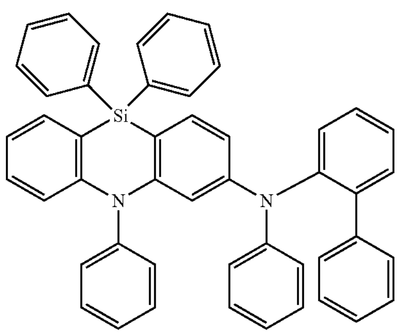
A8
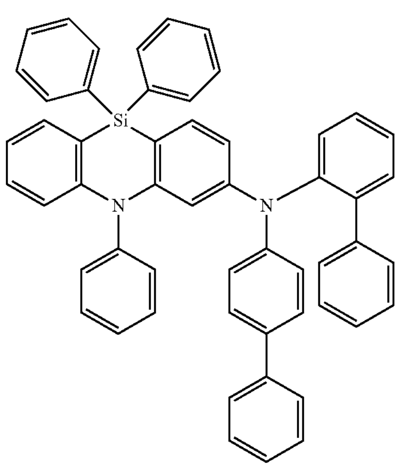
-continued
A9
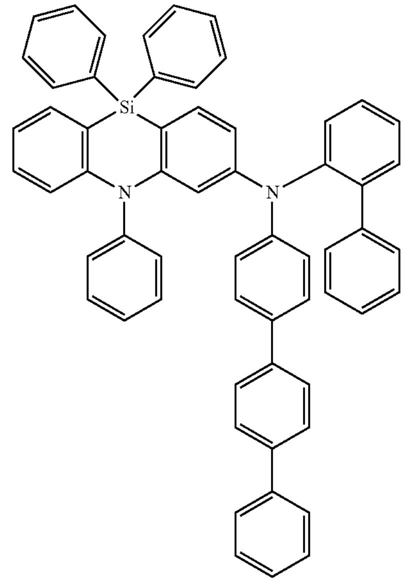
A10
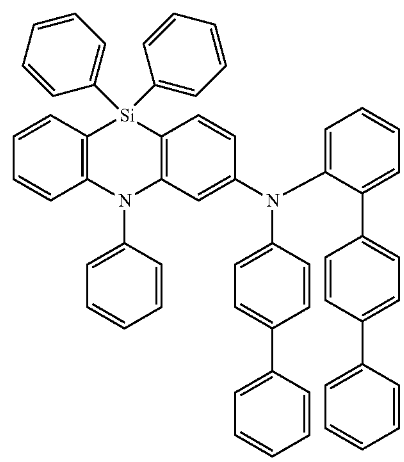
A11
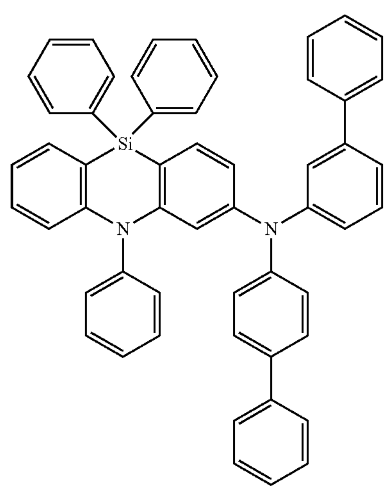

-continued
A12
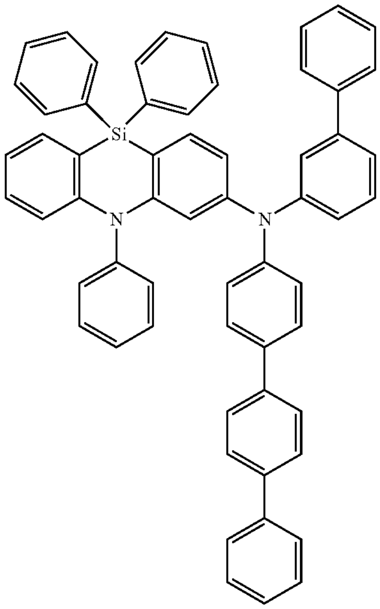
A13
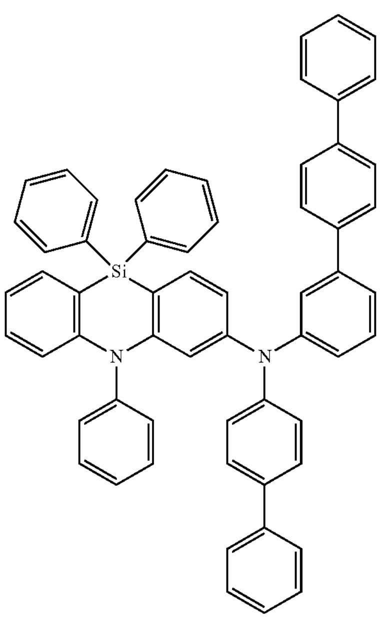
-continued
A14
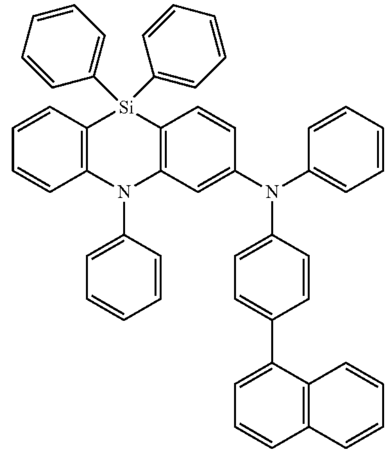
A15
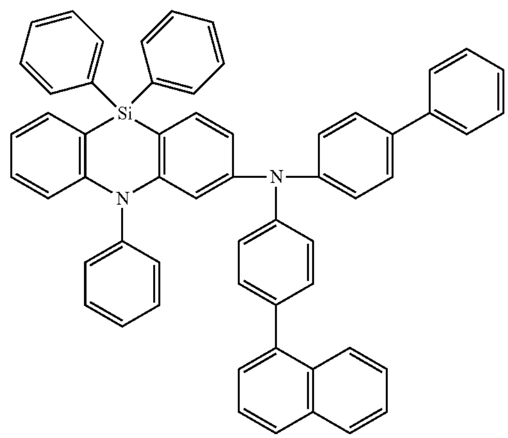
A16
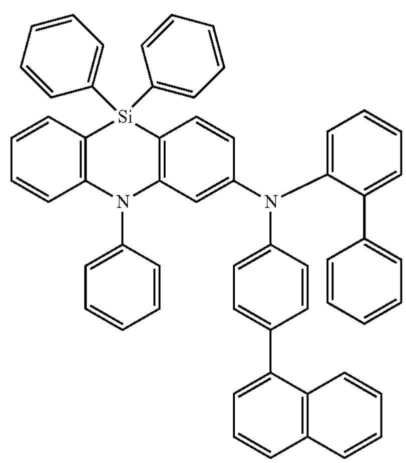

-continued
A17
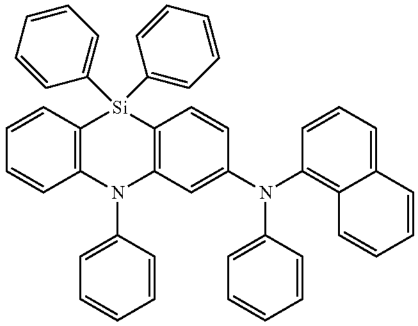
A18
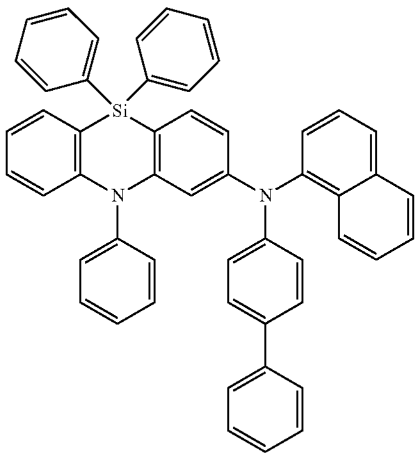
A19
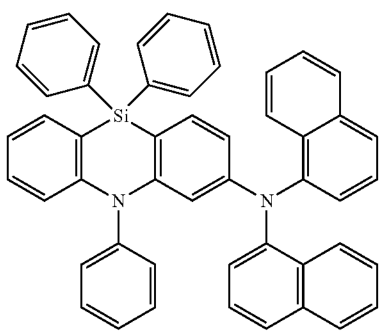
A20
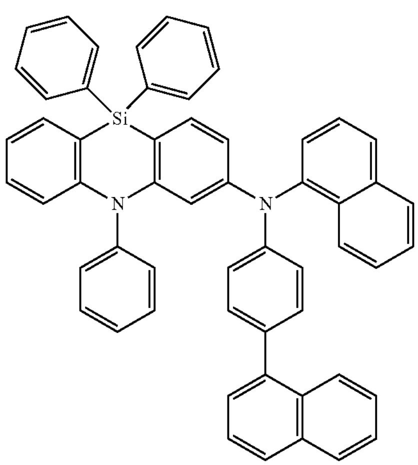
-continued
A21
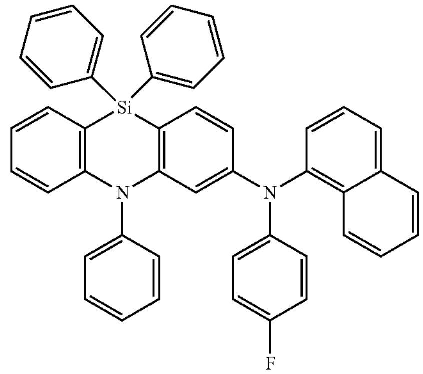
A22
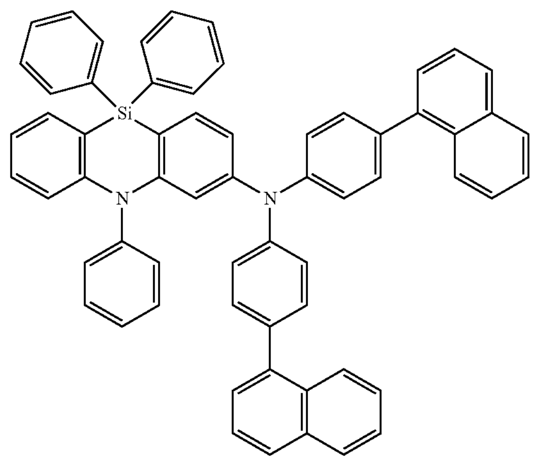
A23
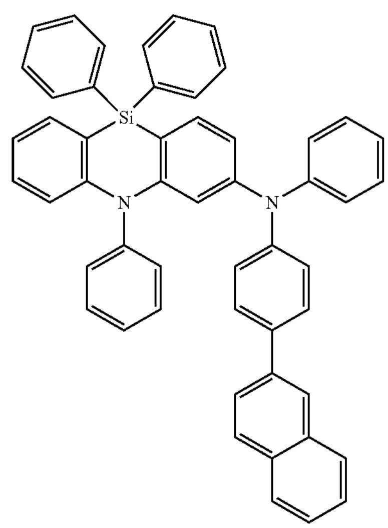

A24
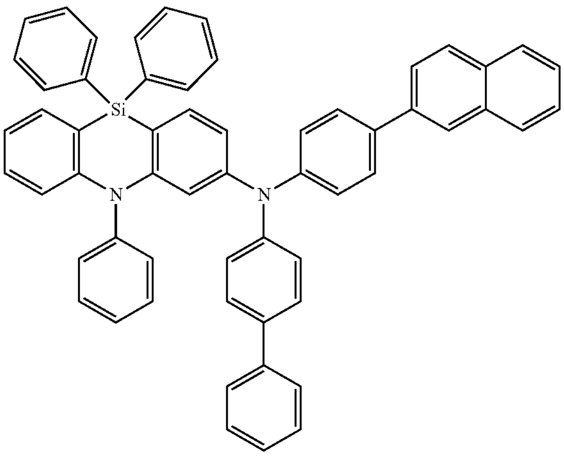
A25
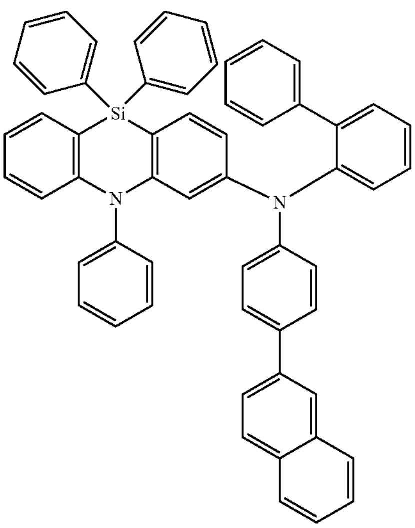
A26
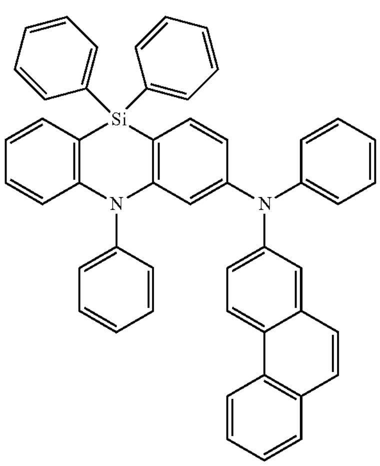
A27
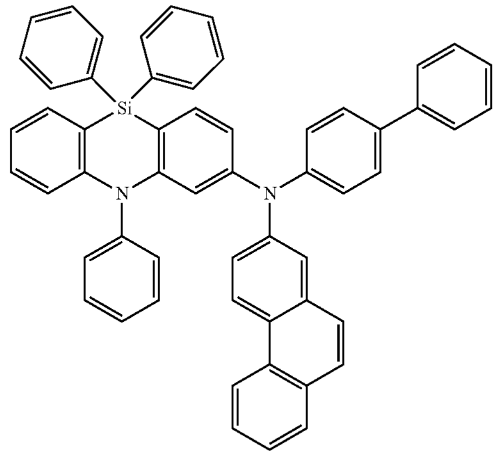
A28
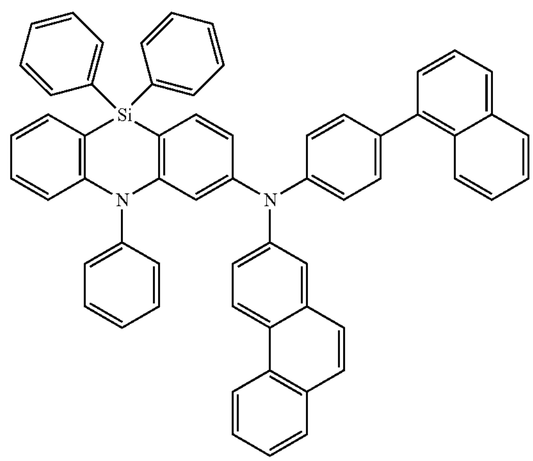
A29
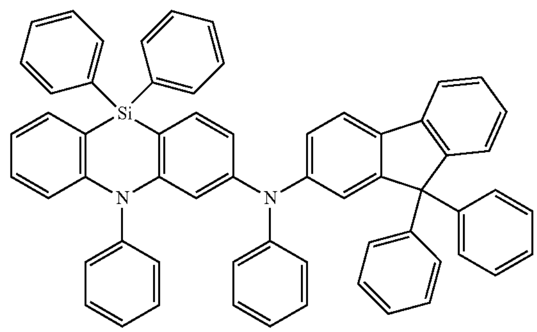

A30
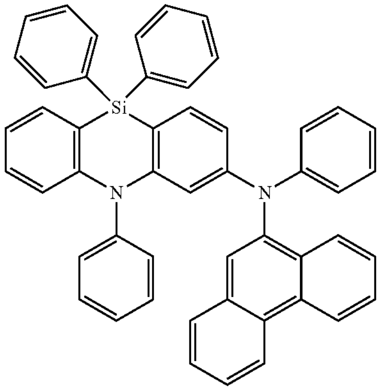
A31
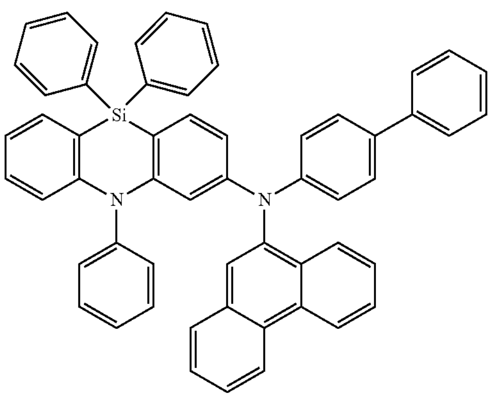
A32
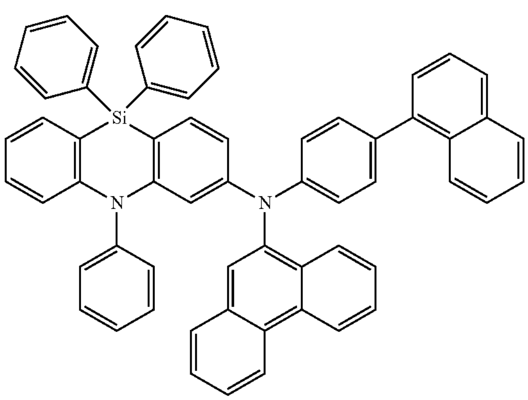
A33
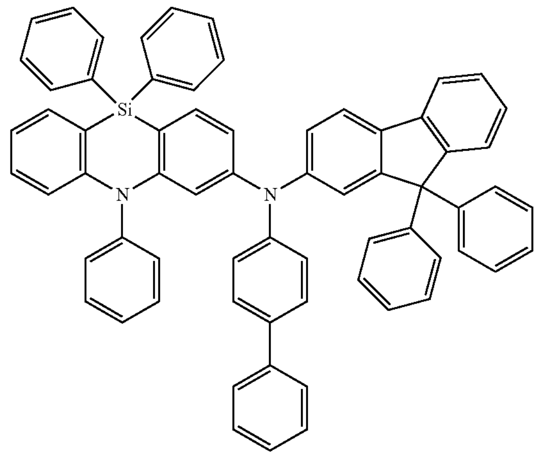
A34
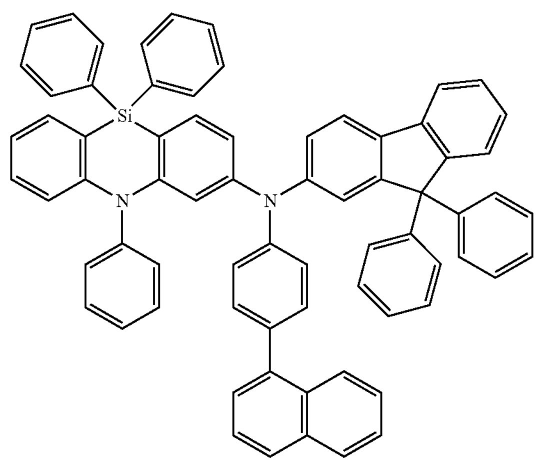
A35
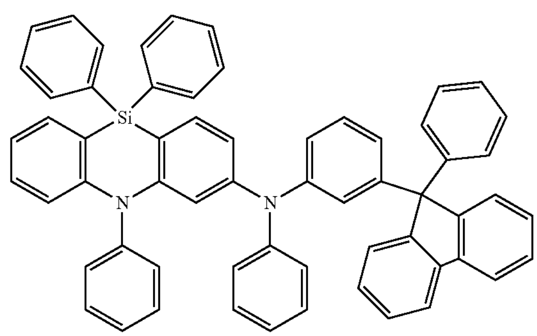

-continued
A36
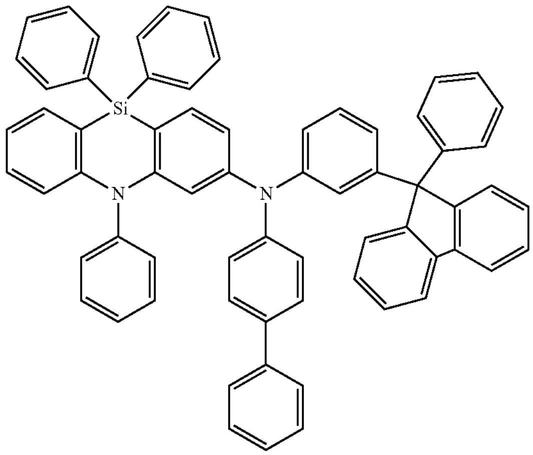
A37
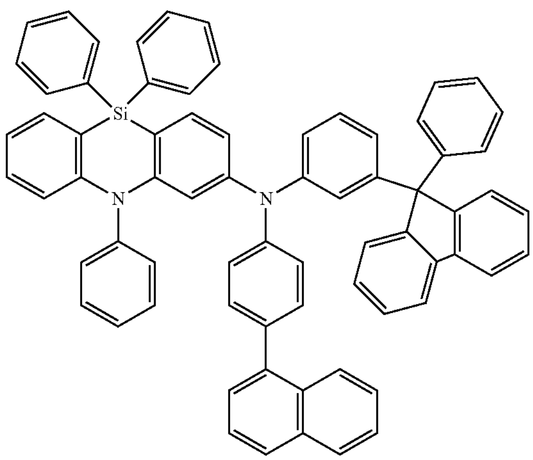
A38
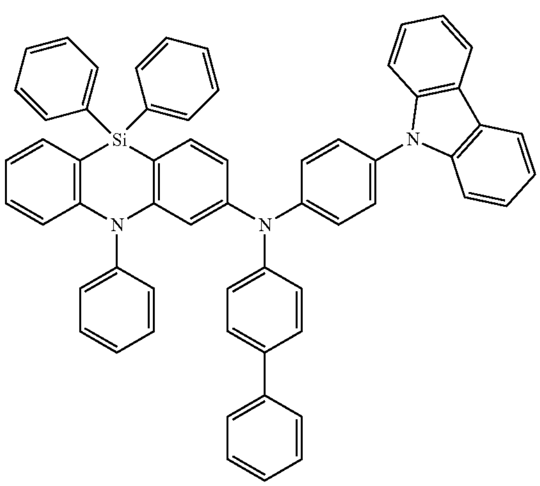
-continued
A39
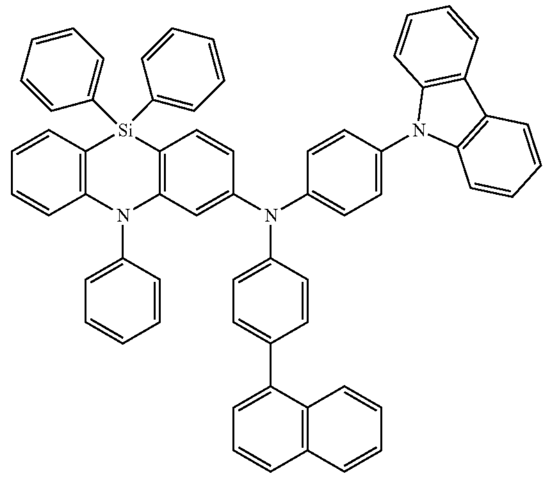
A40
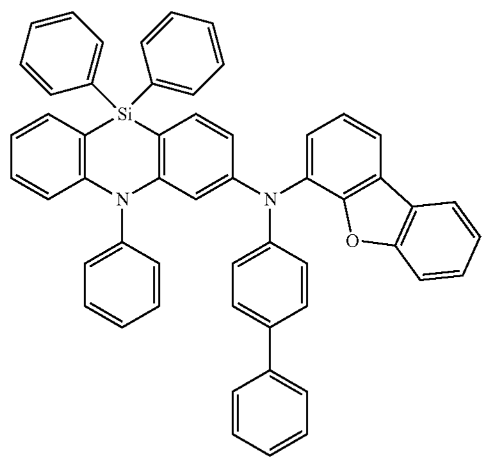
A41
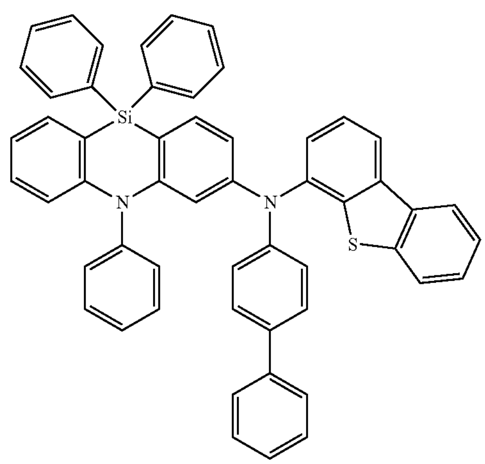

-continued
A42
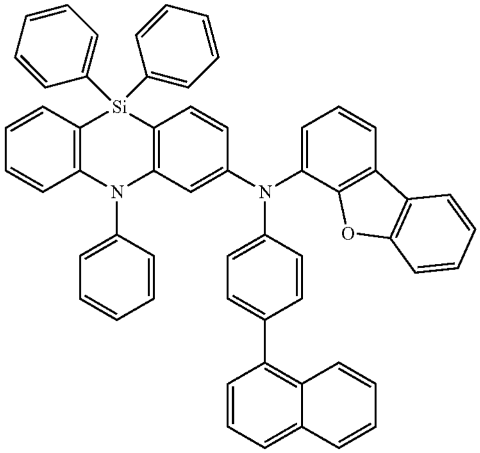
A43
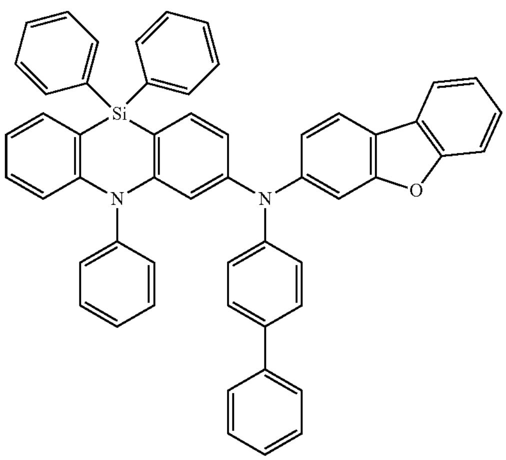
A44
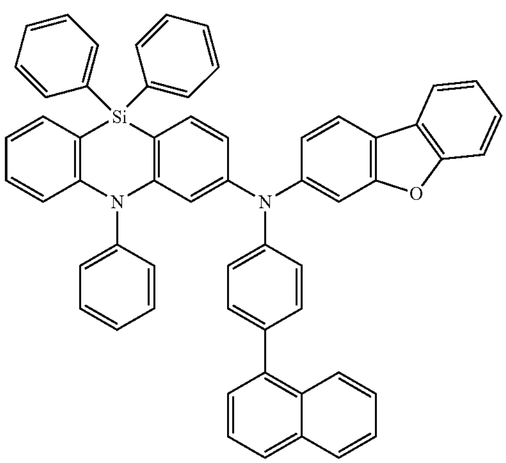
-continued
A45
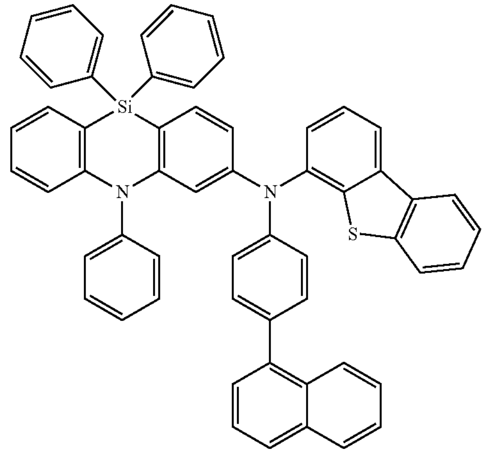
A46
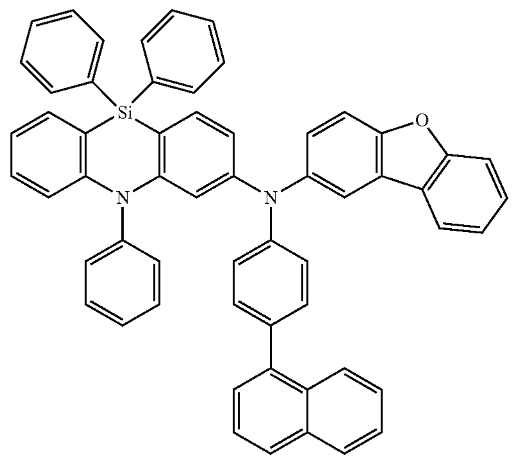
A47
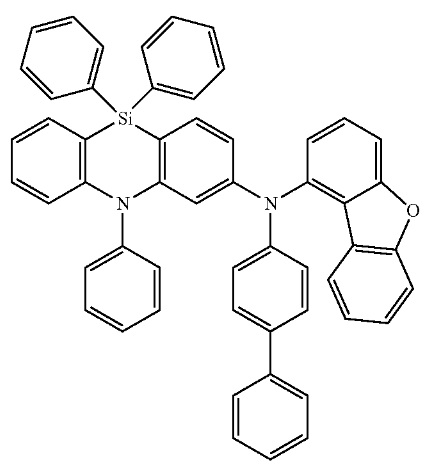

-continued
A48
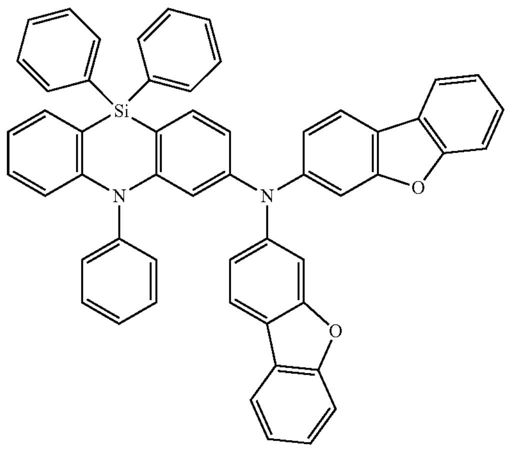
A49
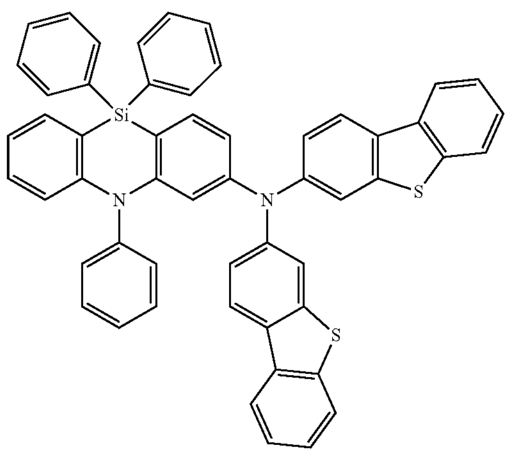
A50
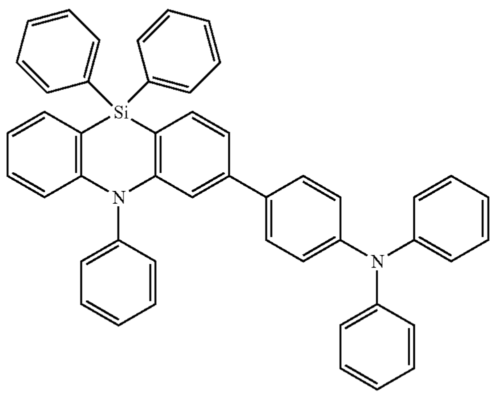
-continued
A51
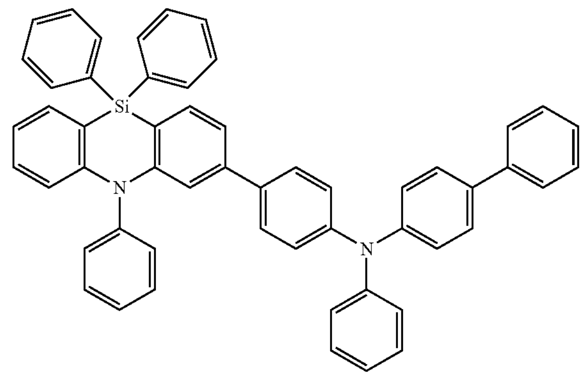
A52
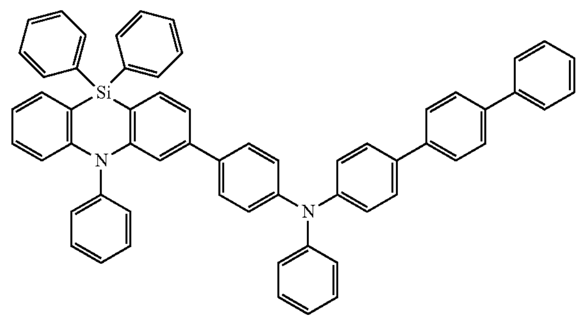
A53
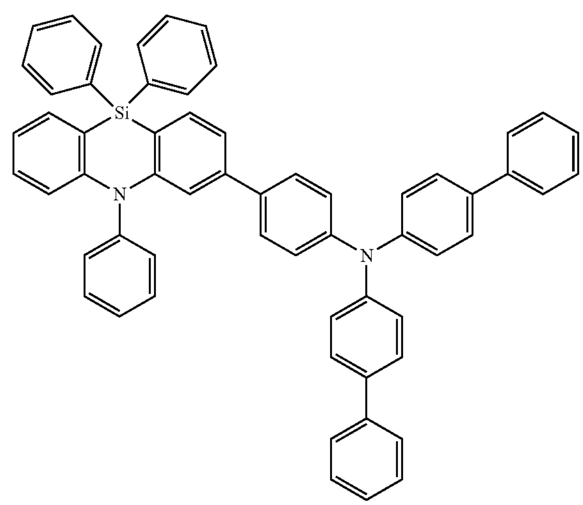

-continued
A54
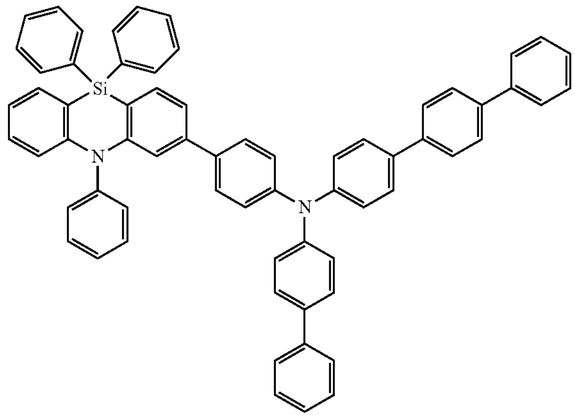
A55
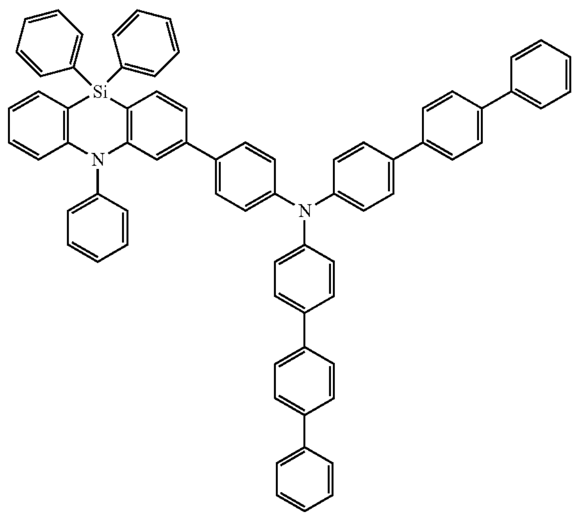
A56
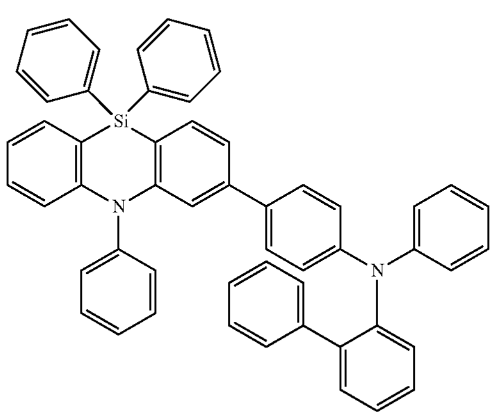
-continued
A57
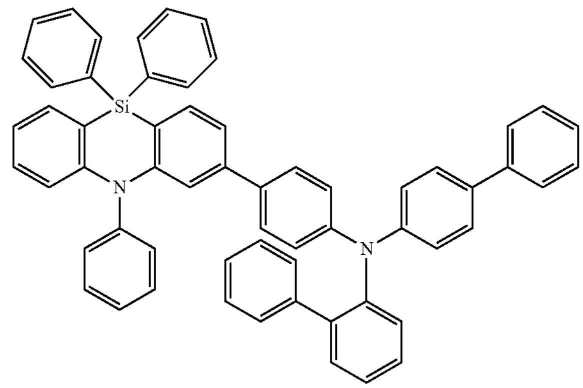
A58
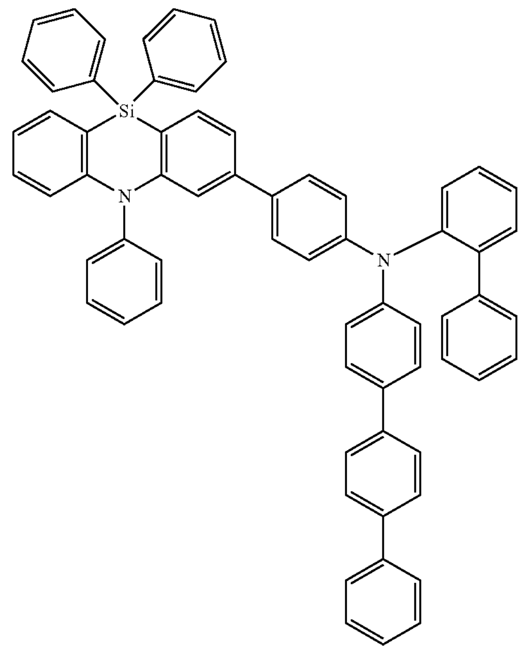
A59
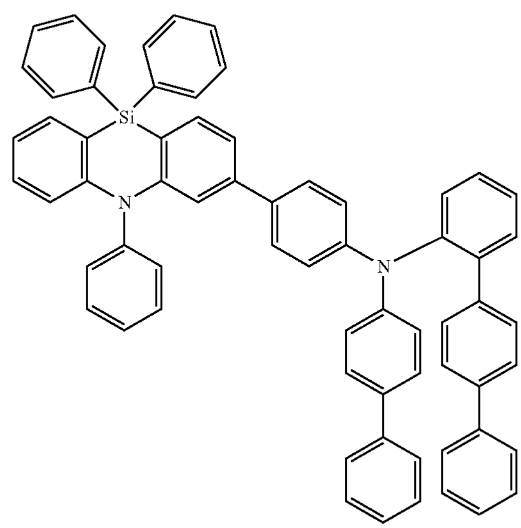

A60
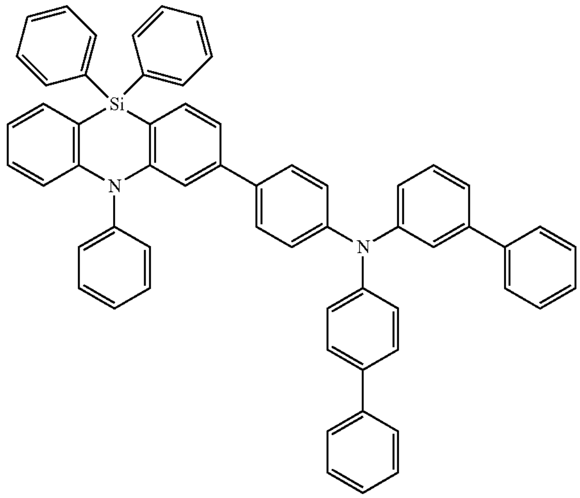
A61
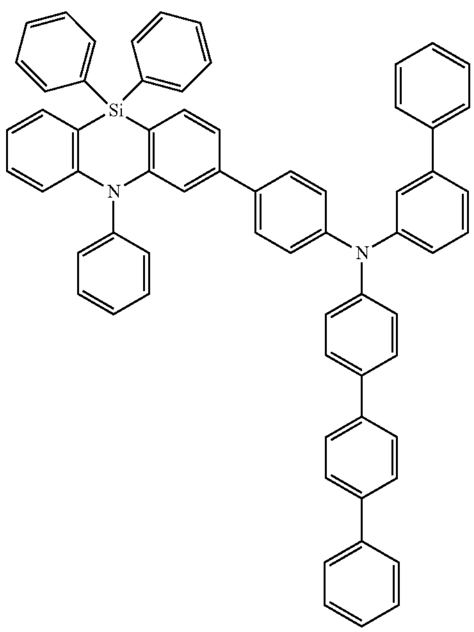
A62
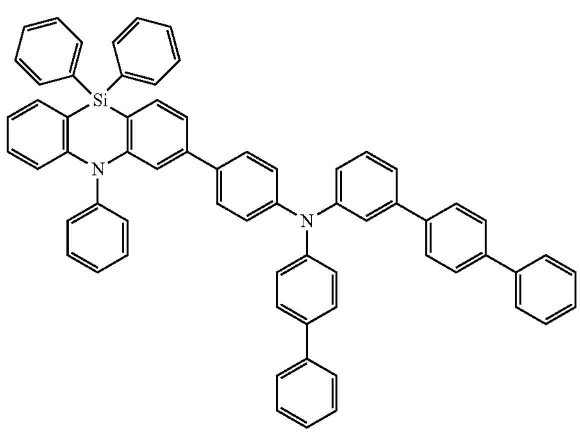
A63
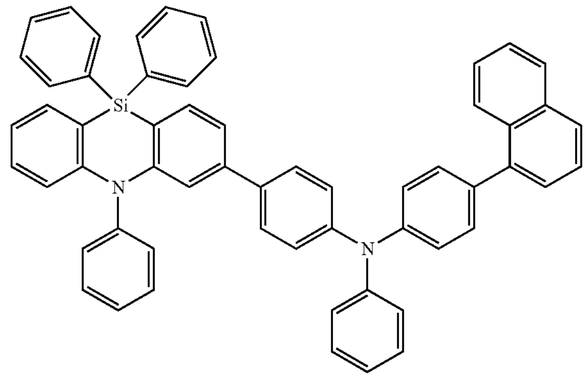
A64
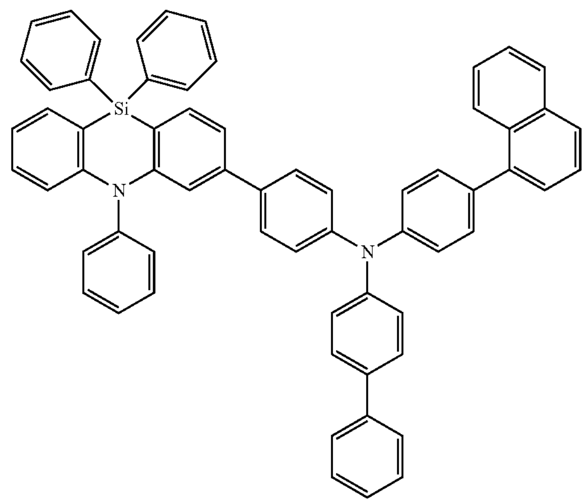
A65
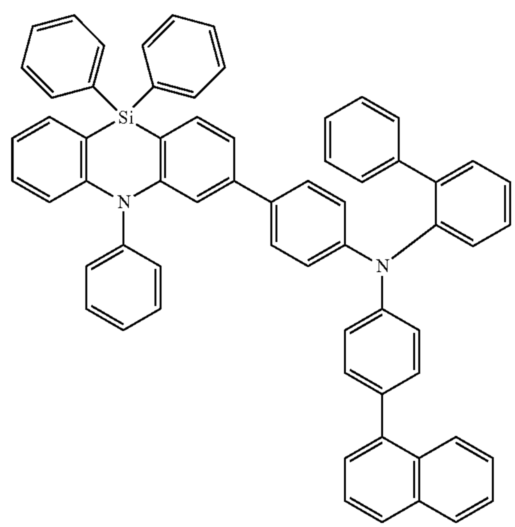

-continued
A66
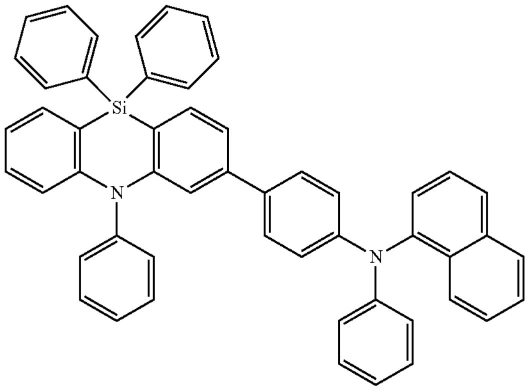
A67
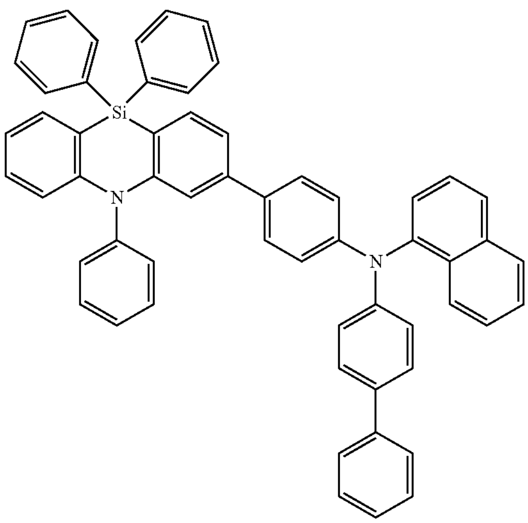
A68
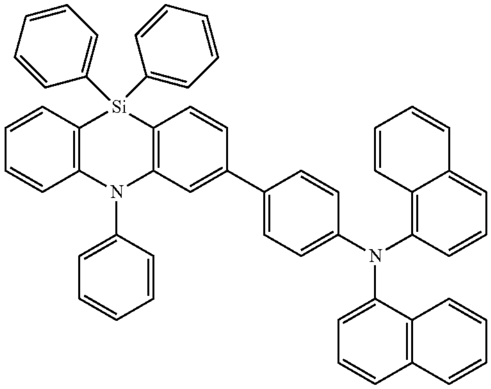
-continued
A69
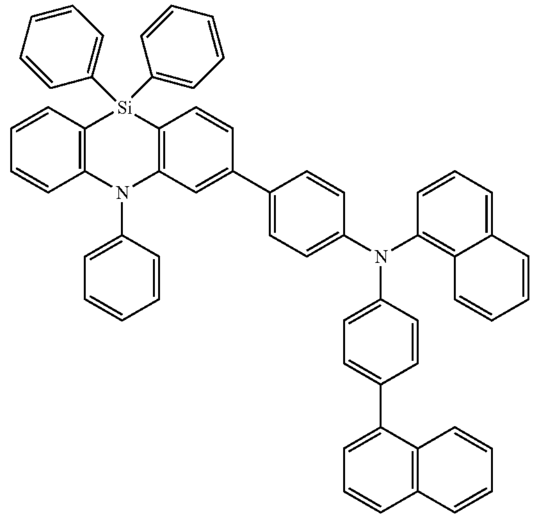
A70
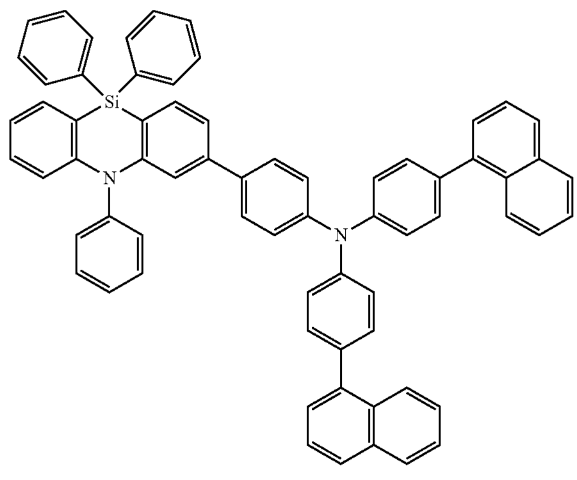
A71
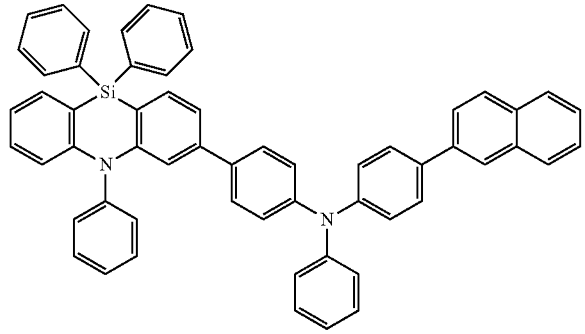

-continued
A72
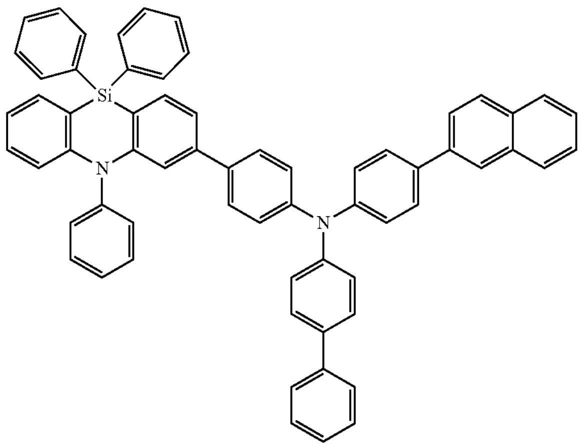
A73
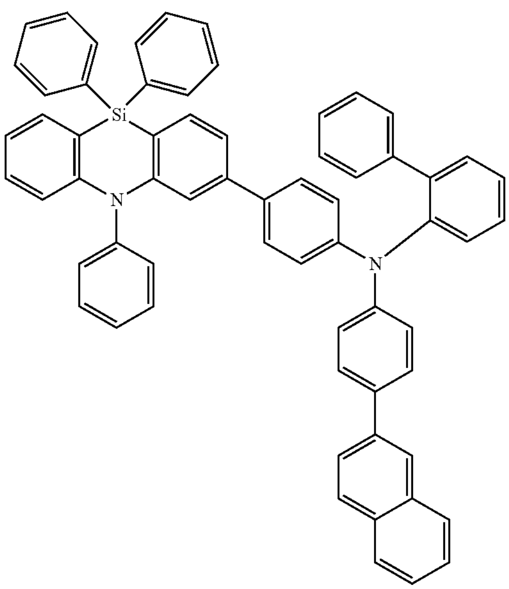
A74
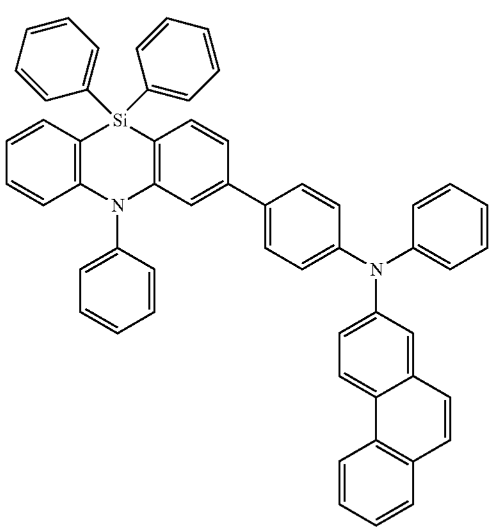
-continued
A75
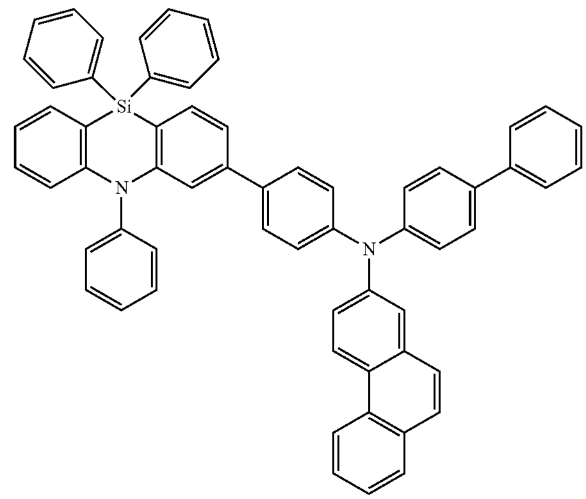
A76
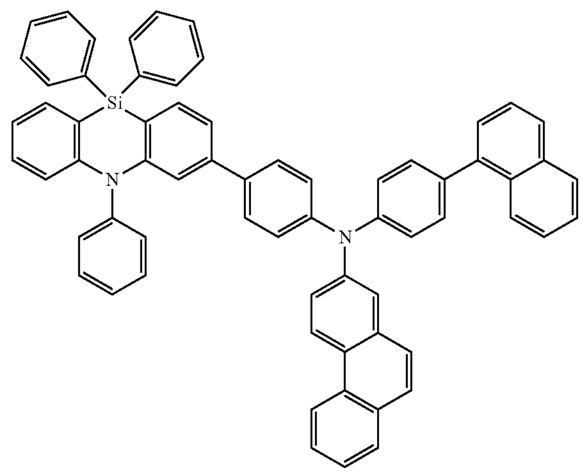
A77
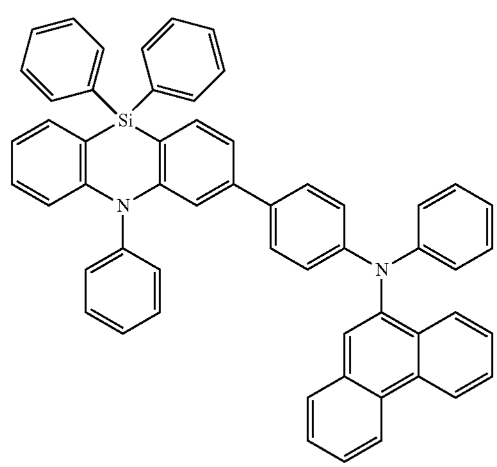

-continued
A78
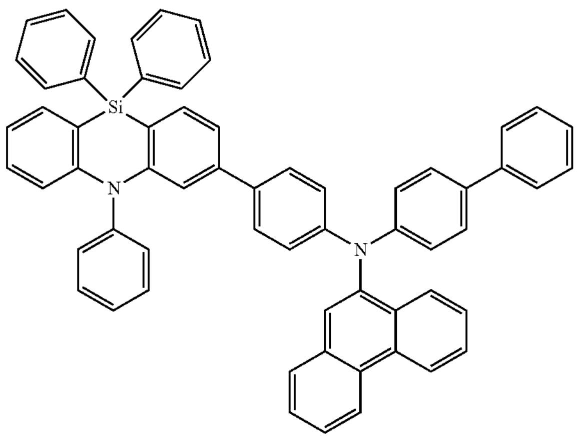
A79
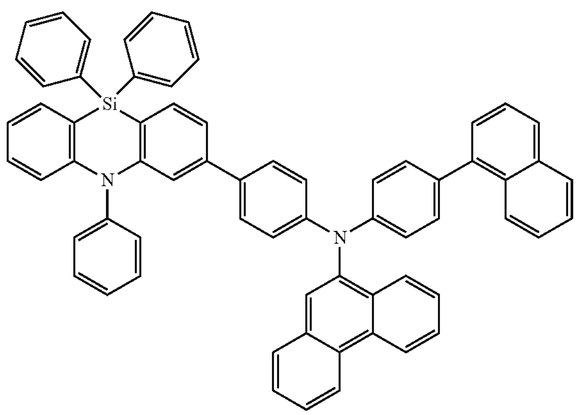
A80
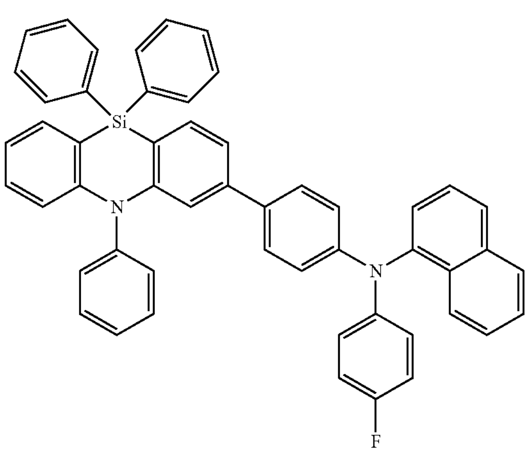
-continued
A81
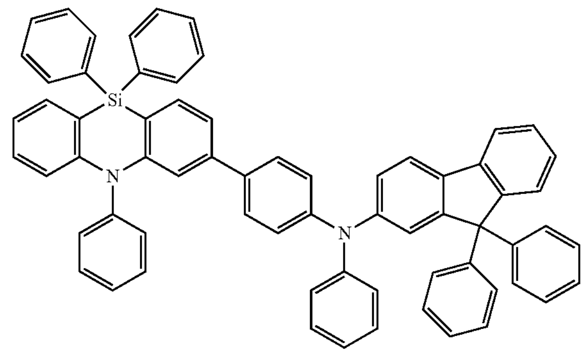
A82
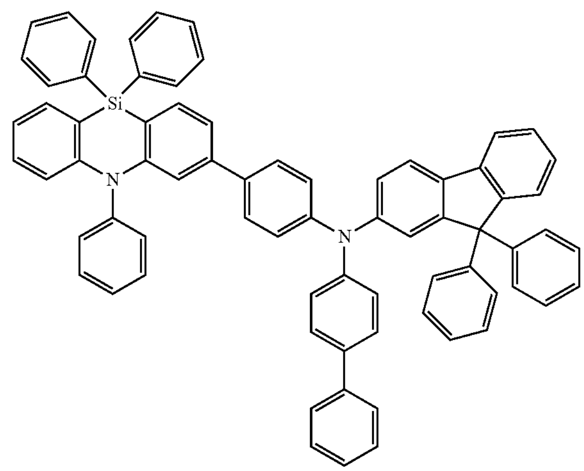
A83
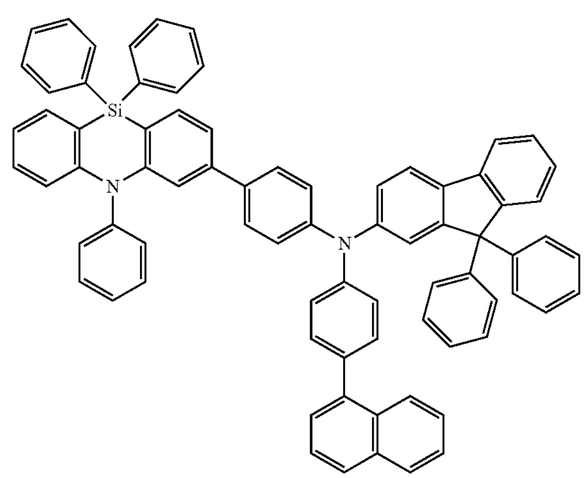

-continued
A84
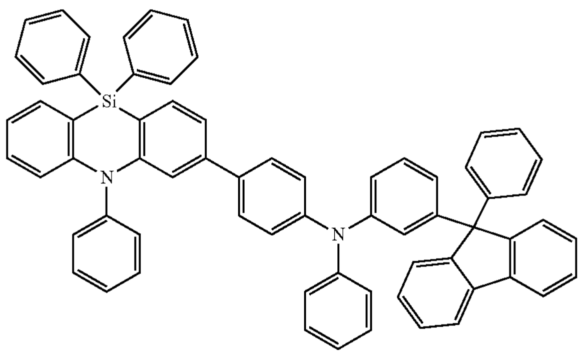
A85
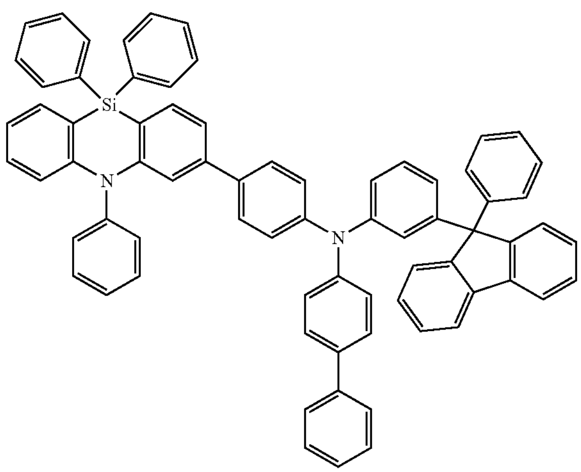
A86
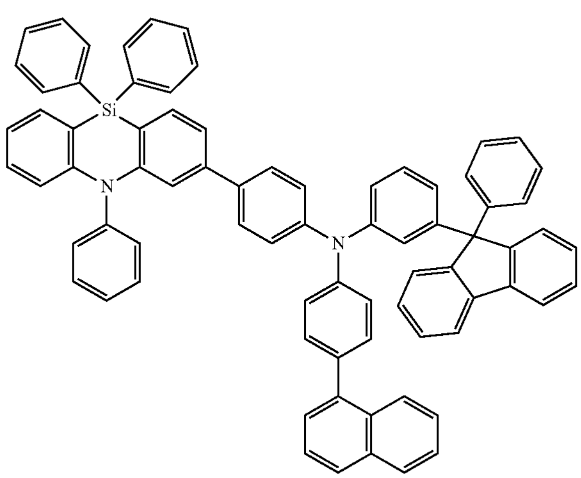
-continued
A87
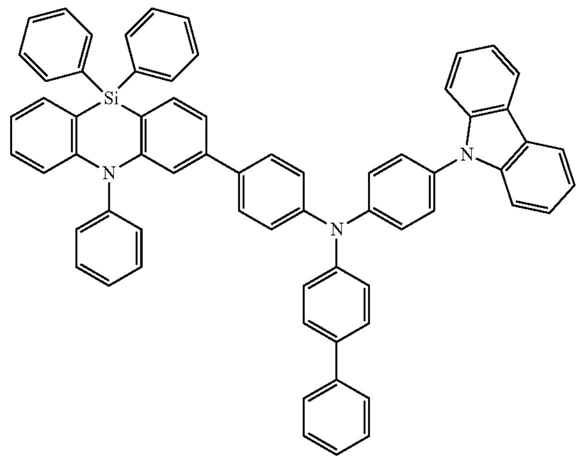
A88
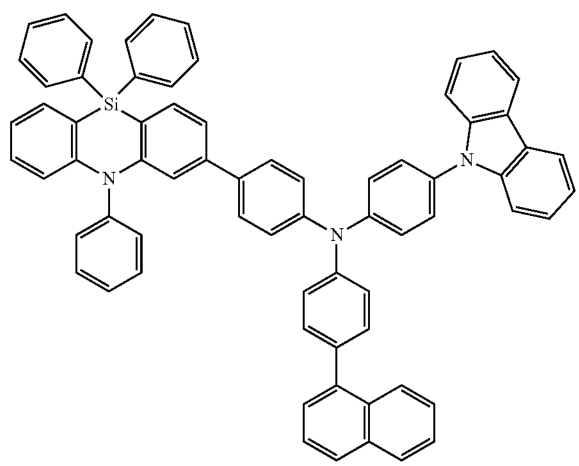
A89
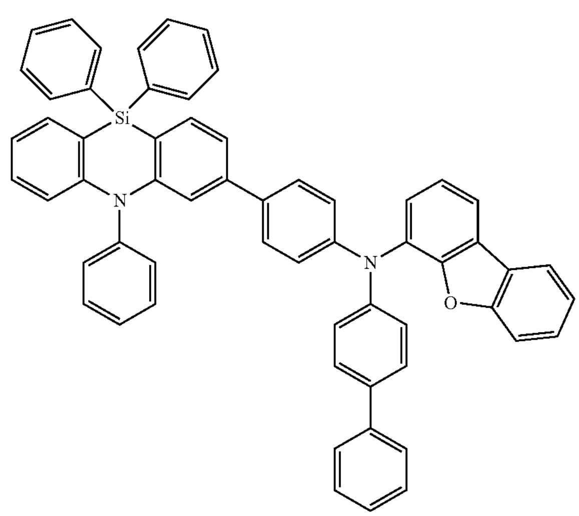

-continued
A90
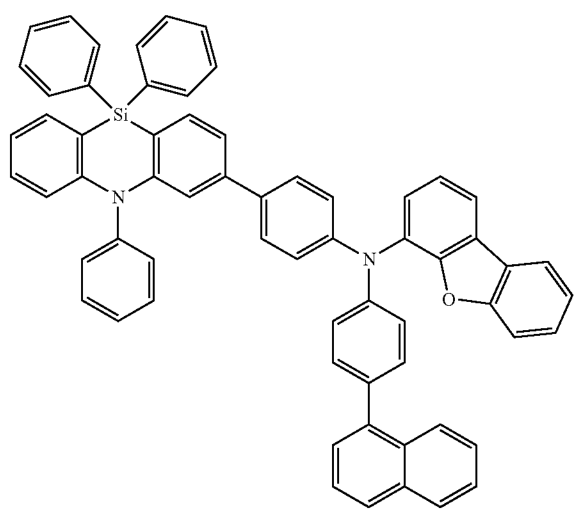
A91
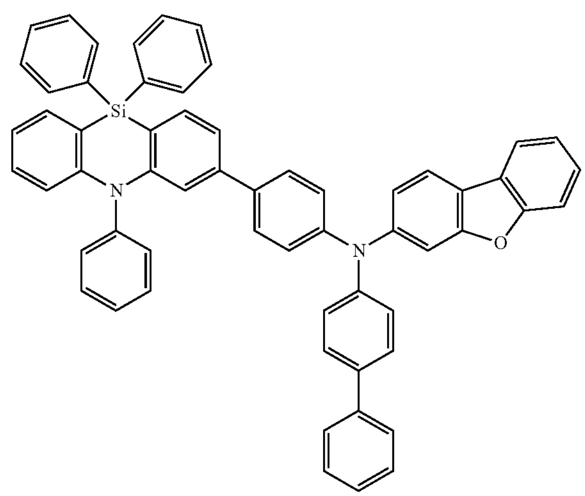
A92
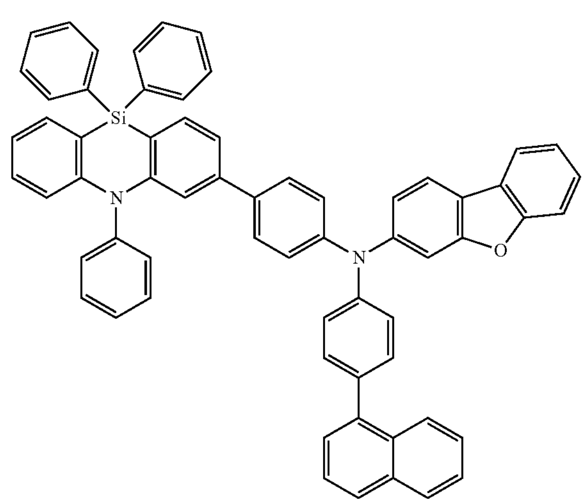
-continued
A93
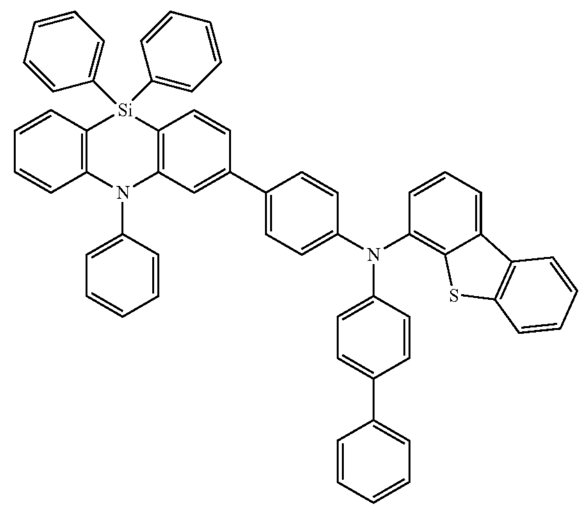
A94
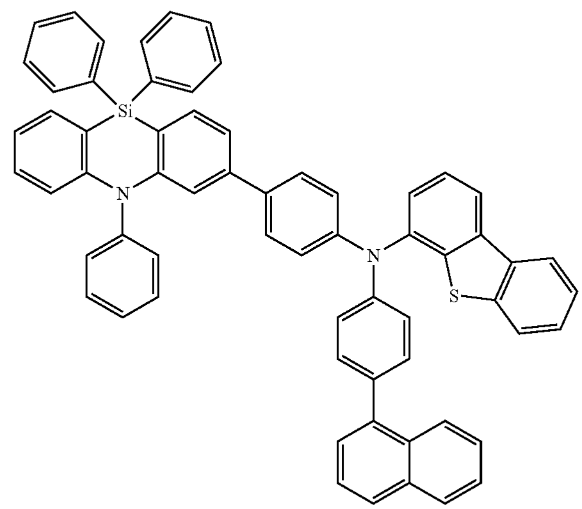
A95
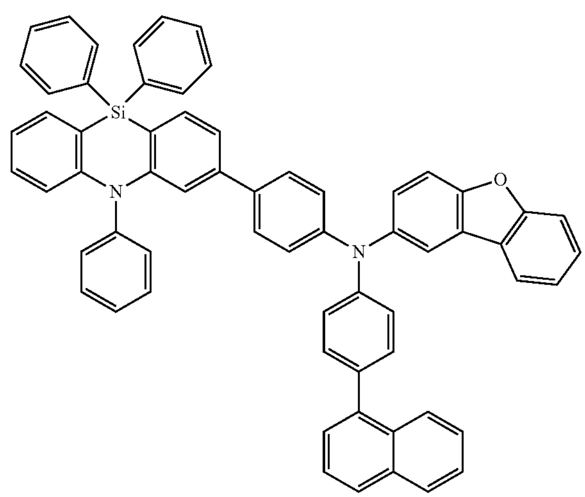

-continued
A96
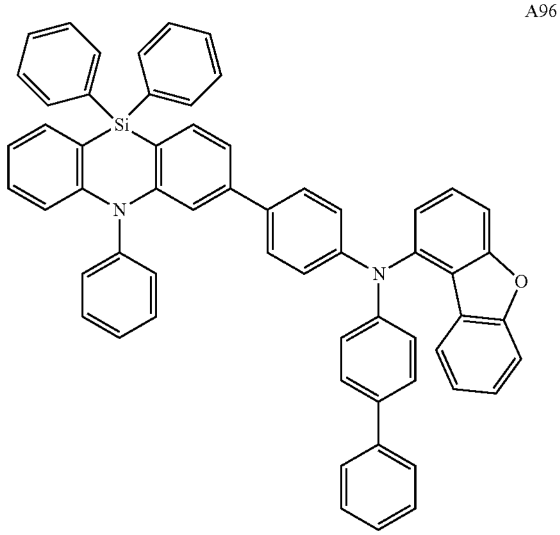
A97
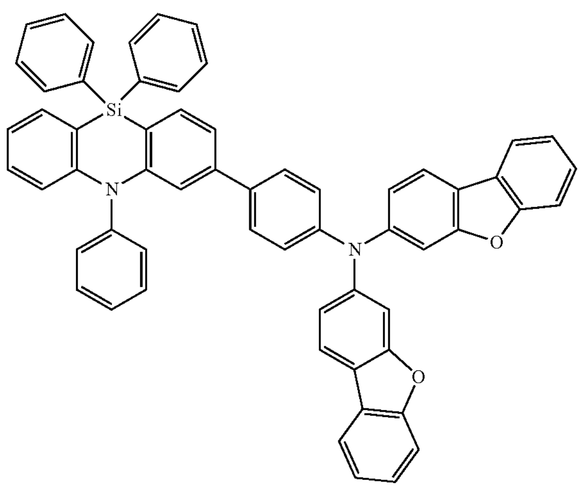
A98
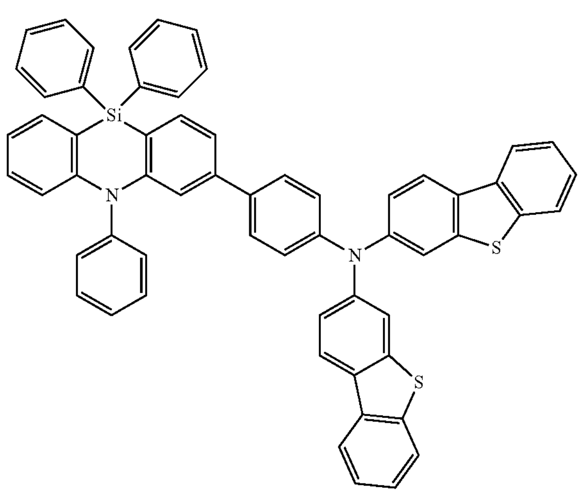
-continued
A99
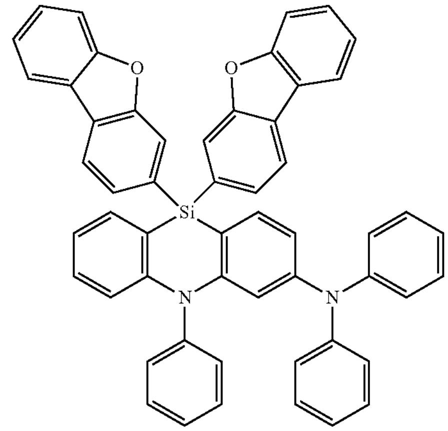
A100
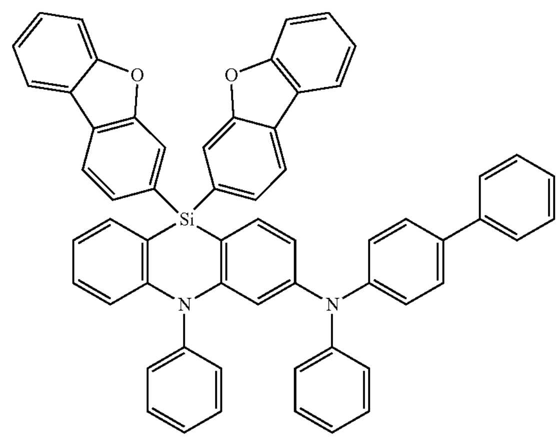
A101
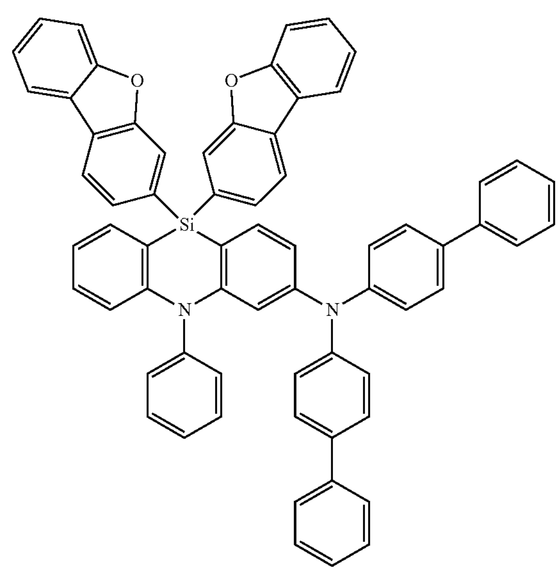

-continued
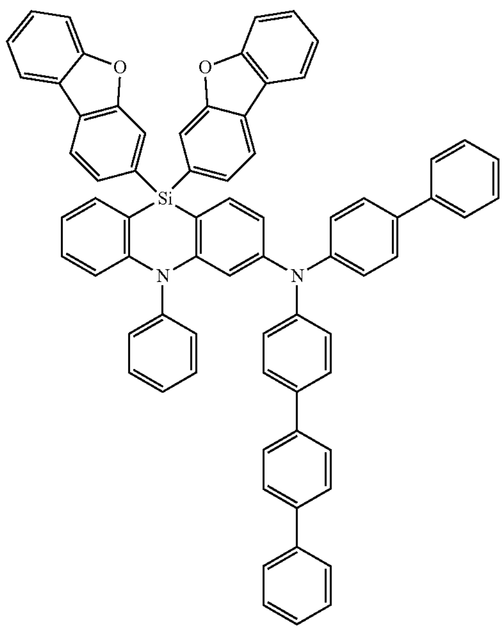
A102
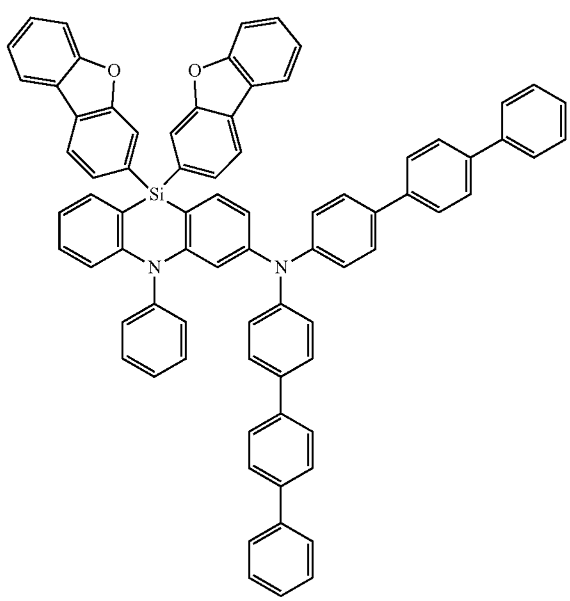
A103
-continued
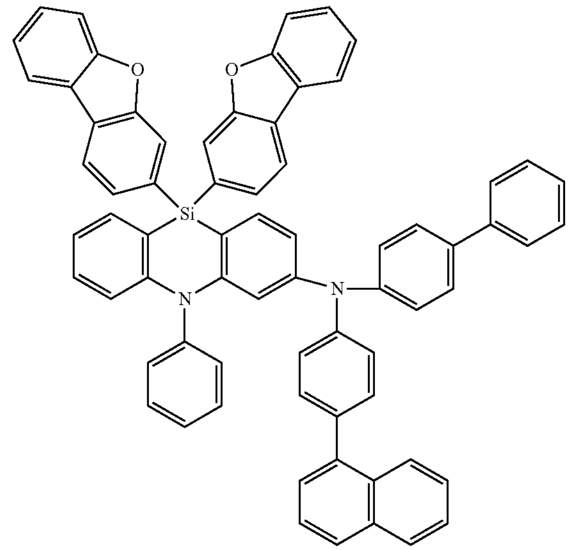
A104
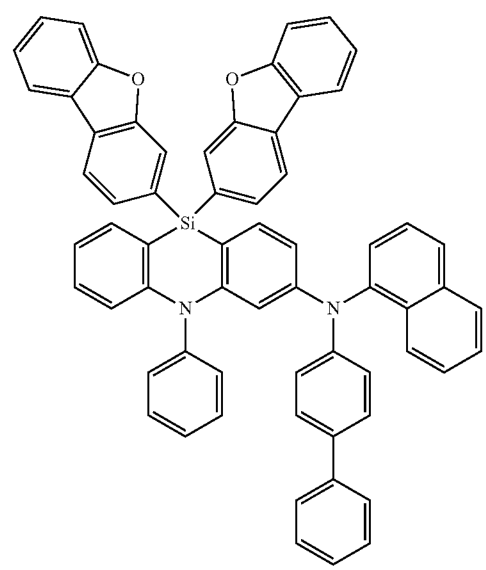
A105

-continued
A106
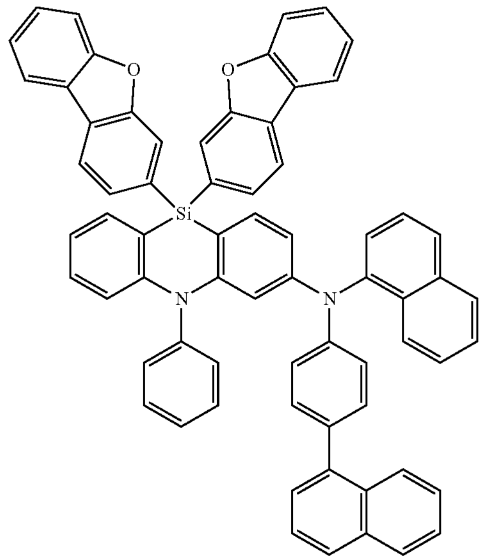
A107
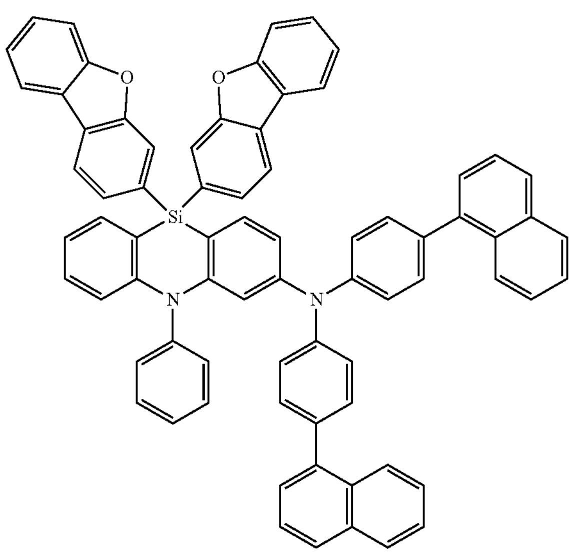
A108
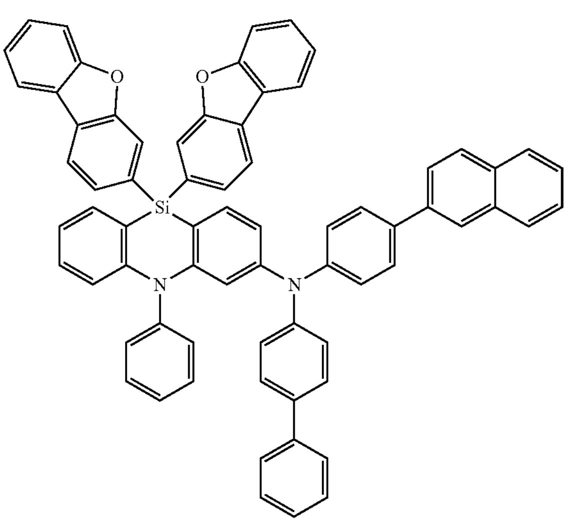
-continued
A109
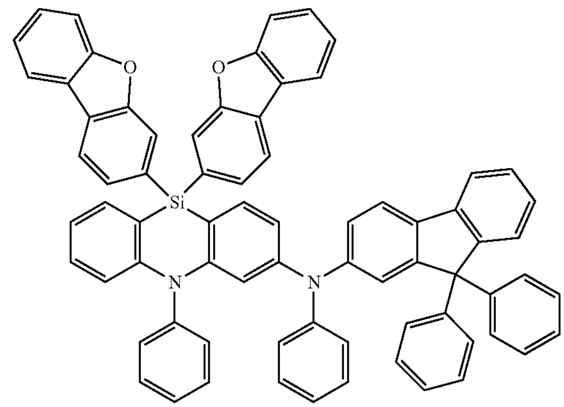
A110
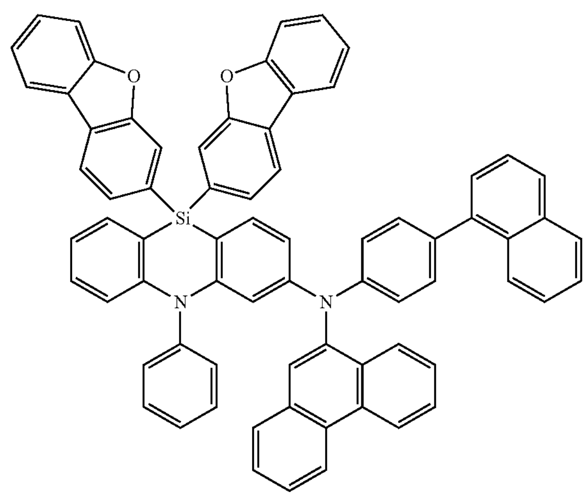
A111
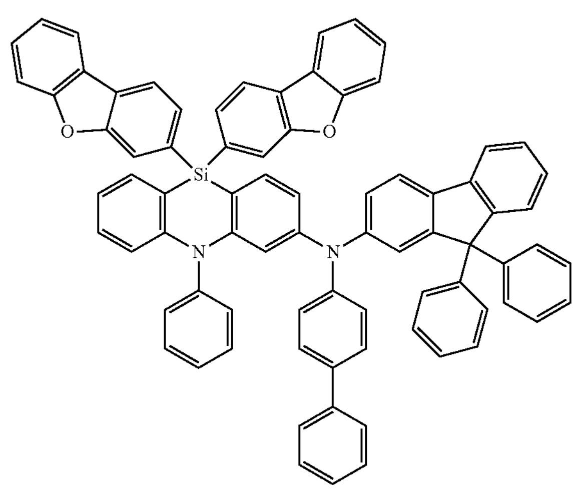

-continued
A112
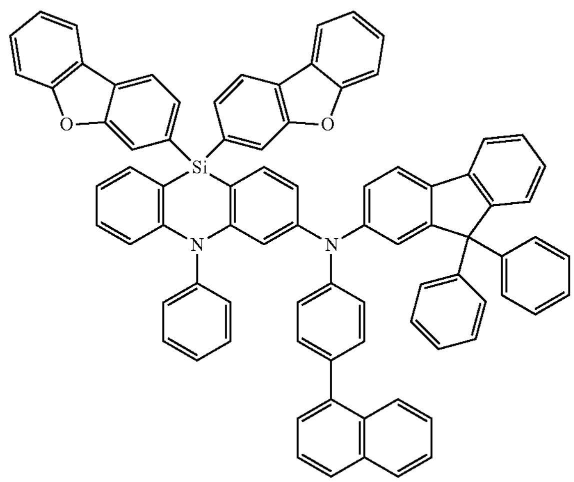
A113
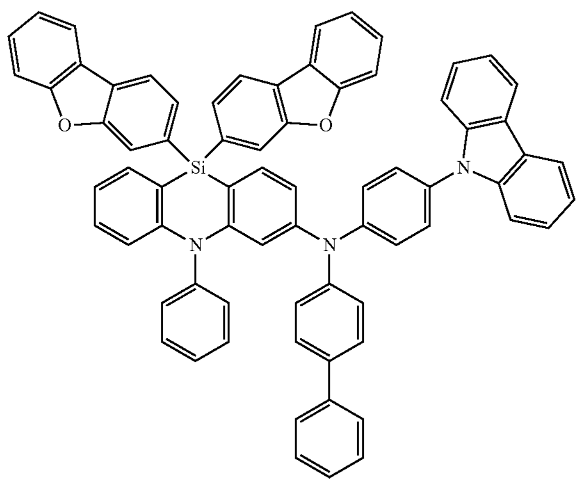
A114
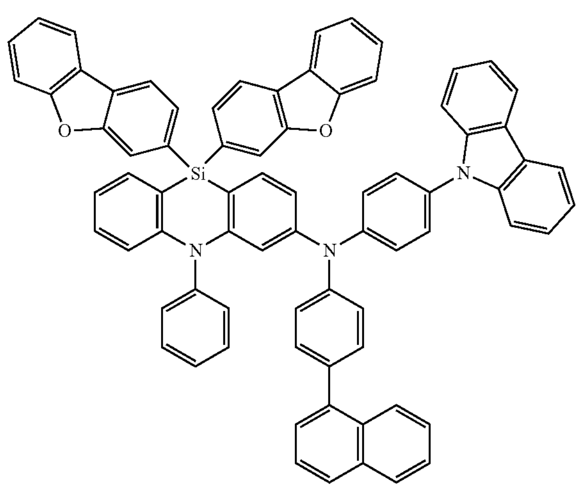
-continued
A115
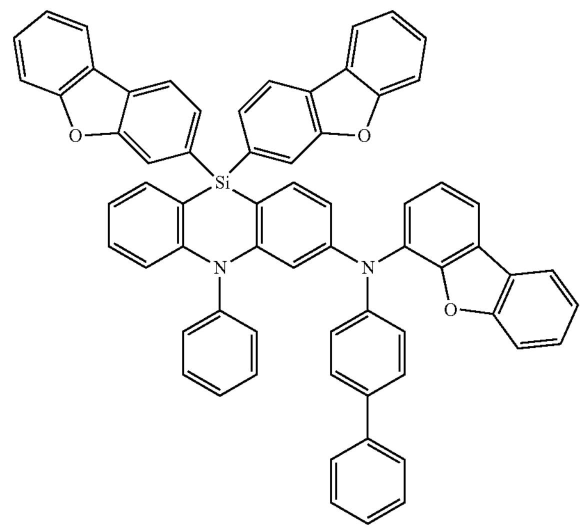
A116
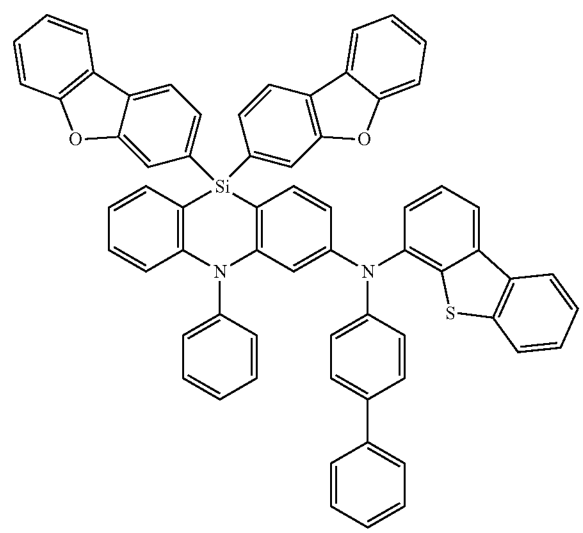
A117
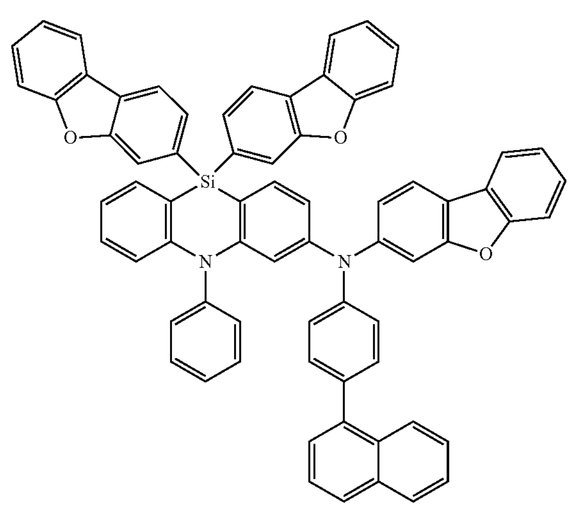

-continued
A118
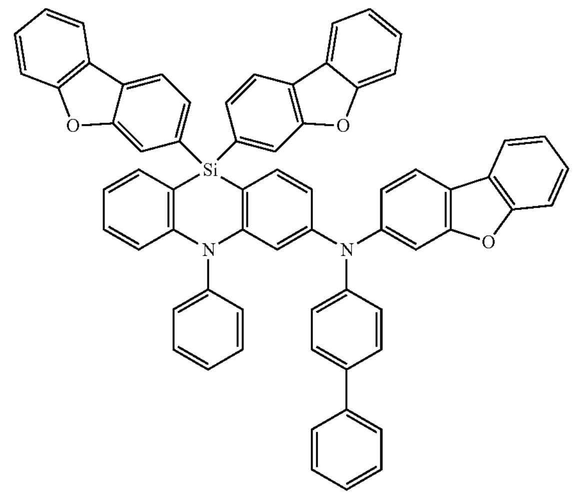
A119
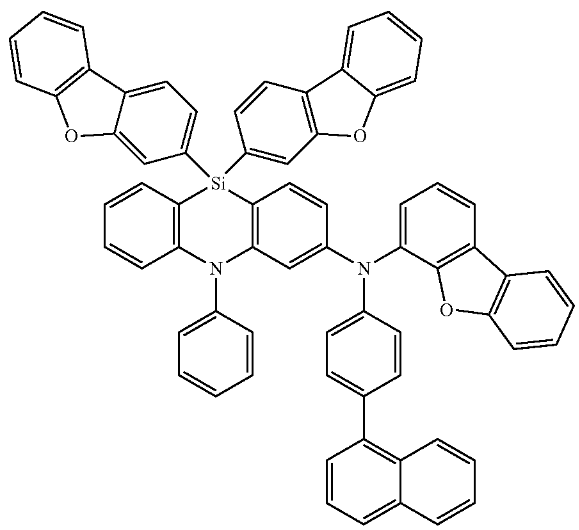
A120
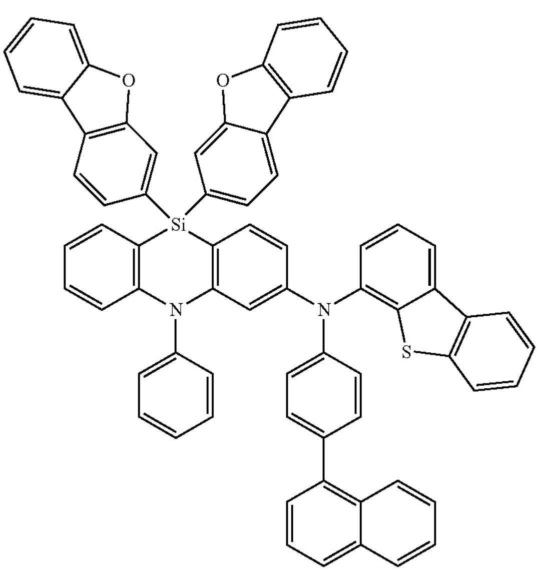
-continued
A121
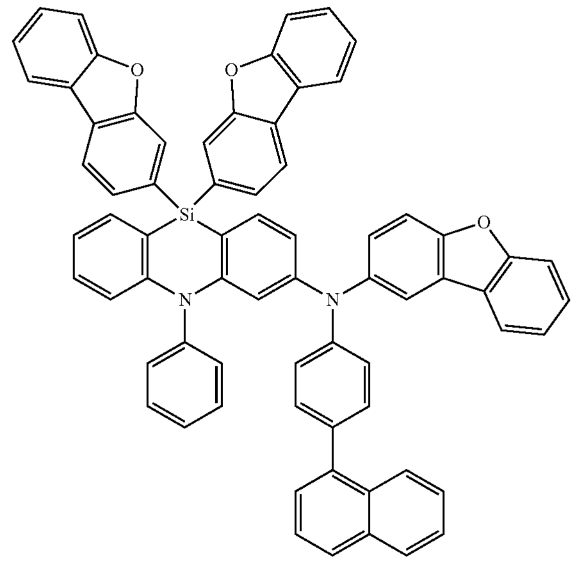
A122
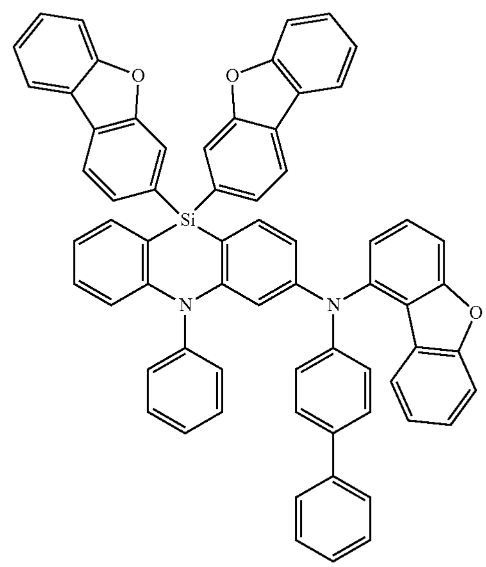
A123
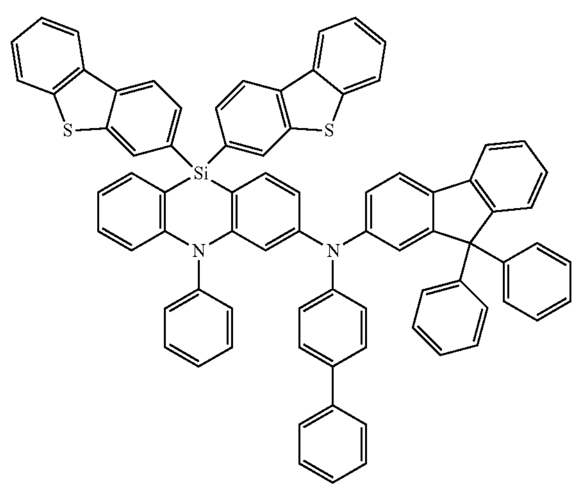

A124
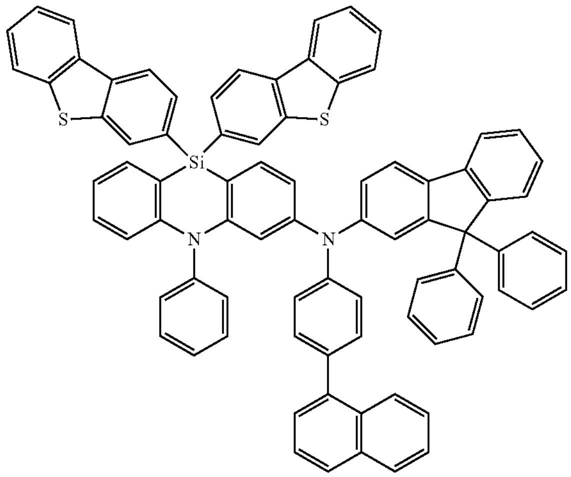
A125
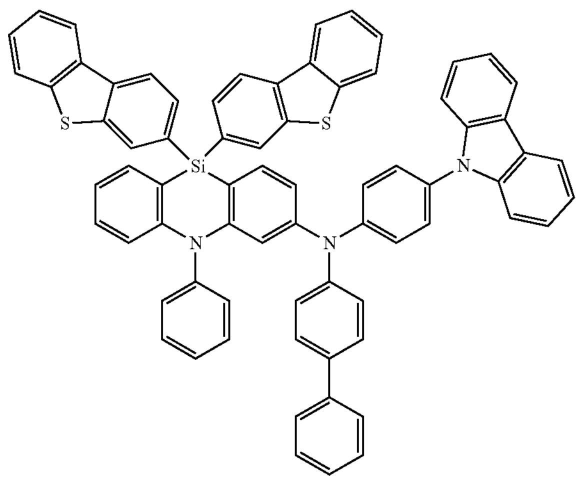
A126
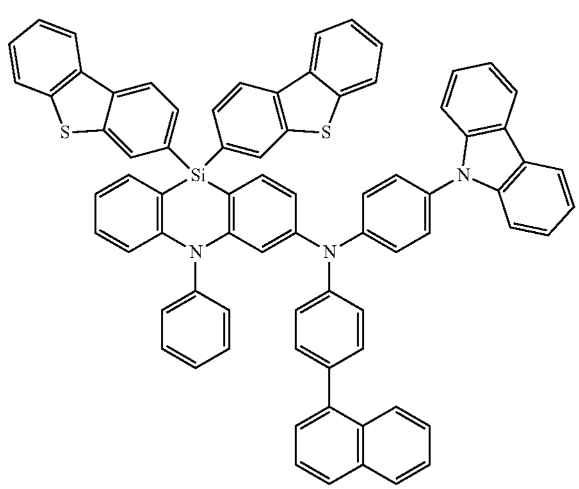
A127
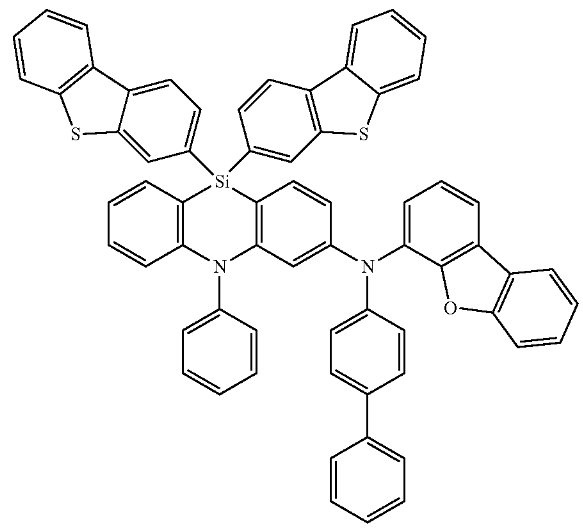
A128
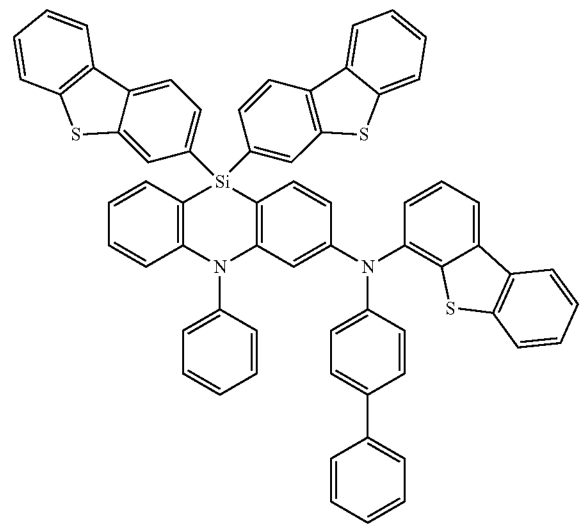
A129
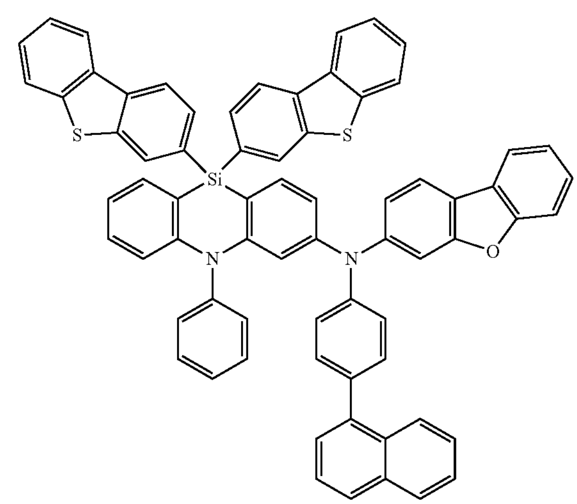

-continued
A130
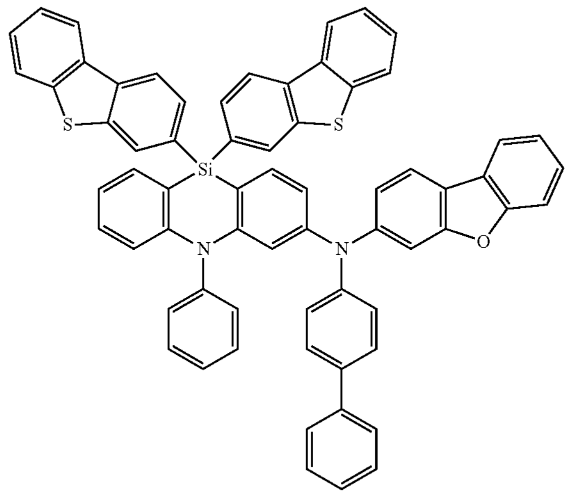
A131
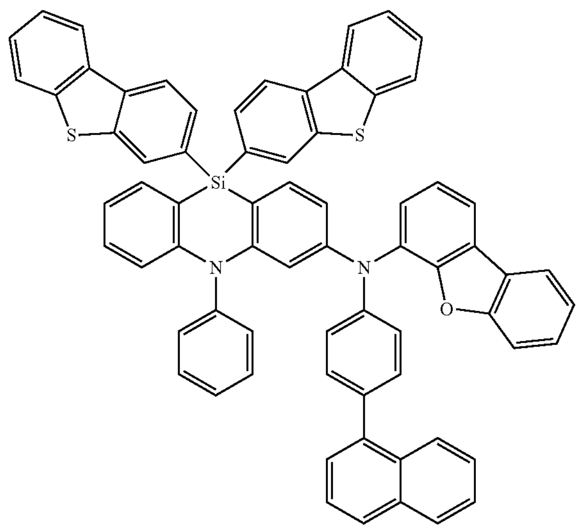
A132
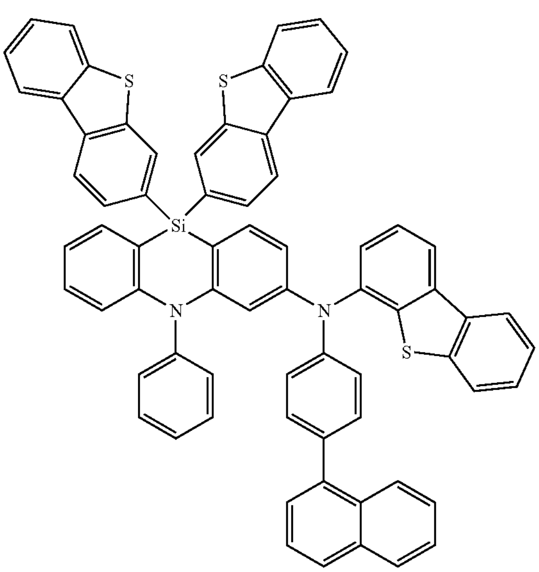
-continued
A133
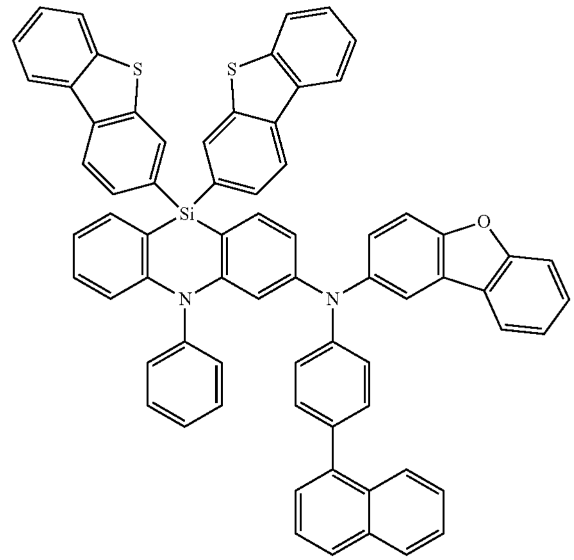
A134
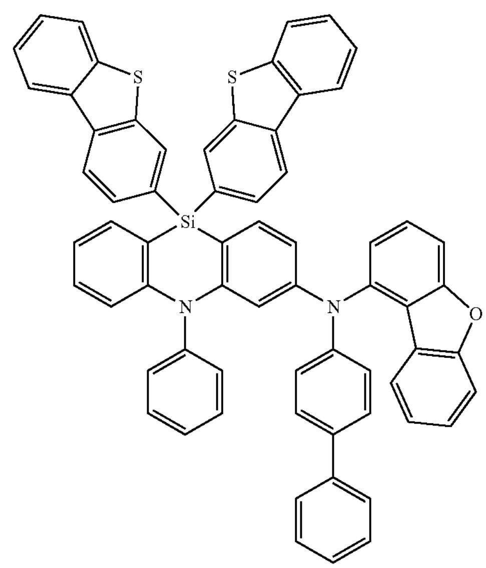
A135
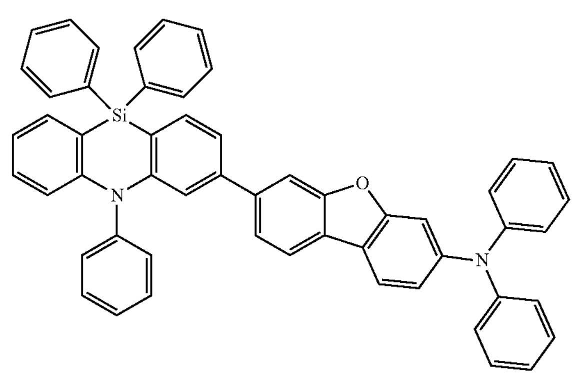

-continued
A136
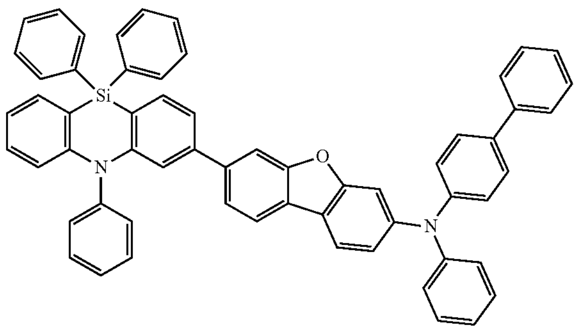
A137
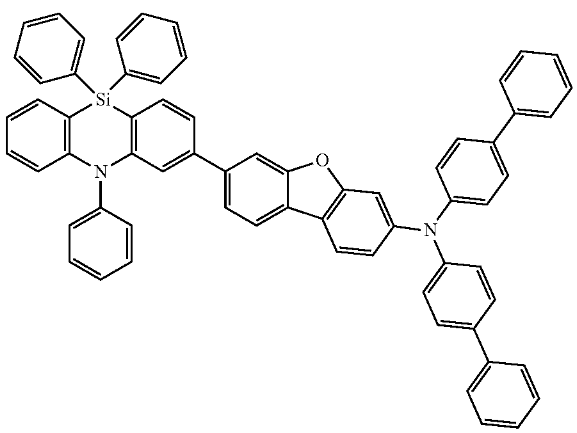
A138
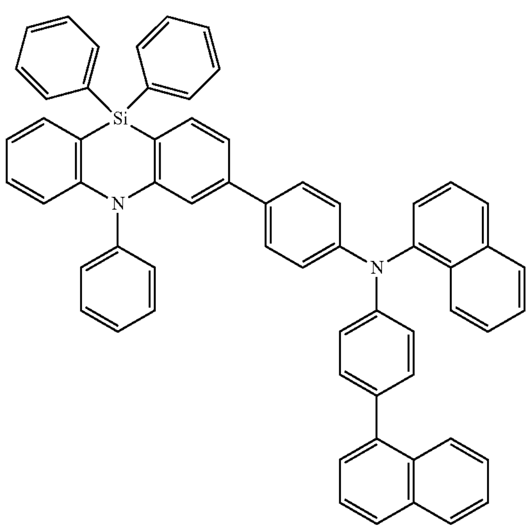
-continued
A139
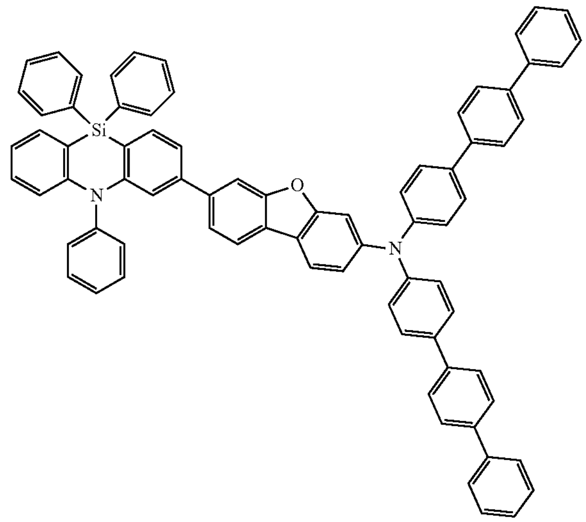
A140
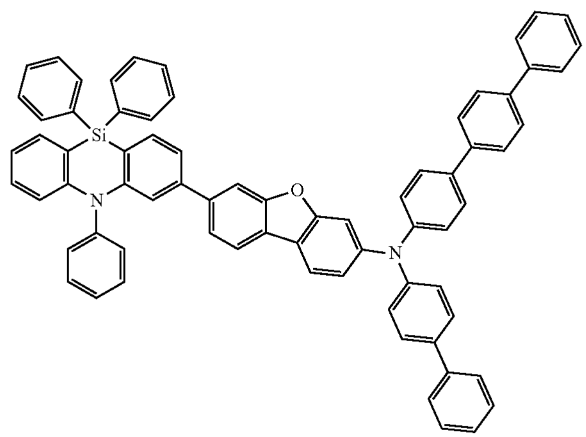
A141
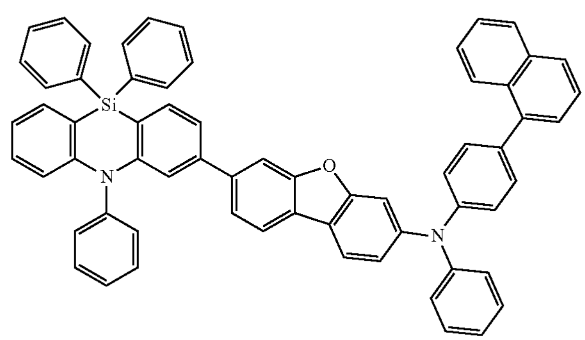

A142
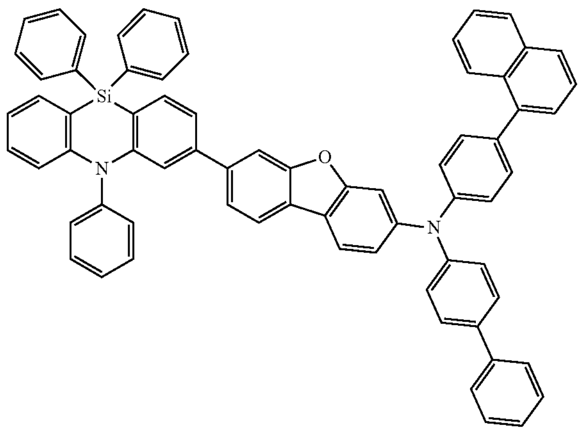
A143
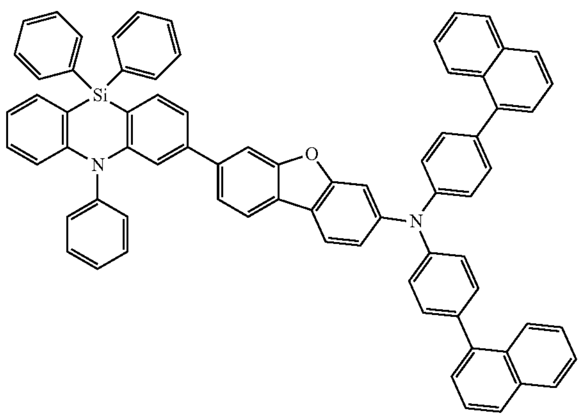
A144
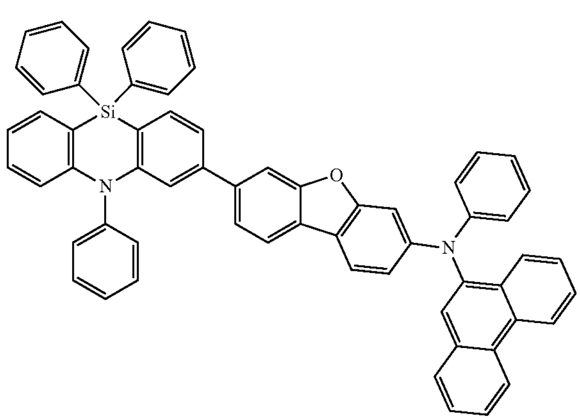
A145
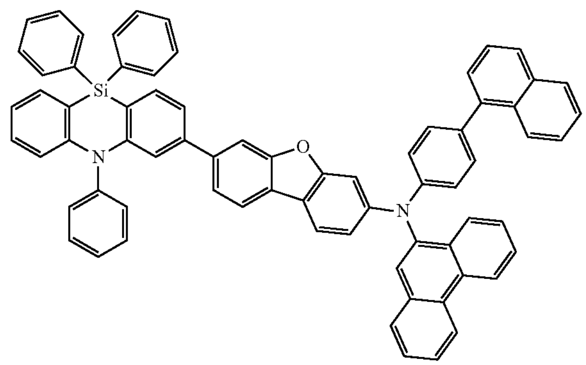
A146
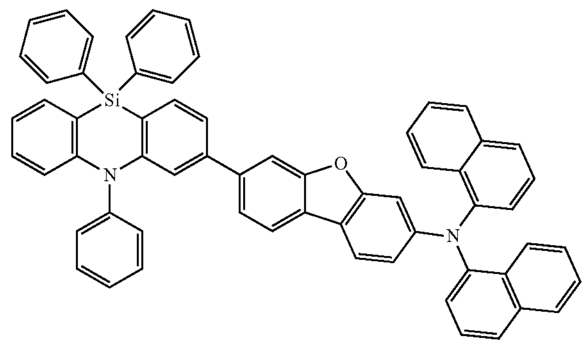
A147
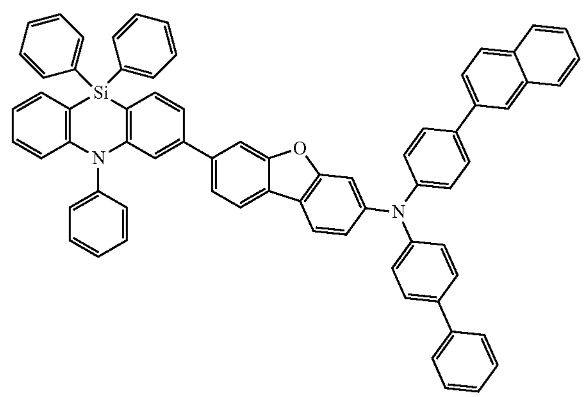
A148
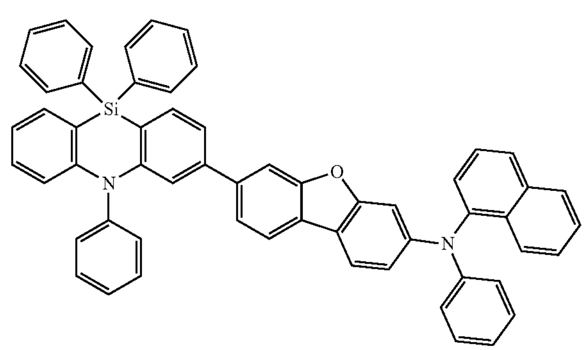

A149
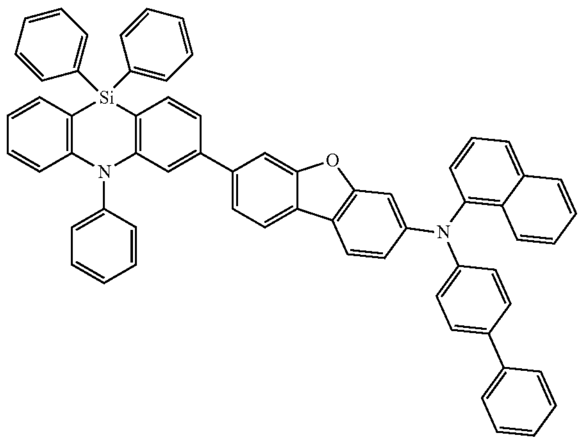
A150
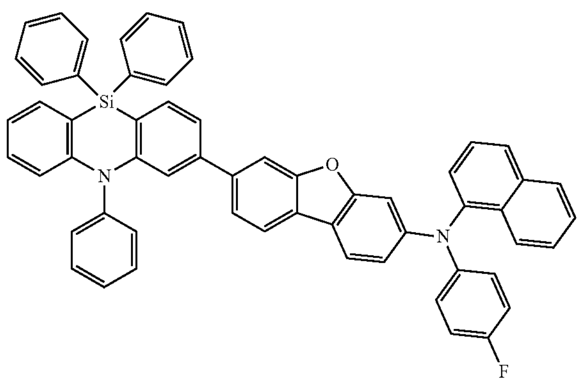
A151
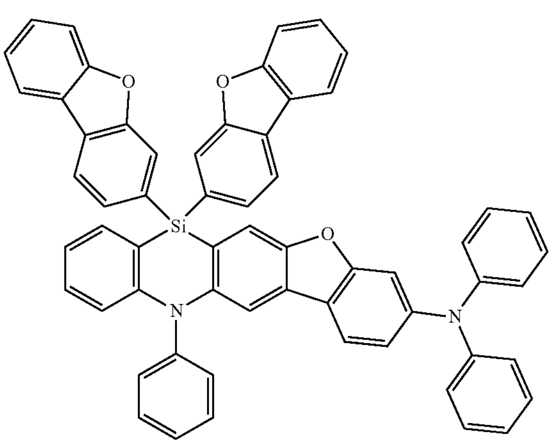
A152
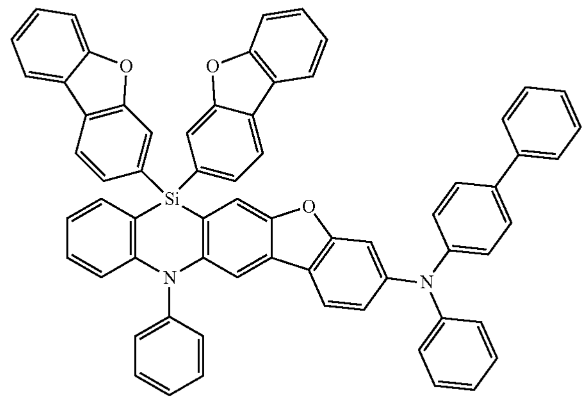
A153
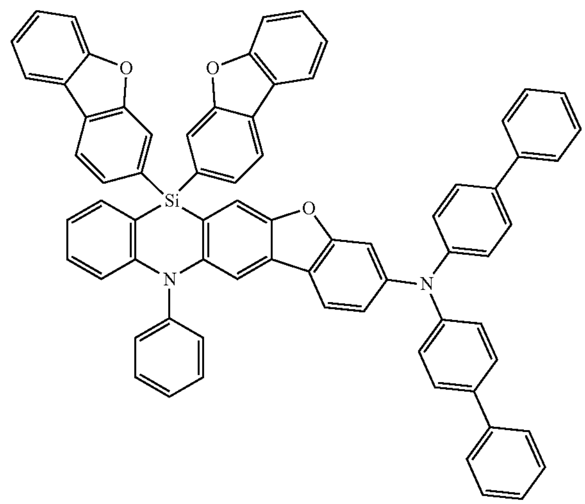
A154
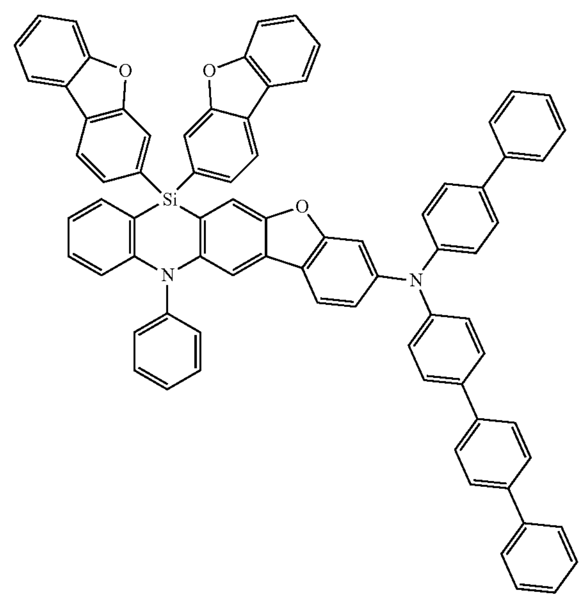

-continued
A155
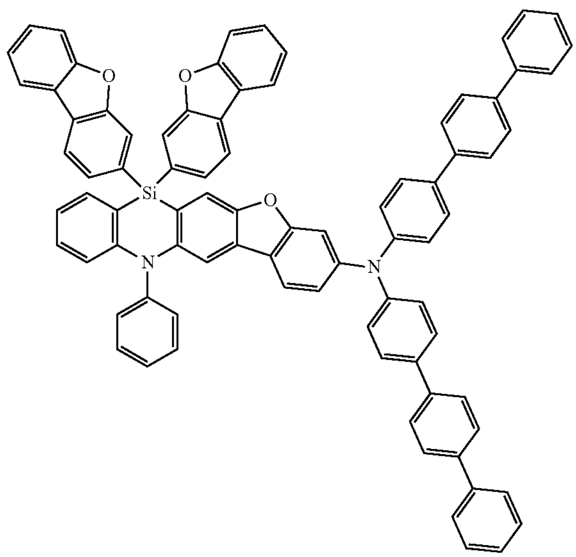
A156
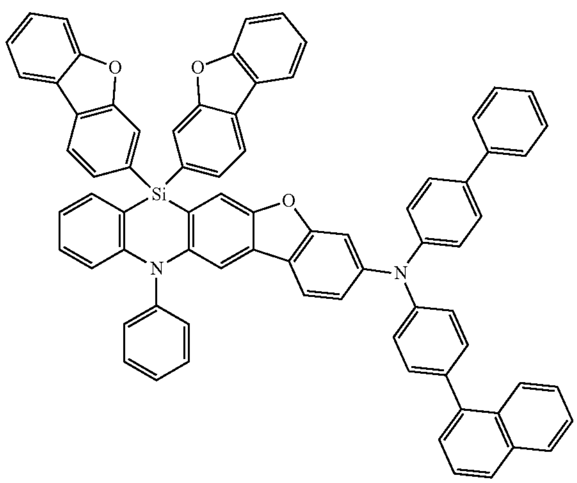
A157
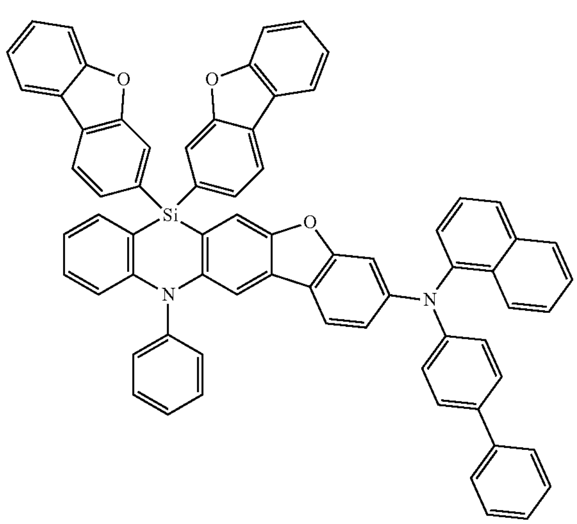
-continued
A158
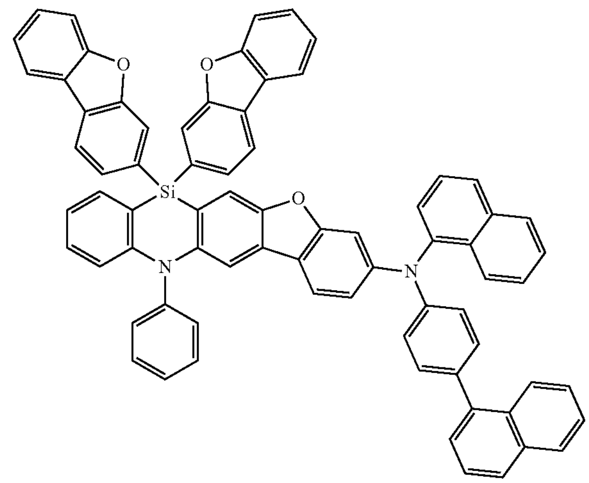
A159
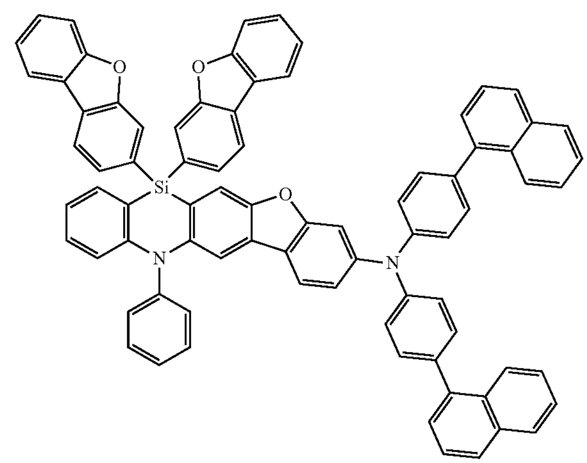
A160
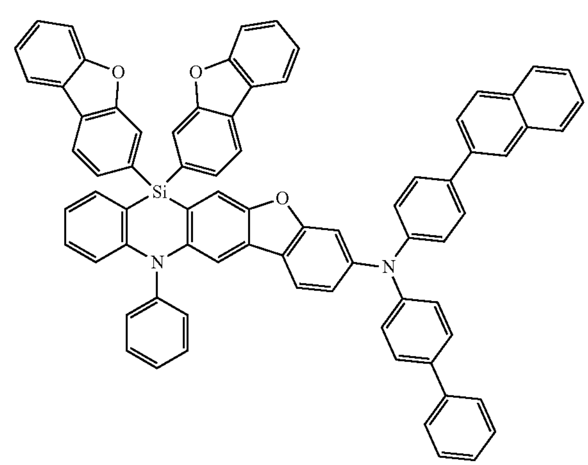

-continued
A161
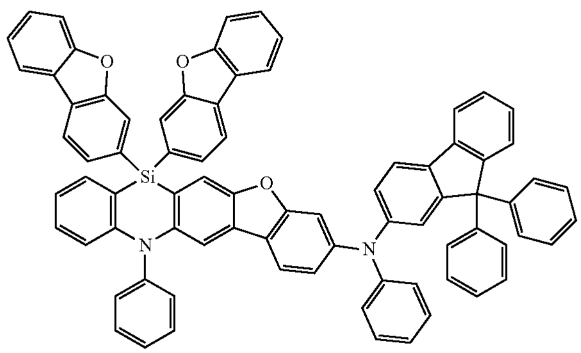
A162
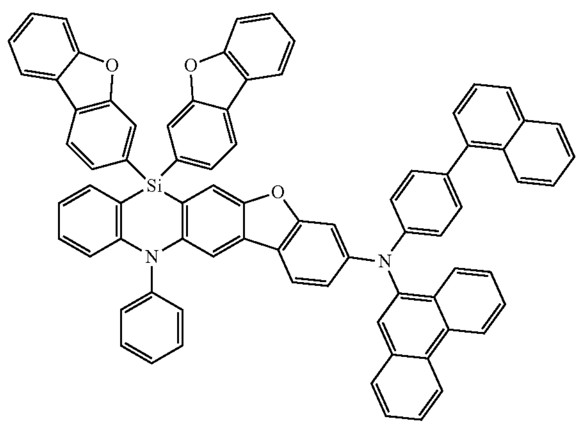
A163
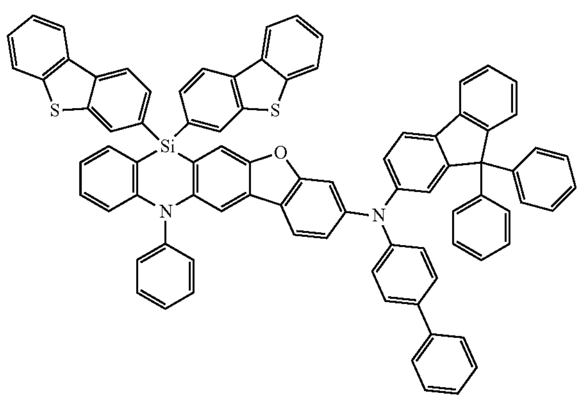
A164
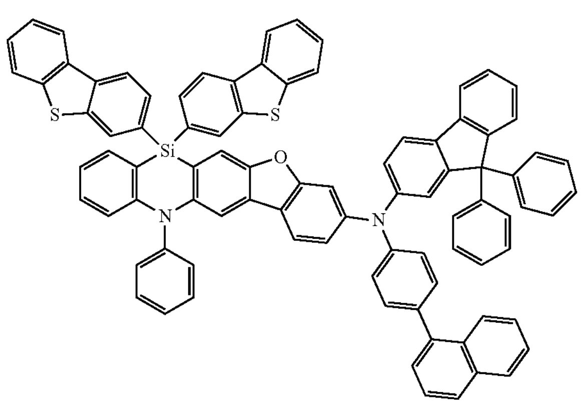
-continued
A165
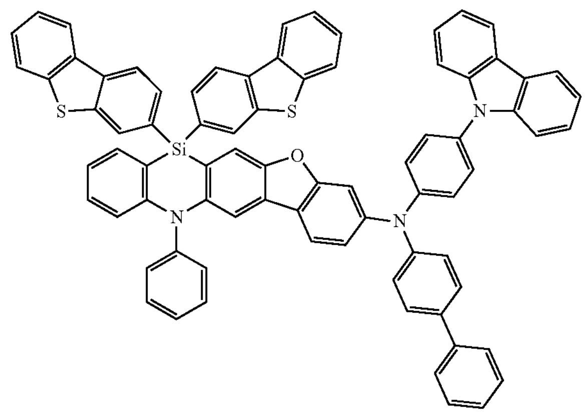
A166
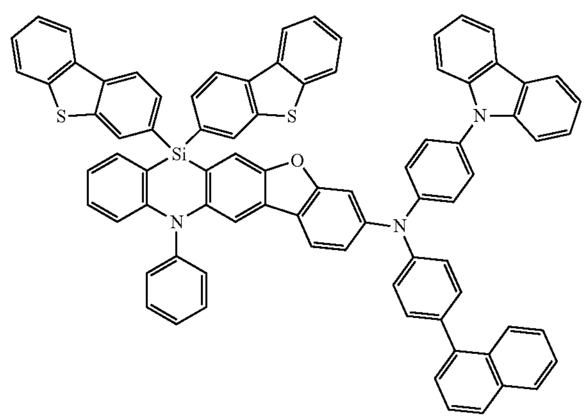
A167
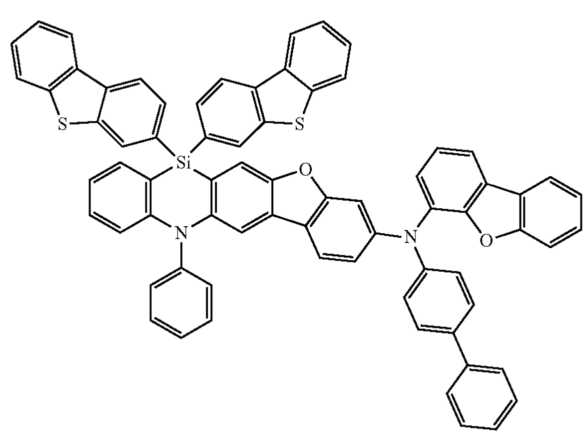

-continued
A168
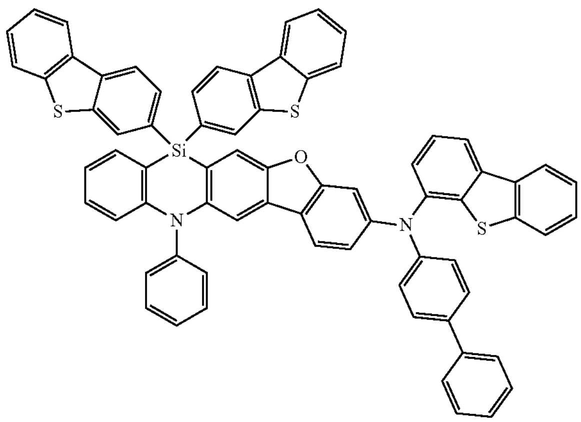
A169
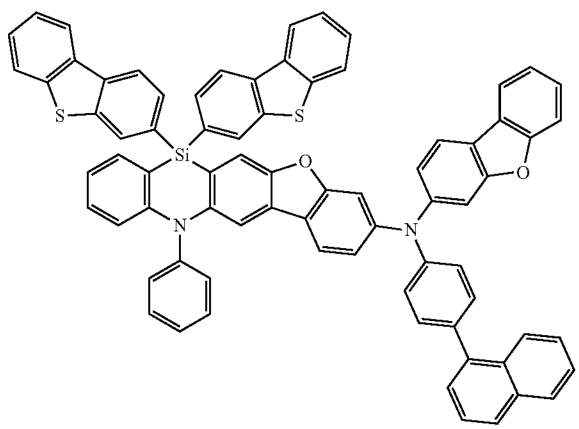
A170
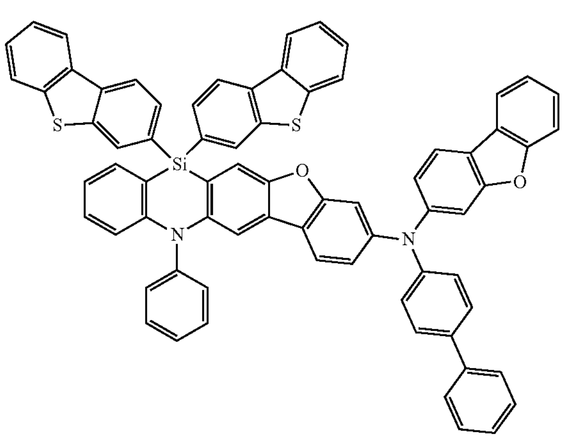
-continued
A171
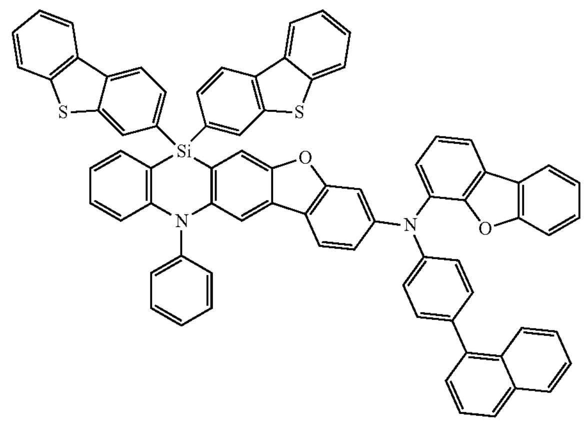
A172
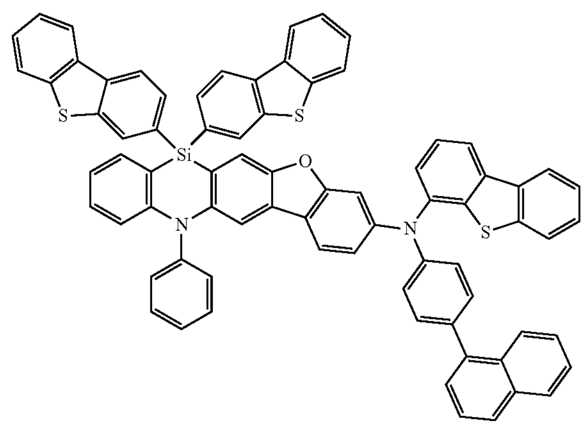
A173
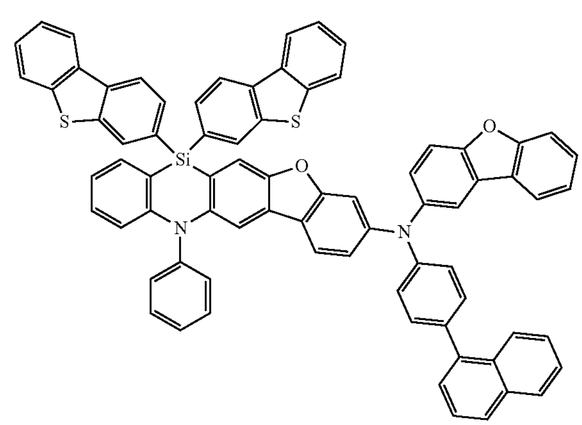

A174
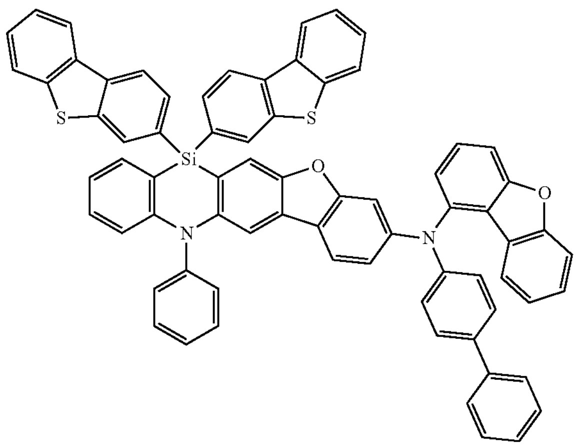
[Compound Group B]
B1
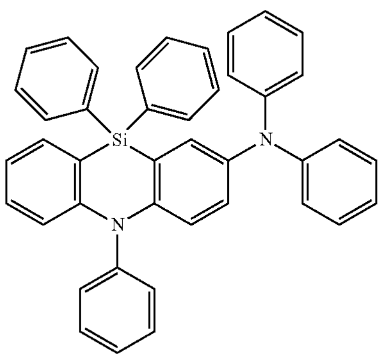
B2
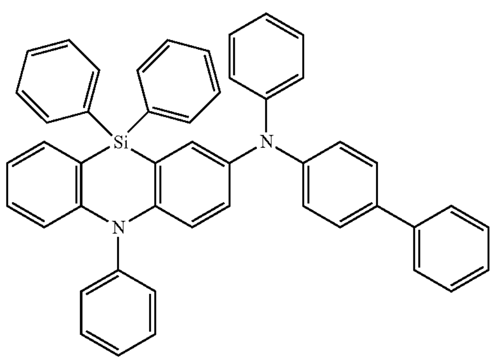
B3
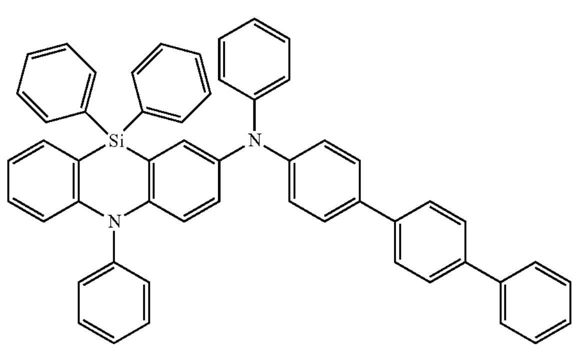
B4
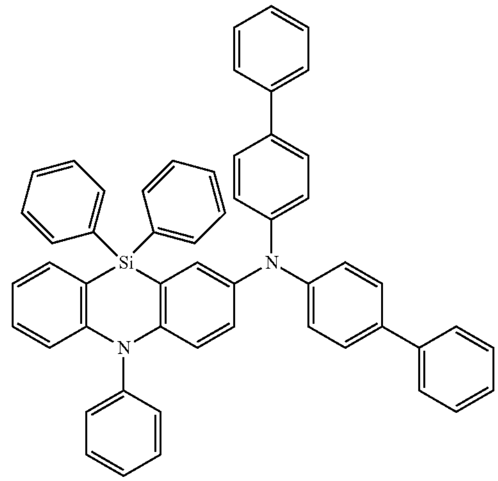
B5
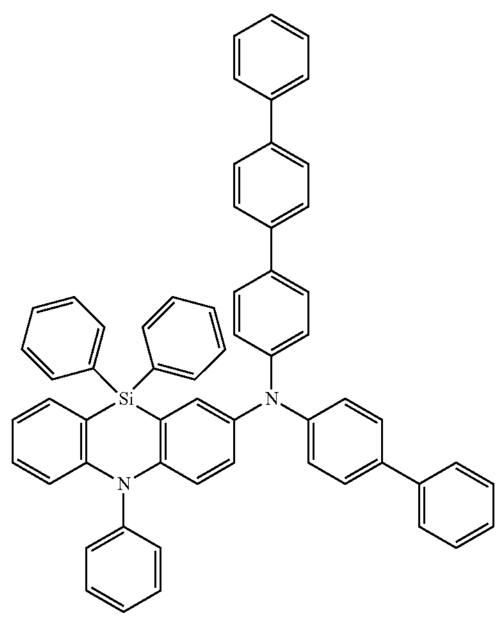

-continued
B6
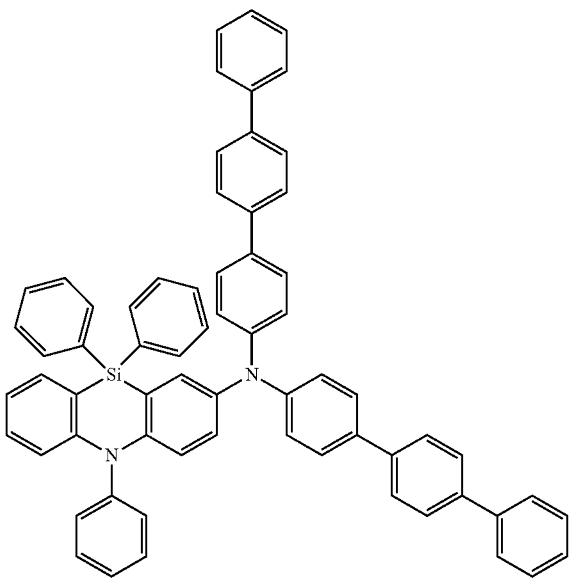
B7
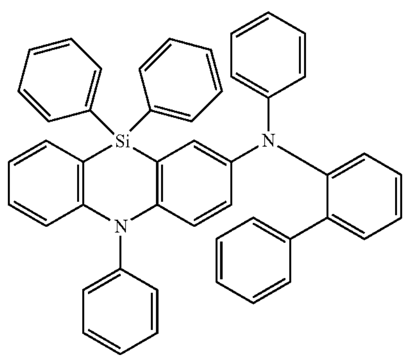
B8
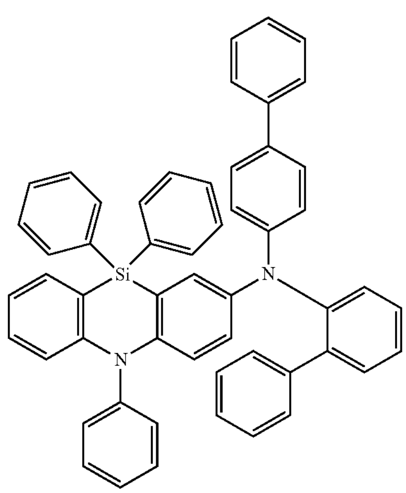
-continued
B9
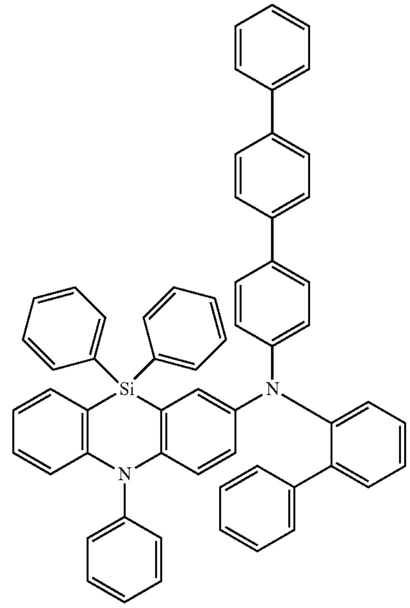
B10
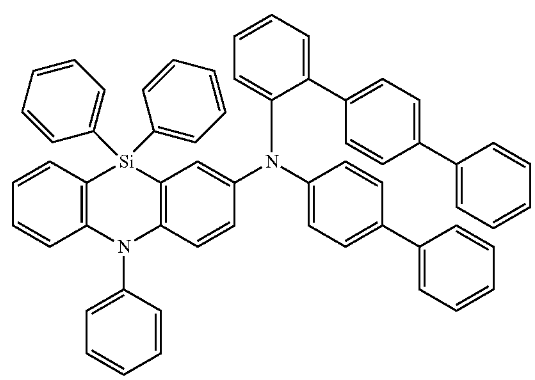
B11
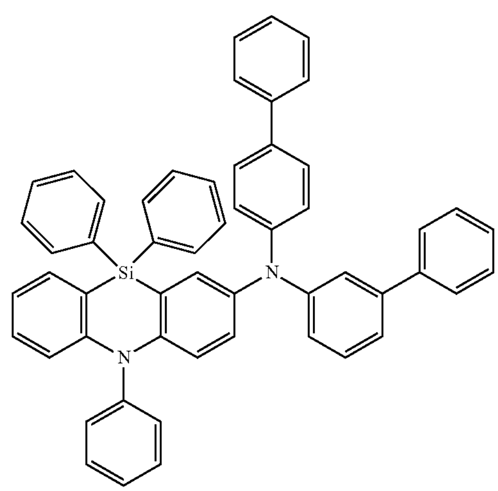

-continued
B12
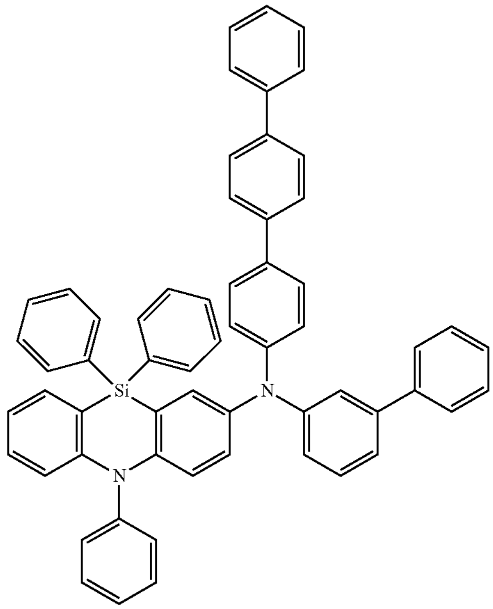
B13
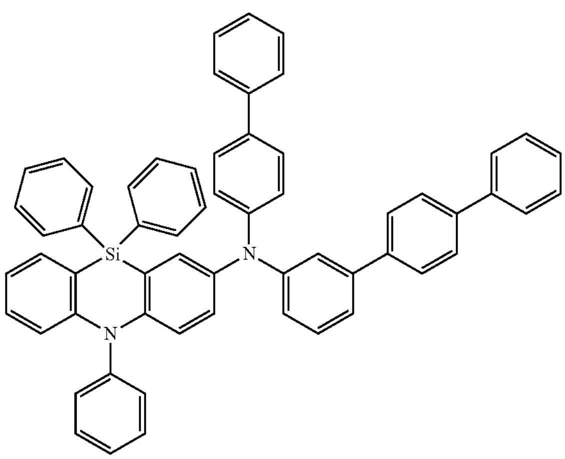
B14
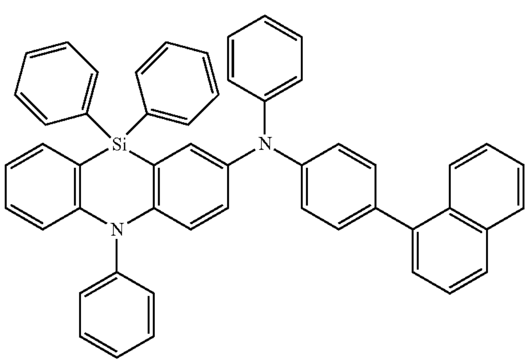
-continued
B15
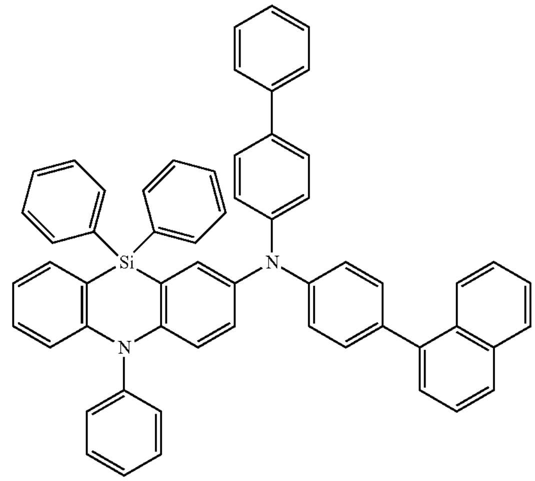
B16
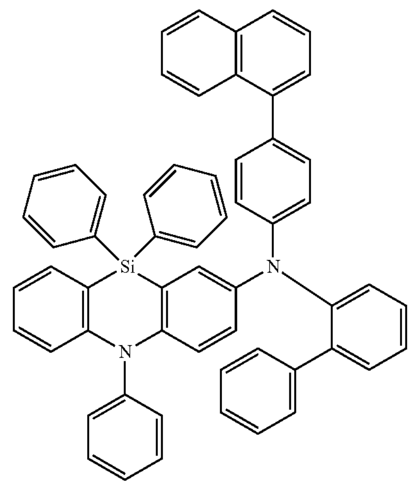
B17
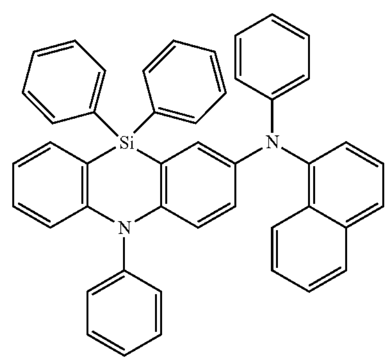

-continued
B18
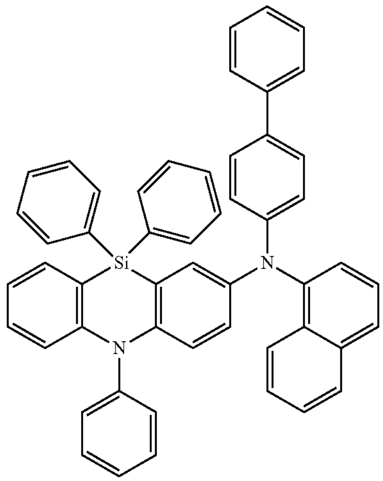
B19
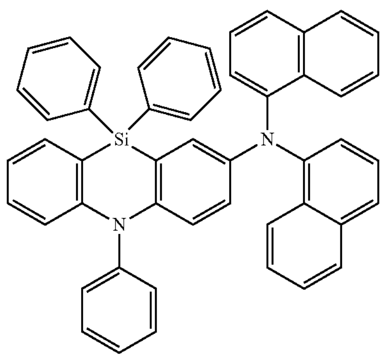
B20
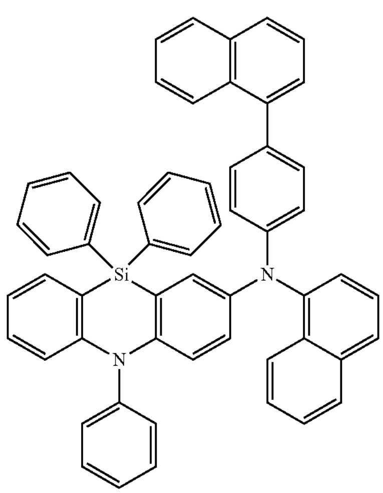
-continued
B21
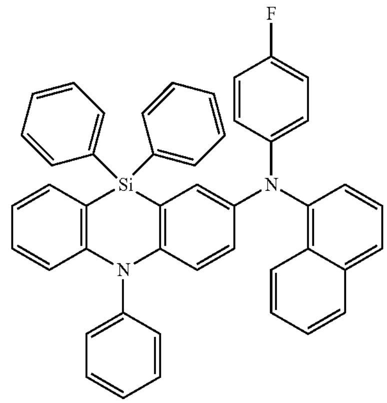
B22
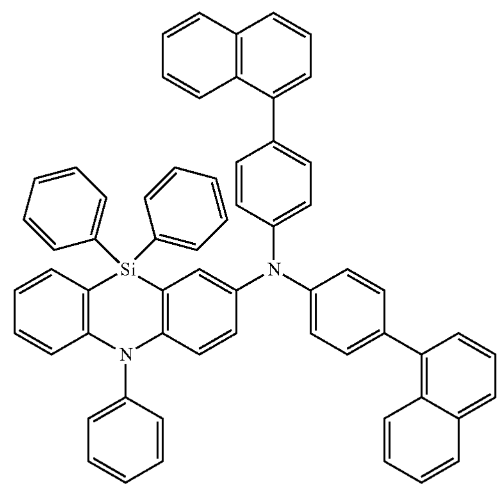
B23
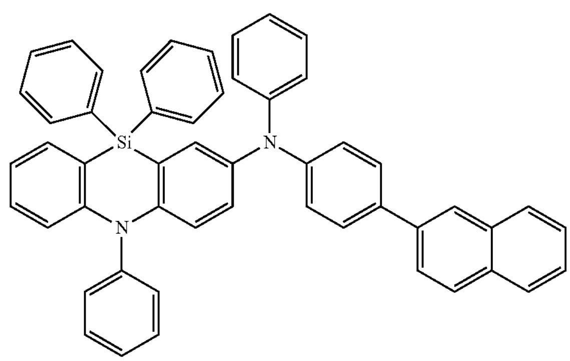

-continued
B24
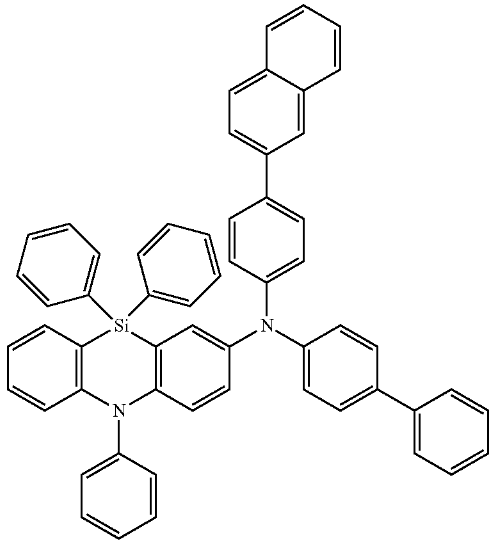
B25
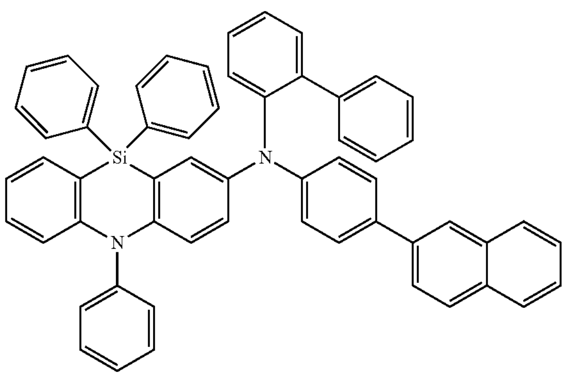
B26
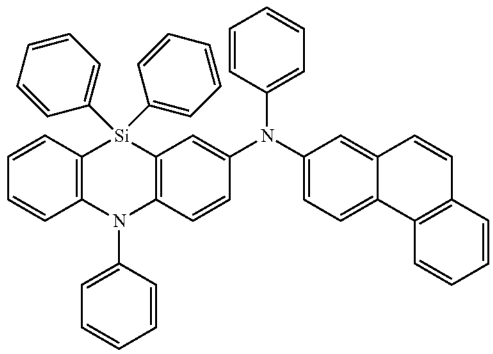
-continued
B27
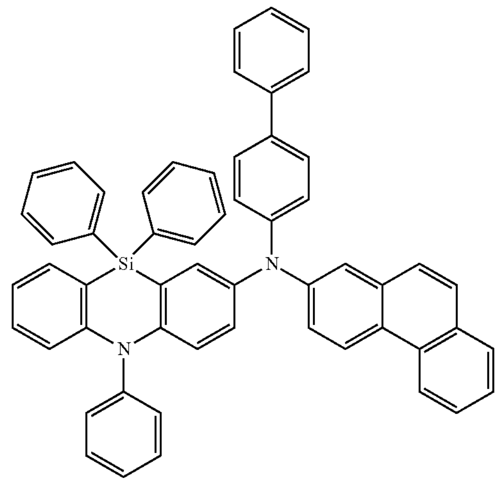
B28
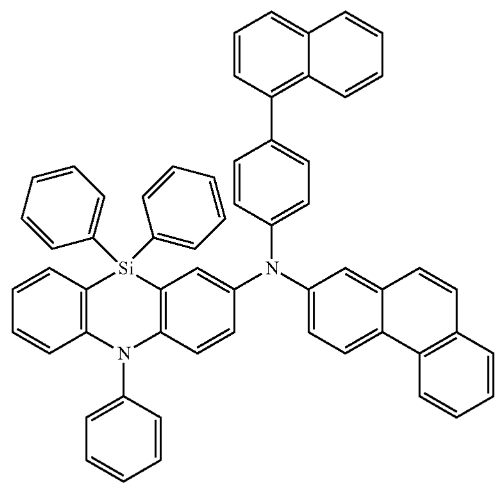
B29
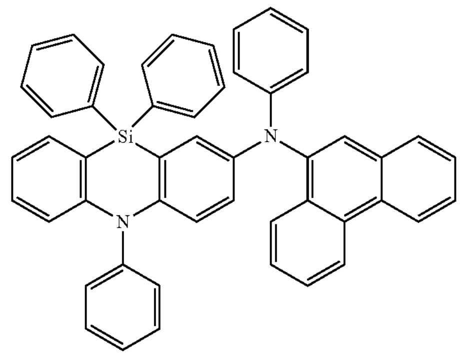

-continued
B30
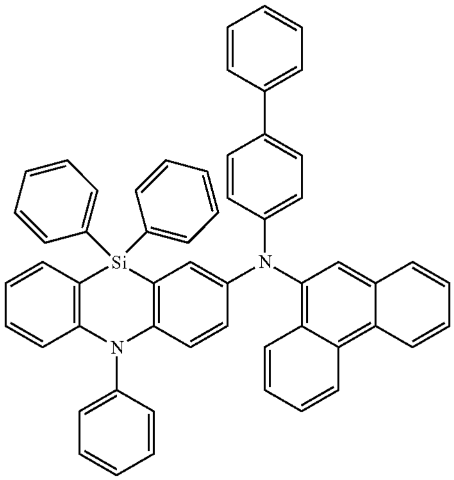
B31
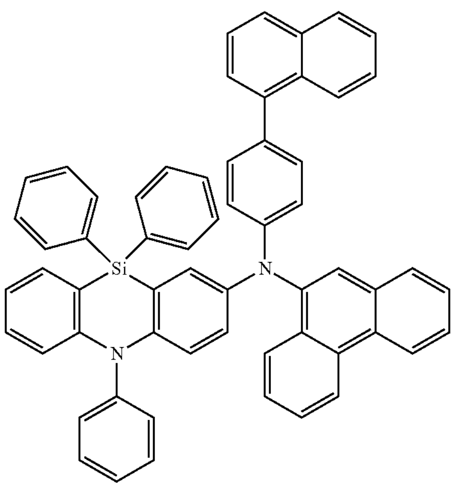
B32
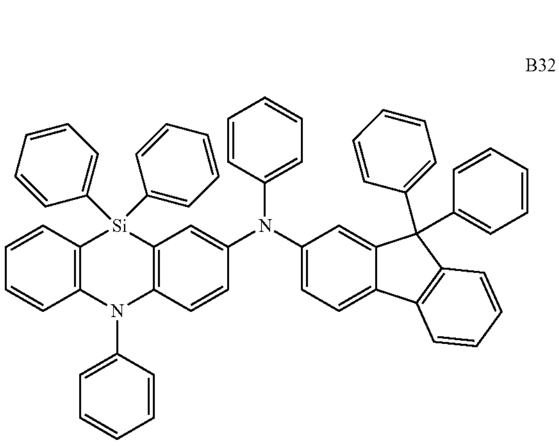
-continued
B33
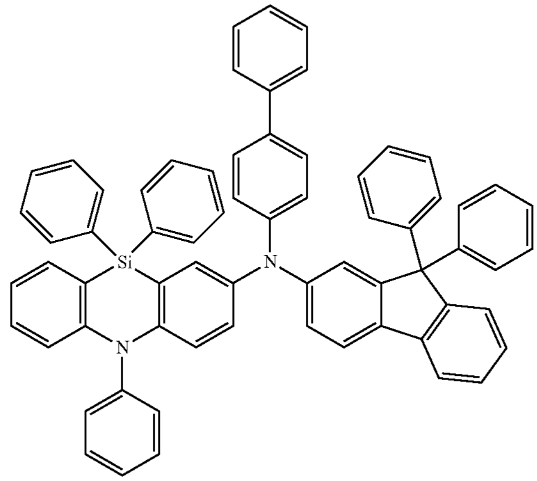
B34
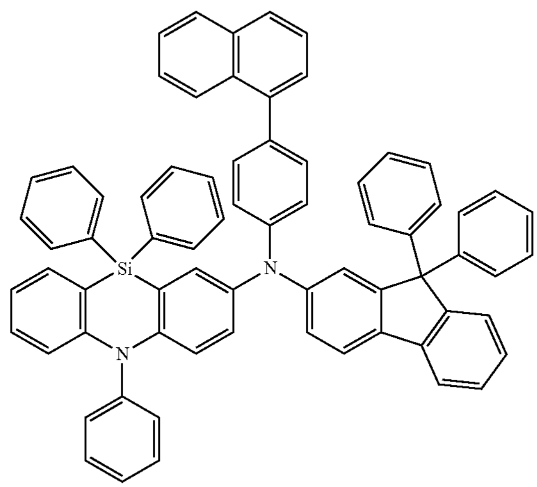
B35
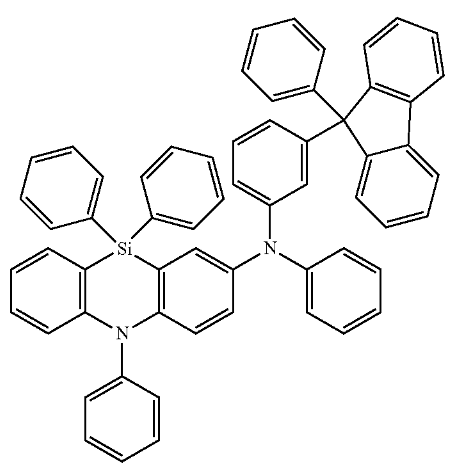

-continued
B36
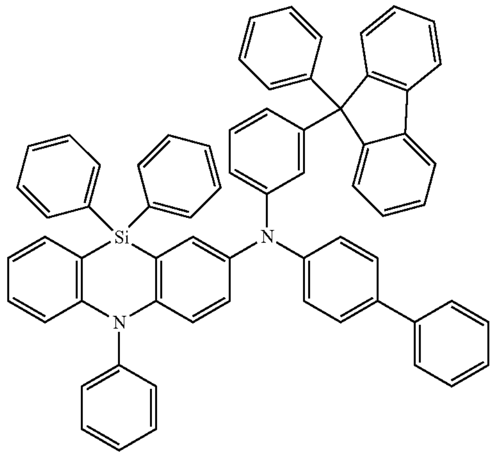
B37
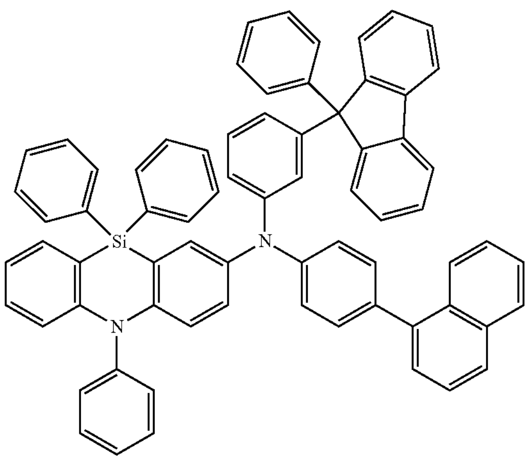
B38
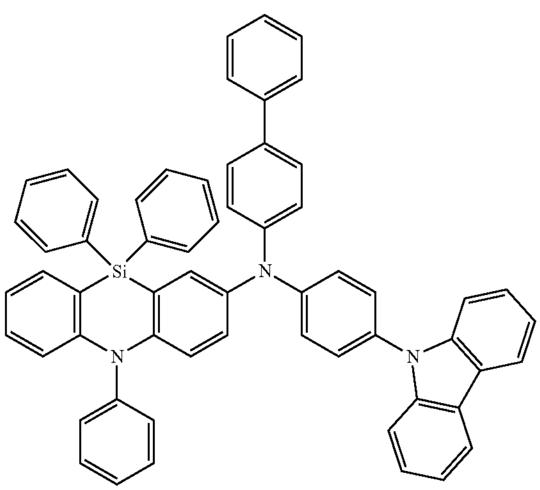
-continued
B39
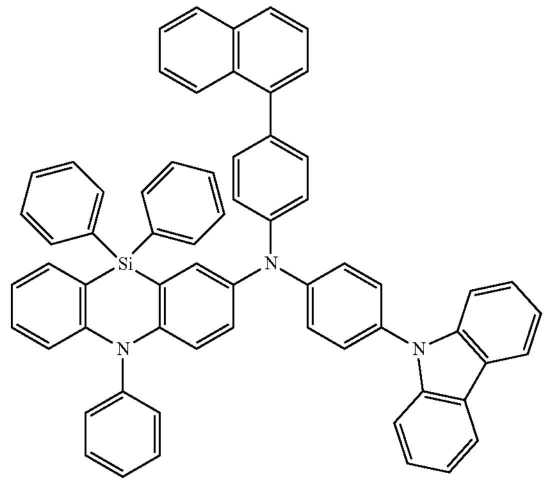
B40
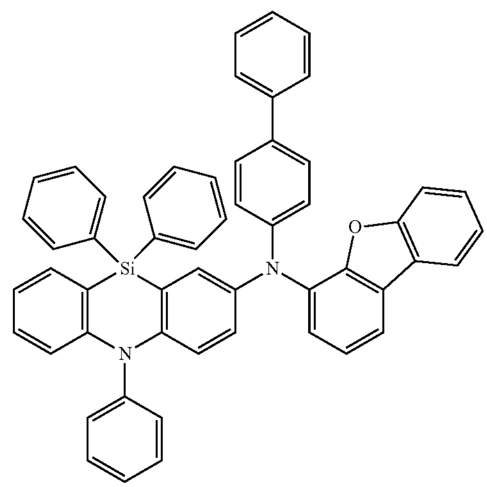
B41
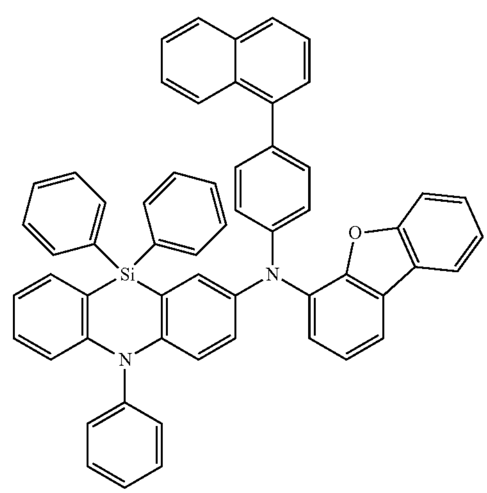

-continued
B42
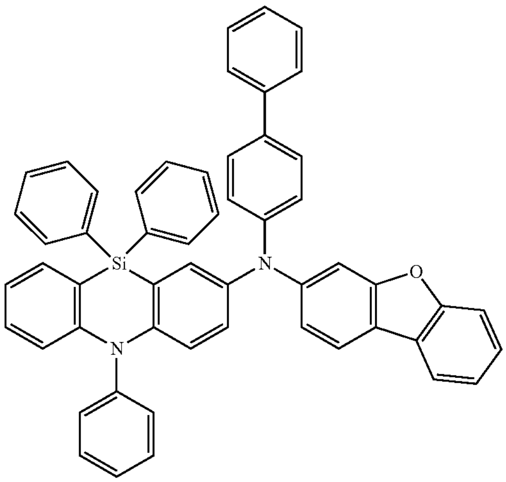
B43
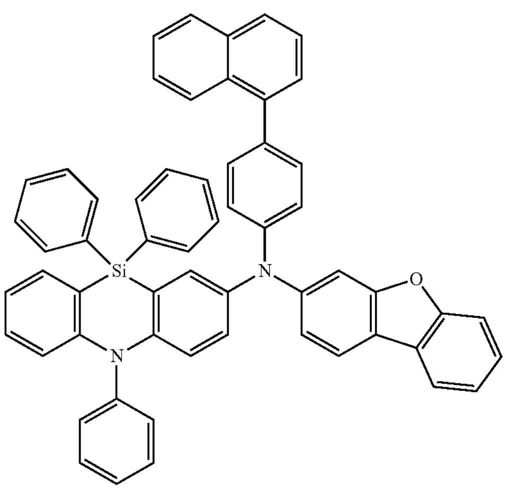
B44
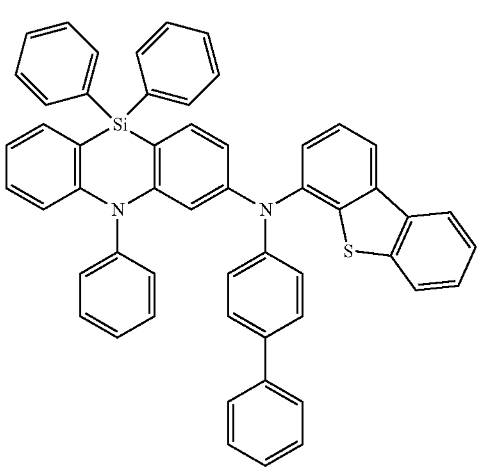
-continued
B45
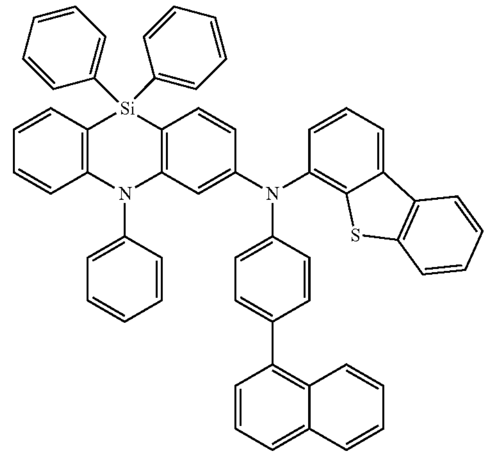
B46
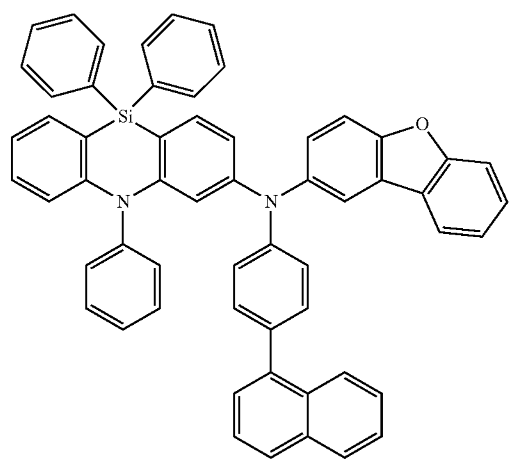
B47
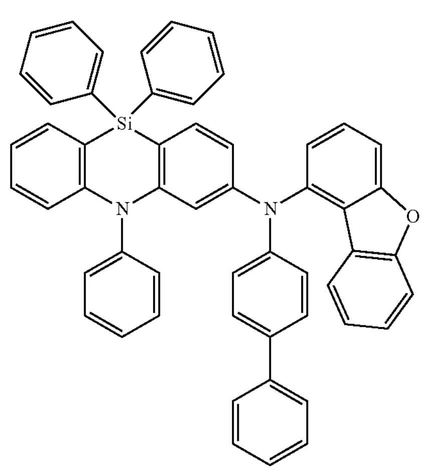

B48
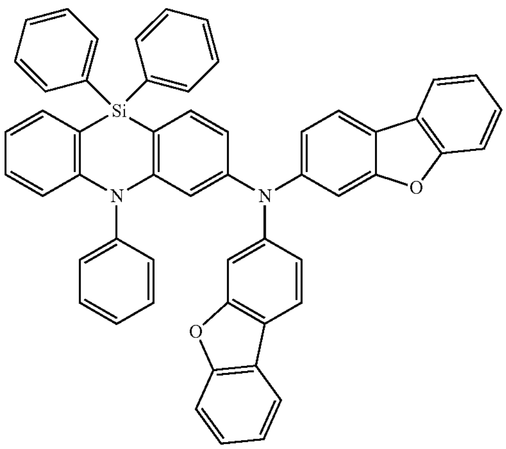
B49
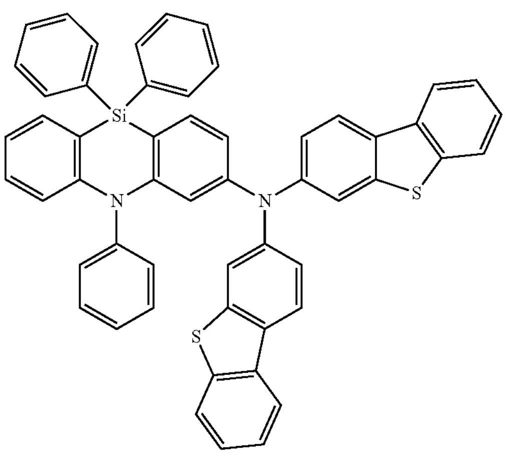
B50
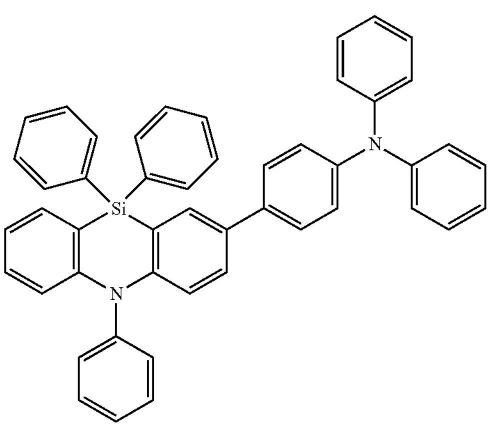
B51
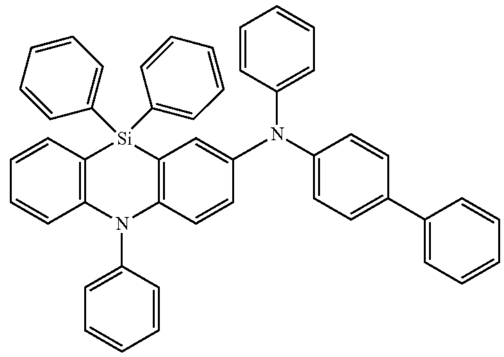
B52
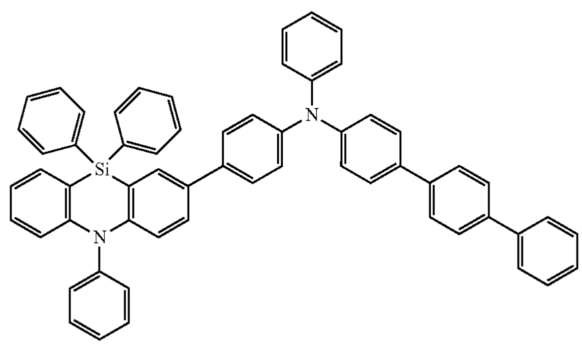
B53
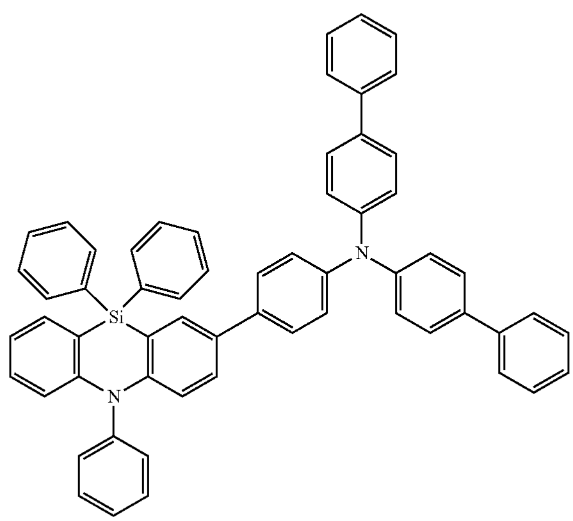

-continued
B54
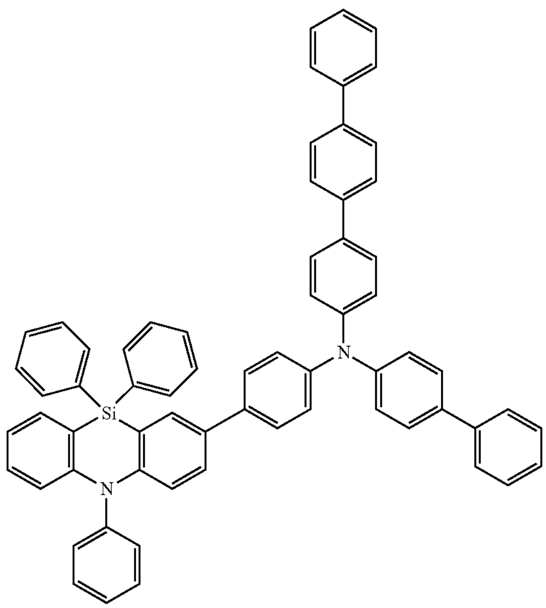
B55
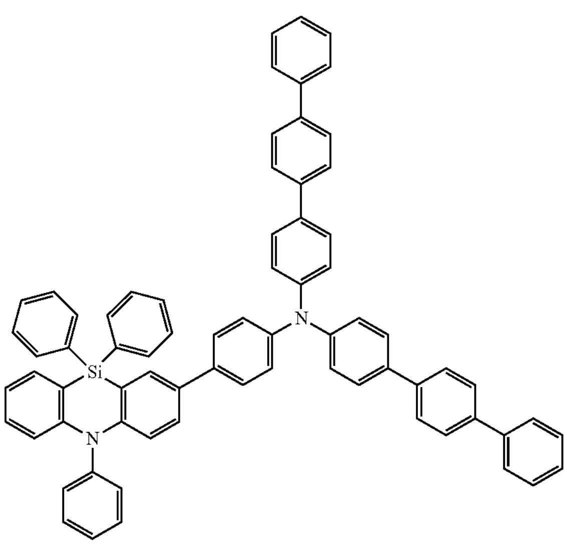
B56
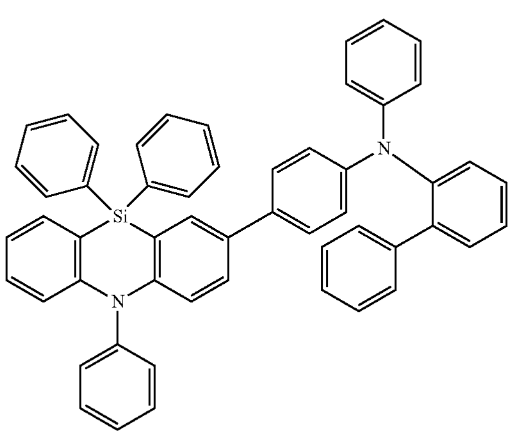
-continued
B57
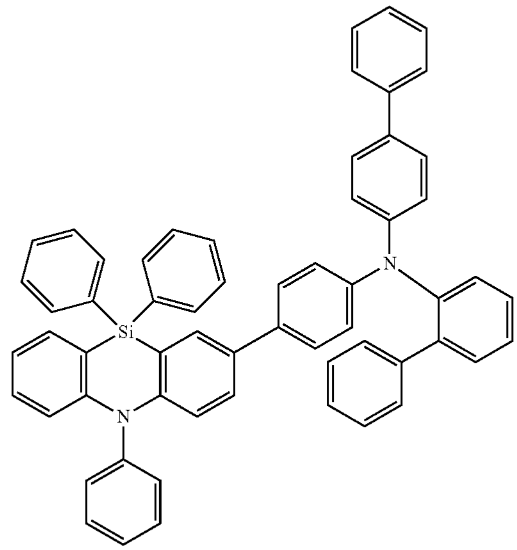
B58
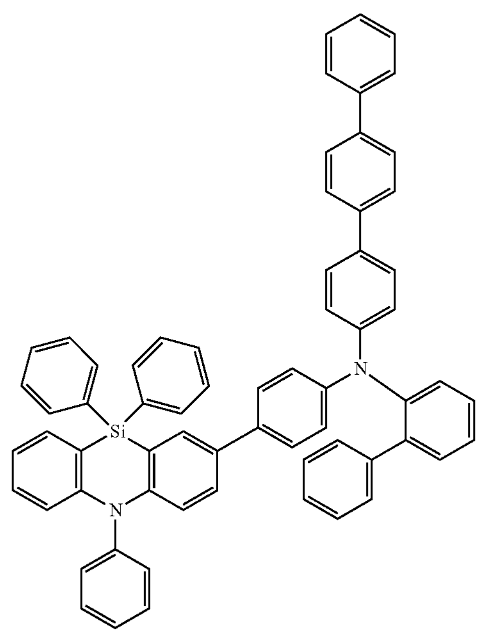

-continued
B59
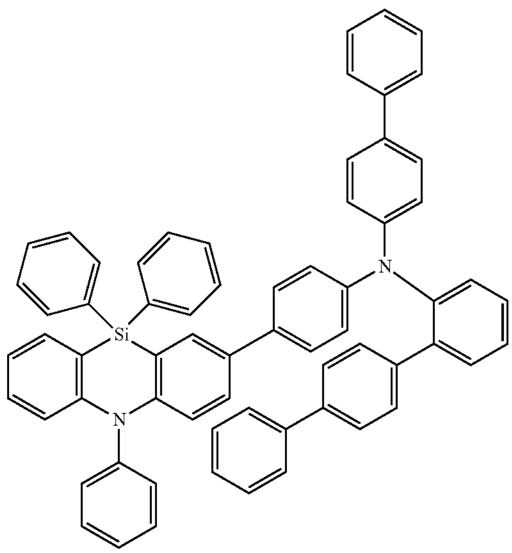
B60
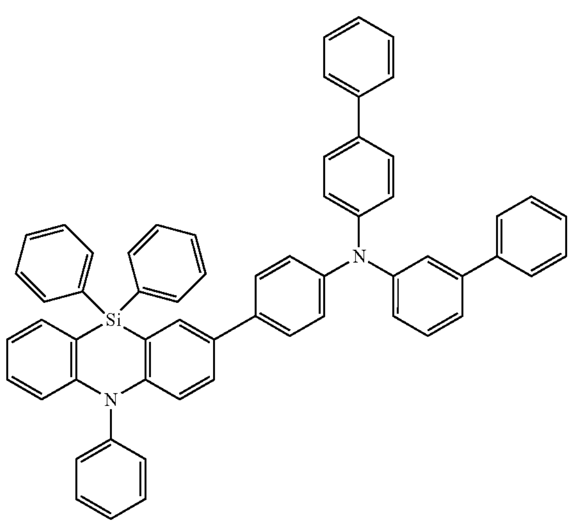
-continued
B61
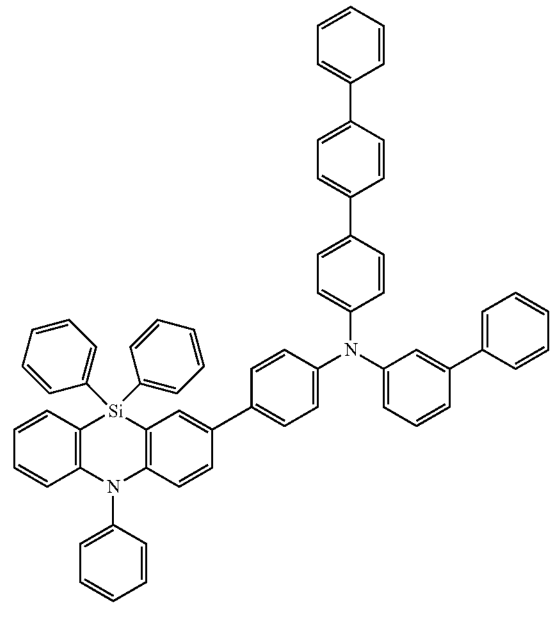
B62
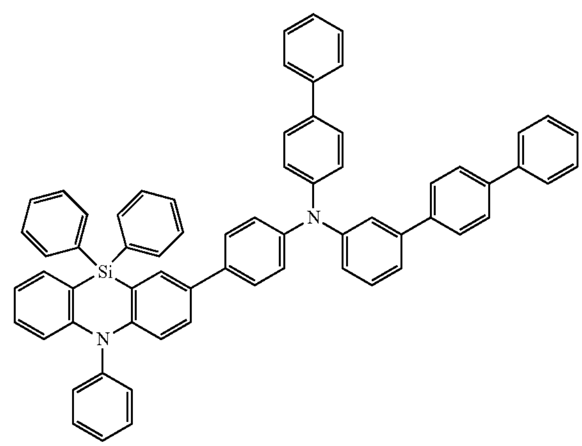
B63
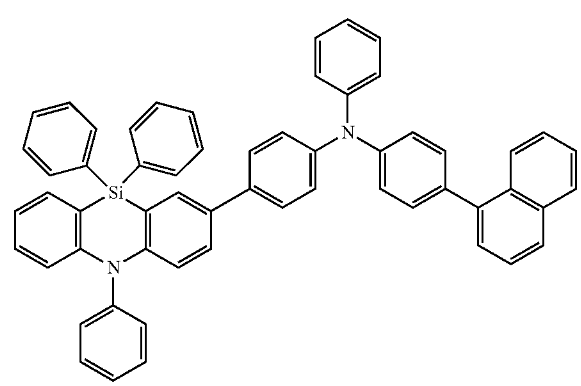

-continued
B64
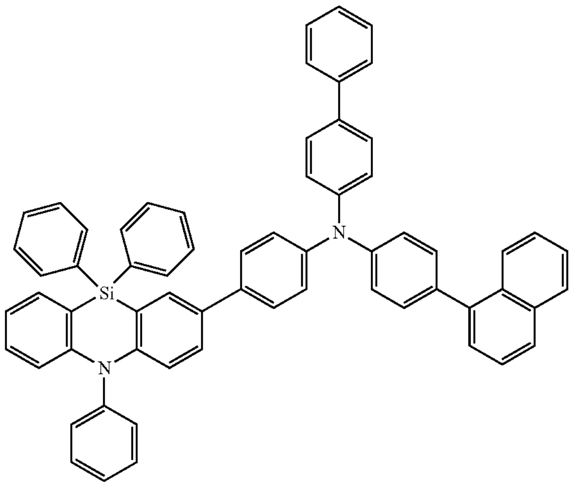
B65
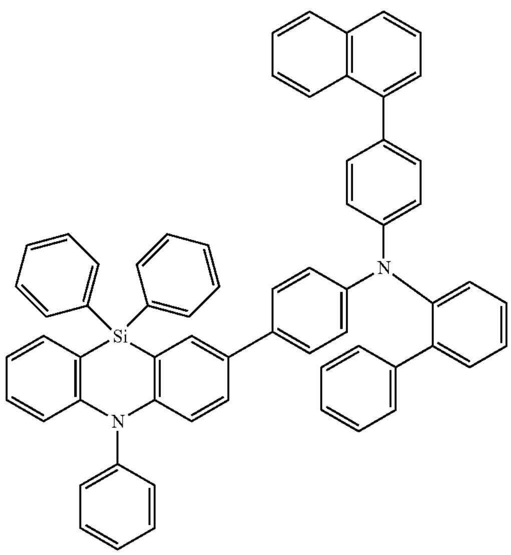
B66
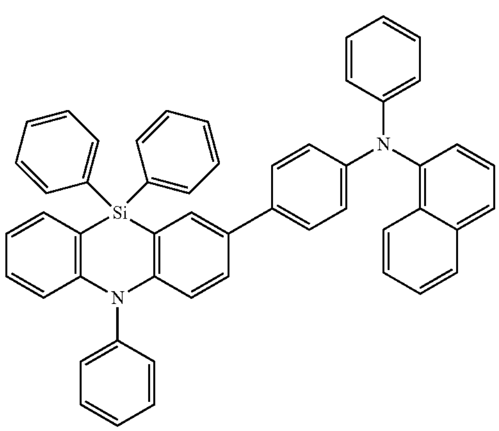
-continued
B67
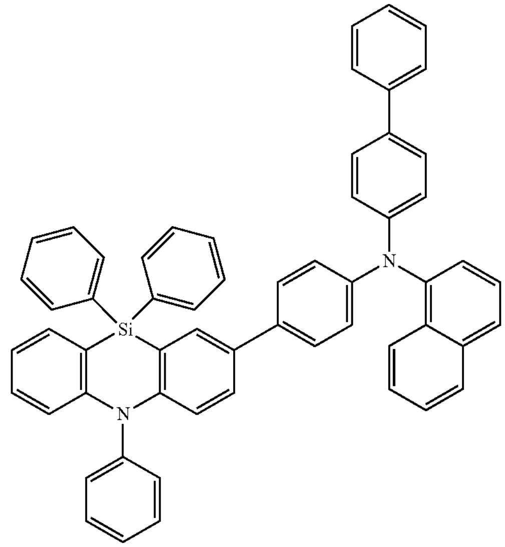
B68
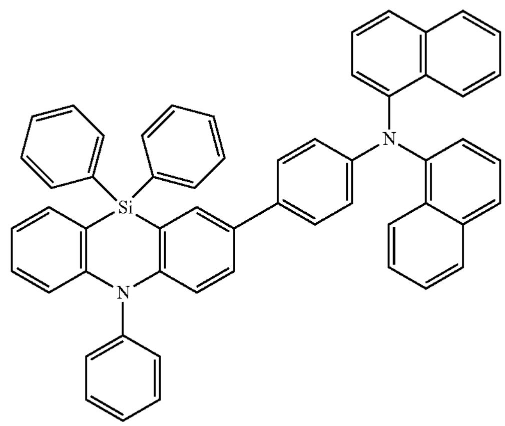
B69
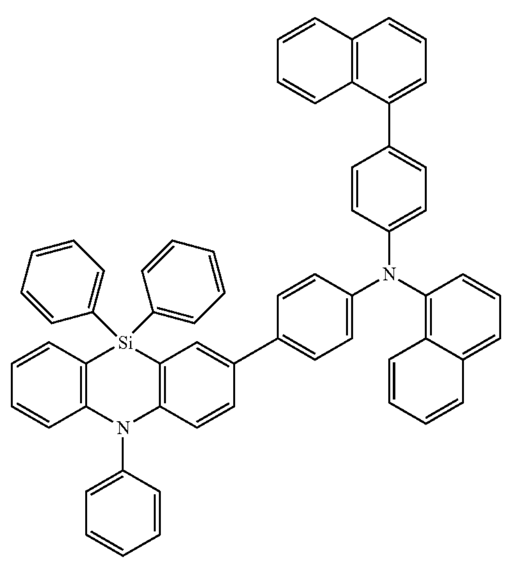

-continued
B70
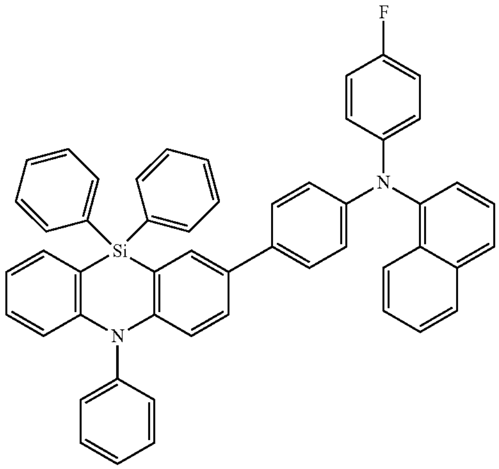
B71
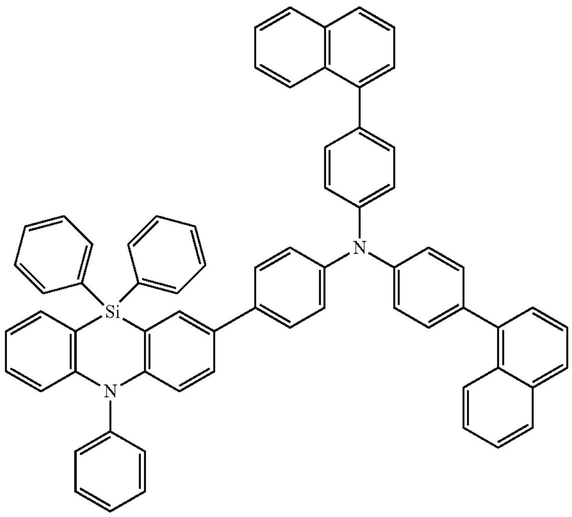
B72
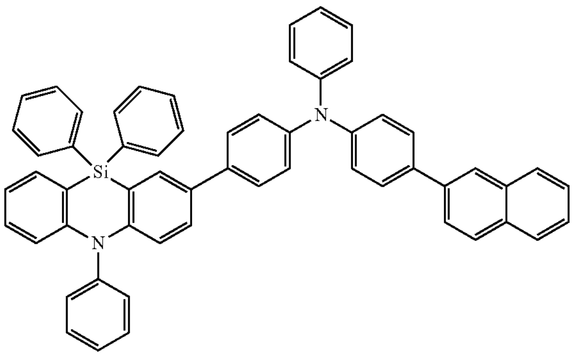
-continued
B73
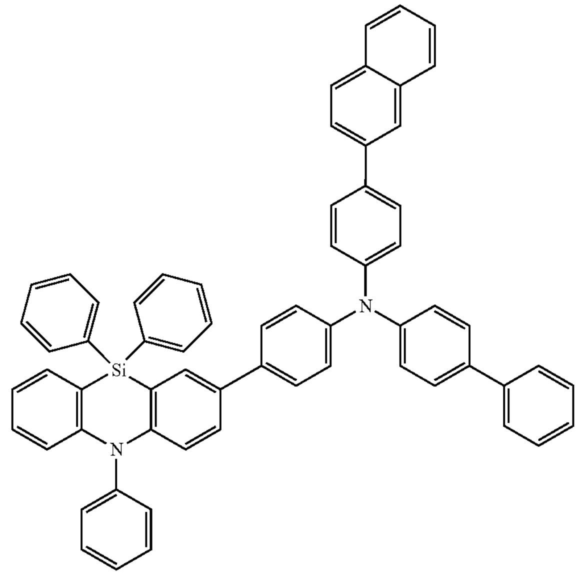
B74
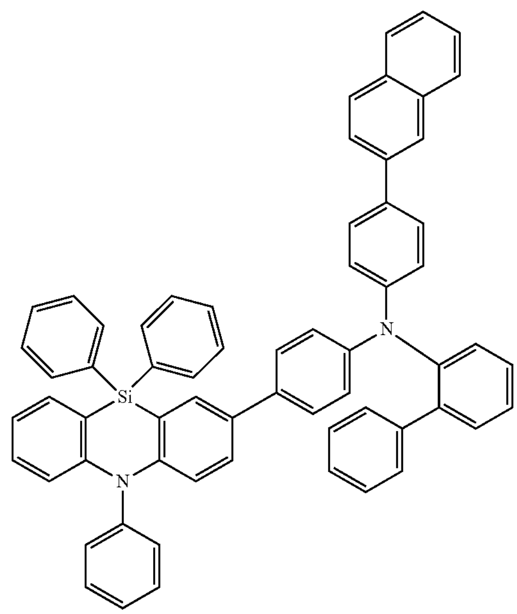
B75
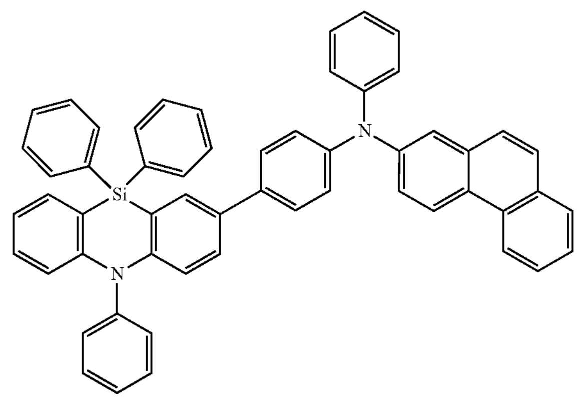

-continued
B76
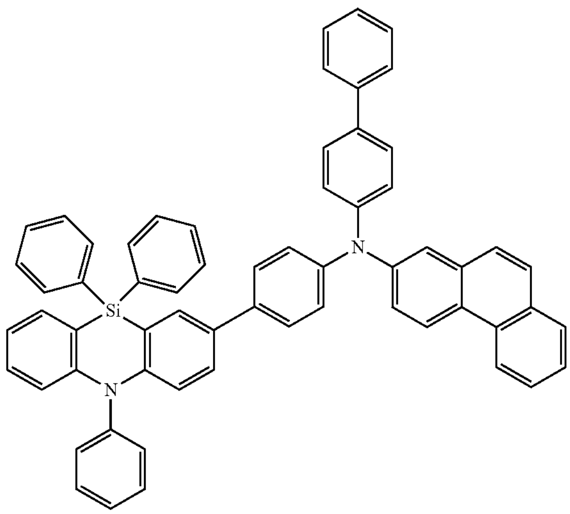
B77
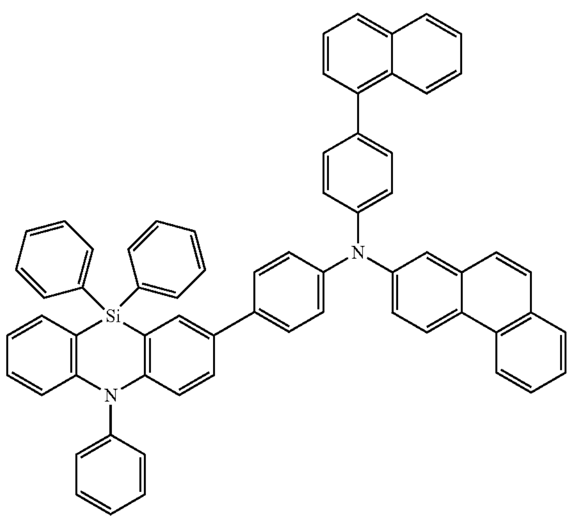
B78
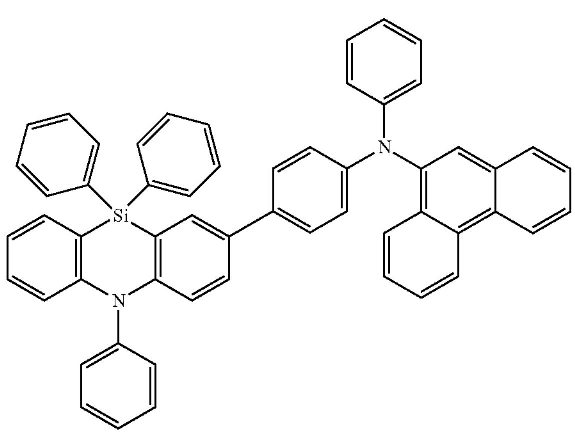
-continued
B79
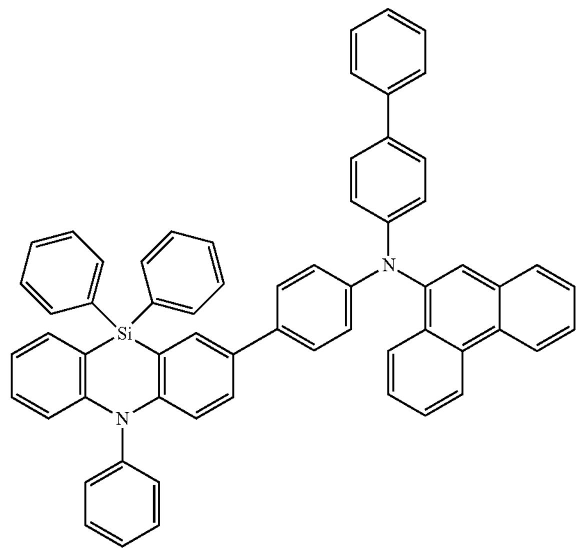
B80
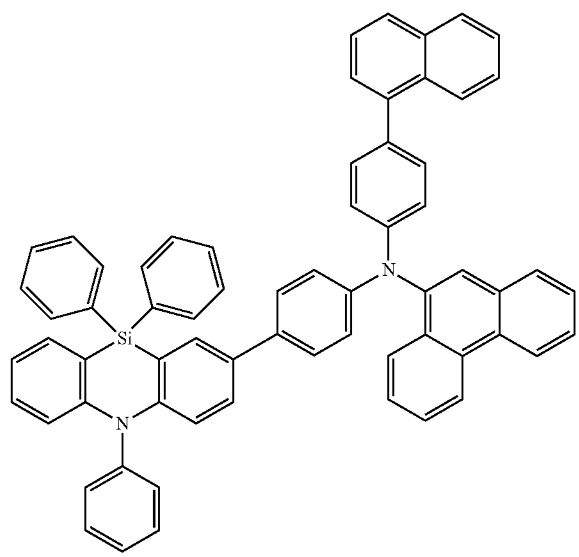
B81
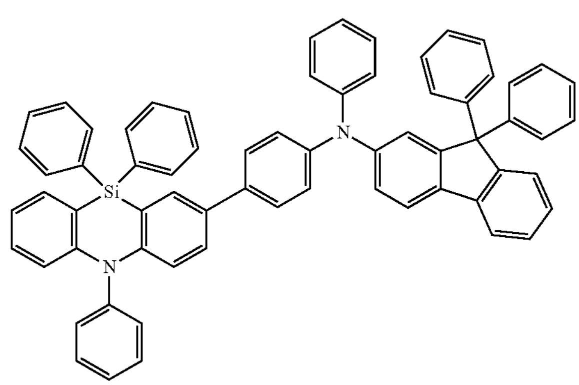

-continued
B82
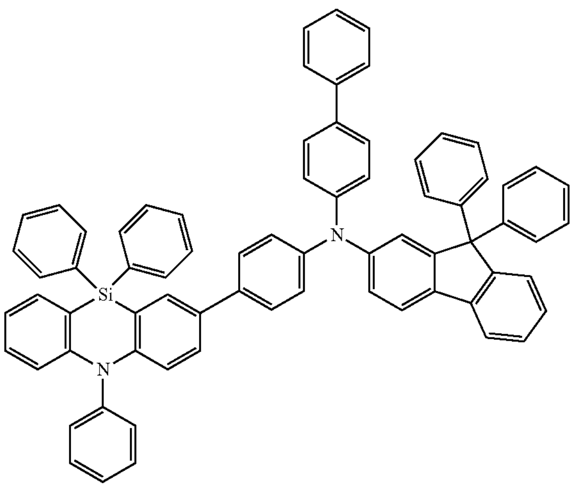
B83
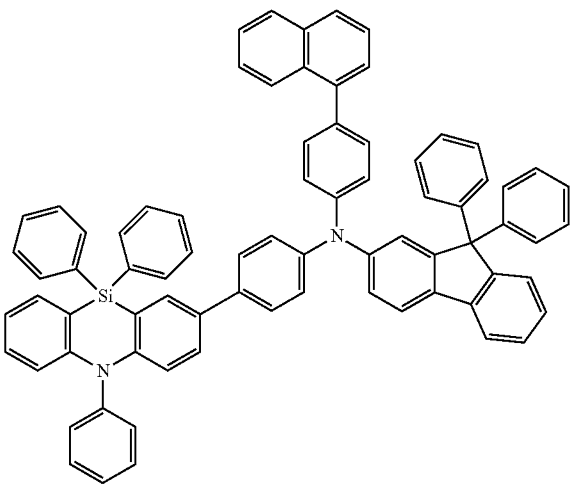
B84
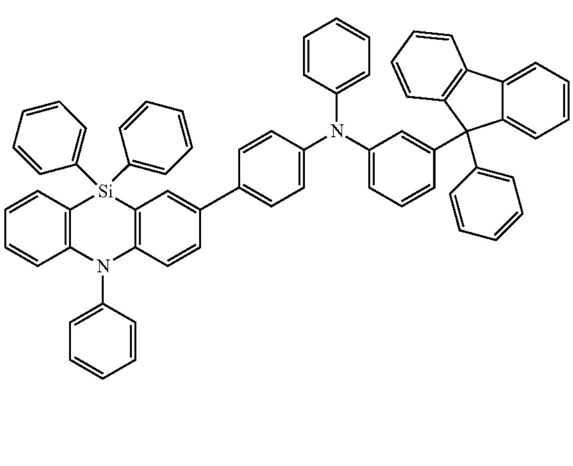
-continued
B85
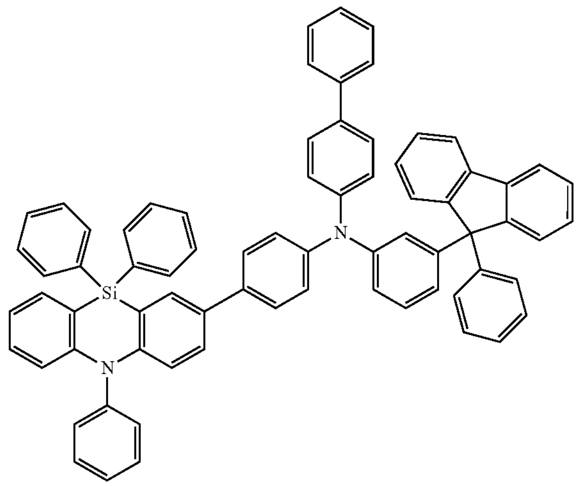
B86
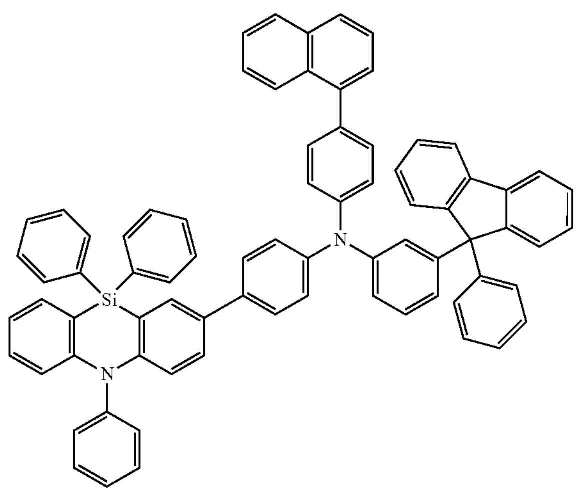
B87
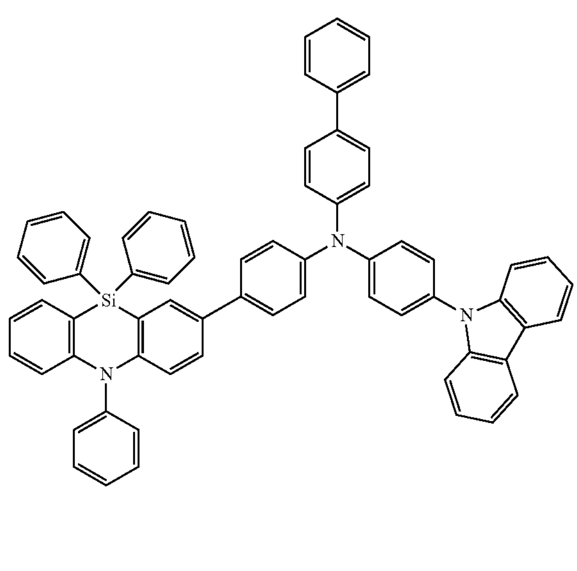

B88
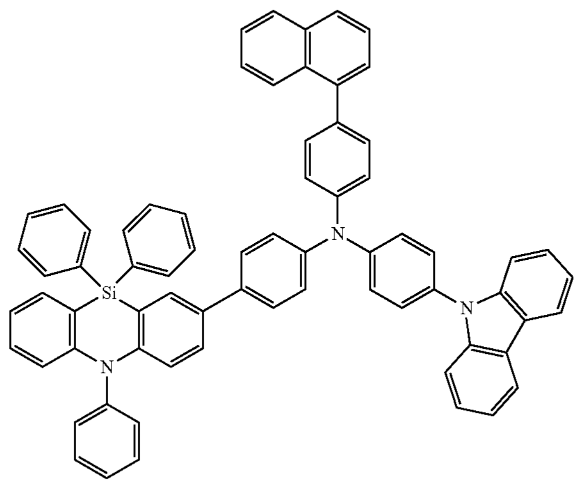
B89
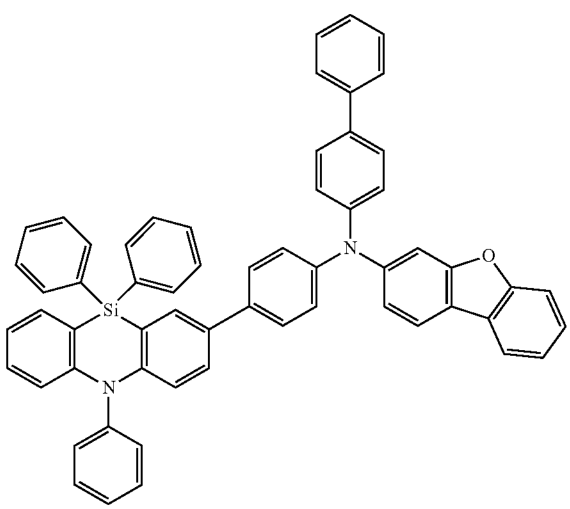
B90
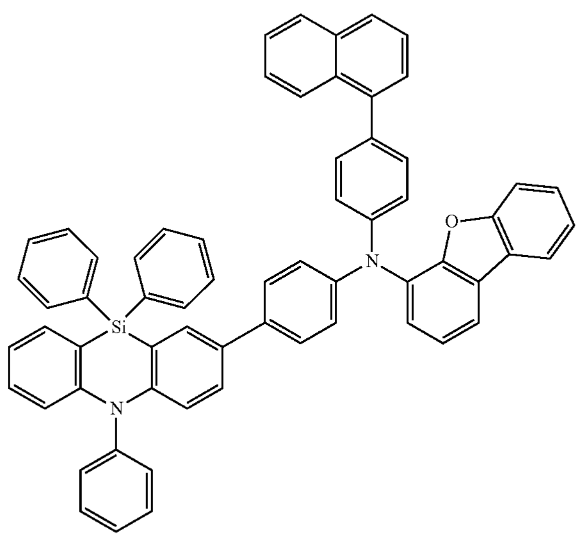
B91
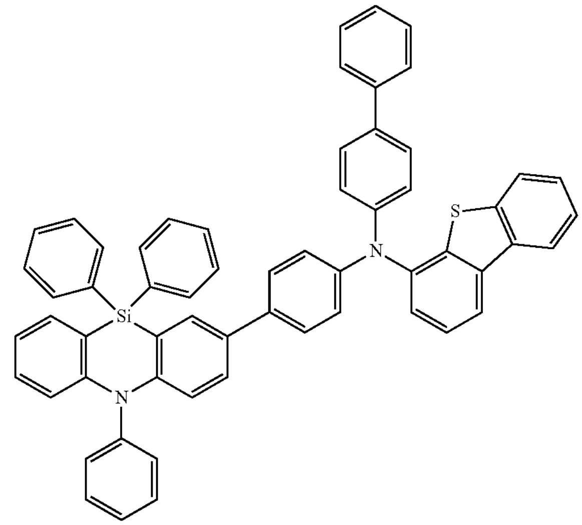
B92
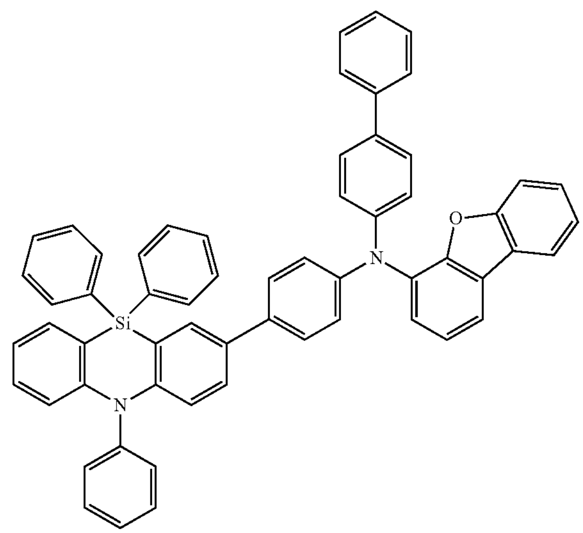
B93
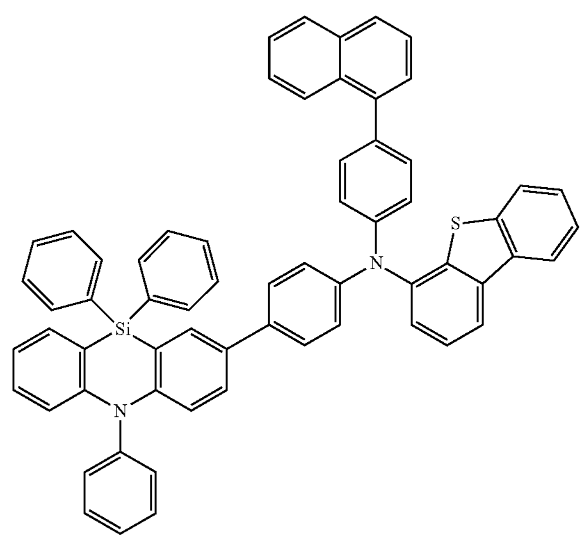

-continued
B94
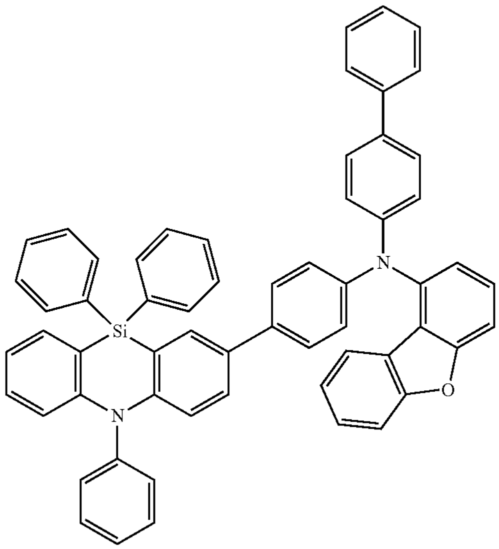
B95
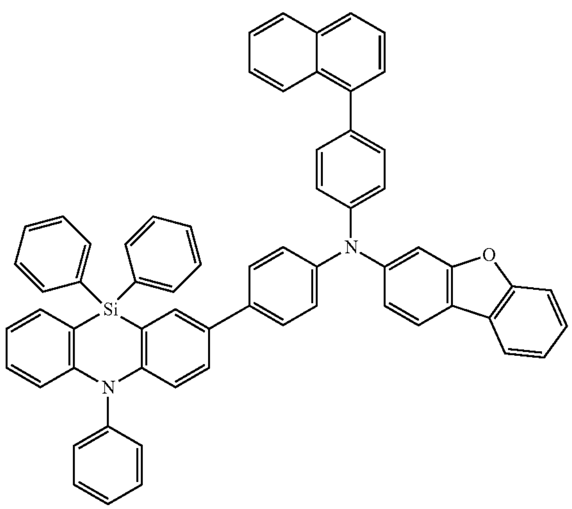
B96
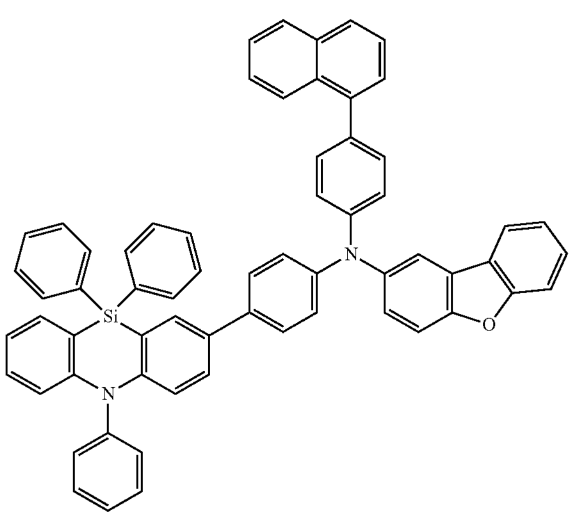
-continued
B97
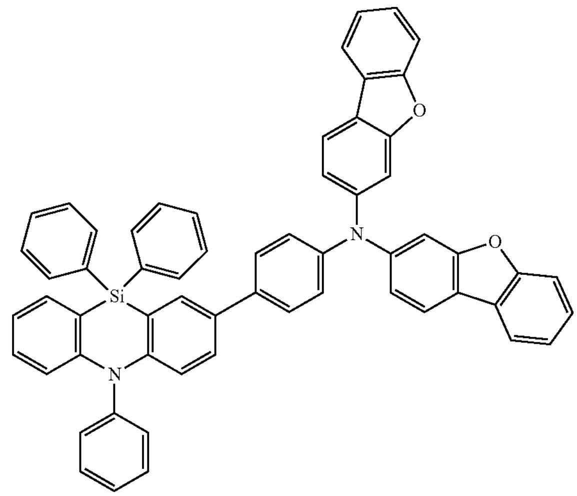
B98
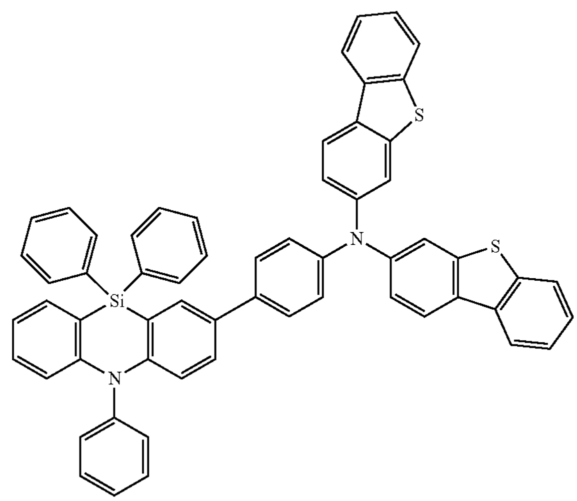
B99
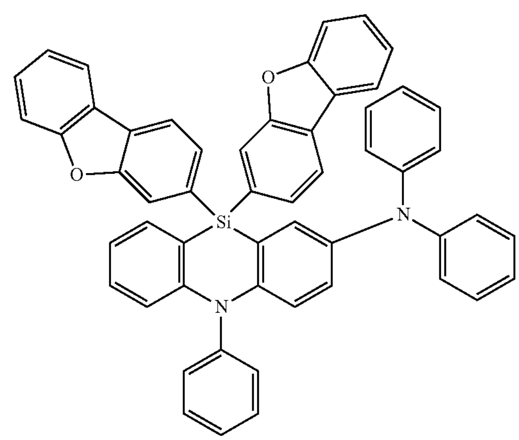

B100
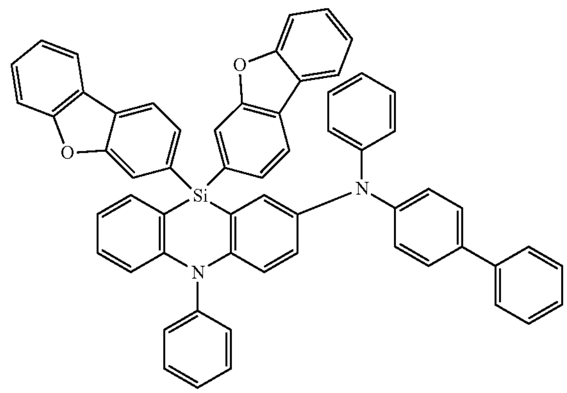
B101
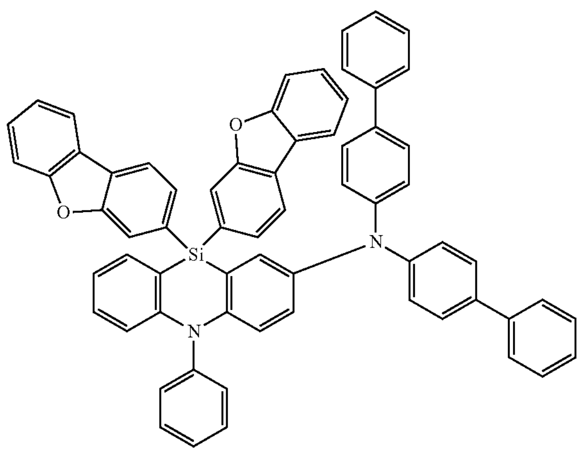
B102
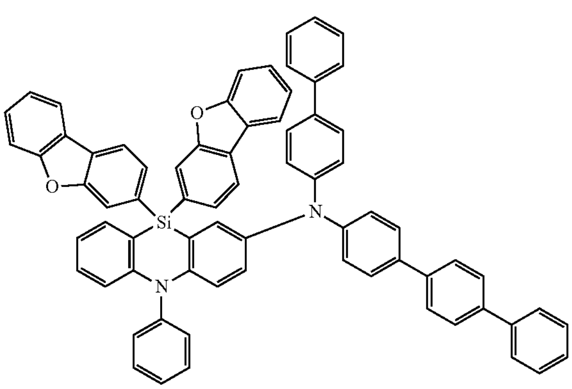
B103
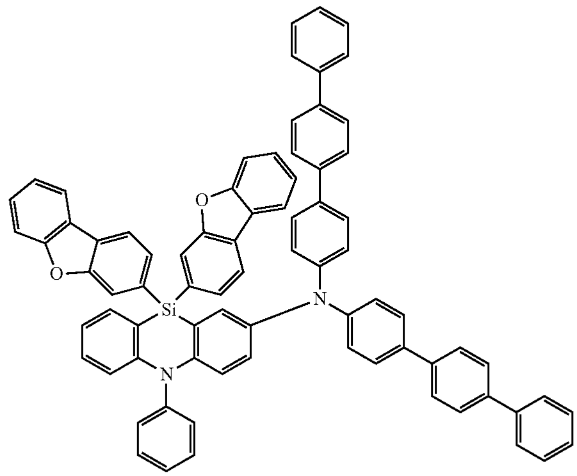
B104
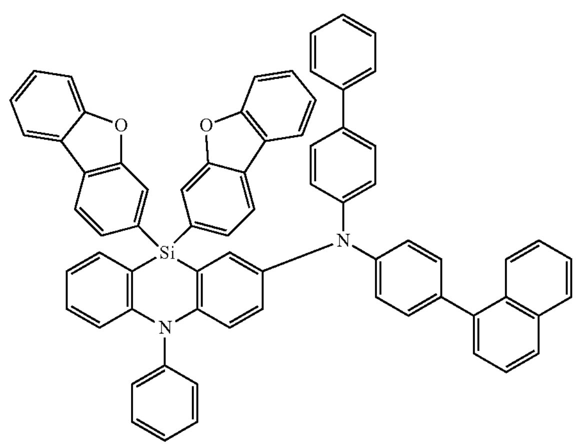
B105
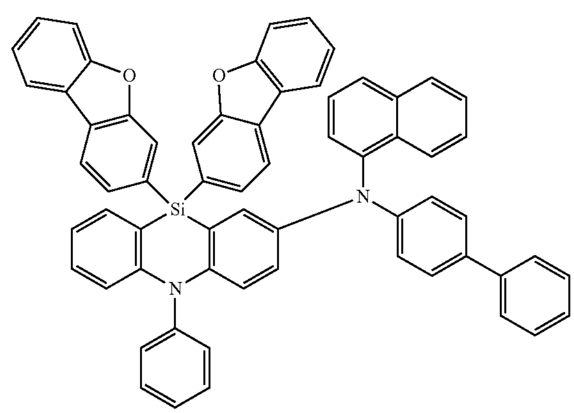

-continued
B106
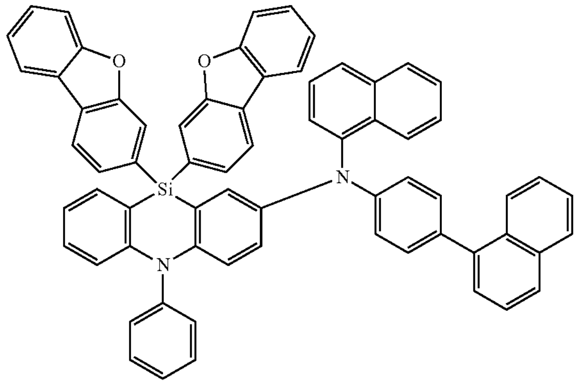
B107
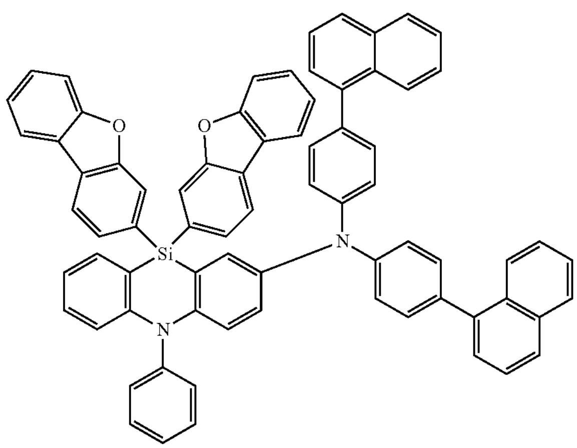
B108
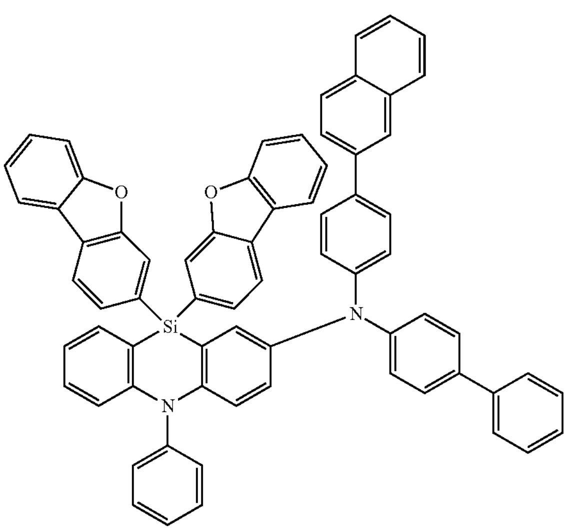
-continued
B109
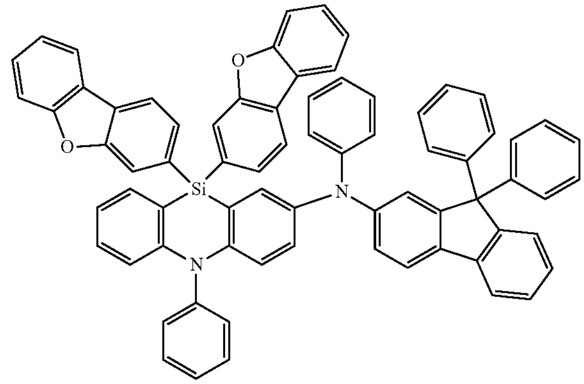
B110
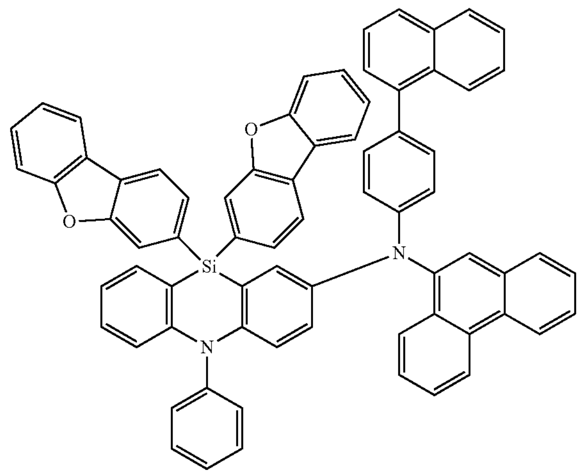
B111
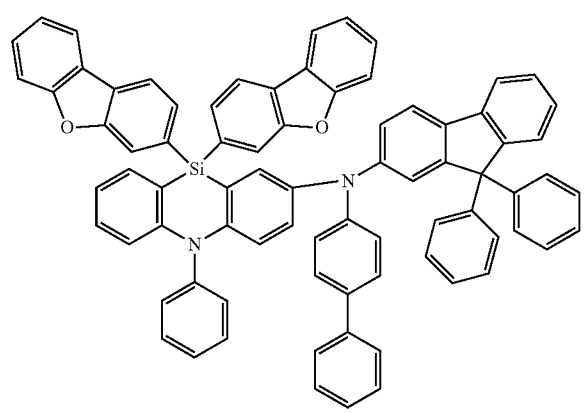

-continued
B112
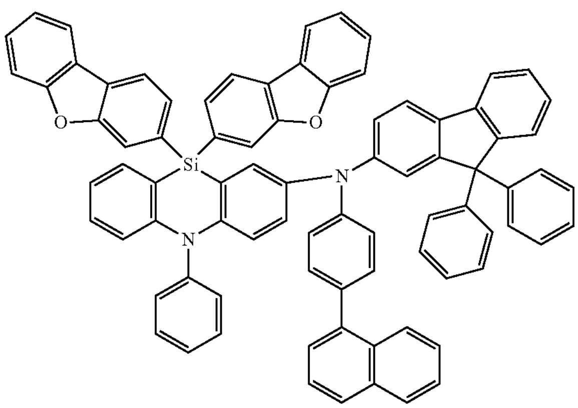
B113
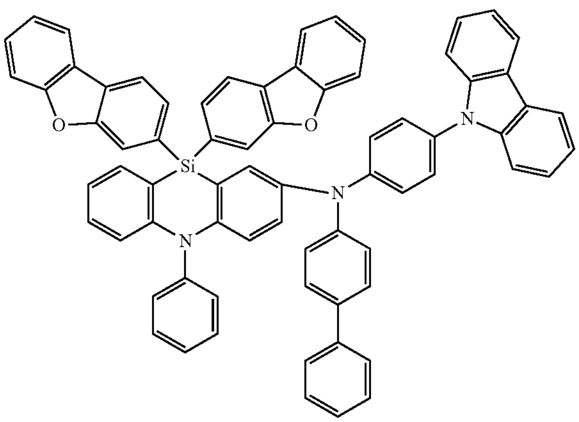
B114
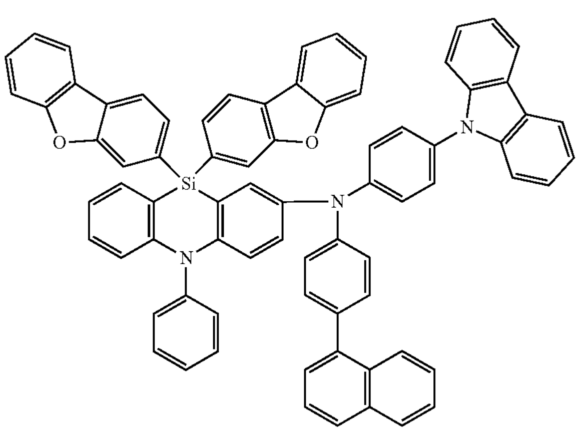
-continued
B115
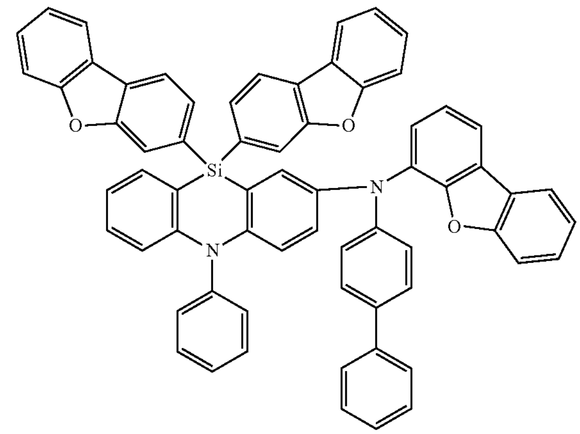
B116
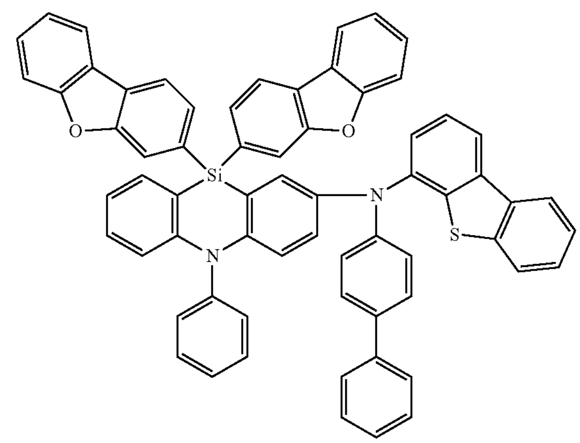
B117
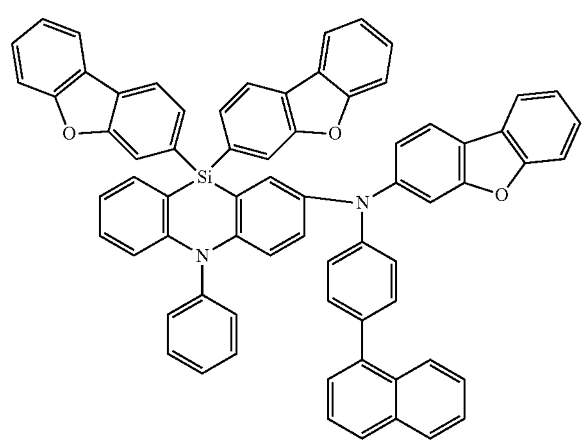

-continued

B118

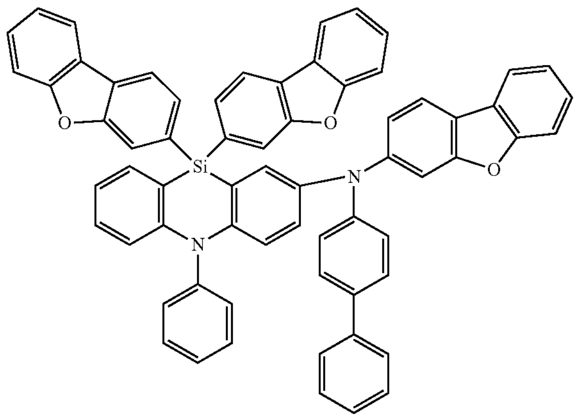

B119

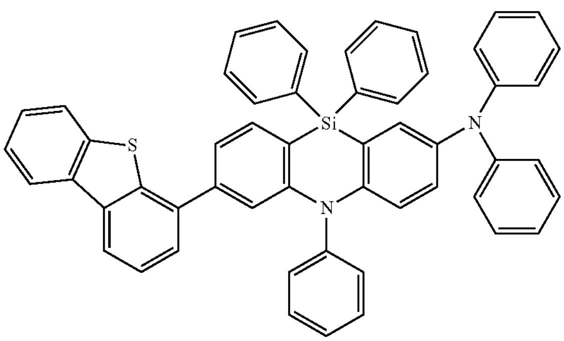

B120

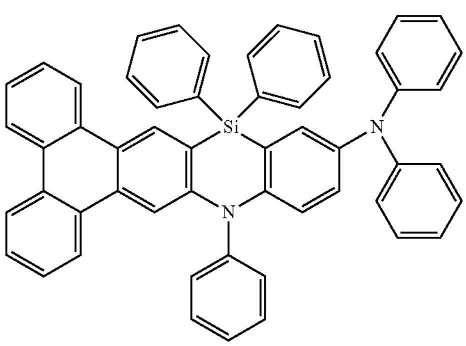

B121

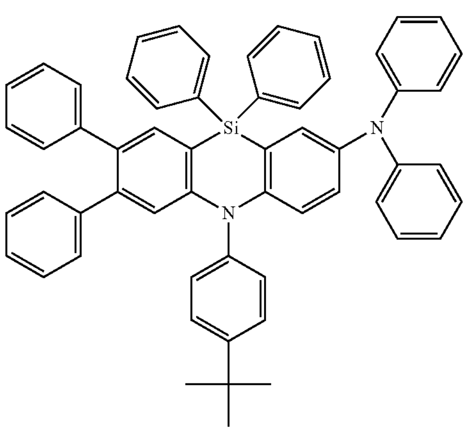

-continued

B122

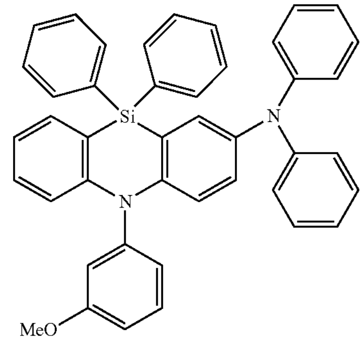

19. An amine compound represented by the following Formula 2-1 or 2-2:

[Formula 2-1]

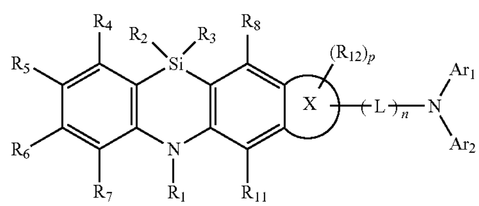

[Formula 2-2]

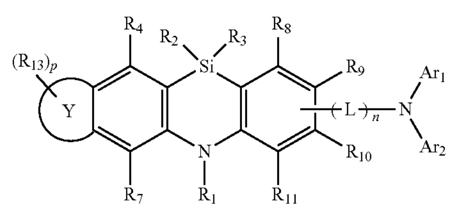

in Formula 2-1 and Formula 2-2, $R_1$ is a substituted or unsubstituted aryl group having 6 to 40 ring carbon atoms, $R_2$ and $R_3$ are each independently a substituted or unsubstituted aryl group having 6 to 40 ring carbon atoms, or a substituted or unsubstituted heteroaryl group having 2 to 40 ring carbon atoms, $R_4$ to $R_{11}$ are each independently a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, or form a ring by combining adjacent groups with each other, $Ar_1$ and $Ar_2$ are each independently a substituted or unsubstituted aryl group having 6 to 40 ring carbon atoms, or a substituted or unsubstituted heteroaryl group having 2 to 40 ring carbon atoms, L is a direct linkage, a substituted or unsubstituted arylene group having 6 to 30 ring carbon atoms, or a substituted or unsubstituted heteroarylene group having 2 to 30 ring carbon atoms, n is an integer of 1 to 4, X and Y are each independently a hydrocarbon ring having 6 to 40 ring carbon atoms, or a heterocycle having 2 to 40 ring carbon atoms, $R_{12}$ and $R_{13}$ are each independently a hydrogen atom, a deuterium atom, a halogen atom, a substituted or unsubstituted silyl group, a substituted or unsubstituted alkyl group having 1 to 10 carbon atoms, a substituted or unsubstituted alkoxy group having 1 to 10 carbon atoms, a substituted or unsubstituted aryloxy group having 6 to 30 ring carbon atoms, a substituted or unsubstituted aryl group having 6 to 40 ring carbon atoms, or a substituted or unsubstituted heteroaryl group having 2 to 40 ring carbon atoms, and p and q are each independently an integer of 0 to 3.

20. The amine compound as claimed in claim 19, wherein Formulae 2-1 and 2-2 are represented by the following Formulae 2-1A and 2-2A, respectively:

[Formula 2-1A]

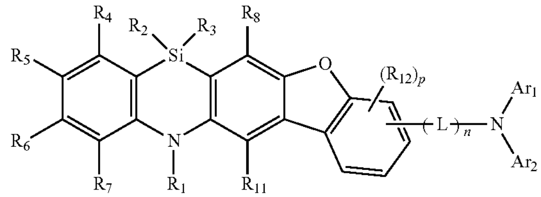

[Formula 2-2A]

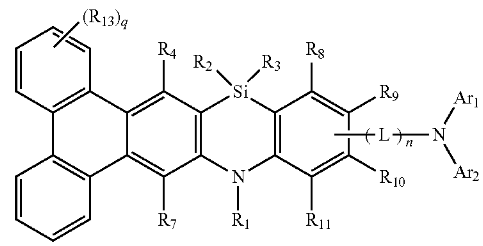

in Formula 2-1A and Formula 2-2A, $R_{12}$ and p are the same as defined in Formula 2-1, $R_{13}$ and q are the same as defined in Formula 2-2, and $R_1$ to $R_{11}$, $Ar_1$, $Ar_2$, L, and n are the same as defined in Formula 1.

* * * * *